United States Patent
Shin et al.

(10) Patent No.: US 10,204,821 B2
(45) Date of Patent: Feb. 12, 2019

(54) SEMICONDUCTOR DEVICES HAVING ISOLATION INSULATING LAYERS AND METHODS OF MANUFACTURING THE SAME

(71) Applicant: Samsung Electronics Co., Ltd., Suwon-si, Gyeonggi-do (KR)

(72) Inventors: HeonJong Shin, Yongin-si (KR); Sungmin Kim, Incheon (KR); Byungseo Kim, Suwon-si (KR); Sunhom Steve Paak, Seoul (KR); Hyunjun Bae, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/335,743

(22) Filed: Oct. 27, 2016

(65) Prior Publication Data

US 2017/0047243 A1    Feb. 16, 2017

Related U.S. Application Data

(63) Continuation of application No. 14/600,689, filed on Jan. 20, 2015, now Pat. No. 9,515,172.

(30) Foreign Application Priority Data

Jan. 28, 2014 (KR) .................. 10-2014-0010202
Mar. 18, 2014 (KR) .................. 10-2014-0031713

(51) Int. Cl.
*H01L 21/762*    (2006.01)
*H01L 29/66*     (2006.01)
*H01L 29/78*     (2006.01)
*H01L 27/088*    (2006.01)
(Continued)

(52) U.S. Cl.
CPC ...... *H01L 21/76202* (2013.01); *H01L 21/265* (2013.01); *H01L 21/324* (2013.01); *H01L 27/0886* (2013.01); *H01L 29/66545* (2013.01); *H01L 29/66553* (2013.01);
(Continued)

(58) Field of Classification Search
None
See application file for complete search history.

(56) References Cited

U.S. PATENT DOCUMENTS 6,127,242 A * 10/2000 Batra ............... H01L 21/76202
                                                  257/E21.552
6,143,626 A     11/2000 Yabu
6,281,562 B1    8/2001 Segawa
(Continued)

FOREIGN PATENT DOCUMENTS

CN    10126687     10/2008
TW    201230338    7/2012
(Continued)

*Primary Examiner* — Whitney T Moore
*Assistant Examiner* — Herve Assouman
(74) *Attorney, Agent, or Firm* — Myers Bigel, P.A.

(57) ABSTRACT

The inventive concepts provide semiconductor devices and methods of manufacturing the same. Semiconductor devices of the inventive concepts may include a fin region comprising a first fin subregion and a second fin subregion separated and isolated from each other by an isolation insulating layer disposed therebetween, a first gate intersecting the first fin subregion, a second gate intersecting the second fin subregion, and a third gate intersecting the isolation insulating layer.

19 Claims, 121 Drawing Sheets

(51) Int. Cl.
*H01L 21/265* (2006.01)
*H01L 21/324* (2006.01)

(52) U.S. Cl.
CPC .. *H01L 29/66795* (2013.01); *H01L 29/66818* (2013.01); *H01L 29/785* (2013.01); *H01L 29/7851* (2013.01)

(56) References Cited

U.S. PATENT DOCUMENTS

| | | |
|---|---|---|
| 7,320,908 B2 | 1/2008 | Son |
| 8,293,616 B2 | 10/2012 | Chang |
| 8,435,845 B2 | 5/2013 | Ning et al. |
| 8,466,034 B2 | 6/2013 | Maszara et al. |
| 8,487,348 B2 | 7/2013 | Cea et al. |
| 2004/0235255 A1 | 11/2004 | Tanaka |
| 2005/0173759 A1 | 8/2005 | Kim |
| 2005/0285179 A1 | 12/2005 | Violette |
| 2005/0287731 A1* | 12/2005 | Bian ................ H01L 21/76232 438/201 |
| 2007/0134884 A1* | 6/2007 | Kim ................ H01L 21/823437 438/424 |
| 2007/0138599 A1* | 6/2007 | Ahn ................ H01L 27/10876 257/618 |
| 2008/0265386 A1 | 10/2008 | Muto |
| 2011/0068407 A1* | 3/2011 | Yeh ................ H01L 21/823807 257/369 |
| 2012/0083107 A1 | 4/2012 | Chang et al. |
| 2012/0126884 A1 | 5/2012 | Juengling |
| 2012/0161238 A1 | 6/2012 | Scheiper et al. |
| 2012/0299110 A1 | 11/2012 | Hung et al. |
| 2013/0087832 A1* | 4/2013 | Yu .................... H01L 21/28123 257/192 |
| 2013/0126972 A1 | 5/2013 | Wang et al. |
| 2013/0134506 A1 | 5/2013 | Yagishita |
| 2013/0175579 A1* | 7/2013 | Cheng ............... H01L 29/66795 257/192 |
| 2013/0181263 A1* | 7/2013 | Cai .................. H01L 29/66795 257/288 |
| 2013/0187237 A1 | 7/2013 | Yu et al. |
| 2013/0200449 A1* | 8/2013 | Chen ............... H01L 21/823431 257/296 |
| 2013/0200455 A1 | 8/2013 | Lo et al. |
| 2013/0230958 A1 | 9/2013 | Lee et al. |
| 2013/0240836 A1 | 9/2013 | Lee et al. |
| 2013/0249003 A1 | 9/2013 | Oh et al. |
| 2013/0270559 A1 | 10/2013 | Hafez et al. |
| 2013/0280883 A1* | 10/2013 | Faul .................... H01L 21/2255 438/434 |
| 2015/0028348 A1* | 1/2015 | Jacob .................... H01L 29/785 257/77 |

FOREIGN PATENT DOCUMENTS

| | | |
|---|---|---|
| TW | 201248855 | 12/2012 |
| TW | 201340313 | 10/2013 |

* cited by examiner

SEMICONDUCTOR DEVICES HAVING ISOLATION INSULATING LAYERS AND METHODS OF MANUFACTURING THE SAME

CROSS-REFERENCE TO RELATED APPLICATIONS

The present application is a continuation application of U.S. patent application Ser. No. 14/600,689, filed on Jan. 20, 2015, which claims priority under 35 U.S.C. § 119 to Korean Patent Application No. 10-2014-0010202 filed on Jan. 28, 2014 and Korean Patent Application No. 10-2014-0031713 filed on Mar. 18, 2014, the disclosures of which are hereby incorporated by reference in their entirety.

FIELD

The inventive concepts relate to semiconductor devices and methods of manufacturing the same and, more particularly, to semiconductor devices having a three-dimensional channel and methods of manufacturing the same.

BACKGROUND

As semiconductor devices have become more highly integrated, the integration density of semiconductor devices has progressively increased. Because integration density is limited by the area of the device and the ability to form patterns within that area, there is a need for new methods that are capable of producing finer, more precise patterns than are possible using conventional techniques.

Fin field effect transistors (FINFETs) have been developed as one means of increasing the integration density of semiconductor devices. As sizes of FINFET devices have been reduced to 20 nm or less, it has become increasingly difficult to form isolation insulating layers in fin regions using conventional patterning methods, such as those discussed in U.S. Patent Publication No. 2013/0187237.

The inventive concepts provide structures and methods for producing finer, more precise patterns by preventing the misalignment of photolithography processes and insulating fin regions from each other in a lateral direction.

SUMMARY

The inventive concepts provide semiconductor devices having an isolation insulating layer that is self-alignedly formed to separate fin regions from each other. Such devices may exhibit improved reliability by preventing a short or leakage current between a gate electrode disposed on an isolation insulating layer and a source/drain region.

In some embodiments, semiconductor devices of the inventive concepts comprise a substrate; a fin region disposed on the substrate, the fin region comprising a first fin subregion and a second fin subregion spaced apart from each other in a first direction on the substrate; a discrete isolation insulating island disposed between the first fin subregion and the second fin subregion to separate the first fin subregion from the second fin subregion; a first gate intersecting the first fin subregion and extending in a second direction different from the first direction; a second gate intersecting the second fin subregion and extending in the second direction; and a third gate intersecting the discrete isolation insulating island, extending in the second direction and covering at least a sidewall of the discrete isolation insulating island. Each of the first, second and third gates may include a gate dielectric layer and a gate electrode.

In some embodiments, semiconductor devices of the inventive concepts comprise a substrate; a fin region including a first fin subregion and a second fin subregion spaced apart from each other in a first direction on the substrate, the fin region extending in the first direction; a first gate intersecting the first fin subregion in a second direction different from the first direction; a second gate intersecting the second fin subregion in the second direction; a first isolation insulating layer having a liner-shape formed on a sidewall of a recess region provided in the fin region between the first gate and the second gate; and a third gate covering the first isolation insulating layer and extending in the second direction. Each of the first, second and third gates may include a gate dielectric layer and a gate electrode.

In some embodiments, semiconductor devices of the inventive concepts comprise a substrate; a plurality of fin regions disposed on the substrate and spaced apart from each other in a second direction, each of the fin regions comprising a first fin subregion and a second fin subregion spaced apart from each other in a first direction different from the second direction; a plurality of discrete isolation insulating islands spaced apart from each other in the first direction and second direction, each of the discrete isolation insulating islands disposed in one of the plurality of fin regions between the first fin subregion and second fin subregion to separate the first fin subregion from the second fin subregion; a first source/drain region formed in the first fin subregion of each of the fin regions; a second source/drain region formed in the second fin subregion of each of the fin regions; a punch-through stop layer disposed underneath each of the discrete isolation insulating islands, a conductivity type of the punch-through stop layer being different from that of the first and second source/drain regions; a first gate intersecting the first fin subregion in each of the plurality of fin regions; a second gate intersecting the second fin subregion in each of the plurality of fin regions; and a third gate intersecting the discrete isolation insulating island in each of the plurality of fin regions.

The inventive concepts also provide methods of manufacturing a semiconductor device that comprises an isolation insulating layer that is self-alignedly formed to isolate fin regions from each other. Such methods may be used to fabricate semiconductor devices having improved reliability by preventing a short or leakage current between a gate electrode disposed on an isolation insulating layer and a source/drain region. In some embodiments, methods of the inventive concepts comprise forming a fin region extending in a first direction on a substrate; forming a discrete isolation insulating island comprising an oxide layer in the fin region by oxidizing a portion of the fin region, thereby forming a first fin subregion and a second fin subregion separated from each other in the first direction by the discrete isolation insulating island; and forming a third gate covering at least a sidewall of the discrete isolation insulating island, the third gate extending in a second direction different from the first direction.

In some embodiments, methods of the inventive concepts comprise forming a first fin subregion and a second fin subregion spaced apart from each other in a first direction on a substrate; forming a first discrete isolation insulating island disposed between the first fin subregion and the second fin subregion, the discrete isolation insulating island separating the first fin subregion from the second fin subregion; forming a first gate intersecting the first fin subregion and extending in a second direction different from the first direction; forming a second gate intersecting the second fin subregion and extending in the second direction; and forming a third gate covering a top surface and sidewalls of the discrete isolation insulating island and extending in the second direction. Each of the first to third gates may include a gate dielectric layer and a gate electrode.

In some embodiments, methods of the inventive concepts comprise forming a fin region extending in a first direction on a substrate; forming gate spacers on the fin region, the gate spacers extending in a second direction different from the first direction, and a groove defining that exposes a portion of the fin region; removing the portion of the fin region exposed by the groove to form a recess region; oxidizing the surfaces of the recess region to form an oxide layer; forming a filling insulation layer filling the recess region on the oxide layer to form a isolation insulating layer comprising the oxide layer and the filling insulation layer; and forming a gate filling the groove on the filling insulation layer, the gate including a gate dielectric layer and a gate electrode.

BRIEF DESCRIPTION OF THE DRAWINGS

The foregoing and other aspects, features and advantages of the inventive concepts will be apparent from the following detailed description of example embodiments of the inventive concepts, as illustrated in the accompanying drawings, in which like reference characters refer to the same parts throughout the different views. The drawings are not necessarily to scale, emphasis instead being placed upon illustrating the principles of the inventive concepts. In the drawings:

FIGS. 8AB to 8MB are cross-sectional views taken along line B-B' of FIG. 1 to illustrate a method of manufacturing a semiconductor device according to the first embodiment of the inventive concepts;

FIGS. 8AC to 8MC are cross-sectional views taken along line C-C' of FIG. 1 to illustrate a method of manufacturing a semiconductor device according to the first embodiment of the inventive concepts;

FIGS. 8AD to 8MD are cross-sectional views taken along line D-D' of FIG. 1 to illustrate a method of manufacturing a semiconductor device according to the first embodiment of the inventive concepts;

FIGS. 10AB and 10BB are cross-sectional views taken along line B-B' of FIG. 1 to illustrate a method of manufacturing a semiconductor device according to the first embodiment of the inventive concepts;

FIGS. 10AC and 10BC are cross-sectional views taken along line C-C' of FIG. 1 to illustrate a method of manufacturing a semiconductor device according to the first embodiment of the inventive concepts;

FIGS. 10AD and 10BD are cross-sectional views taken along line D-D' of FIG. 1 to illustrate a method of manufacturing a semiconductor device according to the first embodiment of the inventive concepts;

FIGS. 11AB and 11BB are cross-sectional views taken along line B-B' of FIG. 1 to illustrate a method of manufacturing a semiconductor device according to the second embodiment of the inventive concepts;

FIGS. 11AC and 11BC are cross-sectional views taken along line C-C' of FIG. 1 to illustrate a method of manufacturing a semiconductor device according to the second embodiment of the inventive concepts;

FIGS. 11AD and 11BD are cross-sectional views taken along line D-D' of FIG. 1 to illustrate a method of manufacturing a semiconductor device according to the second embodiment of the inventive concepts;

FIGS. 12AB to 12DB are cross-sectional views taken along line B-B' of FIG. 4A to illustrate a method of manufacturing a semiconductor device according to the third embodiment of the inventive concepts;

FIGS. 12AC to 12DC are cross-sectional views taken along line C-C' of FIG. 4A to illustrate a method of manufacturing a semiconductor device according to the third embodiment of the inventive concepts;

FIGS. 12AD to 12DD are cross-sectional views taken along line D-D' of FIG. 4A to illustrate a method of manufacturing a semiconductor device according to the third embodiment of the inventive concepts;

FIGS. 13AB to 13DB are cross-sectional views taken along line B-B' of FIG. 5 to illustrate a method of manufacturing a semiconductor device according to the fourth embodiment of the inventive concepts;

FIGS. 13AC to 13DC are cross-sectional views taken along line C-C' of FIG. 5 to illustrate a method of manufacturing a semiconductor device according to the fourth embodiment of the inventive concepts;

FIGS. 13AD to 13DD are cross-sectional views taken along line D-D' of FIG. 5 to illustrate a method of manufacturing a semiconductor device according to the fourth embodiment of the inventive concepts;

FIGS. 14AB to 14CB are cross-sectional views taken along line B-B' of FIG. 5 to illustrate a method of manufacturing a semiconductor device according to the fifth embodiment of the inventive concepts;

FIGS. 14AC to 14CC are cross-sectional views taken along line C-C' of FIG. 5 to illustrate a method of manufacturing a semiconductor device according to the fifth embodiment of the inventive concepts;

FIGS. 14AD to 14CD are cross-sectional views taken along line D-D' of FIG. 5 to illustrate a method of manufacturing a semiconductor device according to the fifth embodiment of the inventive concepts;

FIGS. 18AB to 18LB are cross-sectional views taken along line B-B' of FIG. 15A to illustrate a method of manufacturing a semiconductor device according to the sixth embodiment of the inventive concepts;

FIGS. 18AC to 18LC are cross-sectional views taken along line C-C' of FIG. 15A to illustrate a method of manufacturing a semiconductor device according to the sixth embodiment of the inventive concepts;

FIGS. 18AD to 18LD are cross-sectional views taken along line D-D' of FIG. 15A to illustrate a method of manufacturing a semiconductor device according to the sixth embodiment of the inventive concepts;

FIGS. 19AB to 19DB are cross-sectional views taken along line B-B' of FIG. 16A to illustrate a method of manufacturing a semiconductor device according to the seventh embodiment of the inventive concepts;

FIGS. 19AC to 19DC are cross-sectional views taken along line C-C' of FIG. 16A to illustrate a method of manufacturing a semiconductor device according to the seventh embodiment of the inventive concepts;

FIGS. 19AD to 19DD are cross-sectional views taken along line D-D' of FIG. 16A to illustrate a method of manufacturing a semiconductor device according to the seventh embodiment of the inventive concepts;

FIGS. 20AB to 20CB are cross-sectional views taken along line B-B' of FIG. 17A to illustrate a method of manufacturing a semiconductor device according to the eighth embodiment of the inventive concepts;

FIGS. 20AC to 20CC are cross-sectional views taken along line C-C' of FIG. 17A to illustrate a method of manufacturing a semiconductor device according to the eighth embodiment of the inventive concepts;

FIGS. 20AD to 20CD are cross-sectional views taken along line D-D' of FIG. 17A to illustrate a method of manufacturing a semiconductor device according to the eighth embodiment of the inventive concepts;

DETAILED DESCRIPTION OF THE EMBODIMENTS

Figure 1:
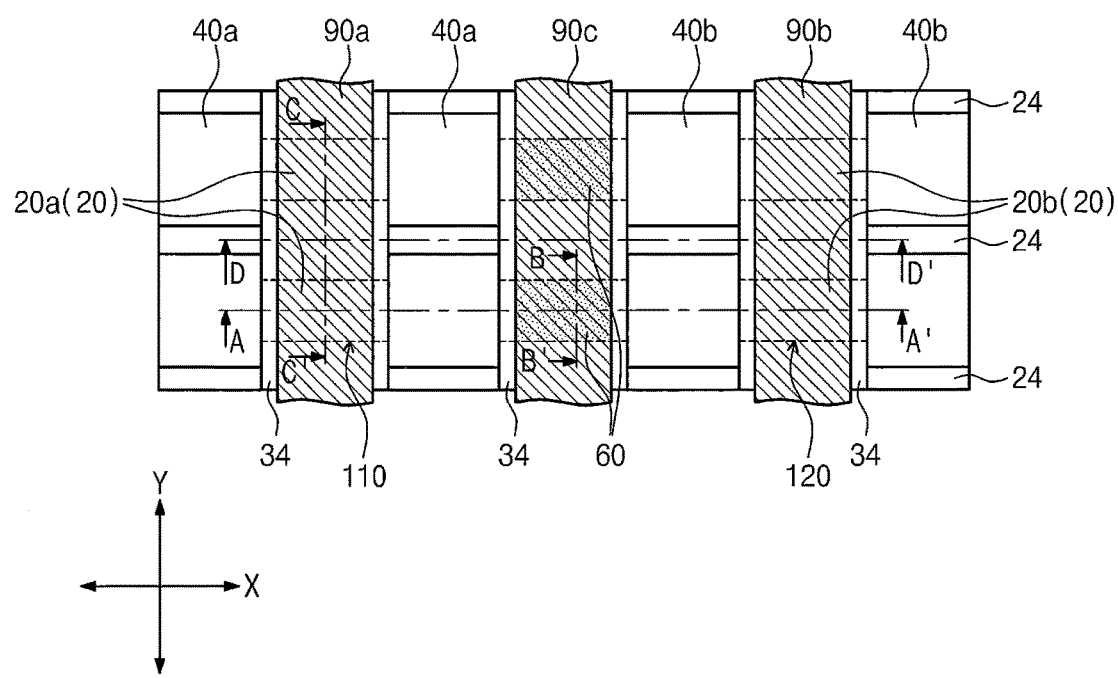
FIG. 1 is a plan view illustrating semiconductor devices according to embodiments of the inventive concepts.

The inventive concepts will now be described more fully hereinafter with reference to the accompanying drawings, in which example embodiments of the inventive concepts are shown and in which aspects of the inventive concepts may be exaggerated for clarity. Advantages and features of the inventive concepts and methods of achieving them will be apparent from the following example embodiments, which will be described with reference to the accompanying drawings. The inventive concepts are not limited to the following example embodiments and may be implemented in various forms. The example embodiments are provided only to disclose the inventive concepts and to allow those skilled in the art to more fully understand advantages and features of the inventive concepts. The inventive concepts are not limited to the specific examples provided herein.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. The inventive concepts are not limited to the specific shape illustrated in the example views, but may include other shapes that may be created according to manufacturing processes. Areas exemplified in the drawings have general properties, and are used to illustrate specific shapes of elements. The drawings should not be construed as limiting the scope of the inventive concept.

It will also be understood that, although the terms first, second, third etc. may be used herein to describe various elements, the elements described thusly should not be limited by those terms. Those terms are only used to distinguish one element from another element. Thus, a first element in some embodiments could be termed a second element in other embodiments without departing from the teachings of the present inventive concepts. Example embodiments of aspects of the inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, the inventive concepts should not be construed as limited to the shapes of regions illustrated herein; it includes deviations in shapes that result, for example, from manufacturing. For example, a region illustrated as a rectangle may have rounded or curved features. Thus, the regions illustrated in the figures are schematic in nature and their shapes are not intended to illustrate the actual shape of a region of a device and are not intended to limit the scope of the inventive concepts.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to one or more of the embodiments described herein may include a plurality of the devices in an array and/or in a two-dimensional pattern that is based on the functionality of the microelectronic device.

Devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a plan view illustrating semiconductor devices according to embodiments of the inventive concepts. FIGS. 2A, 2B, 2C, and 2D are cross-sectional views taken along lines A-A', B-B', C-C', and D-D' of FIG. 1, respectively, to illustrate semiconductor devices according to a first embodiment of the inventive concepts. FIGS. 3A, 3B, 3C, and 3D are cross-sectional views taken along lines A-A', B-B', C-C', and D-D' of FIG. 1, respectively, to illustrate semiconductor devices according to a second embodiment of the inventive concepts.

As shown in FIGS. 1 to 3D, semiconductor devices of the inventive concepts may comprise a substrate 10, a plurality of fin regions 20, a first gate 90a, a second gate 90b, a third gate 90c, a first isolation insulating layer 24, a second isolation insulating layer 60, a first source/drain region 40a, and a second source/drain region 40b.

Semiconductor devices of the inventive concepts may comprise any suitable substrate 10. In some embodiments, the substrate 10 is a semiconductor substrate comprising one or more semiconductor materials, such as silicon (Si), germanium (Ge), silicon-germanium (SiGe), gallium-phosphorus (GaP), gallium-arsenic (GaAs), silicon-carbon (SiC), silicon-germanium-carbon (SiGeC), indium-arsenic (InAs), and/or indium-phosphorus (InP).

Fin regions 20 of the inventive concepts may comprise a portion of the substrate 10 and/or an epitaxial layer on the substrate 10. In some embodiments, one or more of the fin regions 20 is an active region vertically protruding from the substrate 10.

Fin regions 20 of the inventive concepts may extend in a first direction X (e.g., an X-axis direction) and may include a first fin subregion 20a, a second fin subregion 20b, and a third fin subregion 20c therebetween in the first direction X. The fin regions 20 may be isolated from each other in a second direction Y (e.g., a Y-axis direction) different from the first direction X by a first isolation insulating layer 24 extending along the first direction X.

Although FIGS. 1 to 3D show two fin regions 20 isolated from each other in the second direction Y, it is to be understood that the inventive concepts are not limited to such embodiments. In some embodiments, three or more fin regions 20 may be present and isolated from each other.

The first direction X and the second direction Y may intersect each other at any suitable angle. In some embodiments, the first direction X and the second direction Y are perpendicular to each other. It is to be understood, however, that the inventive concepts are not limited to such embodiments.

The first direction X may be parallel to a length direction of one or more of the fin regions 20 (e.g., the long axis of each fin region 20), and the second direction Y may be parallel to a width direction of one or more of the fin regions 20 (e.g., the short axis of each fin region 20). Thus, in some embodiments, the ends of the first fin subregions 20a may face the ends of the second fin subregions 20b in the first direction X.

The first and second fin subregions 20a, 20b may be used as foundations of active regions and/or channel regions of fin field effect transistors (FINFET). In some embodiments, an N-type transistor (e.g., an NMOS transistor) or a P-type transistor (e.g., PMOS transistor) is formed on the first fin subregion 20a and/or the second fin subregion 20b. For example, as shown in FIGS. 1 to 3D, a first transistor 110 comprising a first gate 90a and first source/drain regions 40a may be formed on the first fin subregion 20a, and a second transistor 120 comprising a second gate 90b and second source/drain regions 40b may be formed on the second fin subregion 20b. The first transistor 110 and the second transistor 120 may be isolated from each other by the second isolation insulating layer 60.

The first isolation insulating layer 24, which has a height h1, may be disposed directly on the substrate 10 and may be in contact with a sidewall of one or more of the fin regions 20. In some embodiments, the The first isolation insulating layer 24 may comprise any suitable material(s), including, but not limited to, oxide, nitride, oxynitride, and low-k dielectric material.

The second isolation insulating layer 60 may be disposed between the first fin subregion 20a and the second fin subregion 20b (e.g., in the third fin subregion 20c) to separate the first fin subregion 20a from the second fin subregion 20b and to isolate the first source/drain region 40a from the second source/drain region 40b in the first direction X. Portions of the first isolation insulating layer 24 may be in direct contact with the second isolation insulating layer 60.

The second isolation insulating layer 60 may comprise a plurality of discrete isolation insulating islands. For example, the second isolation insulating layer 60 may comprise a plurality of discrete isolation insulating islands spaced apart from each other in the first direction X and the second direction Y and aligned with each other in the first direction X.

The second isolation insulating layer 60 may comprise any suitable material(s), including, but not limited to, oxide layers formed by oxidizing a portion of the fin region 20. For example, a portion of the fin region 20 that protrudes upward from the first isolation insulating layer 24 may be oxidized to self-alignedly form the second isolation insulating layer 60. In some embodiments, the second isolation insulating layer 60 is formed in a pillar region 22 located above a plane (shown as a dashed line in FIGS. 2A, 2C, 3A, and 3D) that is coplanar or substantially coplanar with the top surface of the first isolation insulating layer 24. Portions of the top surface of the second isolation insulating layer 60 may be curved. A bottom surface of the second isolation insulating layer 60 may be coplanar or substantially coplanar with or lower than the uppermost surface of the first isolation insulating layer 24 (as shown in FIGS. 2A to 2D) or lower than the uppermost surface of the first isolation insulating layer 24 (as shown in FIGS. 3A to 3D). The top surface of the second isolation insulating layer 60 may be coplanar or substantially coplanar with or lower than the top surfaces of the first and second fin subregions 20a, 20b. Sidewalls of the second isolation insulating layer 60 may be in contact with one or more sidewalls of the first fin subregion 20a and/or one or more sidewalls of the second fin subregion 20b, respectively. A width of the second isolation insulating layer 60 may be substantially equal to the width(s) of the fin regions 20 in the second direction Y. However, the inventive concepts are not limited thereto. In some embodiments, the width of the second isolation insulating layer 60 may be smaller or larger than the width(s) of the first and second fin subregions 20a, 20b. A portion of the third fin subregion 20c may be disposed underneath the second isolation insulating layer 60. The third fin subregion 20c may comprise a portion of the fin region 20.

A punch-through stop layer 54 may be formed in the third fin subregion 20c underneath the second isolation insulating layer 60. The punch-through stop layer 54 may extend into the first fin subregion 20a and/or the second fin subregion 20b. The punch-through stop layer 54 may include a high-concentration dopant region. The punch-through stop layer 54 may impede/prevent a leakage current between the first fin subregion 20a and second fin subregion 20b (e.g., a leakage current caused by a punch-through phenomenon between the first and second transistors 110 and 120 formed in/on the first and second fin subregions 20a, 20b). In some embodiments, the punch-through stop layer 54 may block a leakage current between the first and second fin subregions 20a, 20b by impeding/preventing a punch-through phenomenon between a first source/drain region 40a formed in the first fin subregion 20a and a second source/drain region 40b formed in the second fin subregion 20b.

The punch-through stop layer 54 may have a conductivity type that is different from that of the first and second source/drain regions 40a, 40b. In some embodiments, the punch-through stop layer 54 comprises one or more dopants, the conductivity type of which is different from that of the dopant(s) in the first and second source/drain regions 40a, 40b. For example, if the first and second source/drain regions 40a, 40b include N-type dopants, the punch-through stop layer 54 may include one or more P-type dopants (e.g., boron (B) and/or indium (In)). Alternatively, if the first and second source/drain regions 40a, 40b include P-type dopants, the punch-through stop layer 54 may include one or more N-type dopants (e.g., phosphorus (P), arsenic (As), and/or strontium (Sr)).

The punch-through stop layer 54 may have any suitable dopant concentration. In some embodiments, the punch-through stop layer 54 has a dopant concentration in a range of about $10^{10}$ atoms/cm$^3$ to about $10^{25}$ atoms/cm$^3$ (e.g., about $10^{15}$ atoms/cm$^3$ to about $10^{20}$ atoms/cm$^3$). For example, in some embodiments, the punch-through stop layer 54 may comprise B, BF$_2$, In, As, P, and/or Sr ion-implanted in a dose of about $10^{11}$ atoms/cm$^2$ to about $10^{15}$ atoms/cm$^2$.

In some embodiments, the punch-through stop layer 54 is not formed.

The first gate 90a may extend in the second direction Y and may cross over one or more of the first fin subregions 20a and one or more portions of the first isolation insulating layer 24. In some embodiments, the first gate 90a covers at least a portion of the top surface of each first fin subregion 20a disposed thereunder (e.g., a portion of the top surface of the first fin subregion 20a that is exposed between gate spacers 34 disposed on the top surface of the first fin subregion 20a). In some embodiments, the first gate 90a covers a portion of one or more sidewalls of each first fin subregion 20a disposed thereunder.

The second gate 90b may extend in the second direction Y and may cross over one or more of the second fin subregions 20b and one or more portions of the first isolation insulating layer 24. In some embodiments, the second gate 90b covers at least a portion of the top surface of each second fin subregion 20b disposed thereunder (e.g., a portion of the top surface of the second fin subregion 20b that is exposed between gate spacers 34 disposed on the top surface of the second fin subregion 20b). In some embodiments, the second gate 90b covers a portion of one or more sidewalls of each second fin subregion 20b disposed thereunder. The width(s) of the second gate 90b may be substantially equal to the width(s) of the first gate 90a.

The third gate 90c covers at least a portion of the top surface of each second isolation insulating layer 60 disposed thereunder (e.g., portions of the top surface of the second isolation insulating layer 60 that are exposed between gate spacers 34 disposed on the top surfaces of the second isolation insulating layer 60). In some embodiments, the third gate 90c covers a portion of one or more sidewalls of each second isolation insulating layer 60 disposed thereunder. The width(s) of the third gate(s) 90c may be substantially equal to or smaller than the width(s) of the first and second gates 90a, 90b.

Although FIGS. 1 to 3D show a single third gate 90c disposed on a single second isolation insulating layer 60, it is to be understood that the inventive concepts are not limited to such embodiments. In some embodiments, two or more third gates 90c may be disposed on a single second isolation insulating layer 60. Likewise, one or more third gates 90c may be disposed on each of two or more second isolation insulating layers 60.

Semiconductor devices of the inventive concepts may comprise any suitable type(s) of gate. In some embodiments, the first and second gates 90a, 90b may be normal gates useful for the operation of transistors. In some embodiments, the third gate 90c may be a normal gate, a dummy gate (i.e., a gate that is not used for operation of a transistor), or an interconnection for transmitting a signal.

Each of Gates 90a, 90b, 90c of the inventive concepts may comprise a corresponding one of gate electrodes 88a, 88b, 88c and a corresponding one of the gate dielectric layers 80a, 80b, 80c, respectively. The gate dielectric layers 80a, 80b, 80c may extend in the second direction Y. Each of the gate dielectric layers 80a, 80b, 80c may be disposed between a corresponding one of the gate electrode 88a, 88b, and 88c and a corresponding one of the adjacent fin subregions 20a, 20b and the second isolation layer 60, respectively (e.g., between the corresponding one of the gate electrodes 88a, 88b, 88c and the top surface of the corresponding one of the fin subregions 20a, 20b and the second isolation layer 60 disposed thereunder, respectively) and/or between the corresponding one of the gate electrodes 88a, 88b, 88c and the adjacent source/drain region(s) 40. For example, the first gate 90a may comprise a first gate electrode 88a and a first gate dielectric layer 80a, wherein the first gate dielectric layer 80a is disposed between the first gate electrode 88a and the first fin subregion 20a disposed thereunder and the first source/drain region 40a disposed therearound. Similarly, the third gate 90c may comprise a third gate electrode 88c and a third gate dielectric layer 80c, wherein the third gate dielectric layer 80c is disposed between the third gate electrode 88c and the second isolation insulating layer 60 disposed thereunder and the first and second source/drain regions 40a, 40b disposed on either side. Accordingly, each of gate dielectric layers 80a, and 80b, 80c may cover the sidewalls and bottom surface of the corresponding one of the gate electrodes 88a 88b, 88c, as well as the top surface of the corresponding one of the fin region 20a, 20b and/or second isolation insulating layer 60. In some embodiments, the gate dielectric layers 80a, 80b, 80c intersects the first isolation insulating layer 24.

Each of gate dielectric layers 80a, 80b, 80c of the inventive concepts may comprise any suitable material(s), including, but not limited to, high-k dielectric materials having a dielectric constant higher than that of silicon oxide. In some embodiments, the gate dielectric layer 80 comprises hafnium oxide, hafnium-silicon oxide, lanthanum oxide, lanthanum-aluminum oxide, zirconium oxide, zirconium-silicon oxide, tantalum oxide, titanium oxide, barium-strontium-titanium oxide, barium-titanium oxide, strontium-titanium oxide, yttrium oxide, aluminum oxide, lead-scandium-tantalum oxide, and/or lead-zinc niobate.

Each of gate electrodes 88a, 88b, 88c of the inventive concepts may comprise any suitable material(s), including, but not limited to, metals and metal nitrides. In some embodiments, each of gate electrodes 88a, 88b, 88c comprises a first gate conductive layer 82 and a second gate conductive layer 84. The first gate conductive layer 82 may be disposed between the second gate conductive layer 84 and the gate dielectric layer 80 to control a work function of the gate electrode 88. In some embodiments, the second gate conductive layer 84 fills a space defined by the first gate conductive layer 82.

Each first gate conductive layer 82 of the inventive concepts may comprise any suitable material(s), including, but not limited to, metal and/or metal nitride. For example, in some embodiments, each first gate conductive layer 82 comprises titanium nitride (TiN), tantalum nitride (TaN), titanium carbide (TiC), titanium-aluminum (TiAl), titanium-aluminum carbide (TiAlC), titanium-aluminum nitride (TiAlN), tantalum carbide (TaC), and/or tantalum-aluminum nitride (TaAlN).

Each second gate conductive layer 84 of the inventive concepts may comprise any suitable material(s), including, but not limited to, metal and/or metal nitride. For example, in some embodiments, each second conductive layer 84 comprises tungsten (W) and/or aluminum (Al).

Gate electrodes 88a, 88b, 88c of the inventive concepts may be formed using any suitable process(es), including, but not limited to, replacement processes and gate last processes.

Figure 2A:
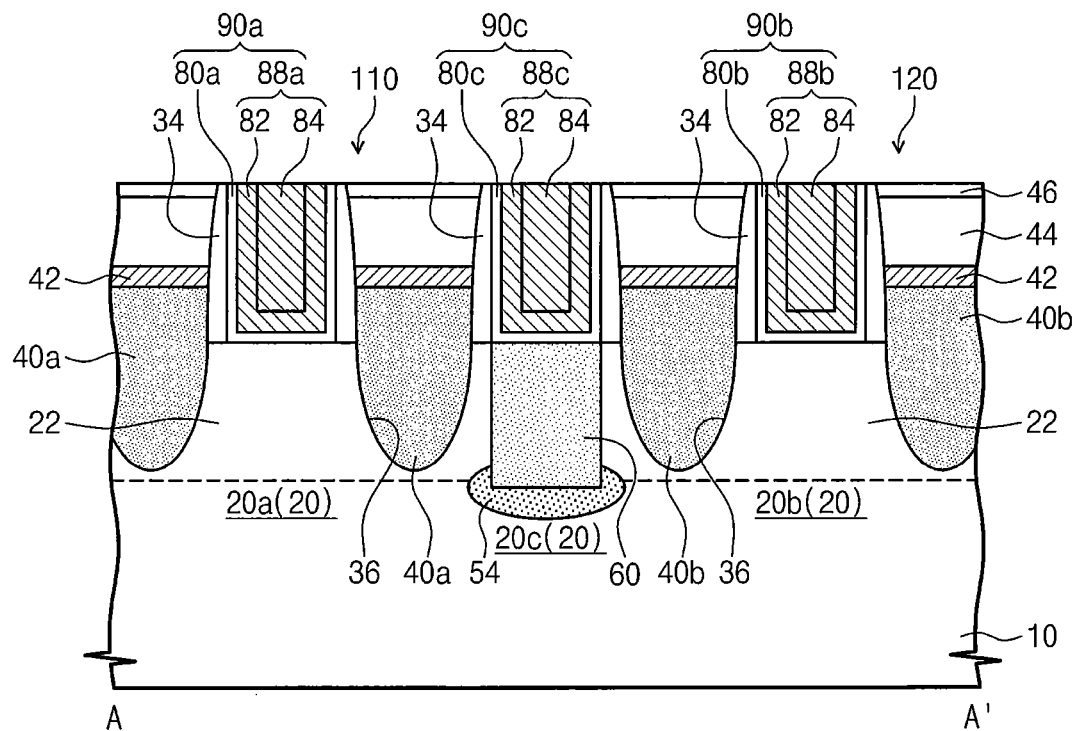
FIGS. 2A to 2D are cross-sectional views taken along lines A-A', B-B', C-C', and D-D' of FIG. 1, respectively, to illustrate semiconductor devices according to a first embodiment of the inventive concepts.
Figure 2B:
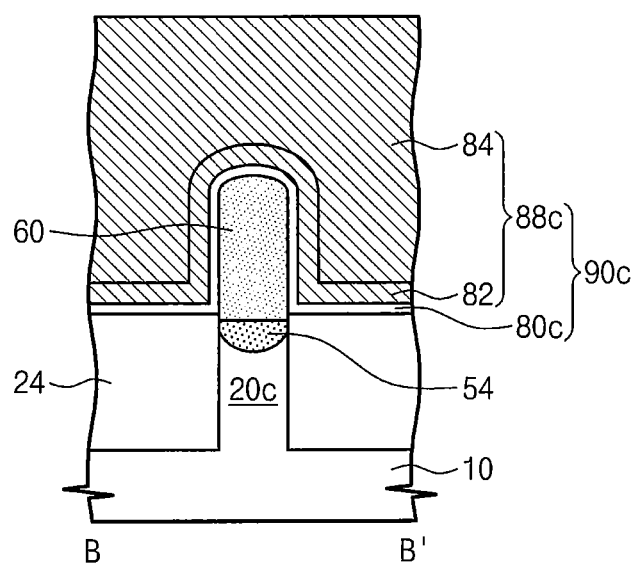
Figure 2C:
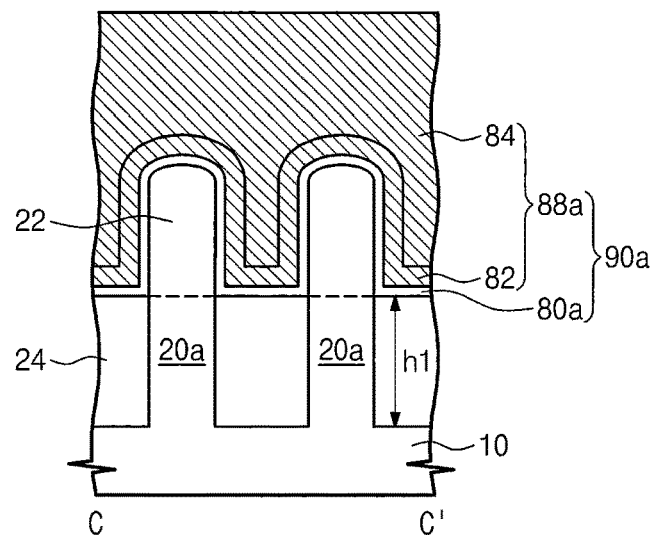
Figure 2D:
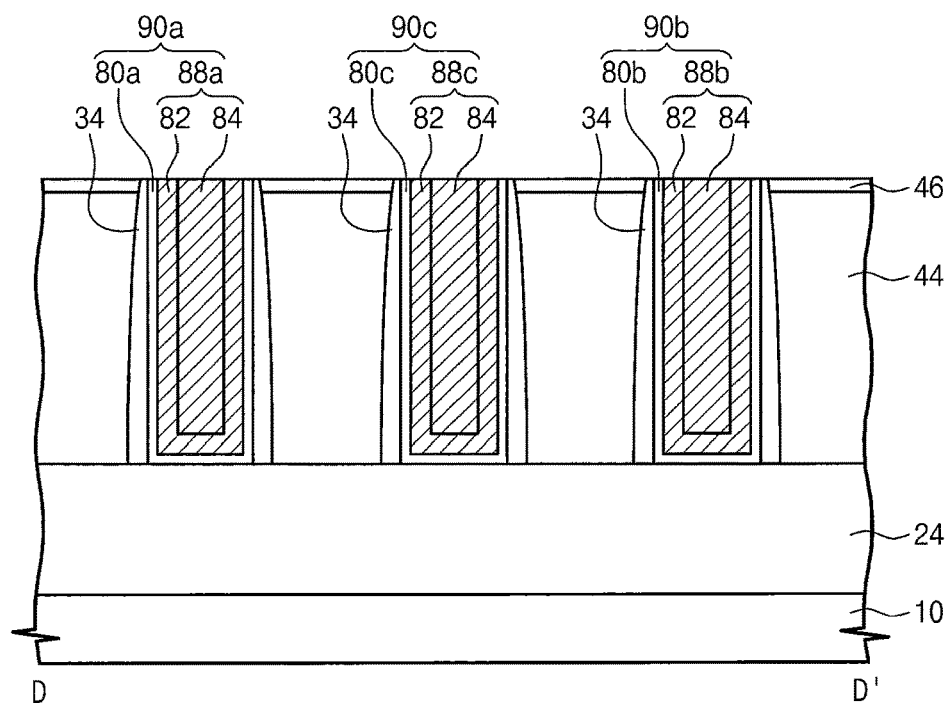
Figure 3A:
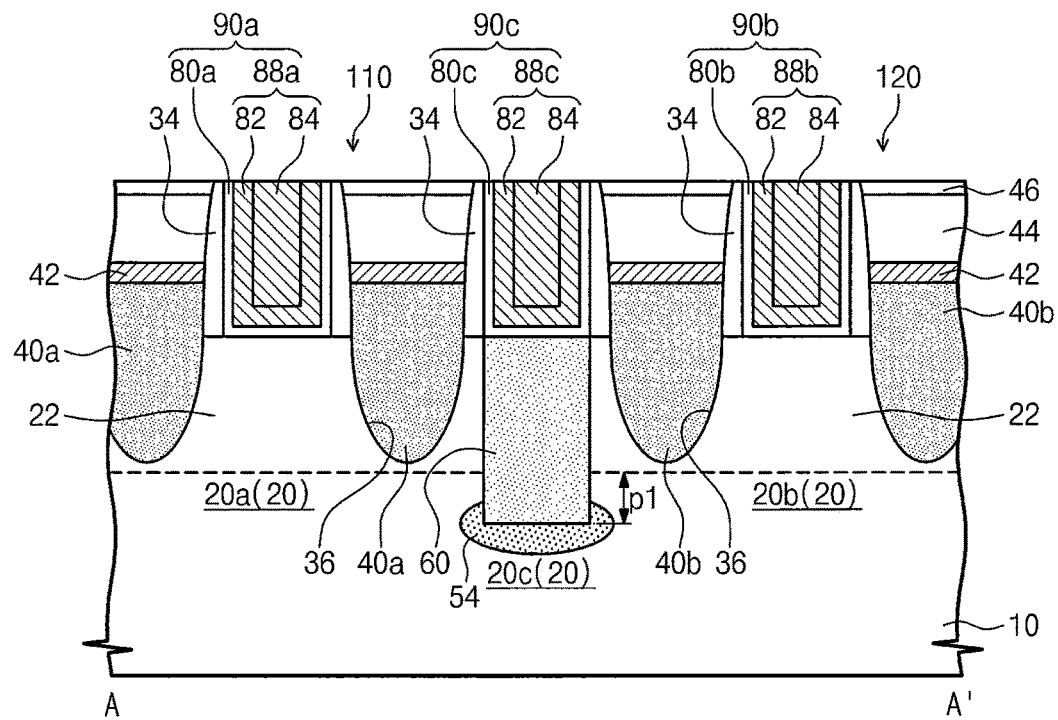
FIGS. 3A to 3D are cross-sectional views taken along lines A-A', B-B', C-C', and D-D' of FIG. 1, respectively, to illustrate semiconductor devices according to a second embodiment of the inventive concepts.
Figure 3B:
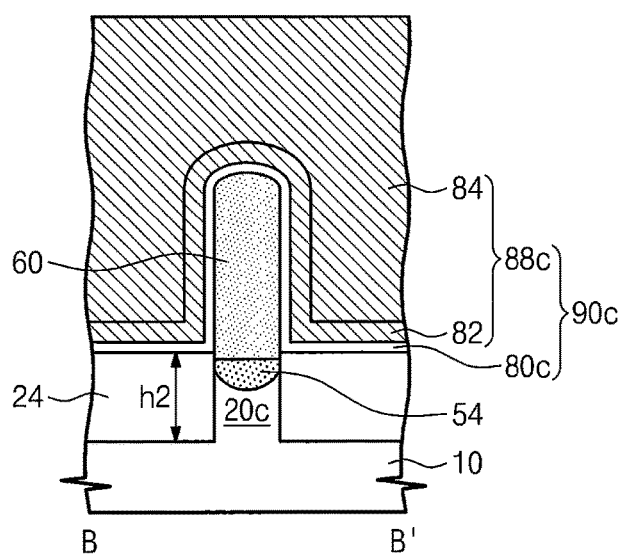
Figure 3C:
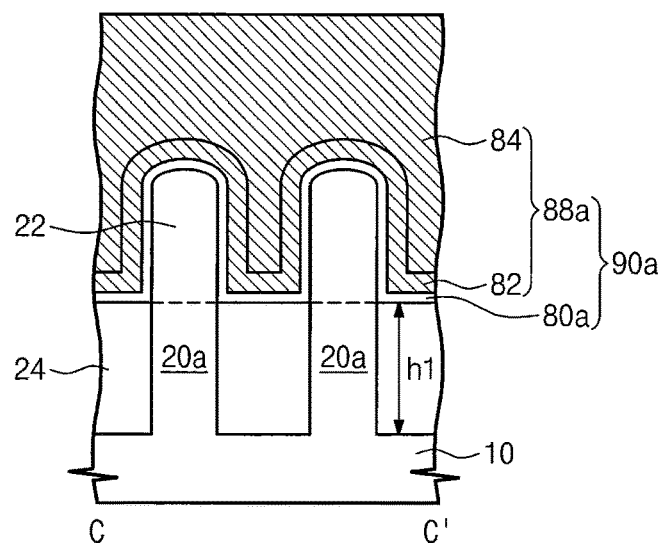

Gate electrodes 88a, 88b, 88c of the inventive concepts may have any suitable dimensions. In some embodiments, a lower portion of the third gate electrode 88c (e.g., the lower surface of the third gate electrode 88c) is substantially equal in size with or smaller than an upper portion of the second isolation insulating layer 60 (e.g., the upper surface of the second isolation insulating layer 60). For example, as shown in FIGS. 2A and 3A, in some embodiments, the width of the lower portion of the third gate electrode 88c is substantially equal to, or smaller than the width of the upper portion of the second isolation insulating layer 60. In some embodiments, the top surfaces of the gate electrodes 88a, 88b, 88c are coplanar or substantially coplanar.

Gates 90a, 90b, 90c of the inventive concepts may have any suitable dimensions. In some embodiments, a lower portion of the third gate 90c (e.g., the lower surface of the third gate 90c) is substantially equal in size with or smaller than an upper portion of the second isolation insulating layer 60 (e.g., the upper surface of the second isolation insulating layer 60). For example, as shown in FIGS. 2A and 3A, in some embodiments, the width of the lower portion of the third gate 90c is substantially equal to the width of the upper portion of the second isolation insulating layer 60.

In some embodiments, the top surfaces of the gates 90a, 90b, 90c are coplanar or substantially coplanar. In some embodiments, the top surfaces of the gate dielectric layers 80a, 80b, 80c are coplanar with or substantially coplanar with gate electrodes 88a, 88b, 88c. As shown in FIGS. 2A to 2D, in some embodiments, the heights of the first and second gates 90a, 90b are substantially equal to the height of the third gate 90c. As shown in FIGS. 3A to 3D, in some embodiments, the height of the third gate 90c is greater than the heights of the first and second gates 90a, 90b.

As shown in FIGS. 2A to 2D, in some embodiments, the heights of the first and second gate electrodes 88a, 88b are substantially equal to the height of the third gate electrode 88c. As shown in FIGS. 3A to 3D, in some embodiments, the height of a portion of the third gate electrode 88c is greater than the heights of the first and second gate electrodes 88a, 88b.

In those embodiments in which the third gate 90c is to be used as a normal gate or signal interconnection, signal delays may be reduced/prevented when the height of the third gate electrode 88c is substantially equal to that of the first and second gate electrodes 88a, 88b. Accordingly, characteristics of semiconductor devices according to the inventive concepts may be improved.

Each of source/drain regions 40a, 40b may be disposed in a corresponding one of the subfin regions 20a, 20b on either side of the corresponding one of the gates 90a, 90b. For example, the first source/drain region 40a may be formed in the first fin subregion 20a adjacent to the sidewalls of the first gate 90a, and the second source/drain region 40b may be formed in the second fin subregion 20b adjacent to the sidewalls of the second gate 9013.

Source/drain regions 40a, 40b of the inventive concepts may be formed using any suitable process(es), including, but not limited to, epitaxial filling processes. In some embodiments, each of source/drain regions 40a, 40b comprises epitaxial layers (e.g., epitaxial layer comprising one or more semiconductor materials) formed in recessed portion 36 of a fin region 20. For example, the first source/drain region 40a may comprise epitaxial layers formed in a recessed portion 36 of the first fin subregion 20a and the second source/drain region 40b may comprise epitaxial layers formed in a recessed portion 36 of the second fin subregion 20b. In some embodiments, at least one of the source/drain regions 40a, 40b lacks an epitaxial layer. In some embodiments, each of the source/drain regions 40a, 40b lacks an epitaxial layer.

Source/drain regions 40a, 40b of the inventive concepts may have any suitable dimensions. In some embodiments, the first and second source/drain regions 40a, 40b protrude above the top surfaces of the first and second fin subregions 20a, 20b, such that the first and second source/drain regions 40a, 40b comprise elevated source/drain structures. A cross section of each of the first and second source/drain regions 40a, 40 may have a polygonal, elliptical shape, or circular shape. The bottom surfaces of the first and second source/drain regions 40a, 40b may be disposed in the pillar region 22 of the fin region 20 (i.e., the bottom surface of each source/drain region 40 may be higher than the top surface of the first isolation insulating layer 24). However, the inventive concepts are not limited thereto. In some embodiments, the bottom surfaces of the first and second source/drain regions 40a, 40b may be disposed in the fin region 20 lower than the top surface of the first isolation insulating layer 24.

Source/drain regions 40a, 40b of the inventive concepts may comprise any suitable dopant(s). In some embodiments, each of source/drain regions 40a, 40b comprises one or more P-type and/or one or more N-type dopants.

The source/drain regions 40a, 40b may be isolated from the gate electrodes 90a, 90b by gate spacers 34, respectively. For example, the first gate 90a and the first source/drain region 40a may be isolated from each other by one or more gate spacers 34 disposed between the sidewalls of the first gate 90a and the sidewalls of the first source/drain region 40a (e.g., between the sidewalls of the first gate dielectric layer 80a and the sidewalls of the first source/drain region 40a). Likewise, the second gate 90b and the second source/drain region 40b may be isolated from each other by one or more gate spacers 34 disposed between the sidewalls of the second gate 90b and the sidewalls of the second source/drain region 40b (e.g., between the sidewalls of the second gate dielectric layer 80b and the sidewalls of the second source/drain region 40b). Similarly, the third gate 90c may isolated from the first and second source/drain regions 40a, 40b by one or more gate spacers 34 disposed between the sidewalls of the third gate 90c and the sidewalls of the first and second source/drain regions 40a, 40b. Accordingly, shorts and leakage currents between the third gate electrode 88c and the first and second source/drain regions 40a, 40b may be impeded/prevented.

Gate spacers 34 may be disposed adjacent to sidewalls of each of the gates 90a, 90b, 90c. The gate spacers 34 may extend in the second direction Y together with the first to third gates 90a, 90b, 90c and may directly contact corresponding ones of gate dielectric layers 80a, 80b, 80c. The top surfaces of the gate spacers 34 may be planarized to be coplanar with or substantially coplanar with the top surfaces of the gates 90a, 90b, 90c. The sidewalls of the second isolation insulating layer 60, which may be parallel to the second direction Y, may be substantially aligned with the inner sidewalls of the gate spacers 34 or the top surface of the second isolation insulating layer 60 may overlap with and be in contact with portions of bottom surfaces of the gate spacers 34. Meanwhile, the width of the upper portion of the second isolation insulating layer 60 may be wider than the lower portion of the third gate electrode 88c.

Gate spacers 34 of the inventive concepts may comprise any suitable material(s), including, but not limited to, silicon nitride and/or silicon oxynitride.

If the first transistor 110 and/or the second transistor 120 is a PMOS transistor, the first source/drain region 40a and/or the second source/drain region 40b may include a compressive stress material. The compressive stress material may be a material (e.g., SiGe) having a lattice constant greater than that of silicon. The compressive stress material may apply a compressive stress to the first fin subregion 20a under the first gate electrode 88a and/or the second fin region 20b under the second gate electrode 88b, thereby improving mobility of carriers of a channel region.

If the first transistor 110 and/or the second transistor 120 is a NMOS transistor, the first source/drain region 40a and/or the second source/drain region 40b may include the same material as the substrate 10 or a tensile stress material. For example, if the substrate 10 is formed of silicon, the first source/drain region 40a and/or the second source/drain region 40b may include silicon or a material (e.g., SiC) having a lattice constant smaller than that of silicon.

Gaps between adjacent gate spacers 34 may be filled with one or more silicide layer, interlayer insulating layers 44 and/or protection patterns 46. For example, a silicide layer 42 may be formed on each of the source/drain regions 40a, 40b, an interlayer insulating layer 44 may be formed on each silicide layer 42, and each protective pattern 46 may be formed on each interlayer insulating layer 44. The top surfaces of the gap fillers (e.g., the top surfaces of protection patterns 46 formed on top surfaces of the silicide layers 42 and/or the interlayer insulating layers 44) may be coplanar with or substantially coplanar with the top surfaces of the gate spacers 34, and the gates 90a, 90b, 90c.

Each silicide layer 42 of the inventive concepts may comprise any suitable material(s), including, but not limited to, nickel (Ni), cobalt (Co), platinum (Pt), and/or titanium (Ti).

Each interlayer insulating layer 44 of the inventive concepts may comprise any suitable material(s), including, but not limited to, silicon oxide and/or low-k dielectric materials having a dielectric constant lower than that of silicon oxide. In some embodiments, each interlayer insulating layer 44 comprises a porous insulating material. An air gap may be formed in each interlayer insulating layer 44.

Each protection pattern 46 of the inventive concepts may comprise any suitable material(s), including, but not limited to, nitride and/or oxynitride.

As noted above, FIGS. 3A to 3D are cross-sectional views taken along lines A-A', B-B', C-C', and D-D' of FIG. 1, respectively, to illustrate semiconductor devices according to a second embodiment of the inventive concepts. Hereinafter, the descriptions of elements already described above with respect to FIGS. 1 and 2A to 2D will be omitted or mentioned only briefly so that differences between the first and second embodiments of the inventive concepts may be highlighted.

As shown in FIG. 3A, the height of the second isolation insulating layer 60 may be greater than the height(s) of the pillar region 22 in the first and second fin subregions 20a, 20b. For example, the top surfaces of the first fin subregion 20a, the second fin subregion 20b, and the second isolation insulating layer 60 may be coplanar or substantially coplanar, whereas the bottom surface of the second isolation insulating layer 60 may be lower than the bottom surface of the pillar region 22 in the first and second fin subregions 20a, 20b by a vertical distance p1 or more. In such embodiments, the height of the second isolation insulating layer 60 may be greater than that of the pillar region 22 in the first and second fin subregions 20a, 20b by at least height p1.

Figure 3D:
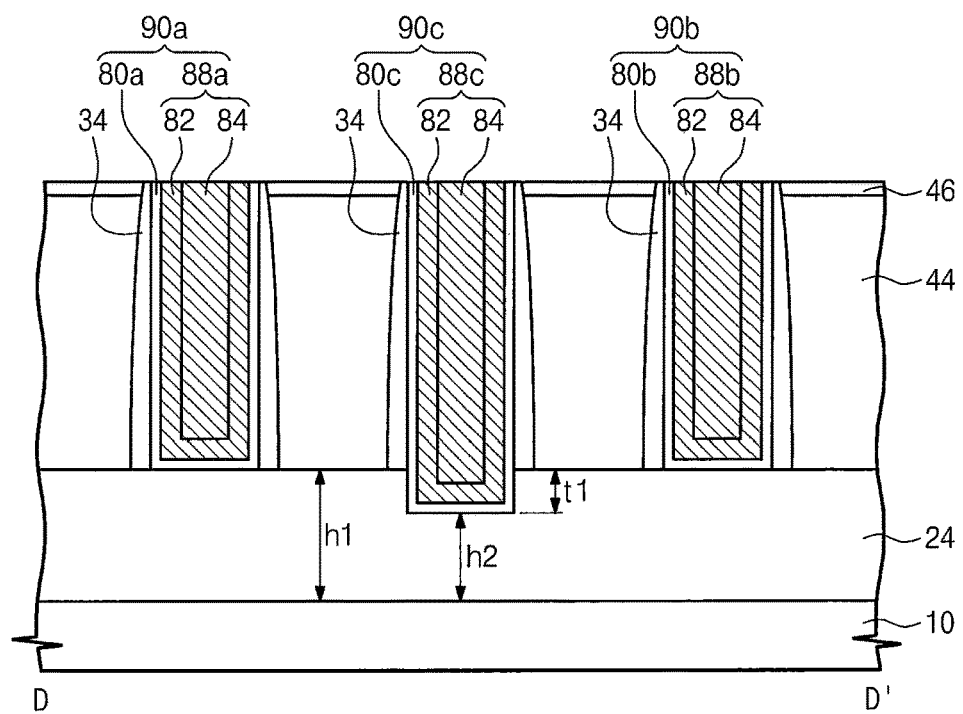

As shown in FIG. 3D, a top surface of a portion of the first isolation insulating layer 24 that is in contact with the second isolation insulating layer 60 in the second direction Y may be lower than the top surfaces of the first isolation insulating layer 24 that are in contact with the first and second fin subregions 20a, 20b. For example, the portion of the first isolation insulating layer 24 that is contact with the second isolation insulating layer 60 in the second direction Y may be recessed by a depth t1 to have a height h2 lower than the height h1 of the portions of the first isolation insulating layer 24 that are in contact with the bottom surfaces of the first and second fin subregions 20a, 20b. In some embodiments, the third gate 90c extends into the recessed portion of the first isolation insulating layer 24. In such embodiments, the height of the third gate 90c may be greater than that of the first gate 90a and/or second gate 90b by at least depth t1.

When the bottom surface of the second isolation insulating layer 60 is lower than the bottom surfaces of the first and second source/drain regions 40a, 40b of the first and second fin subregions 20a, 20b, an improved isolation characteristic may be realized between the first and second source/drain regions 40a, 40b. Thus, the isolation characteristic between the first and second transistors 110 and 120 may be improved by the second isolation insulating layer 60 as well as the punch-through stop layer 54, so the leakage current therebetween may be impeded/prevented.

Figure 4A:
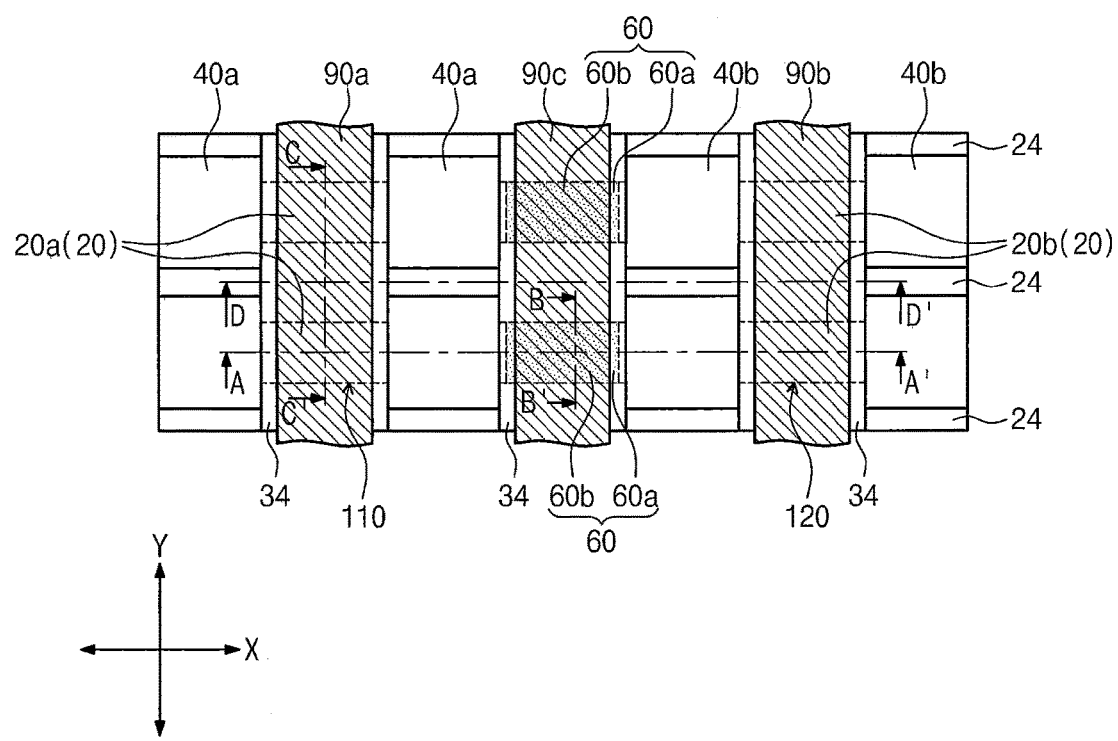
FIG. 4A is a plan view illustrating semiconductor devices according to a third embodiment of the inventive concepts.

FIG. 4A is a plan view illustrating semiconductor devices according to a third embodiment of the inventive concepts. FIGS. 4B to 4E are cross-sectional views taken along lines A-A', B-B', C-C', and D-D' of FIG. 4A, respectively, to illustrate semiconductor devices according to the third embodiment of the inventive concepts. Hereinafter, the descriptions of elements already described above with respect to FIGS. 1 to 3D will be omitted or mentioned only briefly so that differences between the first and second embodiments of the inventive concepts may be highlighted.

Figure 4B:
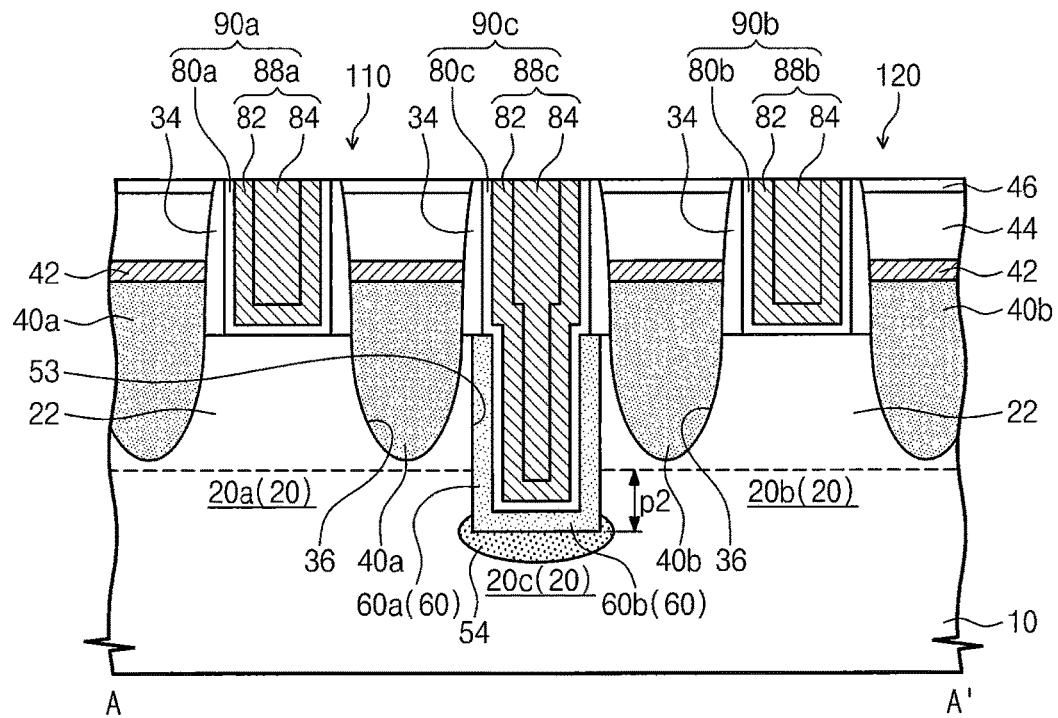
FIGS. 4B to 4E are cross-sectional views taken along lines A-A', B-B', C-C', and D-D' of FIG. 4A, respectively, to illustrate semiconductor devices according to the third embodiment of the inventive concepts.
Figure 4C:
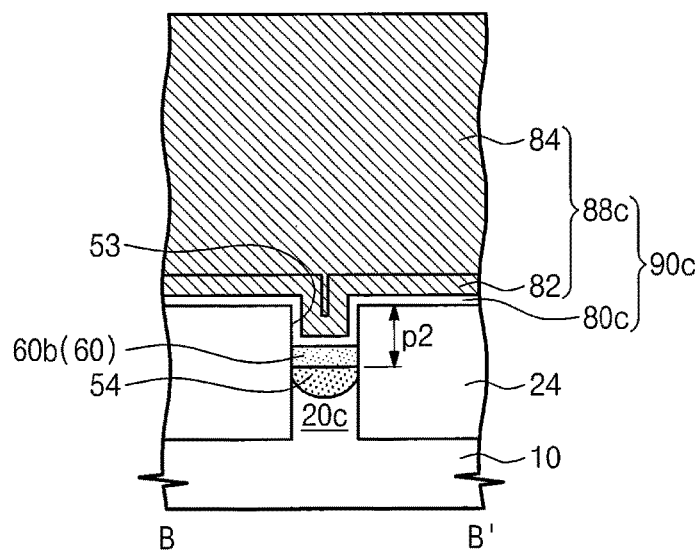
Figure 4D:
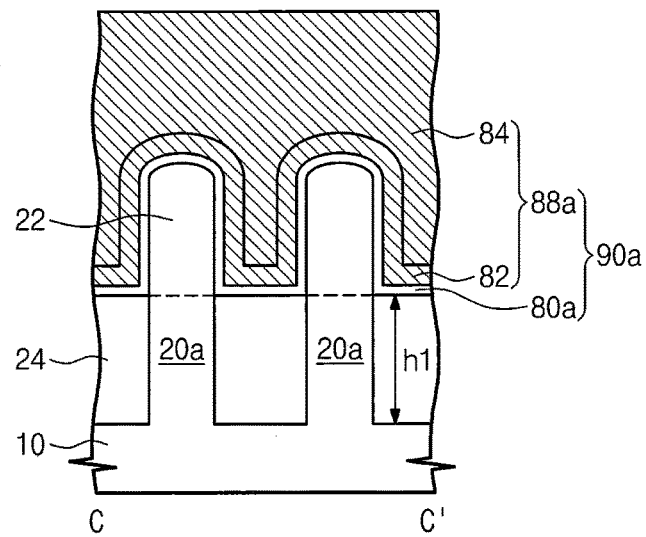

As shown in FIG. 4B, the second isolation insulating layer 60 may have a U-shaped cross section. For example, the second isolation insulating layer 60 may comprise a vertical portion 60a adjacent to the sidewalls of the first and second fin subregions 20a, 20b and a base portion 60b adjacent to the bottom surface of the third gate 90c. The second isolation insulating layer 60 may include a liner-shaped oxide layer that is self-alignedly formed on the top surface of the third fin subregion 20c and the sidewalls of the first and second fin subregions 20a, 20b. For example, the sidewalls of the first and second fin subregions 20a, 20b and the top surface of the third fin subregion 20c may be selectively and self-alignedly oxidized to form the second isolation insulating layer 60. In some embodiments, the second isolation insulating layer 60 is only formed on portions of the sidewalls of the first and second fin subregions 20a, 20b and of the top surface of the third fin subregion 20c that have been exposed by the second recess region 53.

Also as shown in FIG. 4B, the height of the second isolation insulating layer 60 may be greater than the height(s) of the pillar region 22 in the first and second fin subregions 20a, 20b. For example, the top surfaces of the first fin subregion 20a, the second fin subregion 20b, and the second isolation insulating layer 60 may be coplanar or substantially coplanar, whereas the bottom surface of the second isolation insulating layer 60 may be lower than the bottom surface of the pillar region 22 in the first and second fin subregions 20a, 20b by a vertical distance p2 or more. In such embodiments, the height of the second isolation insulating layer 60 may be greater than that of the pillar region 22 in the first and second fin subregions 20a, 20b by at least height p2.

Figure 4E:
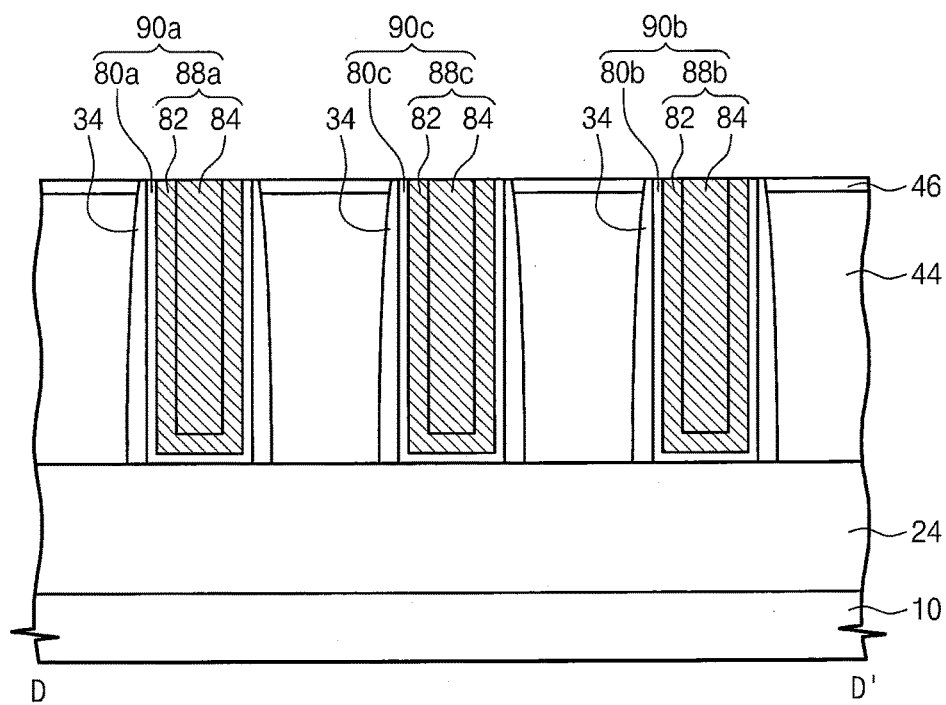

Also as shown in FIG. 4B, the third gate 90c may at least partially fill that portion of the second recess region 53 that is not filled by the second isolation insulating layer 60. For example, the third gate 90c may extend into the second recess region 53 and contact one or more interior surfaces of the second isolation insulating layer 60 (e.g., the interior sidewall(s) of the vertical portion 60a of the second isolation insulating layer 60 and/or the top surface of the base portion 60b of the second isolation insulating layer 60) and may extend in the second direction Y. In such embodiments, the third gate 90c may include a portion disposed between the inner sidewalls of the second isolation insulating layer 60 and another portion disposed between the inner sidewalls of gate spacers 34 disposed on top of the third fin subregion 20c. Accordingly, a bottom surface of the third gate 90c disposed on the second isolation insulating layer 60 may be lower than the uppermost surface of the first isolation insulating layer 24, and the height of the third gate 90c disposed on the second isolation insulating layer 60 may be greater than the heights of the first and second gates 90a, 90b disposed on the first and second fin subregions 20a, 20b. As shown in FIG. 4E, the heights of those portions of the first to third gates 90a, 90b, 90c that are disposed on the first isolation insulating layer 24 may nevertheless be equal or substantially equal.

Figure 5:
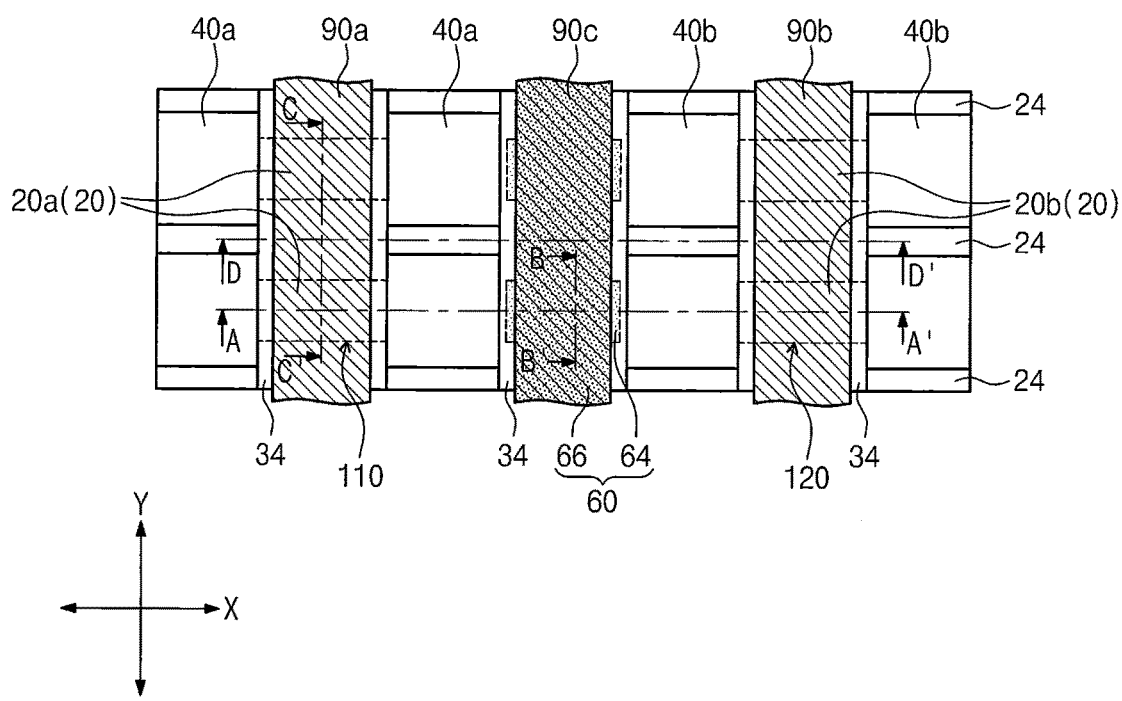
FIG. 5 is a plan view illustrating semiconductor devices according to embodiments of the inventive concepts.

FIG. 5 is a plan view illustrating semiconductor devices according to embodiments of the inventive concepts. FIGS. 6A, 6B, 6C, and 6D are cross-sectional views taken along lines A-N, B-B', C-C', and D-D' of FIG. 5, respectively, to illustrate semiconductor devices according to a fourth embodiment of the inventive concepts. FIGS. 7A, 7B, 7C, and 7D are cross-sectional views taken along lines A-A', B-B', C-C', and D-D' of FIG. 5, respectively, to illustrate semiconductor devices according to a fifth embodiment of the inventive concepts. Hereinafter, the descriptions of elements already described above with respect to FIGS. 1 to 4E will be omitted or mentioned only briefly so that differences between the first and second embodiments of the inventive concepts may be highlighted.

Figure 6A:
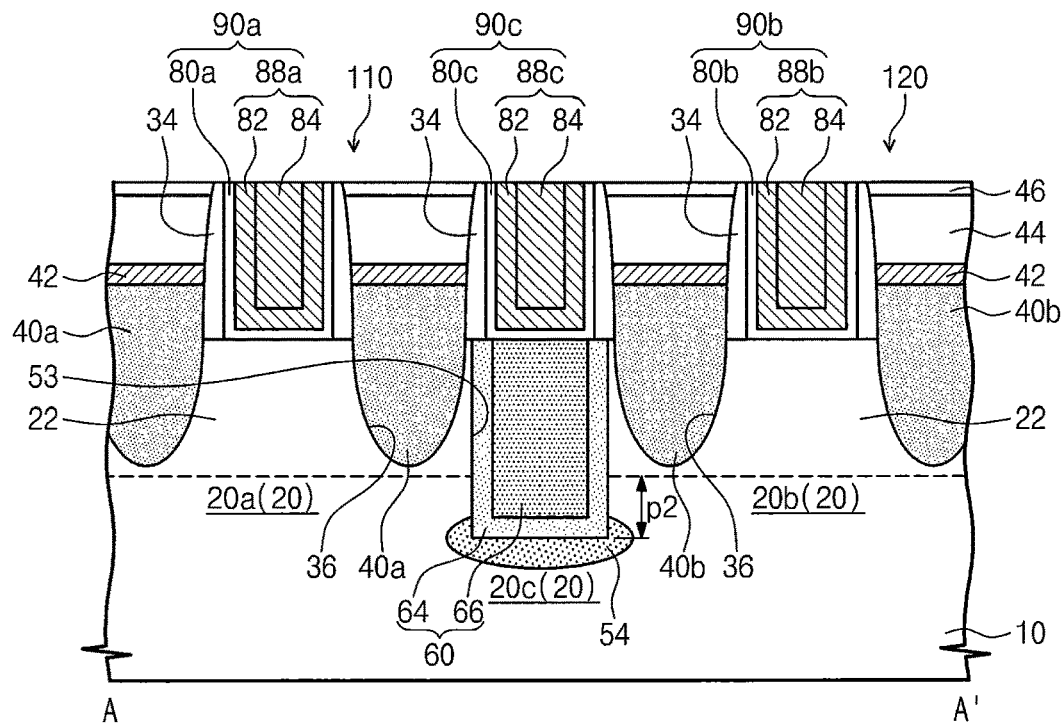
FIGS. 6A to 6D are cross-sectional views taken along lines A-A', B-B', C-C', and D-D' of FIG. 5, respectively, to illustrate semiconductor devices according to a fourth embodiment of the inventive concepts.
Figure 6B:
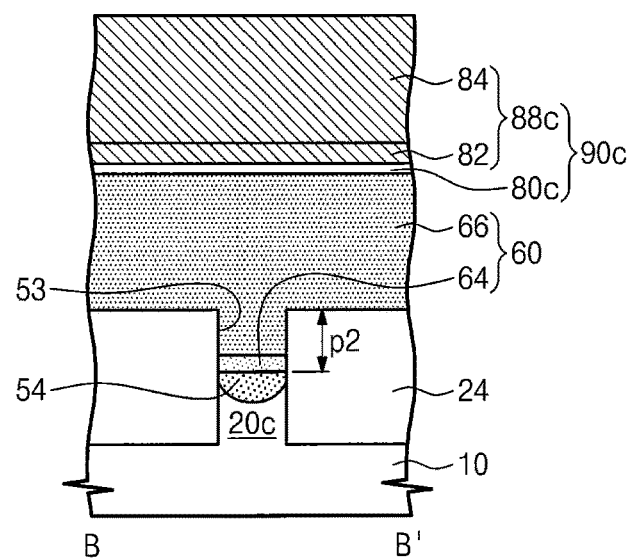
Figure 6C:
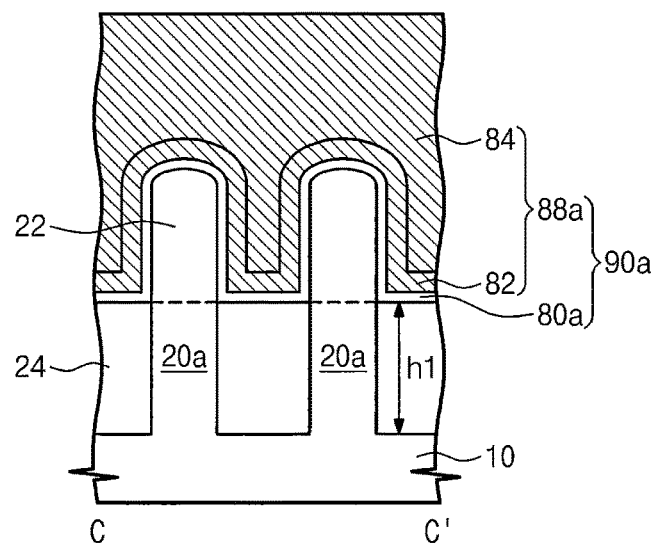
Figure 7A:
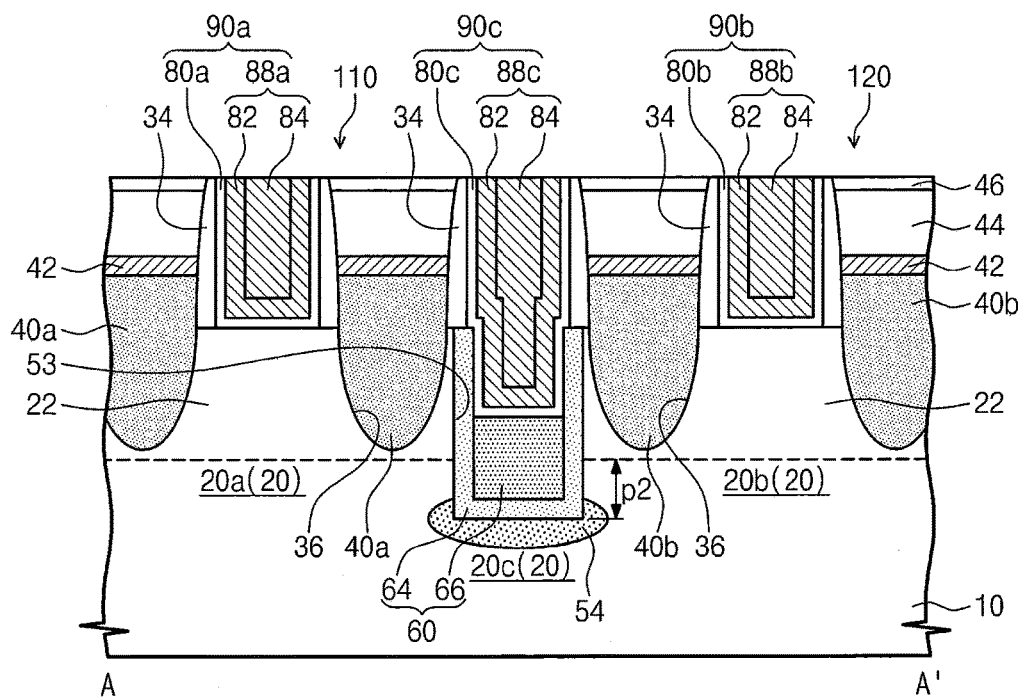
FIGS. 7A to 7D are cross-sectional views taken along lines A-A', B-B', C-C', and D-D' of FIG. 5, respectively, to illustrate semiconductor devices according to a fifth embodiment of the inventive concepts.
Figure 7B:
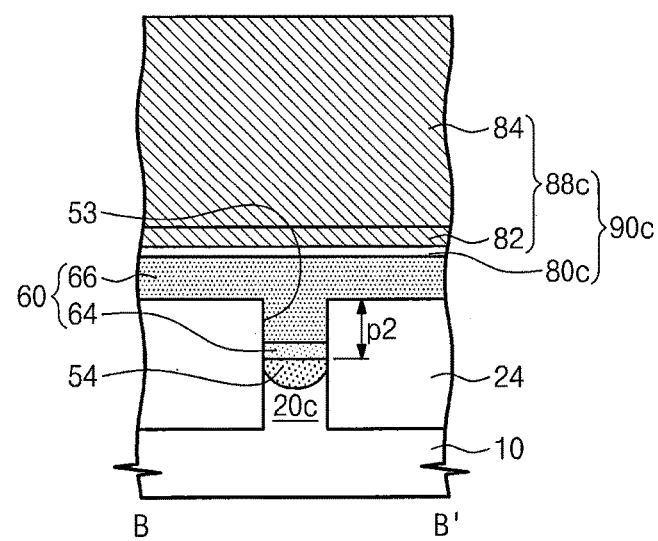
Figure 7C:
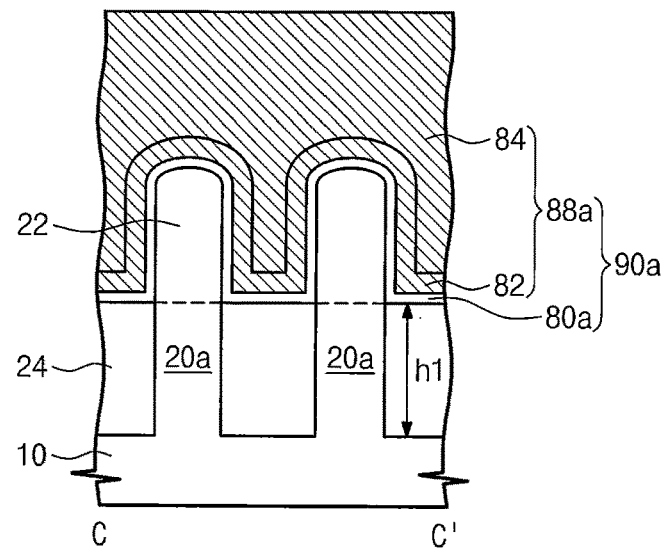

As shown in FIGS. 5, 6A, 6B, 7A and 7B, the second isolation insulating layer 60 may comprise an oxide layer 64 and a filling insulation layer 66. The oxide layer 64 may extend into the second recessed region 53 and may have a U-shaped cross section. The filling insulation layer 66 may be disposed on the oxide layer 64 and may at least partially fill that portion of the second recess region 53 that is not filled by the oxide layer 64. The top surface(s) of the oxide layer 64 and/or filling insulation layer 66 may be coplanar with or substantially coplanar with the top surfaces of the first and second fin subregions 20a, 20b. Alternatively, the top surface(s) of the oxide layer 64 and/or filling insulation layer 66 may be higher than the top surfaces of the first and second fin subregions 20a, 20b. Accordingly, the height of the third gate 90c may be less than the heights of the first and second gates 90a, 90b. Alternatively, as shown in FIG. 7A, the top surface of the filling insulation layer 66 may be lower than the top surfaces of the first and second fin subregions 20a, 20b. Accordingly, the height of the third gate 90c may be greater than the heights of the first and second gates 90a, 90b.

Also as shown in FIGS. 6A and 7A, the height of the second isolation insulating layer 60 may be greater than the height(s) of the pillar region 22 in the first and second fin subregions 20a, 20b. For example, the top surfaces of the first fin subregion 20a, the second fin subregion 20b, and the second isolation insulating layer 60 may be coplanar or substantially coplanar, whereas the bottom surface of the second isolation insulating layer 60 may be lower than the bottom surface of the pillar region 22 in the first and second fin subregions 20a, 20b by a vertical distance p2 or more. In such embodiments, the height of the second isolation insulating layer 60 may be greater than that of the pillar region 22 in the first and second fin subregions 20a, 20b by at least height p2.

Figure 6D:
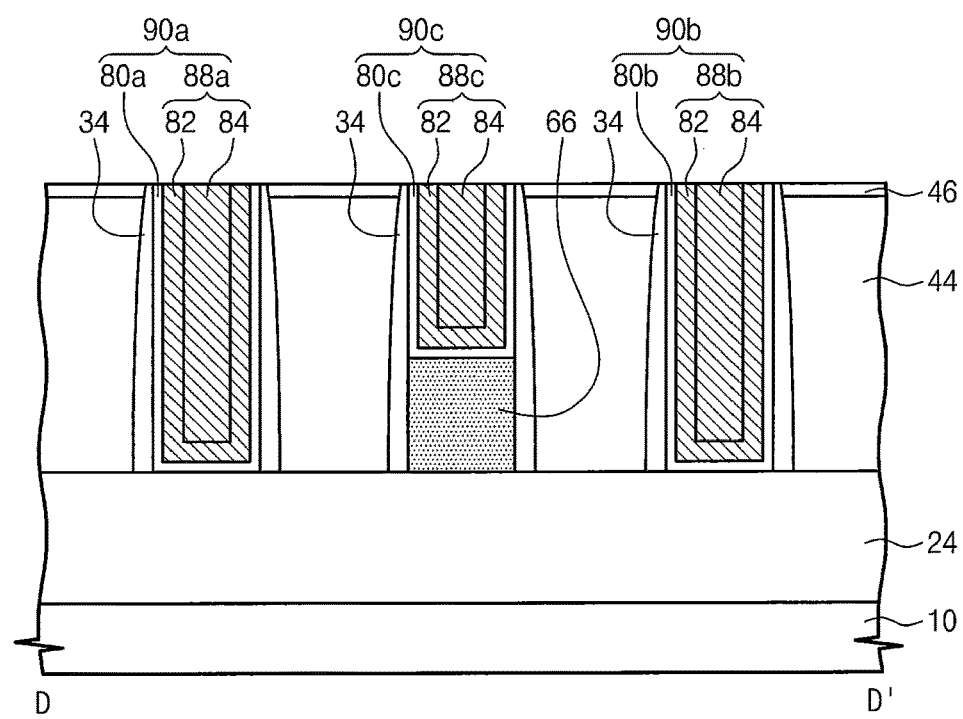
Figure 7D:
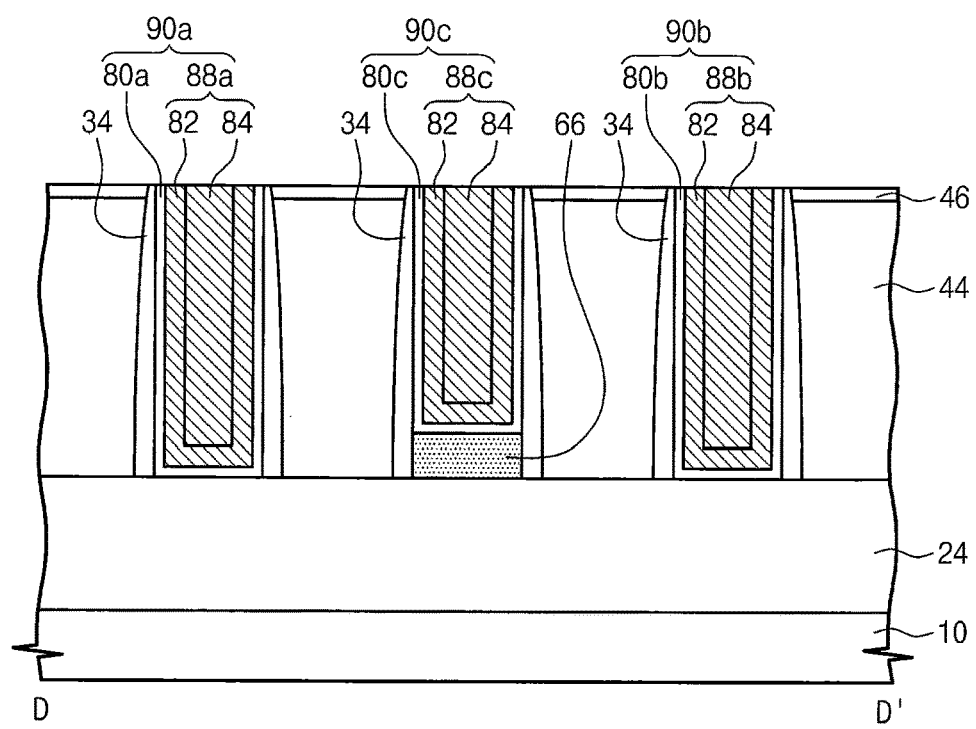

As shown in FIGS. 6D and 7D, the filling insulation layer 66 may extend further in the second direction Y than does the oxide layer 64. Thus, portions of the filling insulation layer 66 may be disposed directly on the first isolation insulating layer 24. The third gate 90c may extend in the second direction Y on the filling insulation layer 66. In some embodiments, the filling insulation layer 66 may comprise discrete isolation insulating islands as described above. In this case, the third gate 90c may cover a top surface and sidewalls of the filling insulation layer 66 and may extend in the second direction Y to intersect or cross the first isolation insulating layer 24.

Figure 8A:
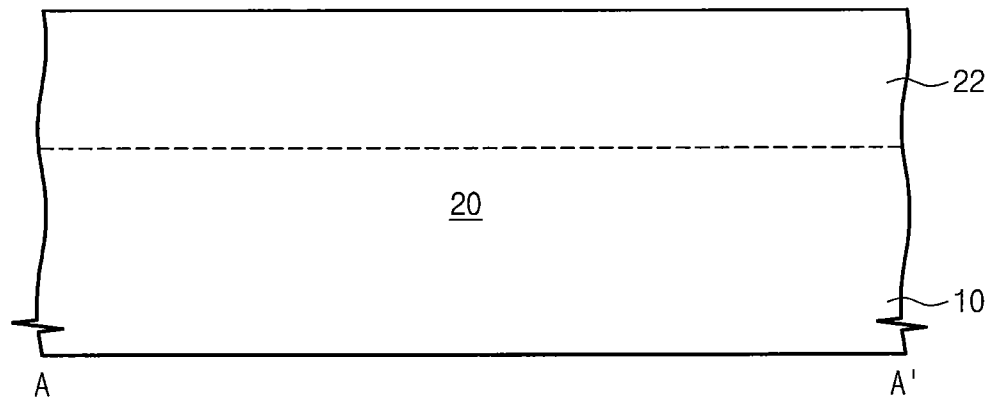
FIGS. 8AA to 8MA are cross-sectional views taken along line A-A' of FIG. 1, which illustrate a method of manufacturing a semiconductor device according to the first embodiment of the inventive concepts.
Figure 8A:
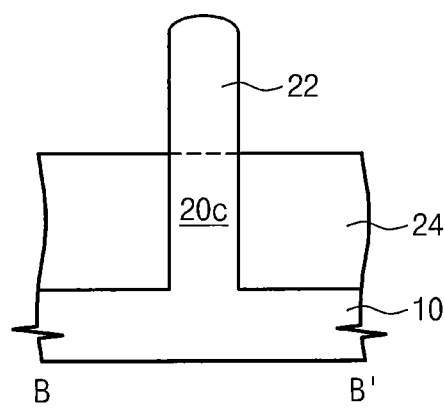
Figure 8A:
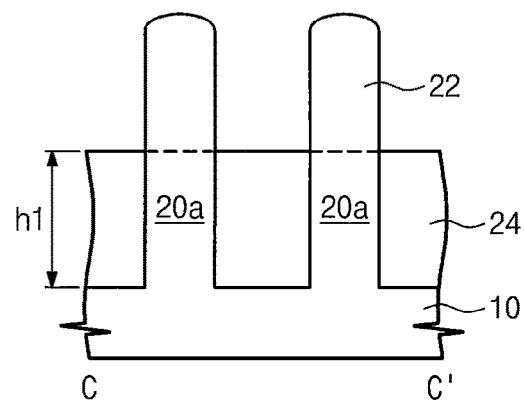
Figure 8A:
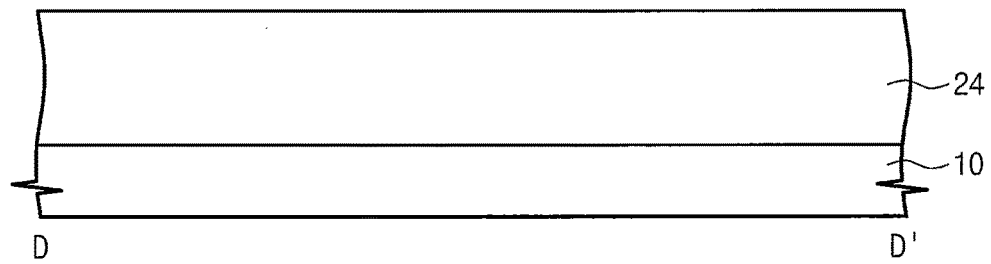

FIGS. 8AA to 14CD are cross-sectional views illustrating processes according to some embodiments of the inventive concepts.

FIGS. 8AA to 8MA, 8AB to 8MB, 8AC to 8MC, and 8AD to 8MD are cross-sectional views taken along lines A-A', B-B', C-C', and D-D' of FIG. 1, respectively, to illustrate processes according to some embodiments of methods of manufacturing semiconductor devices according to the first embodiment of the inventive concepts.

Figure 9A:
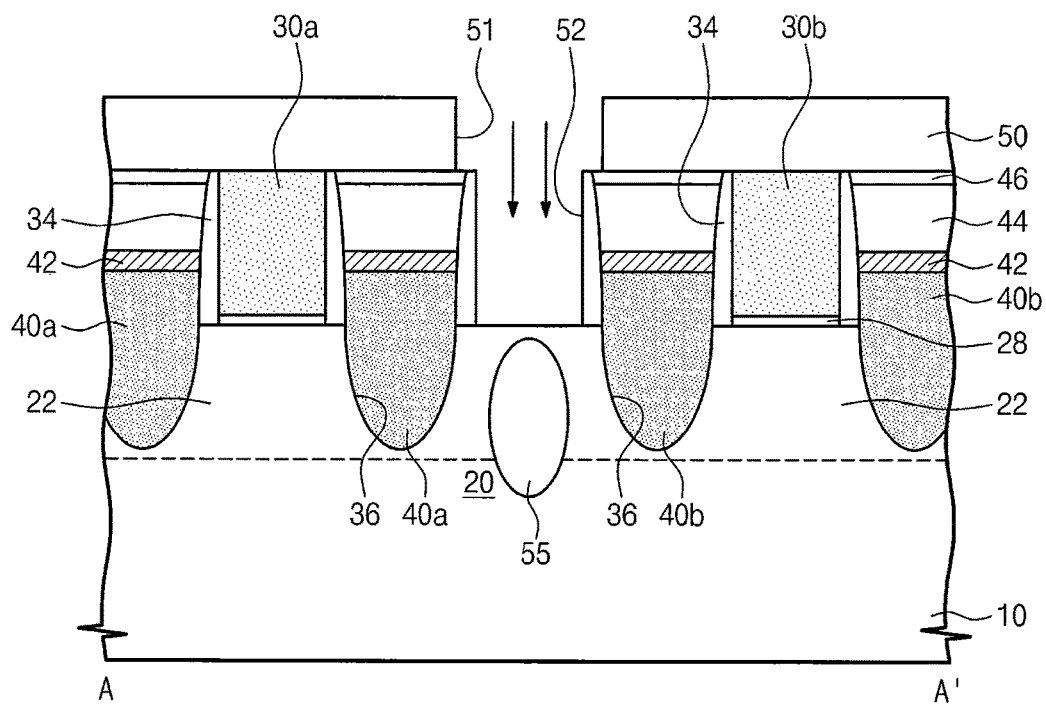
FIGS. 9A to 9D are cross-sectional views respectively taken along lines A-A', B-B', C-C', and D-D' of FIG. 1, respectively, to illustrate a method of manufacturing a semiconductor device according to the first embodiment of the inventive concepts.
Figure 9B:
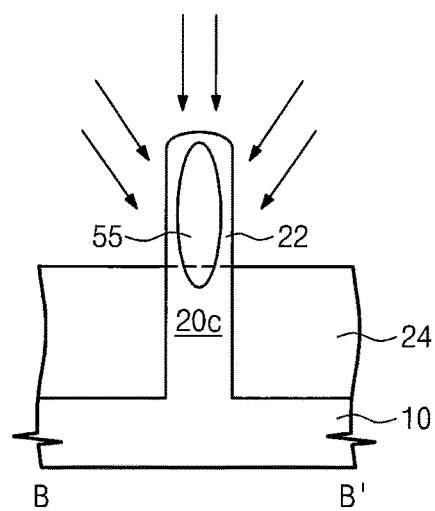
Figure 9C:
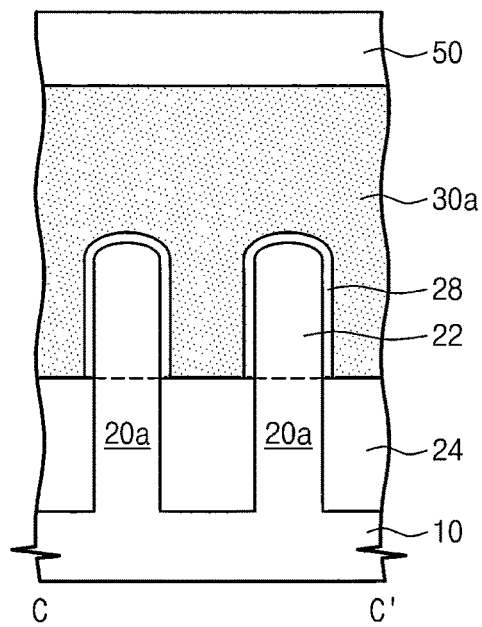
Figure 9D:
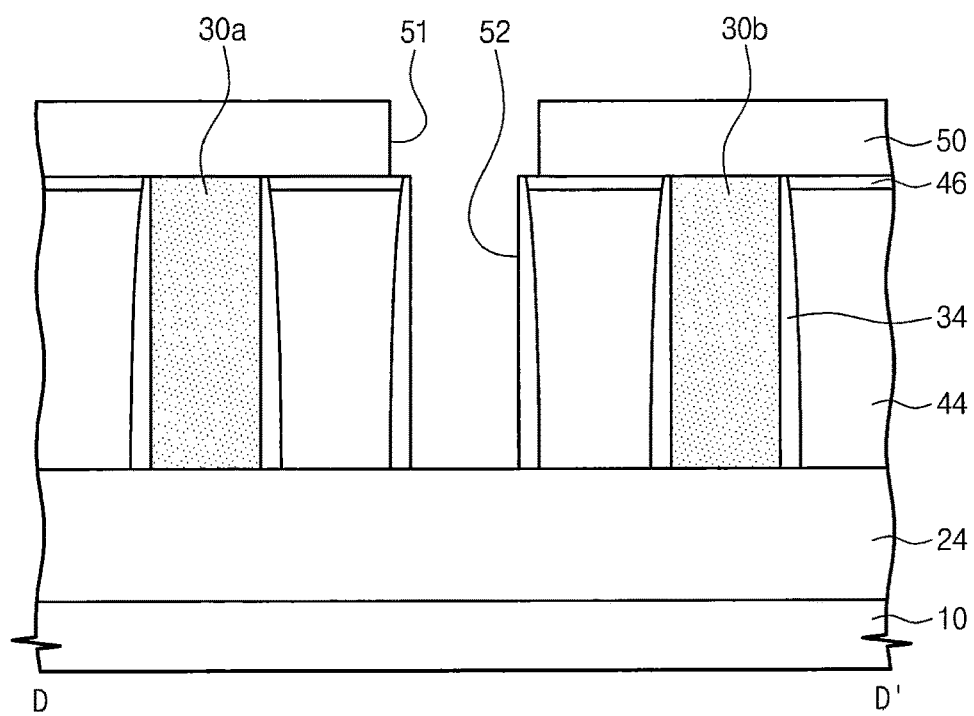

FIGS. 9AA, 9AB, 9AC, and 9AD are cross-sectional views taken along lines A-A', B-B', C-C', and D-D' of FIG. 1, respectively, to illustrate processes according to some embodiments of methods of manufacturing semiconductor devices according to the first embodiment of the inventive concepts.

Figure 10A:
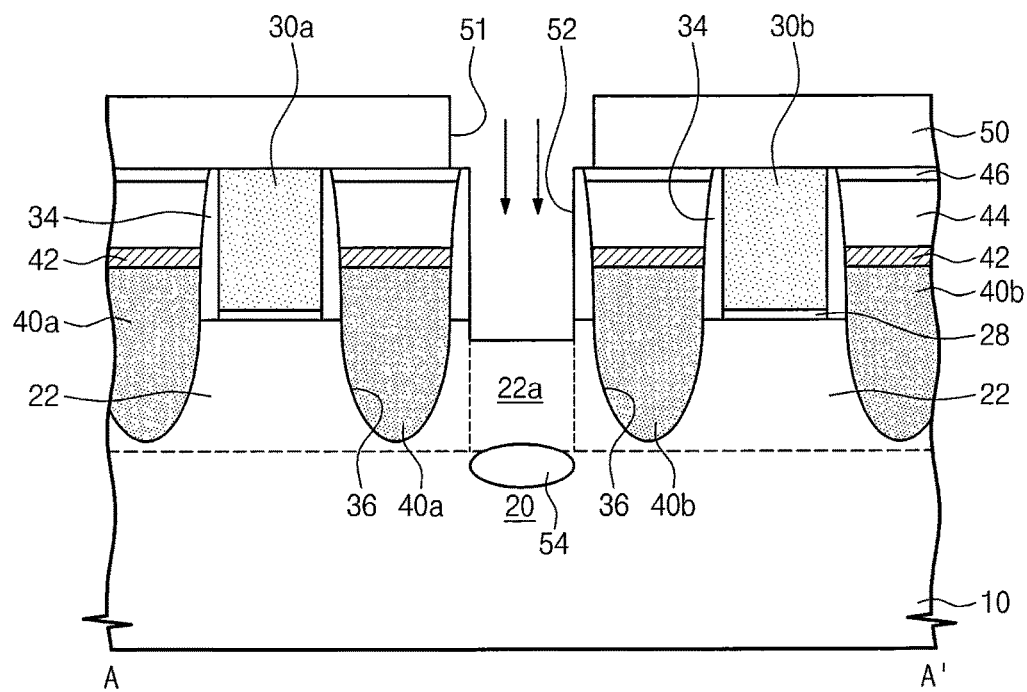
FIGS. 10AA and 10BA are cross-sectional views taken along line A-A' of FIG. 1 to illustrate a method of manufacturing a semiconductor device according to the first embodiment of the inventive concepts.
Figure 10A:
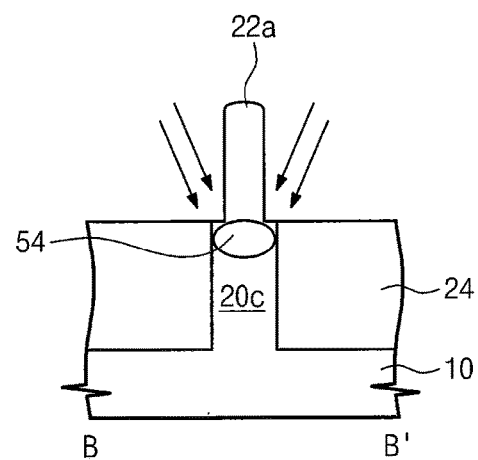
Figure 10A:
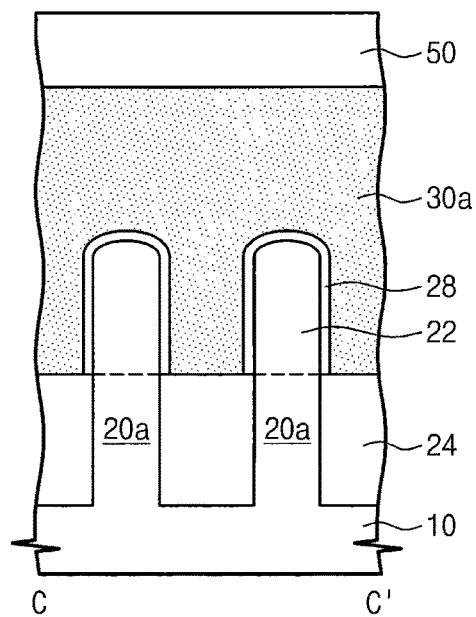
Figure 10A:
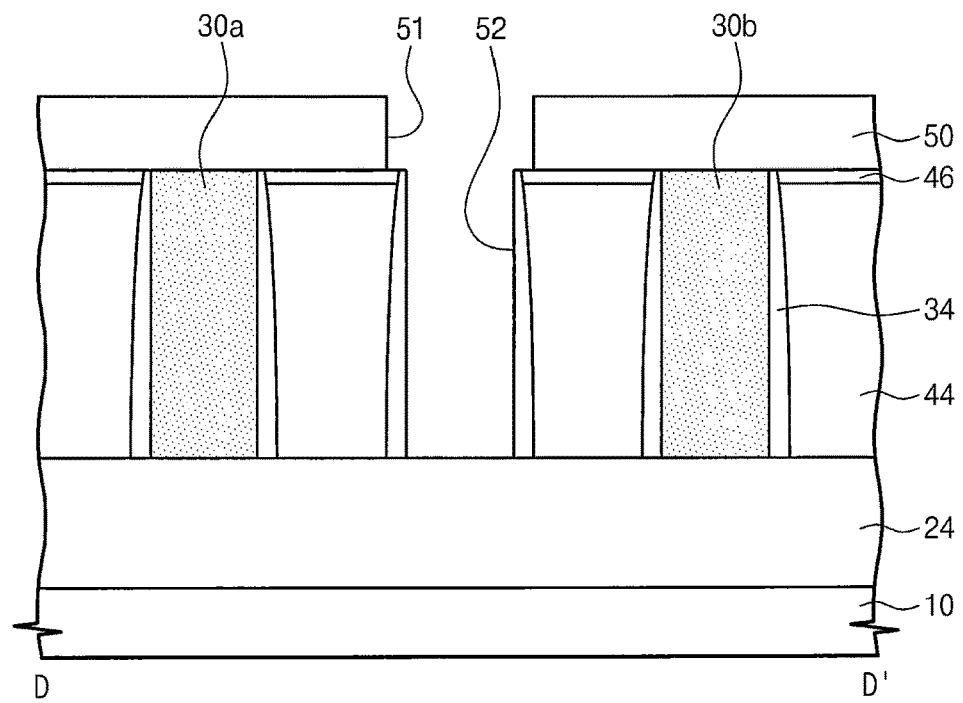

FIGS. 10AA to 10BA, 10AB to 10BB, 10AC to 10BC, and 10AD to 10BD are cross-sectional views taken along lines A-A', B-B', C-C', and D-D' of FIG. 1, respectively, to illustrate processes according to some embodiments of methods of manufacturing semiconductor devices according to the first embodiment of the inventive concepts.

Figure 11A:
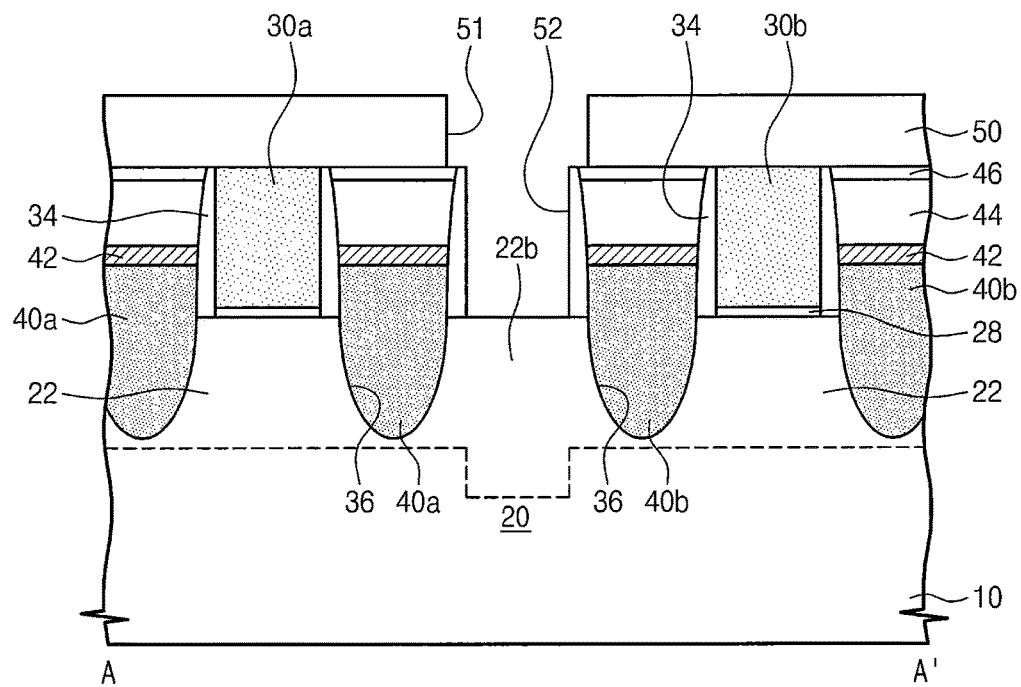
FIGS. 11AA and 11BA are cross-sectional views taken along line A-A' of FIG. 1 to illustrate a method of manufacturing a semiconductor device according to the second embodiment of the inventive concepts.
Figure 11A:
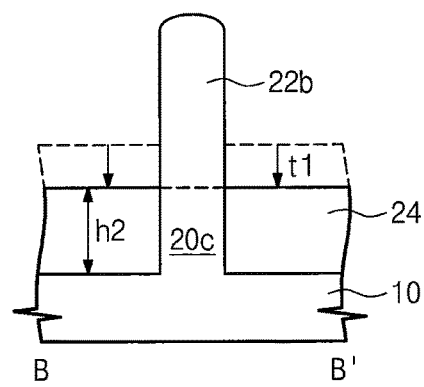
Figure 11A:
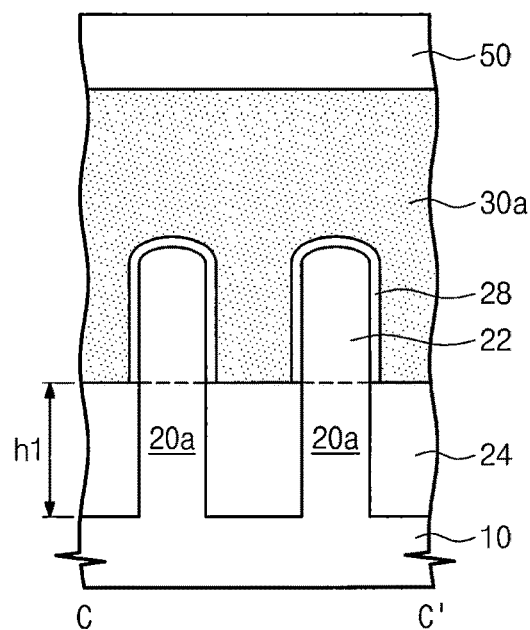
Figure 11A:
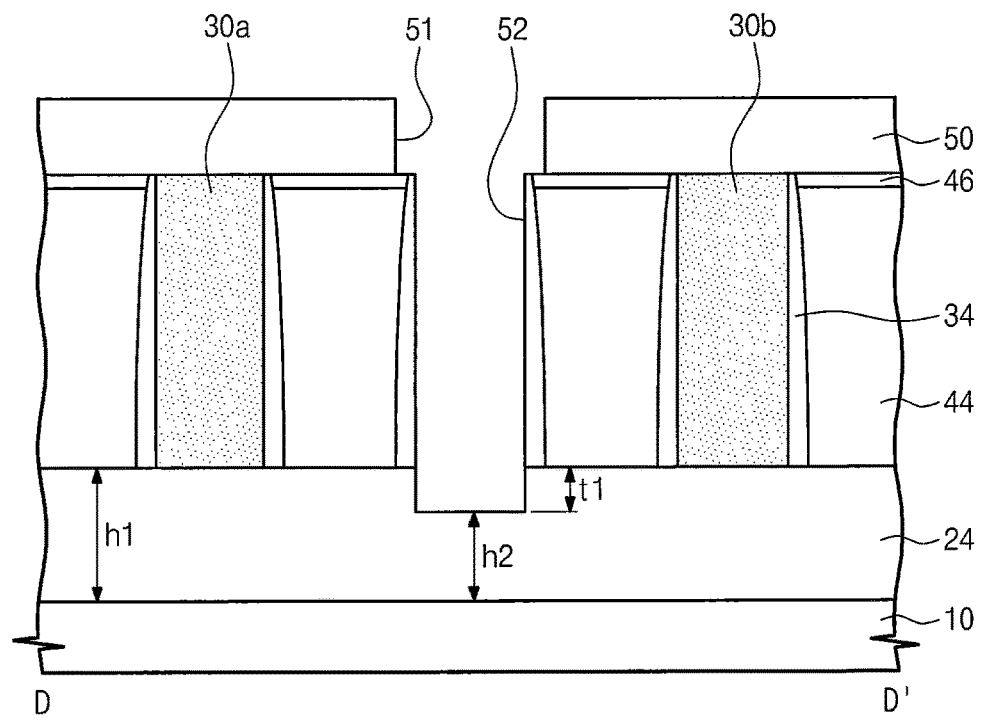

FIGS. 11AA to 1113A, 11AB to 11BB, 11AC to 11BC, and 11AD to 11BD are cross-sectional views taken along lines A-A', B-B', C-C', and D-D' of FIG. 1, respectively, to illustrate processes according to some embodiments of methods of manufacturing semiconductor devices according to the second embodiment of the inventive concepts.

Figure 12A:
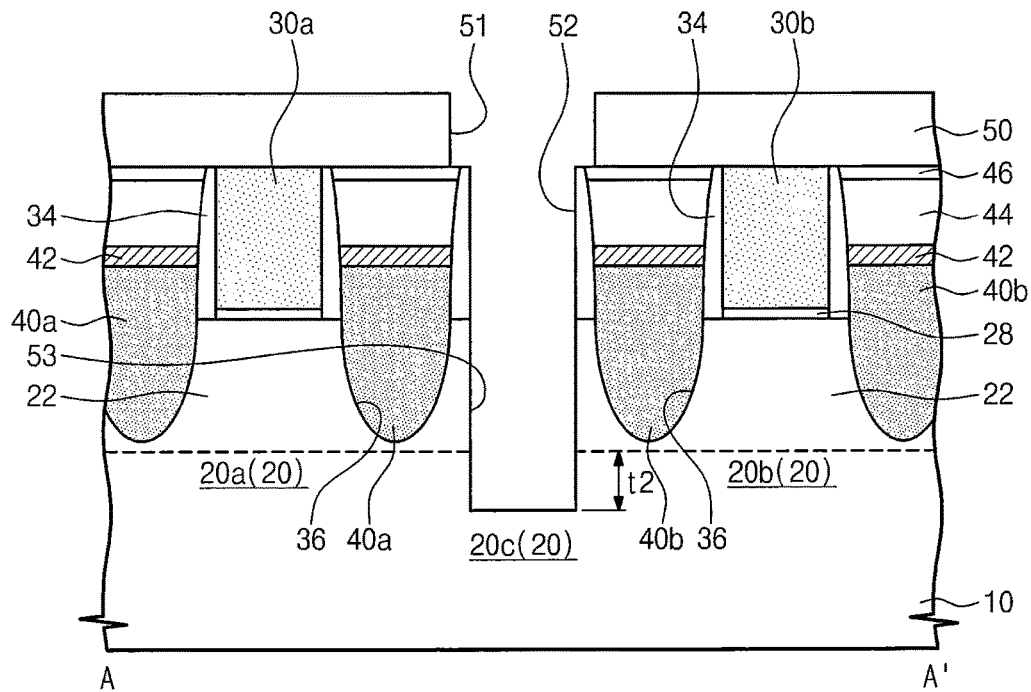
FIGS. 12AA to 12DA are cross-sectional views taken along line A-A' of FIG. 4A to illustrate a method of manufacturing a semiconductor device according to the third embodiment of the inventive concepts.
Figure 12A:
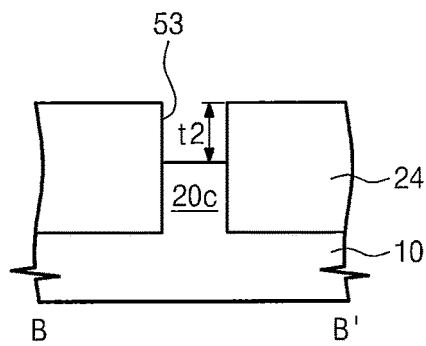
Figure 12A:
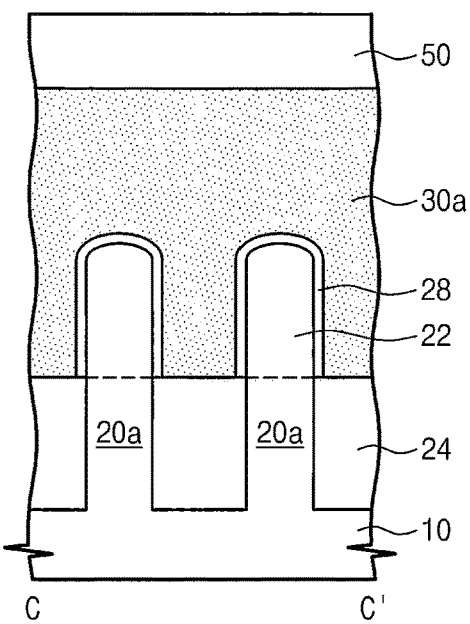
Figure 12A:
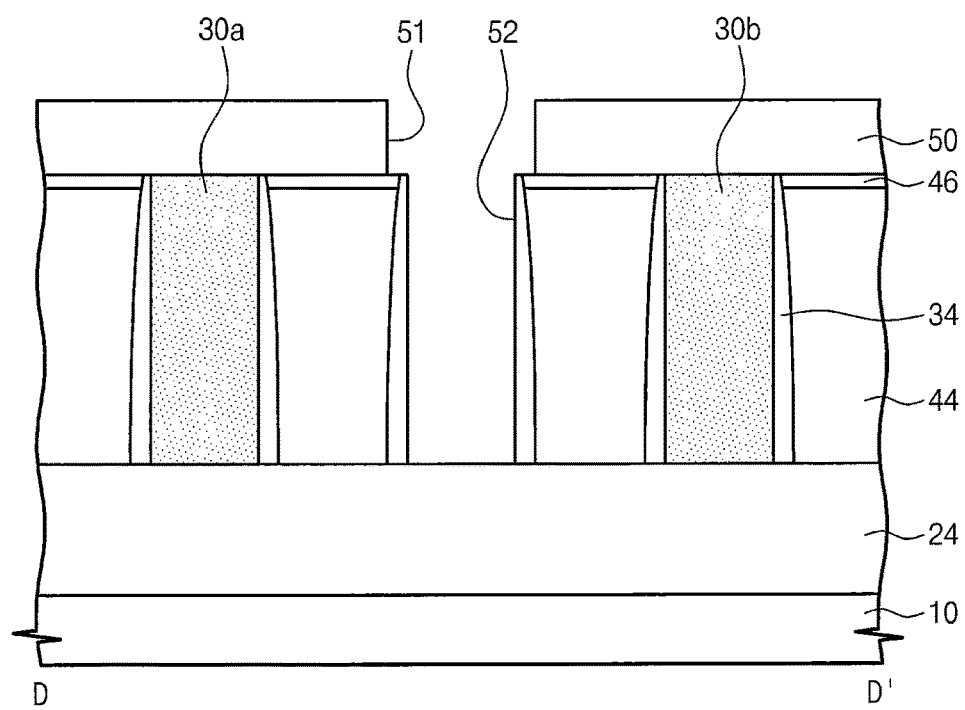

FIGS. 12AA to 12DA, 12AB to 12DB, 12AC to 12DC, and 12AD to 12DD are cross-sectional views taken along lines A-A', B-B', C-C', and D-D' of FIG. 4A, respectively, to illustrate processes according to some embodiments of methods of manufacturing semiconductor devices according to the third embodiment of the inventive concepts.

Figure 13A:
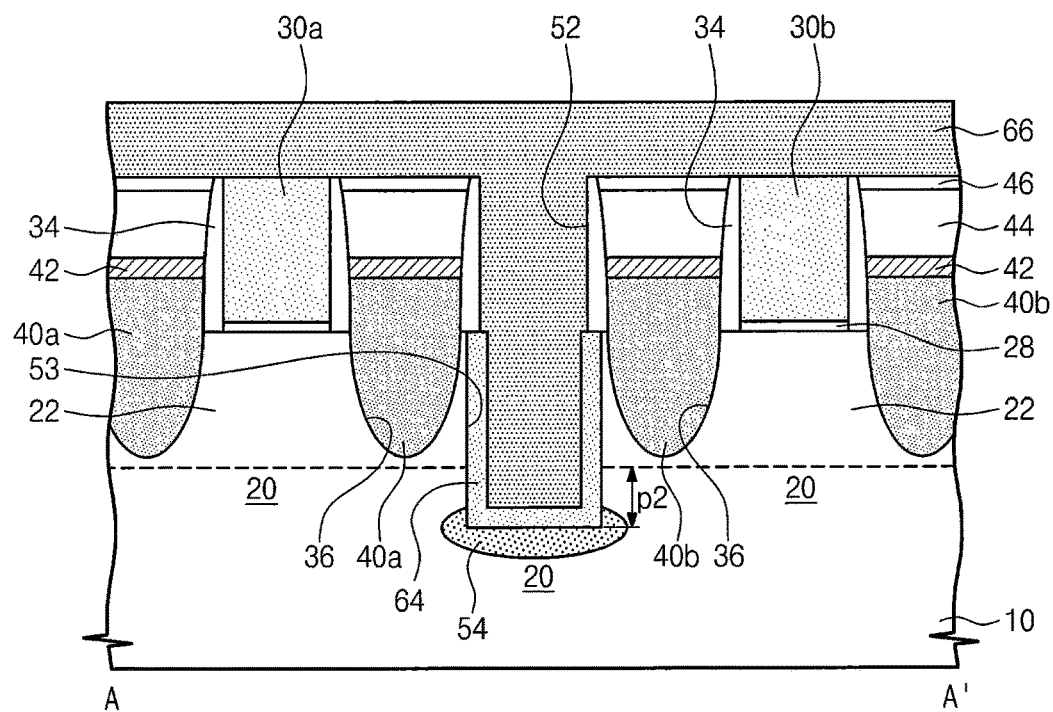
FIGS. 13AA to 13DA are cross-sectional views taken along line A-A' of FIG. 5 to illustrate a method of manufacturing a semiconductor device according to the fourth embodiment of the inventive concepts.
Figure 13A:
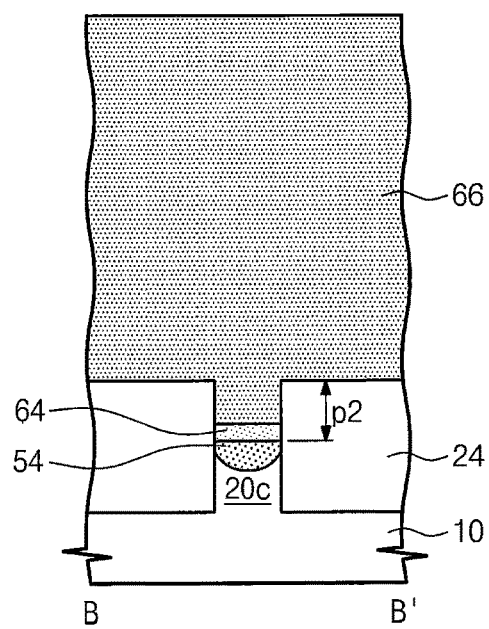
Figure 13A:
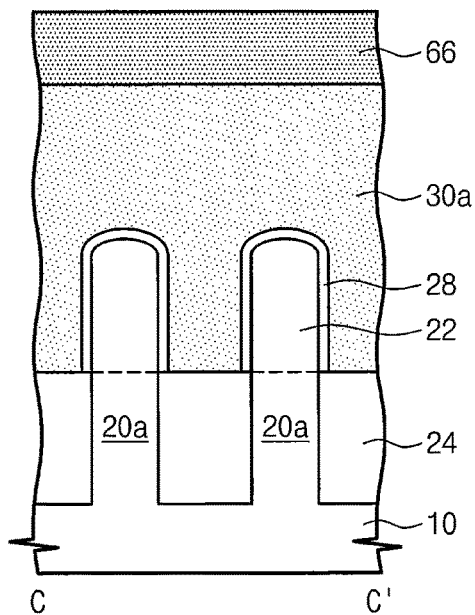
Figure 13A:
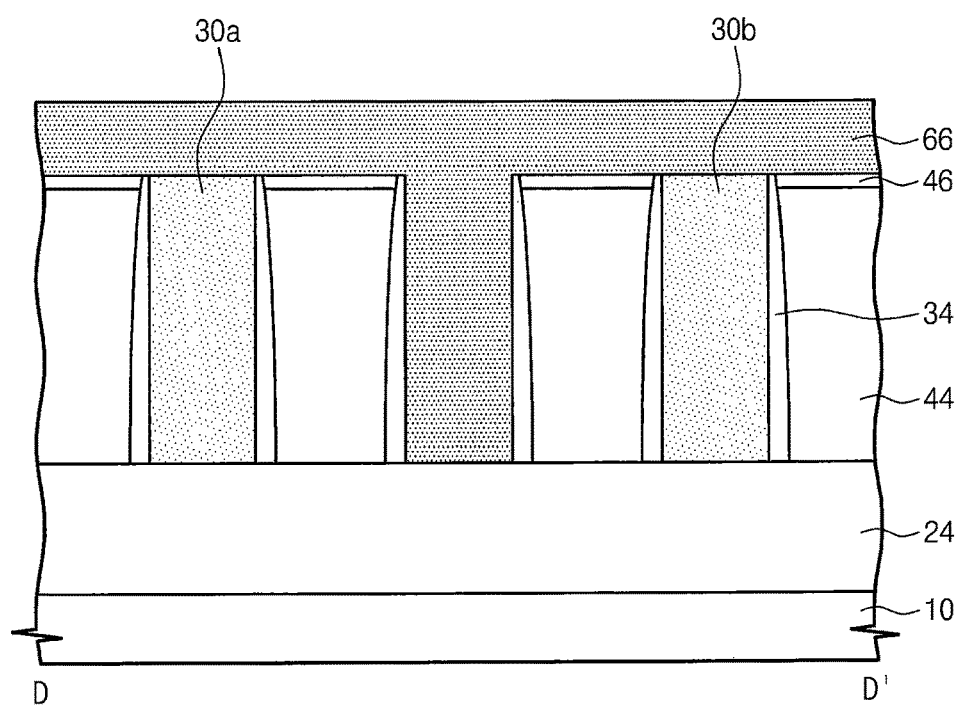

FIGS. 13AA to 13DA, 13AB to 13DB, 13AC to 13DC, and 13AD to 13DD are cross-sectional views taken along lines A-A', B-B', C-C', and D-D' of FIG. 5, respectively, to illustrate processes according to some embodiments of methods of manufacturing semiconductor devices according to the fourth embodiment of the inventive concepts.

Figure 14A:
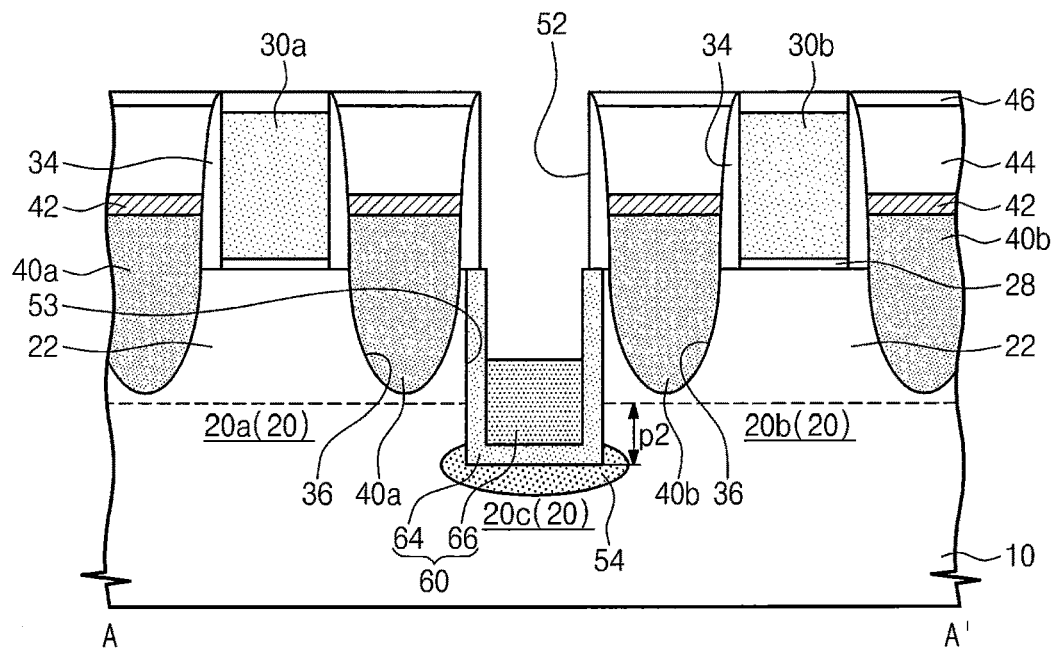
FIGS. 14AA to 14CA are cross-sectional views taken along line A-A of FIG. 5 to illustrate a method of manufacturing a semiconductor device according to the fifth embodiment of the inventive concepts.
Figure 14A:
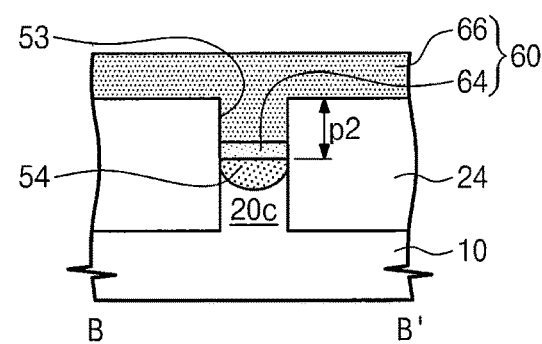
Figure 14A:
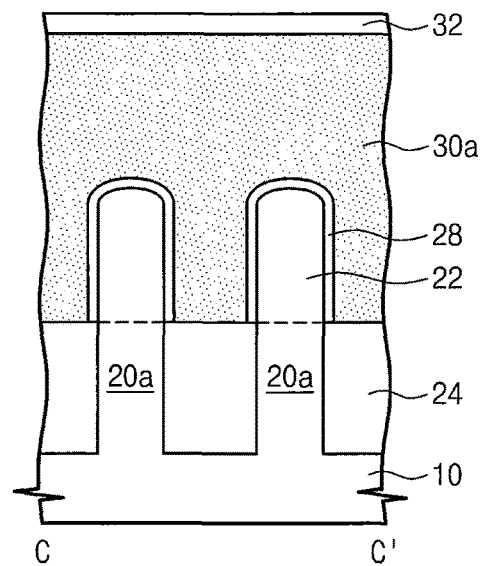
Figure 14A:
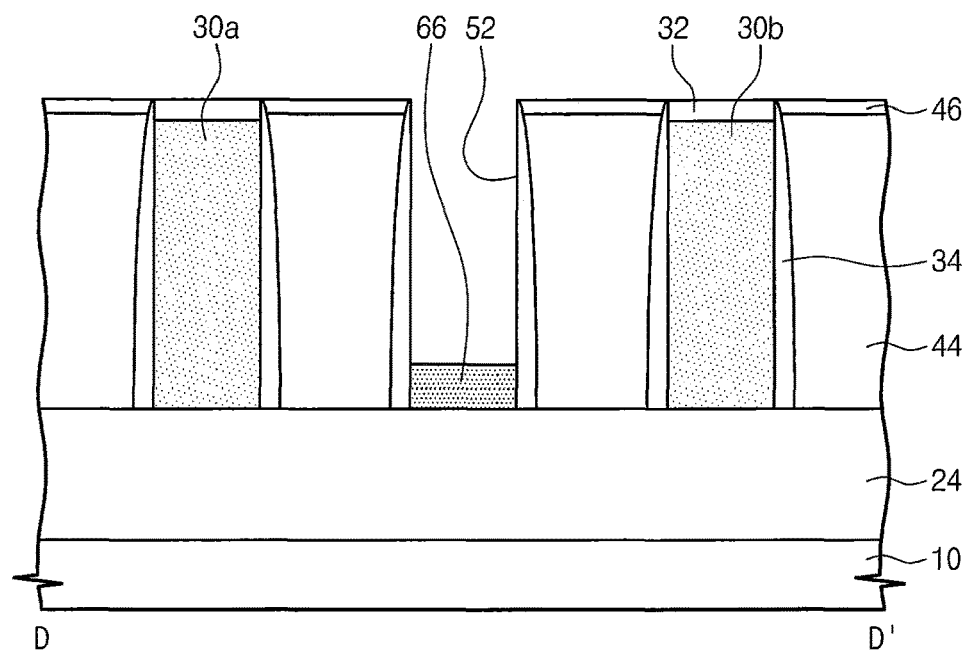

FIGS. 14AA to 14CA, 14AB to 14CB, 14AC to 14CC, and 14AD to 14CD are cross-sectional views taken along lines A-A', B-B', C-C', and D-D' of FIG. 5, respectively, to illustrate processes according to some embodiments of methods of manufacturing semiconductor devices according to the fifth embodiment of the inventive concepts.

As shown in FIGS. 8AA to 8AD, a plurality of fin regions 20 may be formed on the substrate 10.

Fin regions 20 may be formed on any suitable substrate 10. In some embodiments, the substrate 10 is a semiconductor substrate comprising one or more semiconductor materials, such as silicon (Si), germanium (Ge), silicon-germanium (SiGe), gallium-phosphorus (GaP), gallium-arsenic (GaAs), silicon-carbon (SiC), silicon-germanium-carbon (SiGeC), indium-arsenic (InAs), and/or indium-phosphorus (InP).

Fin regions 20 may be formed using any suitable process(es), including, but not limited to, etching and/or epitaxial growth processes. Accordingly, each fin region 20 may comprise a portion of the substrate 10 and/or an epitaxial layer on the substrate 10. In some embodiments, one or more of the fin regions 20 is an active region vertically protruding from the substrate 10.

Each fin region 20 may extend in a first direction X (e.g., an X-axis direction). The fin regions 20 may be separated from each other in a second direction Y (e.g., a Y-axis direction) different from the first direction X.

Although FIGS. 8AA to 8AD show two fin regions 20 isolated from each other in the second direction Y, it is to be understood that the inventive concepts are not limited to such embodiments. In some embodiments, three or more fin regions 20 may be present and isolated from each other.

The first direction X and the second direction Y may intersect each other at any suitable angle. In some embodiments, the first direction X and the second direction Y are perpendicular to each other. It is to be understood, however, that the inventive concepts are not limited to such embodiments.

The first direction X may be parallel to a length direction of one or more of the fin regions 20 (e.g., the length direction of each fin region 20), and the second direction Y may be parallel to a width direction of one or more of the fin regions 20 (e.g., the width direction of each fin region 20).

A first isolation insulating layer 24 may be formed between the fin regions 20 and may extend in the first direction X.

The first isolation insulating layer 24, which has a height h1, may be disposed directly on the substrate 10 and may be in direct contact with the sidewall(s) of one or more of the fin regions 20. In some embodiments, one or more of the fin regions 20 comprises a pillar region 22 that protrudes to a height greater than the height h1 of the first isolation insulating layer 24.

The first isolation insulating layer 24 may comprise any suitable material(s), including, but not limited to, oxide, nitride, oxynitride, and/or a low-k dielectric material.

Figure 8B:
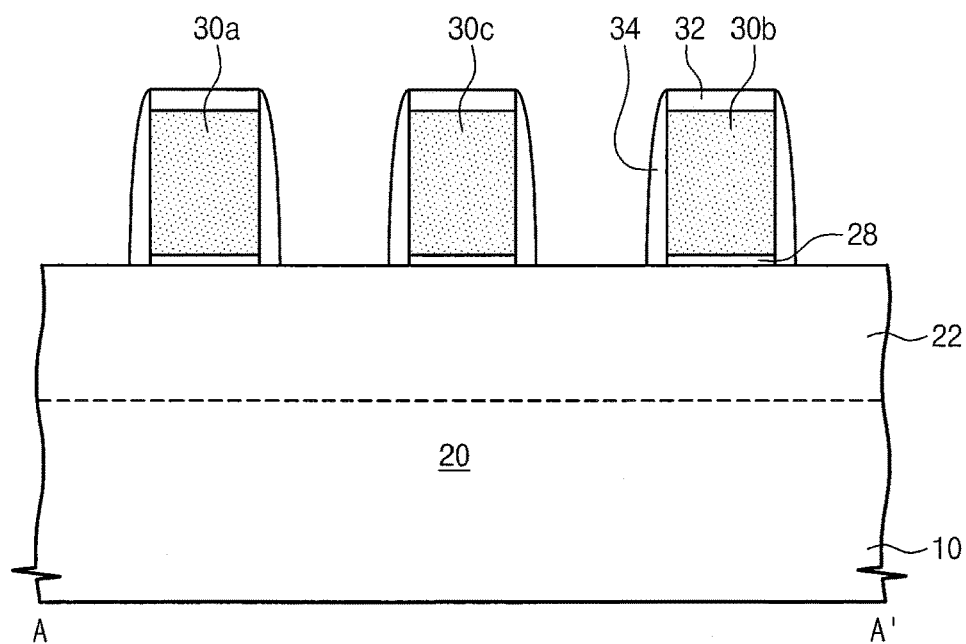
Figure 8B:
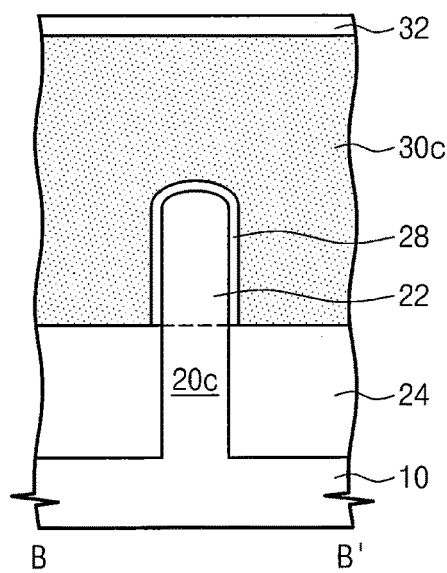
Figure 8B:
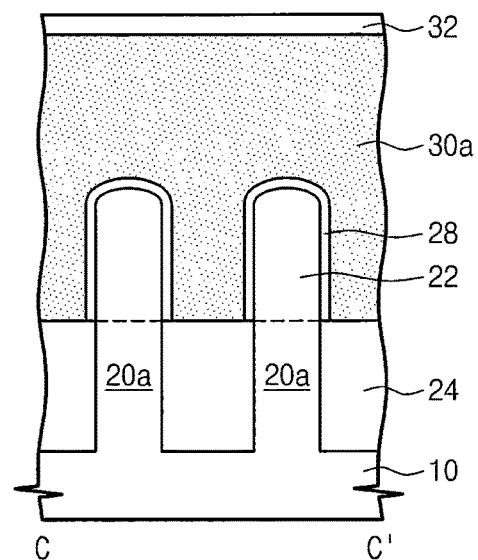
Figure 8B:
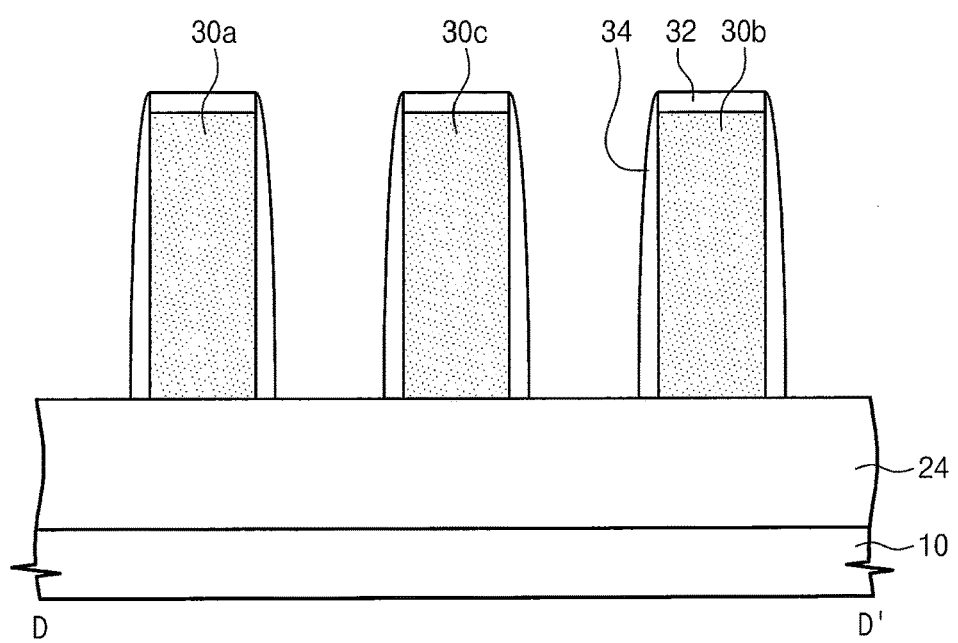

As shown in FIGS. 8BA to 8BD, a plurality of sacrificial gates 30a, 30b, 30c may be formed on the fin regions 20. For example, a first sacrificial gate 30a and a second sacrificial gate 30b may be disposed parallel to each other with a third sacrificial gate 30c therebetween. Each of the sacrificial gates 30a, 30b, 30c may extend in the second direction Y and may cover the top surface and/or sidewalls of each fin region 20. In some embodiments, one or more of the sacrificial gates 30a, 30b, 30c may extend in the second direction Y and may cross the first isolation insulating layer 24.

The sacrificial gates 30a, 30b, 30c may have any suitable dimensions. In some embodiments, the width of the third sacrificial gate 30c may be equal to, substantially equal to or smaller than the width(s) of the first and/or second sacrificial gates 30a, 30b.

Each of the sacrificial gates 30a, 30b, 30c may comprise any suitable material(s), including, but not limited to, polysilicon and/or amorphous silicon.

A sacrificial gate dielectric layer 28 may be formed between each of the sacrificial gates 30a, 30b, 30c and the fin region(s) 20 on which it is disposed. The sacrificial gate dielectric layer 28 may comprise any suitable material(s), including, but not limited to, one or more thermal oxide layers.

A gate capping layer 32 may be formed on a top surface of each of the first to third sacrificial gates 30a, 30b, 30c. The gate capping layer 32 may comprise any suitable material(s), including, but not limited to, silicon nitrides and/or silicon oxynitrides.

Gate spacers 34 may be formed on the sidewalls of each of the gates 30a, 30b, 30c. The gate spacers 34 may extend vertically to cover the sidewalls of the sacrificial gate dielectric layer 28 and/or the gate capping layers 32. The gate spacers 34 may extend in parallel with the sacrificial gates 30a, 30b, 30c in the second direction Y. The gate spacer 34 may comprise any suitable material(s), including, but not limited to, silicon nitride and/or silicon oxynitride.

Figure 8C:
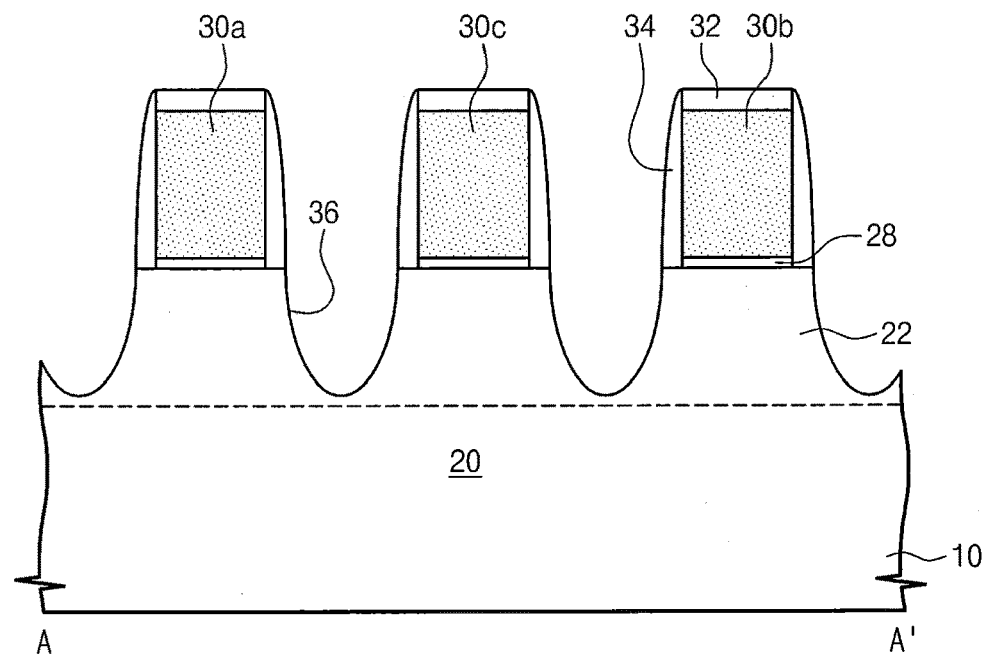
Figure 8C:
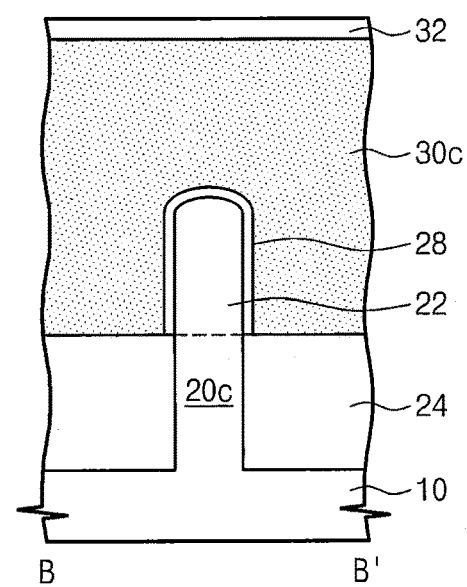
Figure 8C:
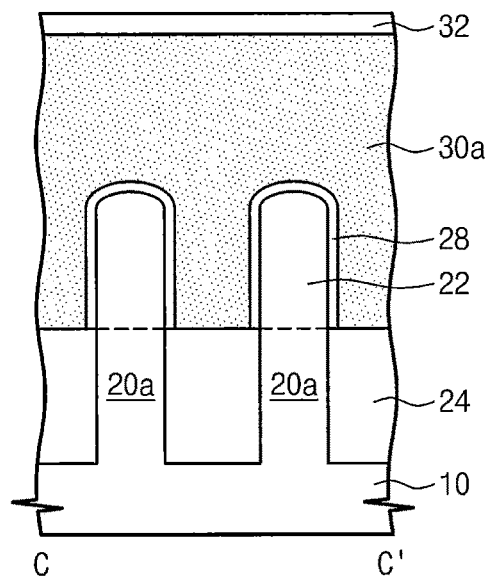
Figure 8C:
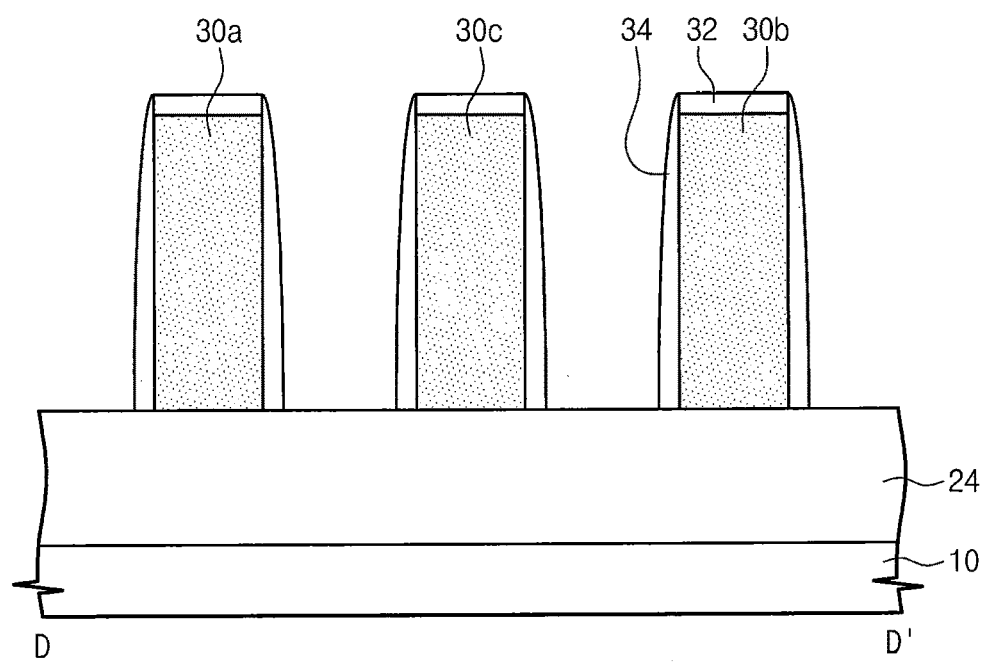

As shown in FIGS. 8CA to 8CD, portions of the fin regions 20 adjacent to the gate spacers 34 may be removed to form first recess regions 36.

The first recess regions 36 may be formed using any suitable process(es), including, but not limited to, dry and/or wet etching processes. In some embodiments, the gate capping layers 32 and the gate spacers 34 are used as an etch mask to form first recess regions 36.

The first recess regions may have any suitable dimensions. Bottom surfaces of the first recess regions 36 may be disposed in the pillar region 22. However, the inventive concepts are not limited thereto. In other embodiments, the bottom surfaces of the first recess regions 36 may be disposed in the fin region 20 lower than a top surface of the first isolation insulating layer 24. Interior sidewalls of the first recess regions 36 may be aligned with exterior sidewalls of the gate spacers 34. In some embodiments, the first recess regions 36 may be enlarged to partially expose bottom surfaces of the gate spacers 34.

Figure 8D:
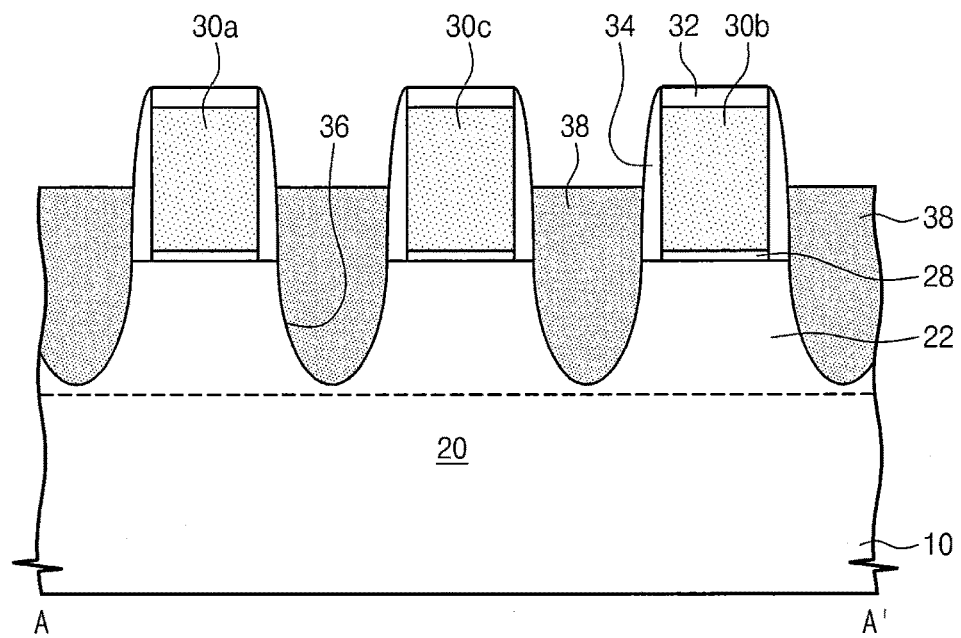
Figure 8D:
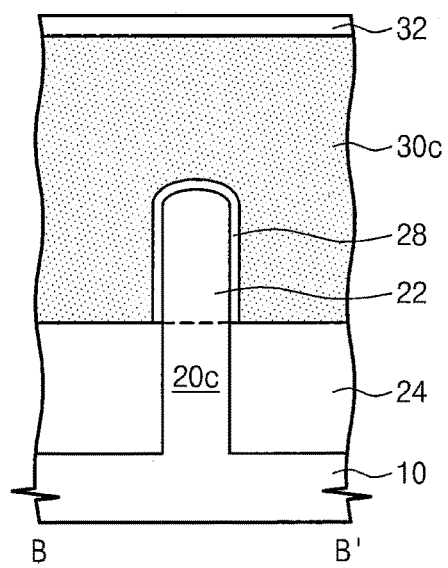
Figure 8D:
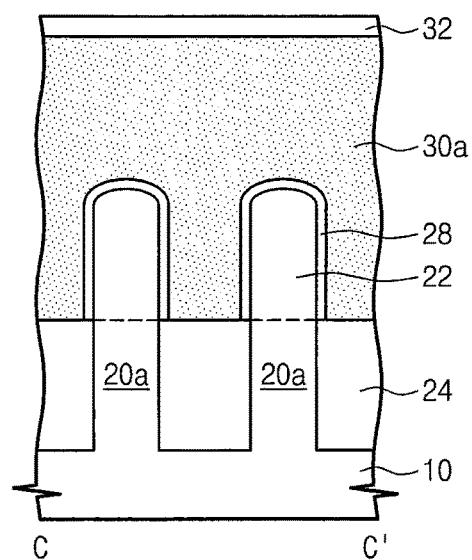
Figure 8D:
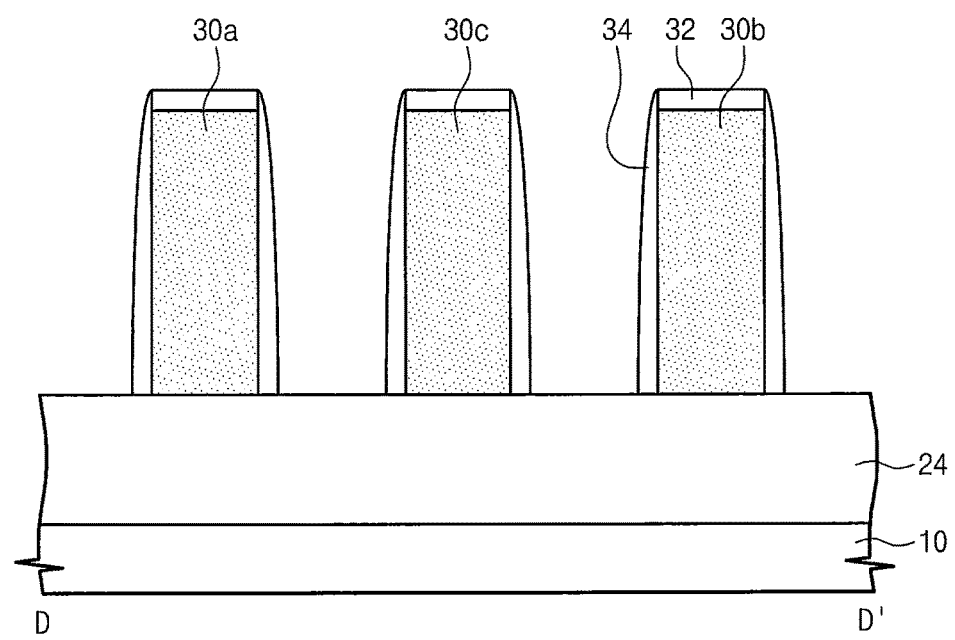

As shown in FIGS. 8DA to 8DD, an epitaxial layer 38 may be formed in each of the first recess regions 36. The epitaxial layer 38 may be formed by selectively epitaxial-growing a semiconductor material. If a PMOS transistor is to be formed, the epitaxial layer 38 may be formed by epitaxial-growing a compressive stress material. The compressive stress material may have a lattice constant greater than that of silicon. For example, silicon-germanium (SiGe) may be epitaxial-grown to form a SiGe epitaxial layer. Alternatively, if an NMOS transistor is to be formed, the epitaxial layer 38 may be formed by epitaxial-growing the same material as the substrate 10 or a tensile stress material. For example, if the substrate 10 comprises Si, Si or SiC may be epitaxially grown to form a Si epitaxial layer or a SiC epitaxial layer having a lattice constant smaller than that of Si. A top surface of the epitaxial layer 38 may be formed to be higher than the top surface of the fin region 20. A cross section of the epitaxial layer 38 may have a polygonal shape, a circular shape, or an elliptical shape.

Figure 8E:
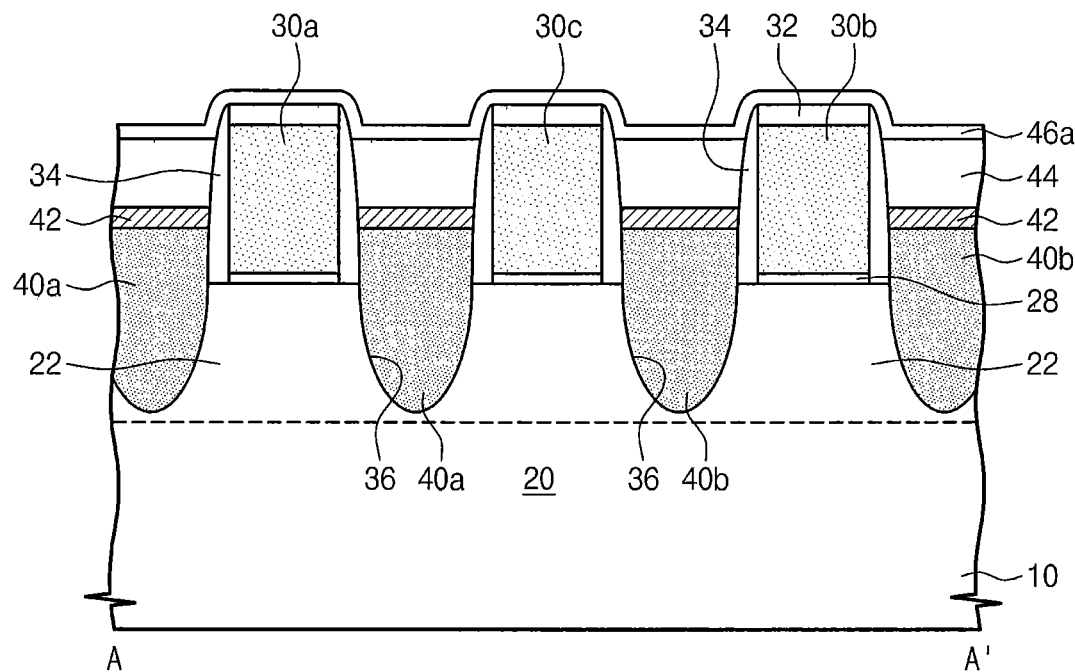
Figure 8E:
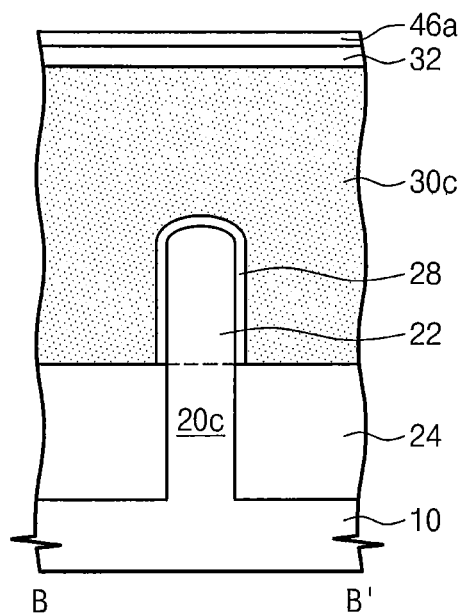
Figure 8E:
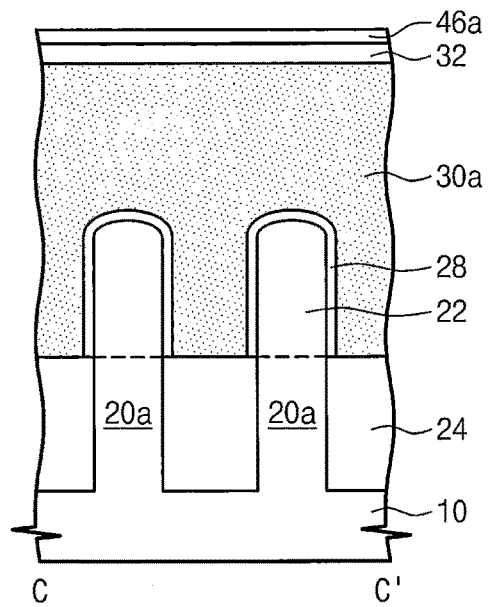
Figure 8E:
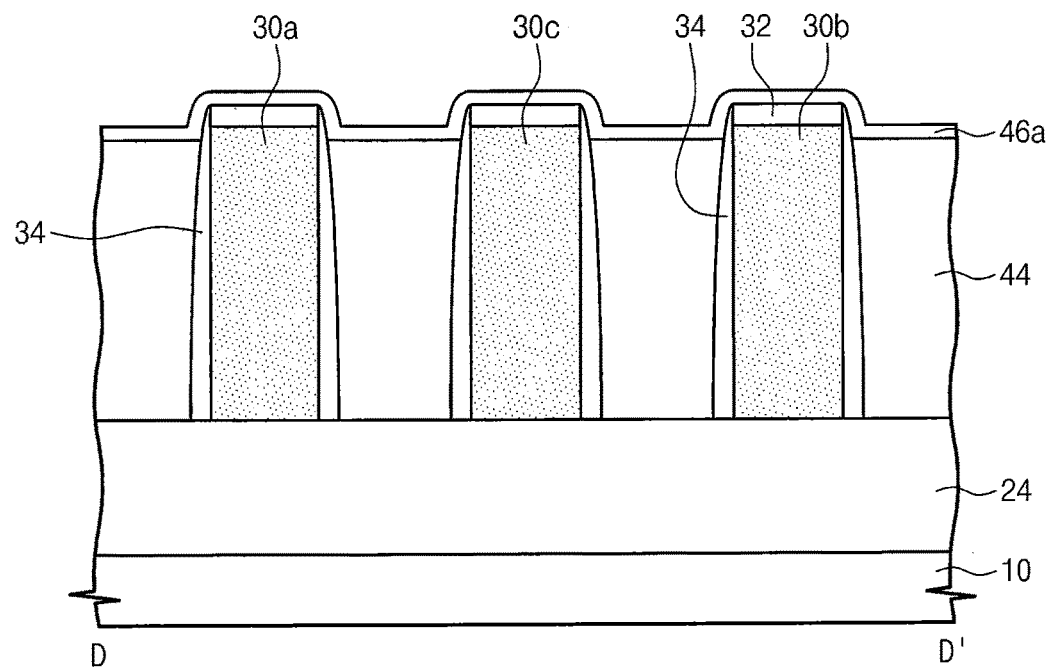

As shown in FIGS. 8EA to 8ED, the epitaxial layers 38 may be doped with dopants to form first and second source/drain regions 40a, 40b. The first source/drain regions 40a may be formed to be adjacent to sidewalls of the first sacrificial gate 30a, and the second source/drain regions 40b may be formed to be adjacent to sidewalls of the second sacrificial gate 30b. In some embodiments, the epitaxial layers 38 may be doped with P-type or N-type dopants in-situ to form the first and second source/drain regions 40a, 40b when the epitaxial layers 38 are formed. In other embodiments, the first and second source/drain regions 40a, 40b may be formed by ion-implanting P-type or N-type dopants into the epitaxial layers 38. Since the first and second drain regions 40a, 40b are formed in the epitaxial layers 38, the first and second drain regions 40a, 40b may have an elevated source/drain structure. In FIG. 8EA, bottom surfaces of the first and second source/drain regions 40a, 40b are disposed in the pillar region 22 higher than the top surface (e.g., a dotted line) of the first isolation insulating layer 24. However, the inventive concepts are not limited thereto. In other embodiments, the bottom surfaces of the first and second source/drain regions 40a, 40b may be disposed in the fin region 20 lower than the top surface (e.g., the dotted line) of the first isolation insulating layer 24. In some embodiments, if the epitaxial layer 38 is not formed, dopants may be injected into the fin regions 20 to form the first and/or second source/drain regions 40a and/or 40b.

The first and second source/drain regions 40a, 40b may be isolated from the first to third sacrificial gates 30a, 30b, 30c by the gate spacers 34. A silicide layer 42 may be formed on each of the first and second source/drain regions 40a, 40b. The silicide layer 42 may include at least one metal of nickel (Ni), cobalt (Co), platinum (Pt), or titanium (Ti). An interlayer insulating layer 44 may be formed on the silicide layers 42. The interlayer insulating layer 44 may include an oxide or a low-k dielectric material. The interlayer insulating layer 44 may include a porous material. The interlayer insulating layer 44 may include an air gap therein. The interlayer insulating layer 44 may be formed using a chemical vapor deposition (CVD) process, an atomic layer deposition (ALD) process, or a spin coating process. The interlayer insulating layer 44 may be formed to cover the gate capping layers 32 and may be then etched by an etch-back process until the gate capping layer 32 and portions of the gate spacers 34 are exposed. The interlayer insulating layer 44 may partially fill a space between the gate spacers 34 opposite to each other. A protection layer 46a may be formed on the interlayer insulating layer 44. The protection layer 46a may be formed to cover the gate capping layer 32 and the gate spacer 34 which are exposed by the interlayer insulating layer 44. For example, the protection layer 46a may include a nitride and/or an oxynitride.

Figure 8F:
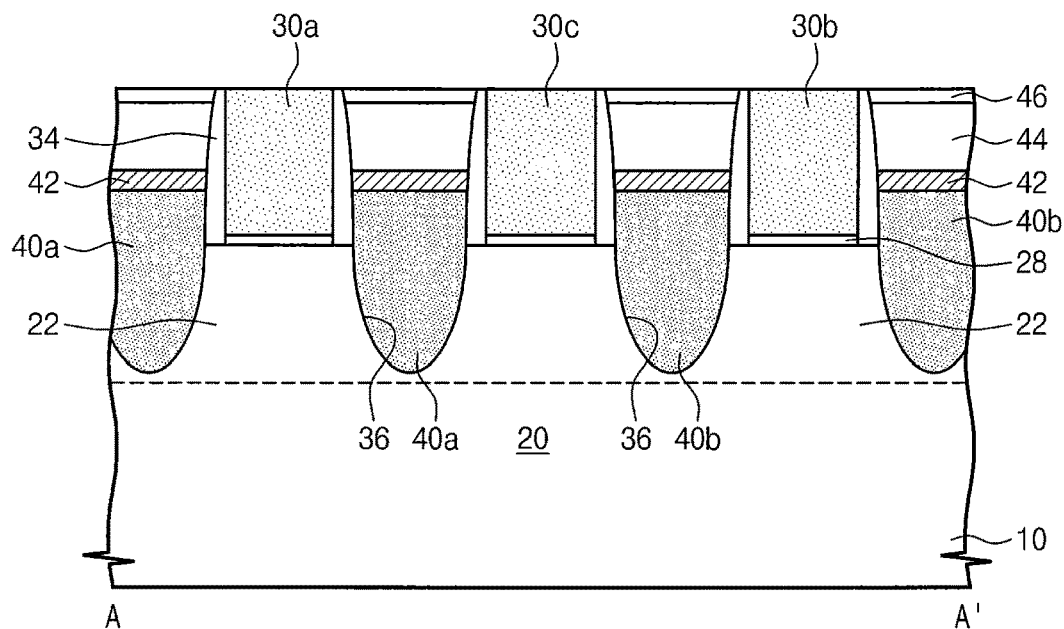
Figure 8F:
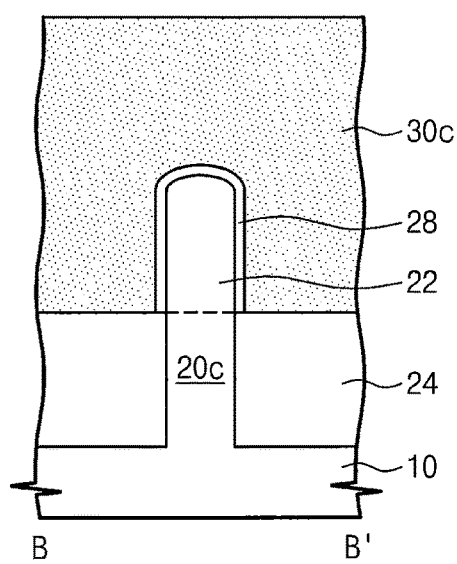
Figure 8F:
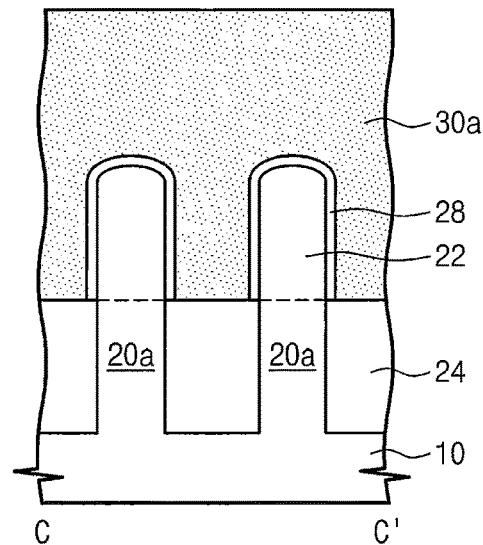
Figure 8F:
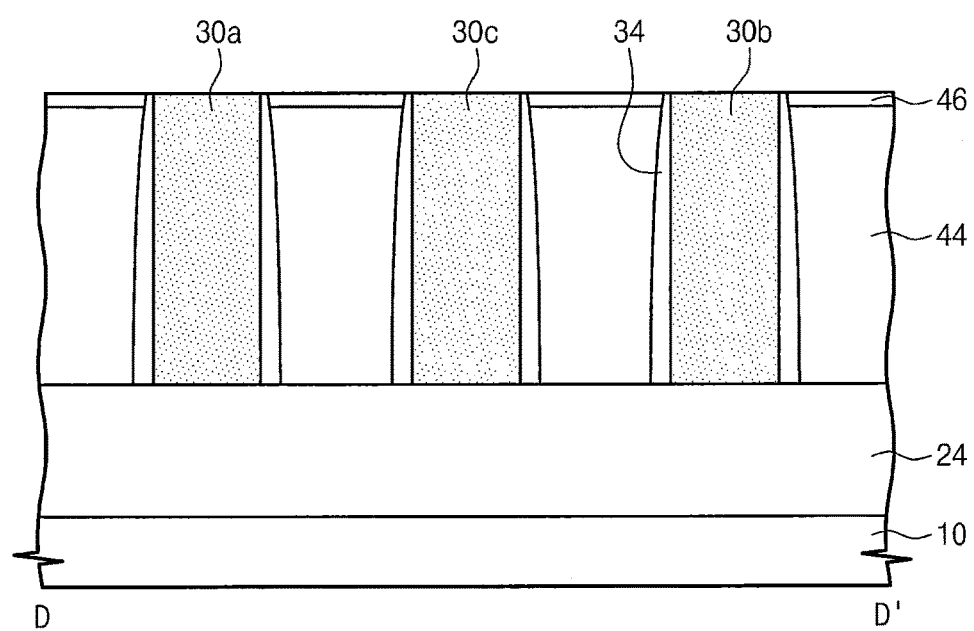

As shown in FIGS. 8FA to 8FD, protection patterns 46 spaced apart from each other may be formed on the interlayer insulating layer 44. For example, the protection layer 46a and the gate capping layer 32 may be planarized by, for example, a chemical mechanical polishing (CMP) process, so the gate capping layer 32 and a portion of the protection layer 46a thereon may be removed. At this time, the gate spacer 34 may be partially removed. As a result, top surfaces of the first to third sacrificial gates 30a, 30b, 30c may be exposed and the protection patterns 46 may be formed on only the interlayer insulating layer 44.

Figure 8G:
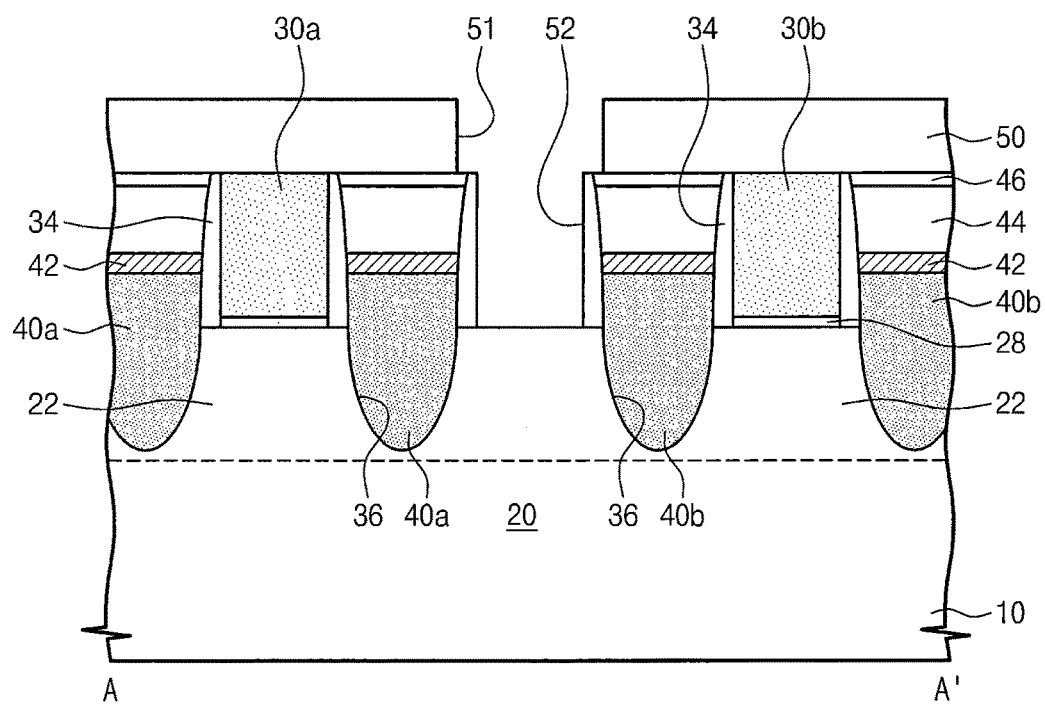
Figure 8G:
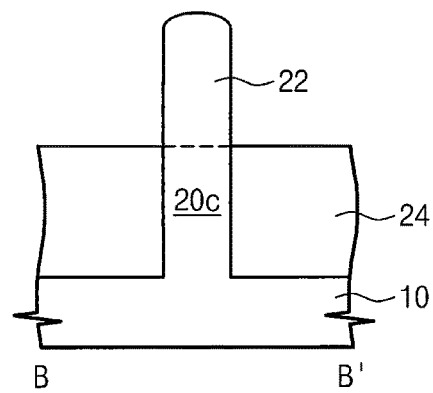
Figure 8G:
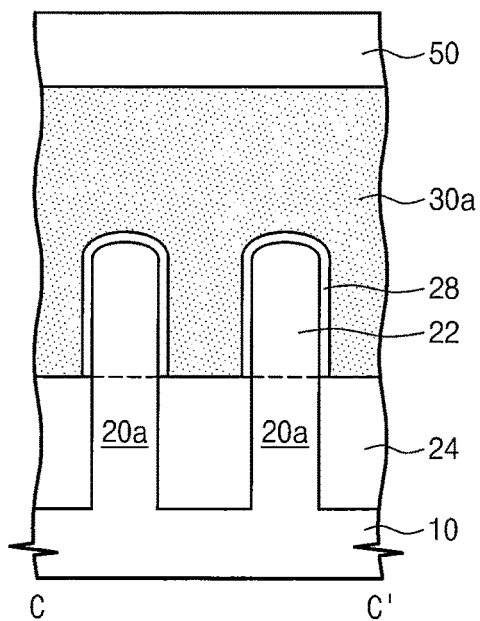
Figure 8G:
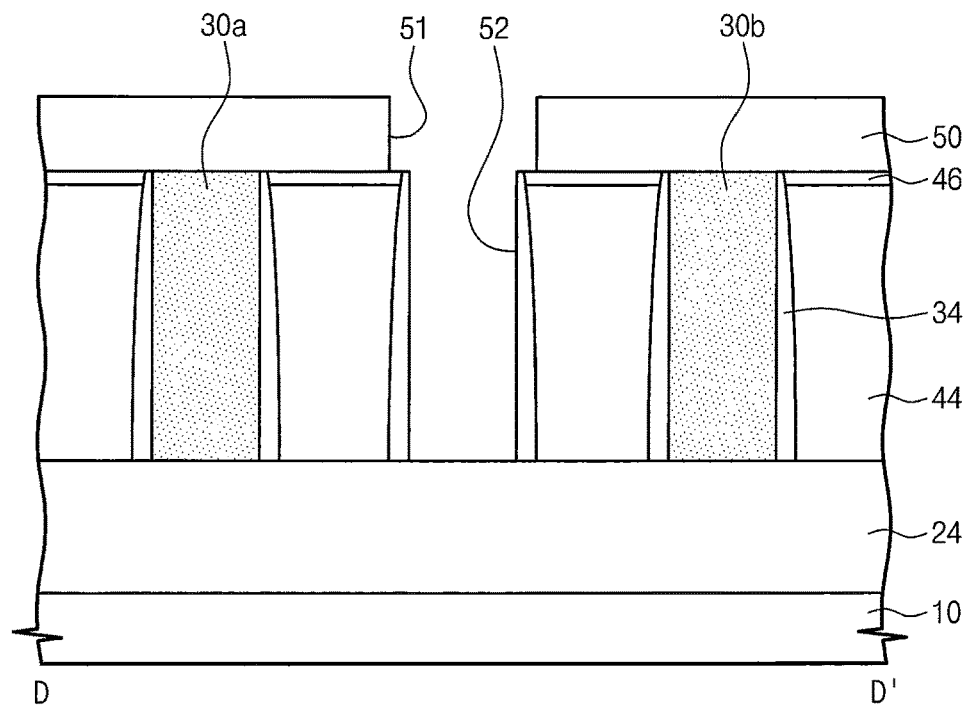

As shown in FIGS. 8GA to 8GD, a first mask 50 may be formed to cover the first and second sacrificial gates 30a, 30b and to have a first opening 51 exposing the third sacrificial gate 30c. The first opening 51 may have a width greater than the width of the third sacrificial gate 30c in the first direction X and may extend in the second direction Y. The first opening 51 may partially expose the gate spacers 34 and the protection patterns 46 which are adjacent to the third sacrificial gate 30c. The first mask 50 may include a hard mask layer or a photoresist layer. The hard mask layer may be formed of, for example, a spin-on-hardmask (SOH) layer. The third sacrificial gate 30c and the sacrificial gate dielectric layer 28 may be removed using the first mask 50 as an etch mask to form a first groove 52. The first groove 52 may extend in the second direction Y. The first and second source/drain regions 40a, 40b adjacent to the third sacrificial gate 30c are covered with the gate spacers 34 and the protection patterns 46 during the formation of the first groove 52 not to be exposed, and thus, it is possible to protect/prevent the first and second source/drain regions 40a, 40b from being etched. The first groove 52 may expose portions of the fin regions 20 (e.g., portions of the pillar regions 22). In addition, the first groove 52 may partially expose the first isolation insulating layer 24.

Figure 8H:
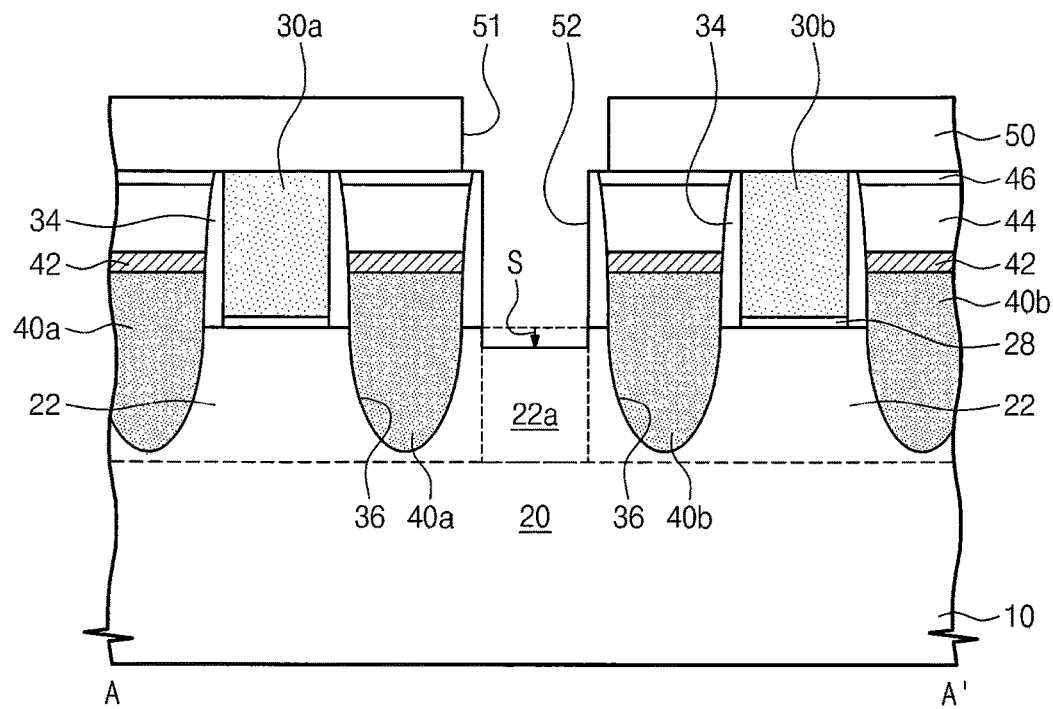
Figure 8H:
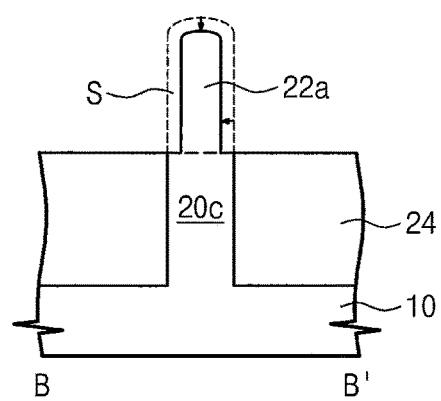
Figure 8H:
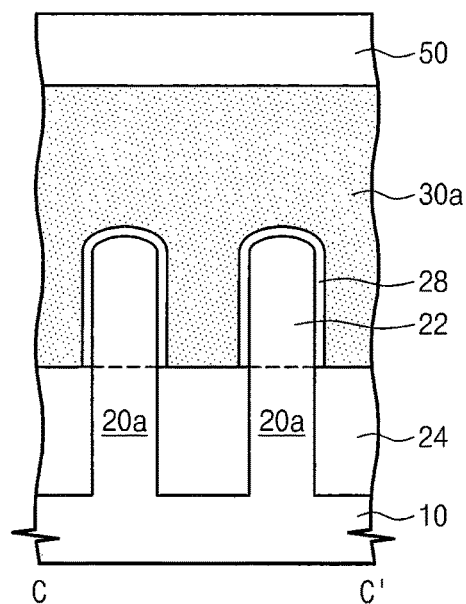
Figure 8H:
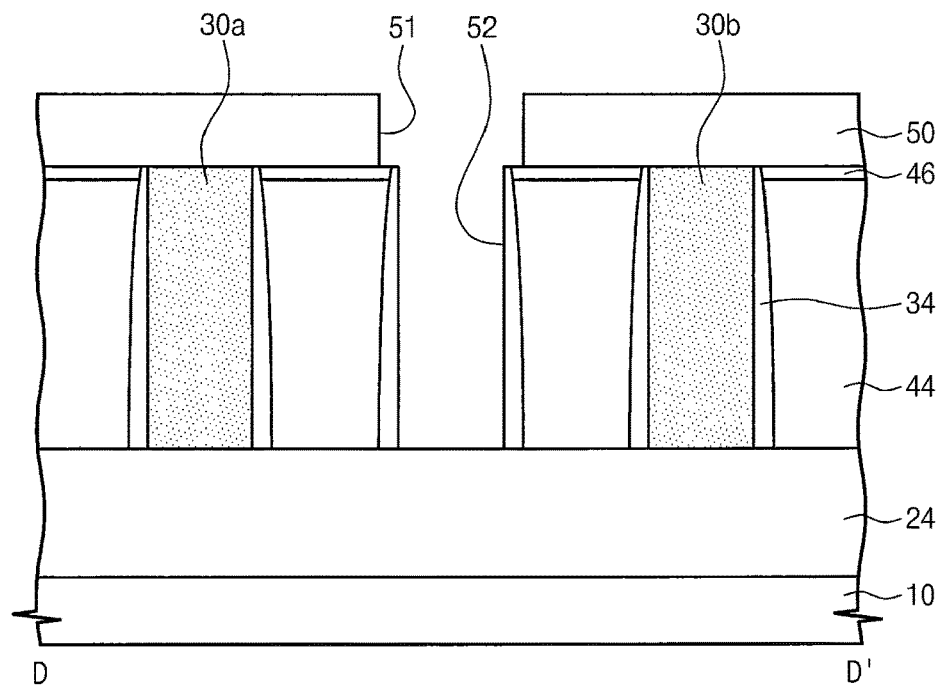

As shown in FIGS. 8HA to 8HD, the fin region 20 exposed by the first groove 52 may be trimmed to form a trimmed pillar region 22a. For example, a portion of the pillar region 22 may be removed through the trimming process by, for example, a thickness S. Each of the top surface and the sidewalls of the pillar region 22 may be removed by the thickness S. For example, the thickness S may be in a range of 1/20 to 1/3 of the width of each of the fin regions 20.

Figure 8I:
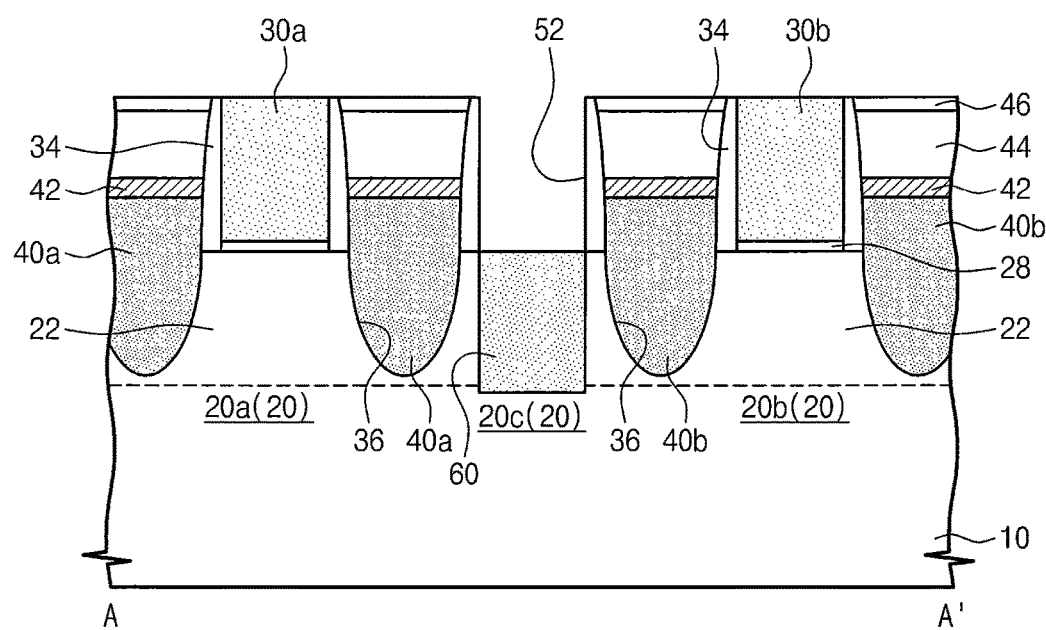
Figure 8I:
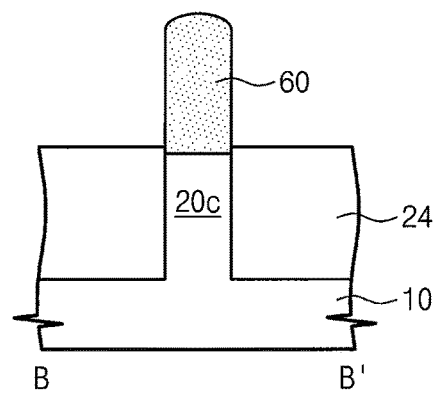
Figure 8I:
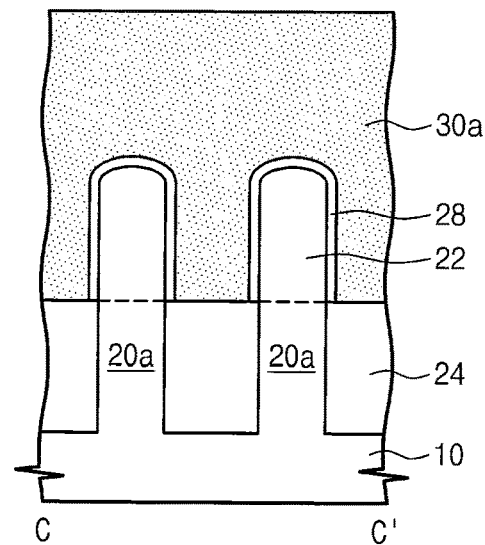
Figure 8I:
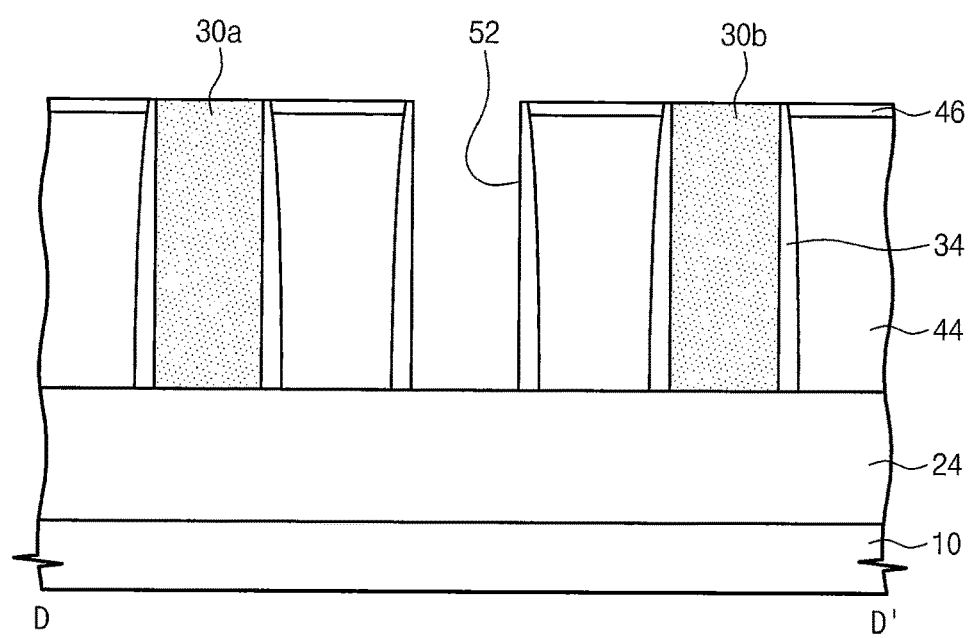

As shown in FIGS. 8IA to 8ID, the first mask 50 may be removed, and the trimmed pillar region 22a may be then oxidized to form a second isolation insulating layer 60. The second isolation insulating layer 60 may be formed to be self-aligned with the first groove 52 by the oxidation of the trimmed pillar region 22a. For example, the second isolation insulating layer 60 may be an oxide layer that is formed by oxidizing the trimmed pillar region 22a using a plasma oxidation process. For example, the trimmed pillar region 22a may be oxidized using an oxygen gas or an ozone gas at a temperature of 20° C. to 800° C. under a plasma atmosphere to form the second isolation insulating layer 60. In other embodiments, the second isolation insulating layer 60 may be an oxide layer that is formed by oxidizing the trimmed pillar region 22a using a thermal oxidation process. For example, the second isolation insulating layer 60 may be an oxide layer which is formed by oxidizing the trimmed pillar region 22a using a dry oxidation process, a wet oxidation process, or a thermal radical oxidation process.

A first fin subregion 20a and a second fin subregion 20b may be formed in each of the fin regions 20. The first fin subregion 20a and the second fin subregion 20b may be separated from each other in the first direction X by the second isolation insulating layer 60. In addition, a third fin subregion 20c connected to the substrate 10 may be formed in each fin region 20 under the second isolation insulating layer 60.

The second isolation insulating layer 60 may be a discrete isolation insulating island (e.g., an island-shaped pattern) having a top surface and sidewalls. For example, sidewalls of the second isolation insulating layer 60 which are arranged in the second direction Y may be exposed by the first groove 52. In other words, the sidewalls of the second isolation insulating layer 60 exposed by the first groove 52 may be parallel to the first direction X. Sidewalls of the second isolation insulating layer 60 which are arranged in the first direction X may be in contact with a sidewall of the first fin subregion 20a and a sidewall of the second fin subregion 20b which face each other. In other words, the sidewalls of the second isolation insulating layer 60 which are in contact with the sidewalls of the first and second fin subregions 20a, 20b may be parallel to the second direction Y. A plurality of the second isolation insulating layers 60 may be spaced apart from and aligned with each other in the second direction Y. In some embodiments, the sidewalls of the second isolation insulating layer 60 arranged in the first direction X may be in contact with the first and second source/drain regions 40a, 40b. The second isolation insulating layer 60 may have sidewalls aligned with inner sidewalls of the gate spacers 34. Alternatively, a width in the first direction X of the second isolation insulating layer 60 may be widened, so a top surface of the second isolation insulating layer 60 may partially overlap with a bottom surface of the gate spacer 34. A bottom surface of the isolation insulating layer 60 may be formed to be lower than the top surface of the first isolation insulating layer 24. For example, a portion of the fin region 20 lower than the top surface of the first isolation insulating layer 24 may be oxidized when the trimmed pillar region 22a is oxidized. In some embodiments, the trimming process of the pillar region 22 may be omitted and the pillar region 22 may be oxidized to form the second isolation insulating layer 60.

Figure 8J:
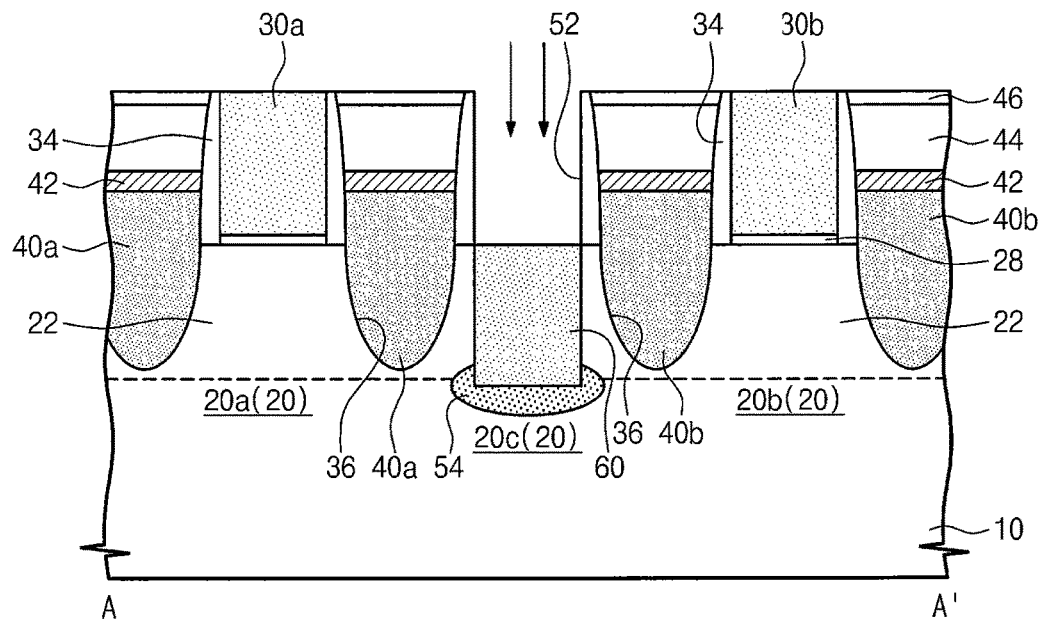
Figure 8J:
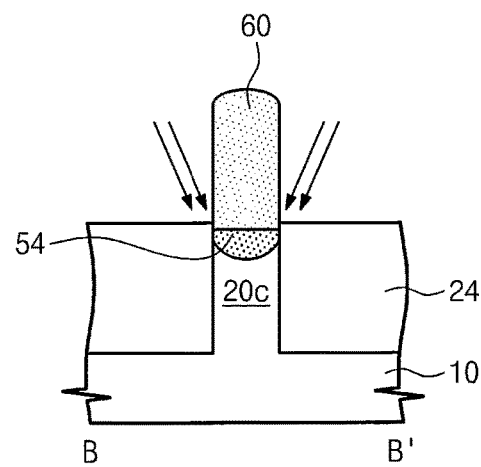
Figure 8J:
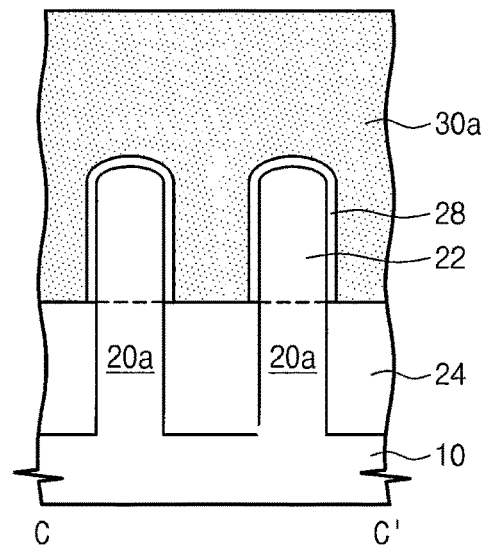
Figure 8J:
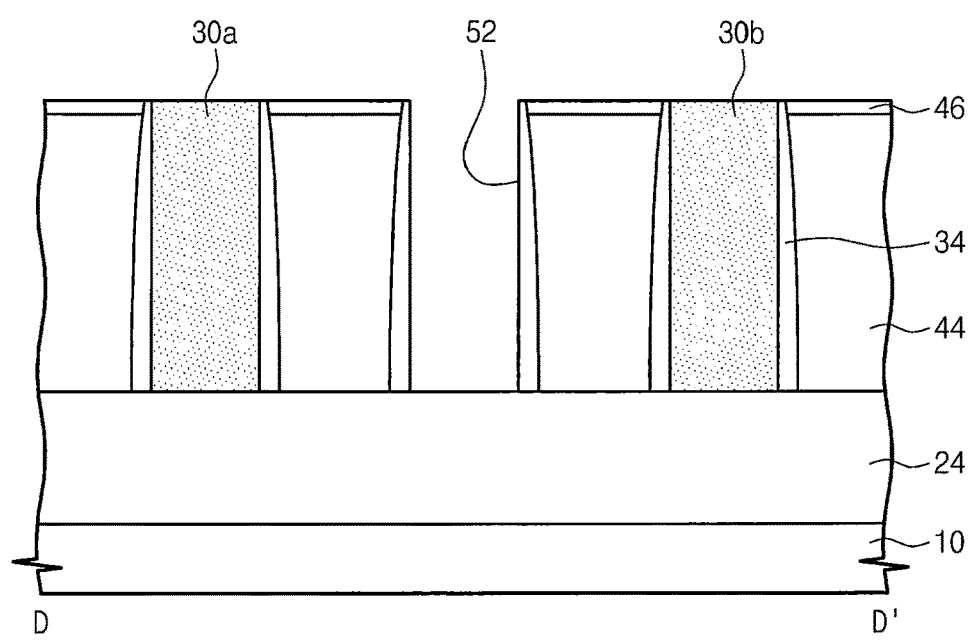

As shown in FIGS. 8JA to 8JD, a punch-through stop layer 54 may be formed in the third fin subregion 20c under the second isolation insulating layer 60. The punch-through stop layer 54 may extend into the first and second fin subregions 20a, 20b. A conductivity type of the punch-through stop layer 54 may be different from that of the first and second source/drain regions 40a, 40b. For example, the punch-through stop layer 54 may include dopants of which a conductivity type is different from that of the first and second source/drain regions 40a, 40b. For example, if the first and second source/drain regions 40a, 40b include N-type dopants, the punch-through stop layer 54 may include P-type dopants. Alternatively, if the first and second source/drain regions 40a, 40b include P-type dopants, the punch-through stop layer 54 may include N-type dopants. For example, the punch-through stop layer 54 may include the P-type dopants such as boron (B) or indium (In). Alternatively, the punch-through stop layer 54 may include the N-type dopants such as phosphorus (P), arsenic (As), or strontium (Sr). The punch-through stop layer 54 may have a dopant concentration in a range of about $10^{15}$ atoms/cm$^3$ to about $10^{20}$ atoms/cm$^3$. For example, dopants such as boron (B), BF$_2$, indium (In), arsenic (As), phosphorus (P), or strontium (Sr) may be ion-implanted in the third fin subregion 20c under the second isolation insulating layer 60 with a dose of about $10^{11}$ atoms/cm$^2$ to about $10^{15}$ atoms/cm$^2$ to form the punch-through stop layer 54. For example, an angle of the ion implantation may be in a range of about 10 degrees to about 50 degrees with respect to the substrate 10.

Figure 8K:
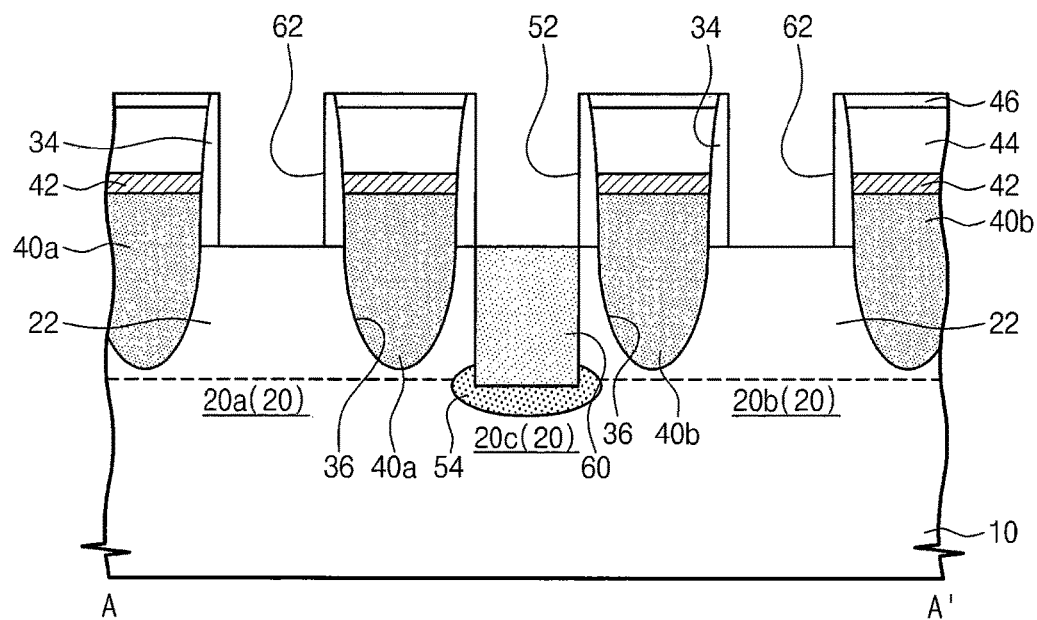
Figure 8K:
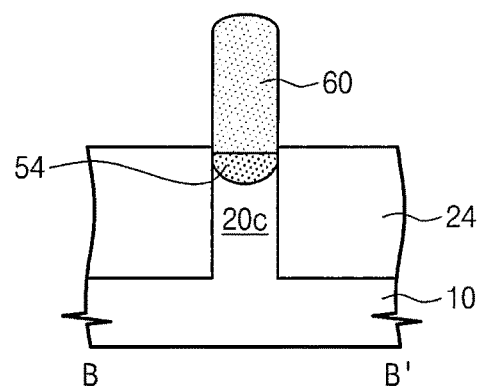
Figure 8K:
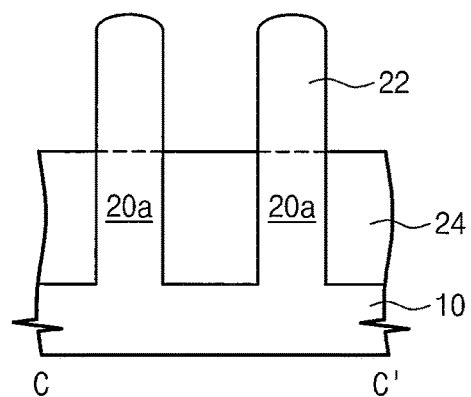
Figure 8K:
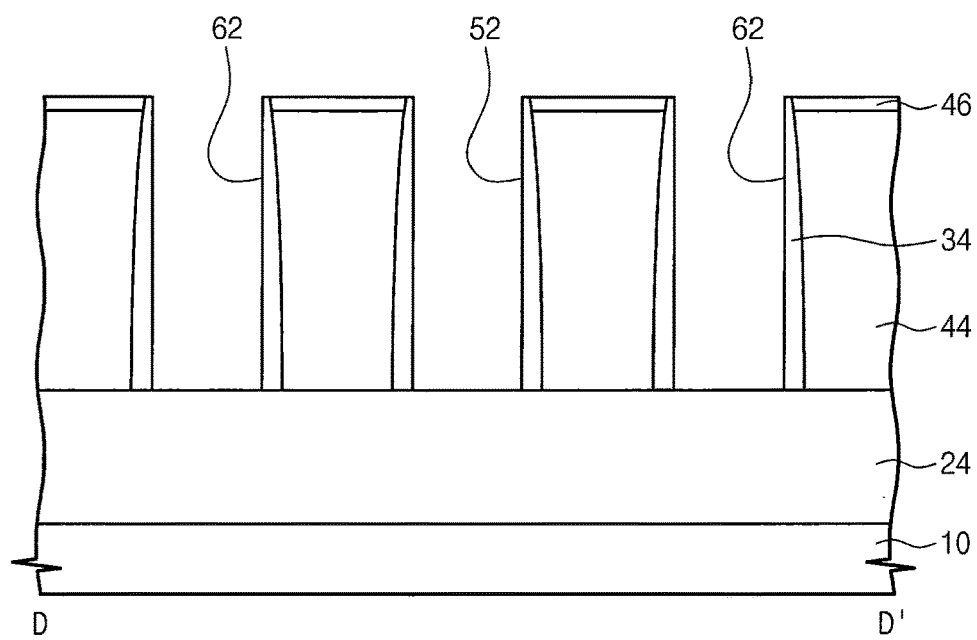

As shown in FIGS. 8KA to 8KD, a second groove 62 may be formed on each of the first and second fin subregions 20a, 20b. For example, the second grooves 62 may formed by sequentially removing the first and second sacrificial gates 30a, 30b and the sacrificial gate dielectric layer 28. For example, the first and second sacrificial gates 30a, 30b may be selectively removed using the gate spacers 34 and the protection patterns 46 as an etch mask. When the sacrificial gate dielectric layer 28 is removed, a portion of the second isolation insulating layer 60 may be removed. Top surfaces and sidewalls of the first and second fin subregions 20a, 20b may be partially exposed by the second grooves 62. For example, portions of the pillar regions 22 of the first and second fin subregions 20a, 20b may be exposed by the second grooves 62. In addition, portions of the first isolation insulating layer 24 may be exposed by the second grooves 62.

Figure 8L:
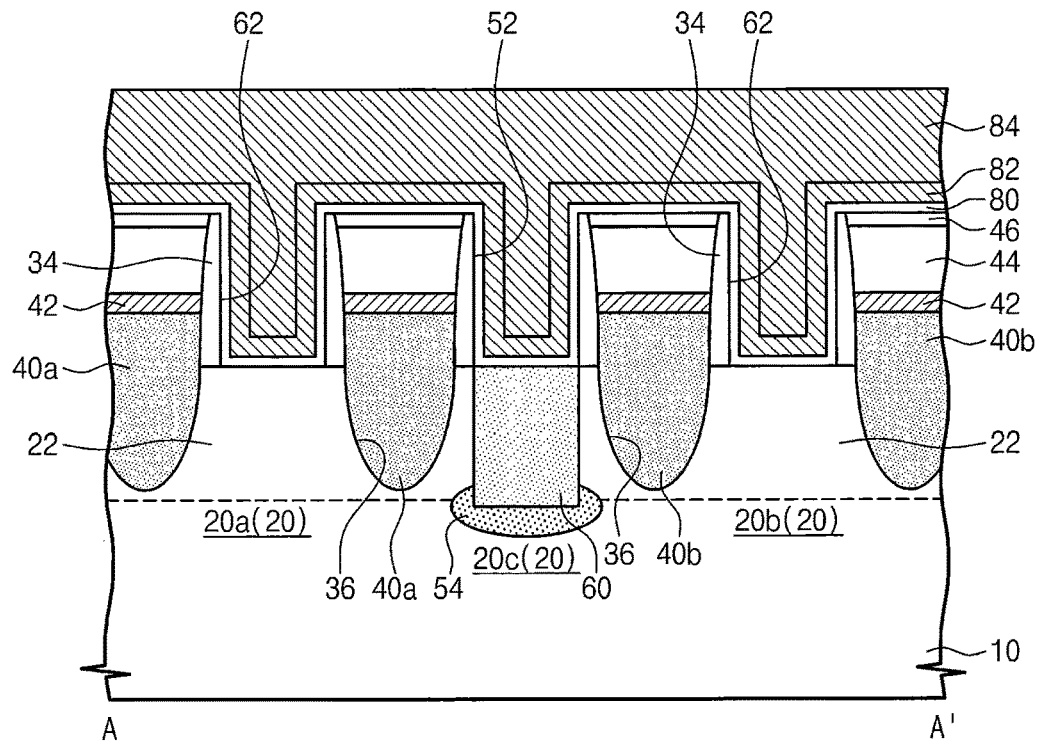
Figure 8L:
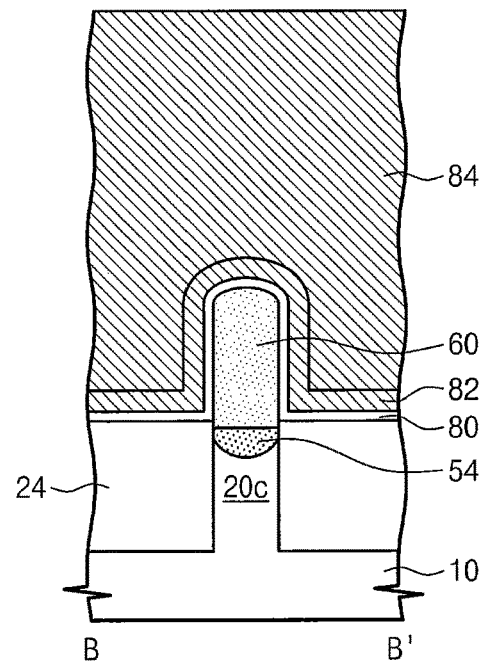
Figure 8L:
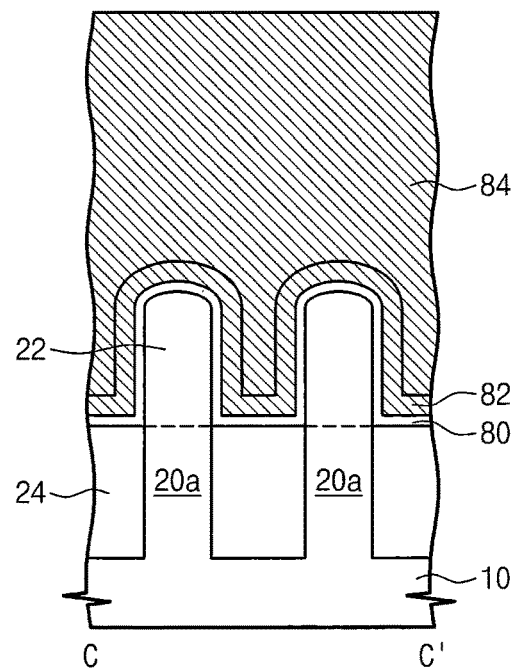
Figure 8L:
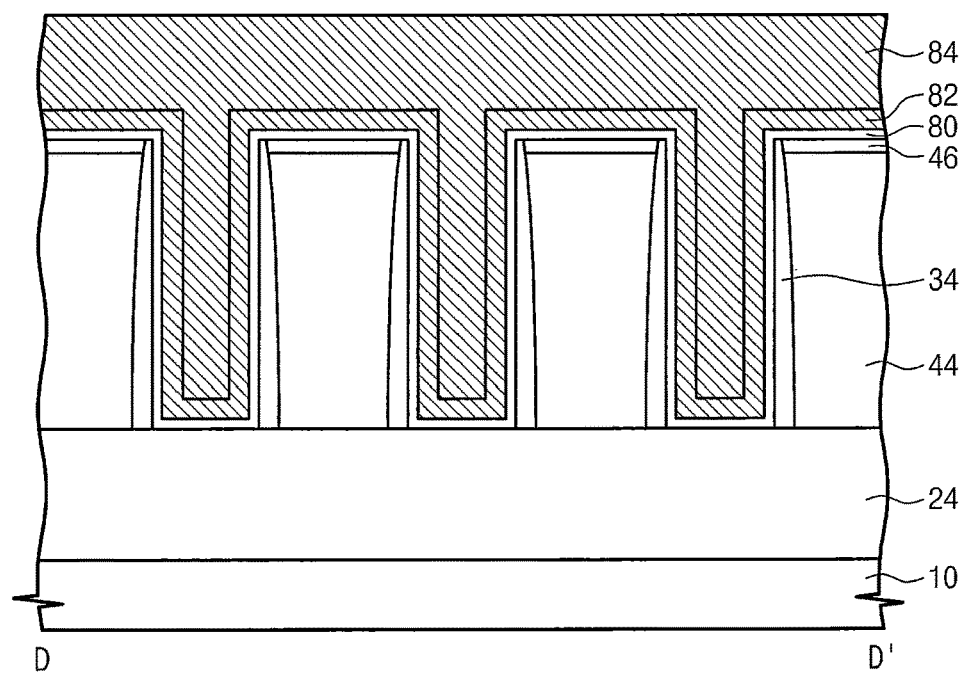

As shown in FIGS. 8LA to 8LD, a gate dielectric layer 80, a first gate conductive layer 82, and a second gate conductive layer 84 may be sequentially formed to fill the first and second grooves 52 and 62. For example, the gate dielectric layer 80, the first gate conductive layer 82, and the second gate conductive layer 84 may be formed by a replacement process refilling grooves formed by the removal of the sacrificial gates 30a, 30b, 30c. The gate dielectric layer 80, the first gate conductive layer 82, and the second gate conductive layer 84 may cover top surfaces and sidewalls of the pillar regions 22 of the fin regions 20. In addition, the gate dielectric layer 80, the first gate conductive layer 82, and the second gate conductive layer 84 may cover the top surface and the sidewalls of the second isolation insulating layer 60. The gate dielectric layer 80 may include a high-k dielectric material having a dielectric constant higher than that of silicon oxide. For example, the gate dielectric layer 80 may include at least one of, but not limited to, hafnium oxide, hafnium-silicon oxide, lanthanum oxide, lanthanum-aluminum oxide, zirconium oxide, zirconium-silicon oxide, tantalum oxide, titanium oxide, barium-strontium-titanium oxide, barium-titanium oxide, strontium-titanium oxide, yttrium oxide, aluminum oxide, lead-scandium-tantalum oxide, or lead-zinc niobate.

The gate dielectric layer 80 may be formed using an ALD process or a CVD process. The first gate conductive layer 82 may include a material capable of controlling a work function of a gate electrode. The second gate conductive layer 84 may fill spaces defined by the first gate conductive layer 82. For example, the first gate conductive layer 82 may include at least one of titanium nitride (TiN), tantalum nitride (TaN), titanium carbide (TiC), titanium-aluminum (TiAl), titanium-aluminum carbide (TiAlC), titanium-aluminum nitride (TiAlN), tantalum carbide (TaC), or tantalum-aluminum nitride (TaAlN). The second gate conductive layer 84 may include a metal. For example, the second conductive layer 84 may include tungsten (W) or aluminum (Al). Each of the first and second gate conductive layers 82, 84 may be formed using an ALD process or a CVD process.

Figure 8M:
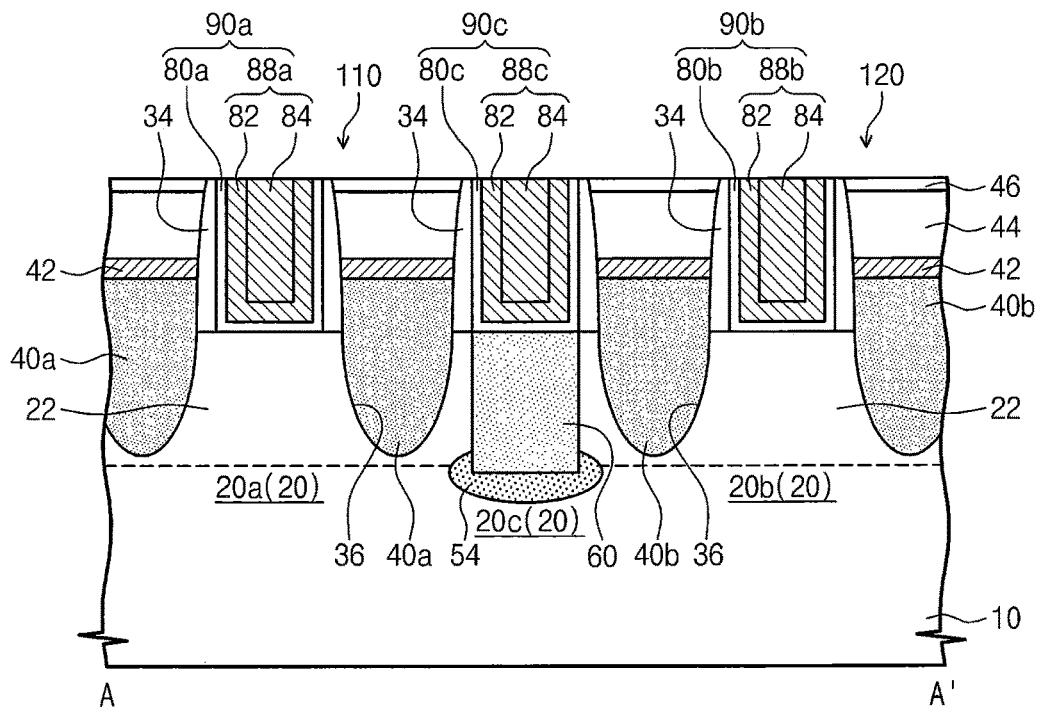
Figure 8M:
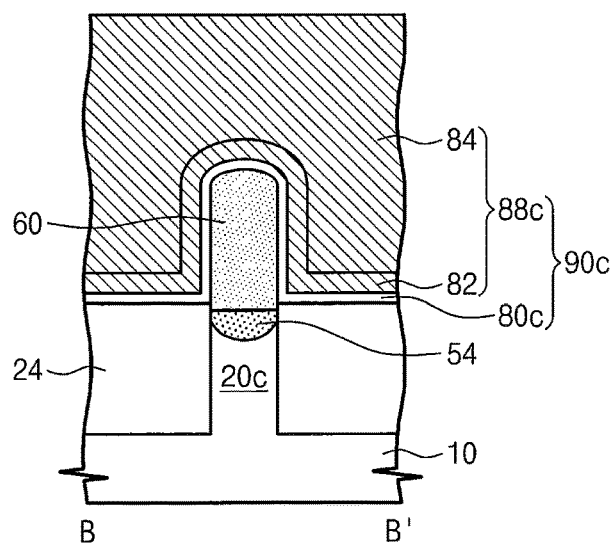
Figure 8M:
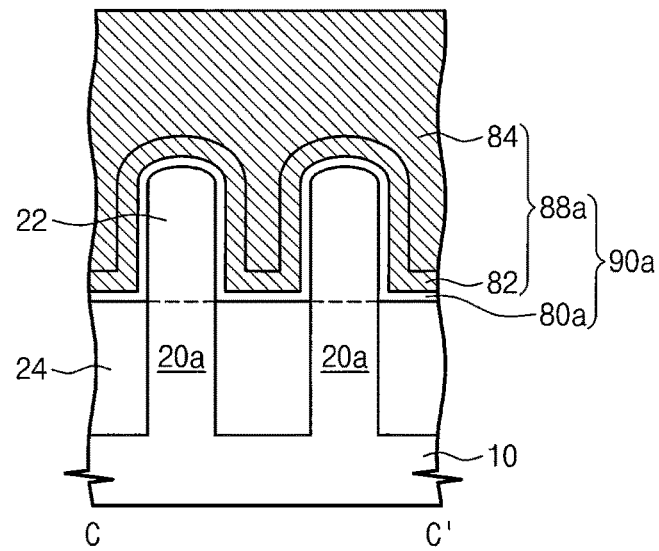
Figure 8M:
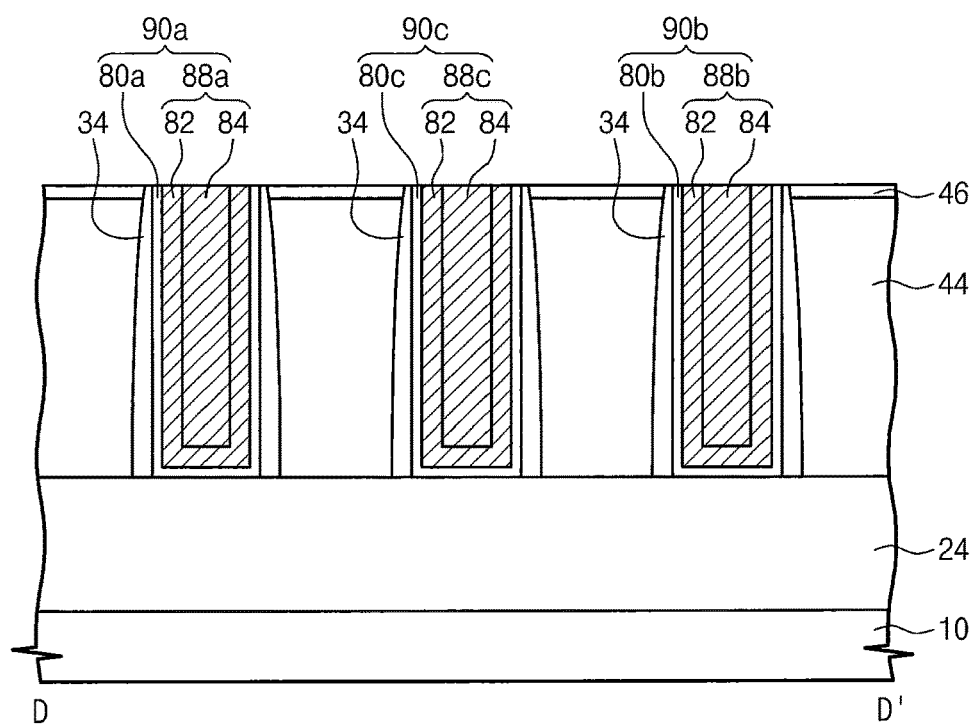

As shown in FIGS. 8MA to 8MD, a first gate 90a, a second gate 90b, and a third gate 90c may be formed on the first fin subregion 20a, the second fin subregion 20b, and the second isolation insulating layer 60, respectively. The first gate 90a may include a first gate dielectric layer 80a and a first gate electrode 88a, the second gate 90b may include a second gate dielectric layer 80b and a second gate electrode 88b, and the third gate 90c may include a third gate dielectric layer 80c and a third gate electrode 88c. To form the first to third gates 90a, 90b, 90c, the second gate conductive layer 84, the first gate conductive layer 82, and the gate dielectric layers 80a, 80b, 80c may be planarized by, for example, a CMP method until the protection patterns 46 and the gate spacers 34 are exposed. Thus, the gate dielectric layer 80 and the first and second gate conductive layers 82, 84 may be removed from top surfaces of the protection patterns 46 and the gate spacers 34 but may remain in the first and second grooves 52, 62. As a result, the first gate electrode 88a may be formed to include the first and second gate conductive layers 82 and 84 intersecting the first fin subregion 20a, and the second gate electrode 88b may be formed to include the first and second gate conductive layers 82, 84 intersecting the second fin subregion 20b. In addition, the third gate electrode 88c may be formed to include the first and second conductive layers 82, 84 intersecting the second isolation insulating layer 60. The first gate dielectric layer 80a may be disposed between the first fin subregion 20a and the first gate electrode 88a, the second gate dielectric layer 80b may be disposed between the second fin subregion 20b and the second gate electrode 88b, and the third gate dielectric layer 80c may be disposed between the second isolation insulating layer 60 and the third gate electrode 88c. Each of the first through third gate dielectric layers 80a, 80b, 80c may surround sidewalls and a bottom surface of the corresponding one of the first to third gate electrodes 88a, 88b, 88c and may extend in the second direction Y. Each of the first and second gate electrodes 88a, 88b and each of the gate dielectric layers 80a, 80b corresponding thereto may cover the top surface and the sidewalls of each of the first and second fin subregions 20a, 20b and may extend in the second direction Y. The third gate electrode 88c and the third gate dielectric layer 80c may surround the top surface and the sidewalls of the second isolation insulating layer 60 and may extend in the second direction Y. Accordingly, the first and second gates 90a, 90b respectively intersecting the first and second fin subregions 20a, 20b may extend in the second direction Y. The first gate 90a may cover the top surface and the sidewalls of the first fin subregion 20a and may extend in the second direction Y to intersect the first isolation insulating layer 24. The second gate 90b may cover the top surface and the sidewalls of the second fin subregion 20b and may extend in the second direction Y to intersect the first isolation insulating layer 24. The third gate 90c may cover the top surface and the sidewalls of the second isolation insulating layer 60 and may extend in the second direction Y to intersect the first isolation insulating layer 24. For example, the third gate 90c may cover the sidewalls and the top surface of the second isolation insulating layer 60 which are exposed between the gate spacers 34 adjacent to the sidewalls of the third gate 90c and may extend in the second direction Y to intersect the first isolation insulating layer 24. The first and second gates 90a, 90b may be used as normal gates for operation of transistors, but the third gate 90c may be used as a dummy gate that is not used for operation of a transistor. Alternatively, the third gate 90c may be used as a signal-transmitting interconnection or a normal gate.

A width of the third gate 90c may be substantially equal to or smaller than widths of the first and second gates 90a, 90b. Heights of the first and second gates 90a, 90b disposed on the first and second fin subregions 20a, 20b may be substantially equal to a height of the third gate 90c disposed on the second isolation insulating layer 60. For example, heights of the first and second gate electrodes 88a and 88b disposed on the first and second fin subregions 20a, 20b may be substantially equal to a height of the third gate electrode 88c disposed on the second isolation insulating layer 60. Accordingly, in the event that the third gate electrode 88c is used as a signal-transmitting interconnection or a normal gate electrode, the third gate electrode 88c has the same thickness as other gate electrodes 88a and 88b to reduce/prevent a signal delay phenomenon through the third gate electrode 88c. As a result, characteristics of the semiconductor device according to the inventive concepts may be improved.

A first transistor 110 including the first gate 90a and the first source/drain regions 40a may be formed on the first fin subregion 20a, and a second transistor 120 including the second gate 90b and the second source/drain regions 40b may be formed on the second fin subregion 20b. The first transistor 110 and/or the second transistor 120 may be an N-type transistor and/or a P-type transistor. The second isolation insulating layer 60 may isolate the first transistor 110 from the second transistor 120. In addition, the punch-through stop layer 54 may further improve the isolation characteristic between the transistors 110 and 120. Thus, the first transistor 110 may be electrically and physically isolated from the second transistor 120 by the second isolation insulating layer 60 and the punch-through stop layer 54.

As described above, since the fin region 20 exposed by the selective removal of the third sacrificial gate 30c is oxidized to form the second isolation insulating layer 60 during the replacement process, the formation process of the second isolation insulating layer 60 may be simplified. For example, it is possible to omit additional photolithography process and etching process for formation of a trench which may be required for the formation of the second isolation insulating layer 60, and thus, productivity of the semiconductor device may be improved. In addition, the third gate 90c may be formed to be self-aligned with the top surface of the second isolation insulating layer 60 in the first groove 52 to reduce/prevent misalignment between the third gate 90c and the second isolation insulating layer 60. Thus, the degree of freedom with respect to the width of the third gate 90c may be secured, and the short and/or the leakage current between the third gate electrode 88c and the first or second source/drain region 40a or 40b may be impeded/prevented.

FIGS. 9A to 9D are cross-sectional views respectively taken along lines A-A', B-B', C-C', and D-D' of FIG. 1 to illustrate a process of another embodiment of a method of manufacturing the semiconductor device according to the first embodiment of the inventive concepts. Hereinafter, the descriptions to the same elements as described in FIGS. 8AA to 8MD will be omitted or mentioned briefly. In other words, differences between the present embodiment and the embodiment of FIGS. 8AA to 8MD will be mainly described.

As shown in FIGS. 9A to 9D, according to the present embodiment, the second isolation insulating layer illustrated in FIGS. 8IA to 8ID may be formed using a separation by implanted oxygen (SIMOX) method. For example, oxygen ($O_2$) may be ion-implanted through an entire surface of the fin region 20 exposed by the first groove 52. The implanted oxygen 55 may be thermally treated to react with silicon of the fin region 20, so an oxide layer may be formed. In some embodiments, the thermal treatment of the fin region 20 including the implanted oxygen 55 may include a thermal oxidation process or the plasma oxidation process described with reference to FIGS. FIGS. 8IA to 8ID.

FIGS. 10AA to 10BD are cross-sectional views illustrating a process of still another embodiment of a method of manufacturing the semiconductor device according to the first embodiment of the inventive concepts. FIGS. 10AA and 10BA are cross-sectional views taken along a line A-A of FIG. 1, and FIGS. 10AB and 10BB are cross-sectional views taken along a line B-B' of FIG. 1. FIGS. 10AC and 10BC are cross-sectional views taken along a line C-C' of FIG. 1, and FIGS. 10AD and 10BD are cross-sectional views taken along a line D-D' of FIG. 1. Hereinafter, the descriptions of elements already described above with respect to FIGS. 8AA to 8MD will be omitted or mentioned only briefly so that differences between the present embodiment and the embodiment of FIGS. 8AA to 8MD may be highlighted.

As shown in FIGS. 10AA to 10AD, a punch-through stop layer 54 may be formed under the trimmed pillar regions 22a before the formation of the second isolation insulating layer 60. Dopants may be ion-implanted under the same condition as described with reference to FIGS. 8JA to 8JD to form the punch-through stop layer 54.

Figure 10B:
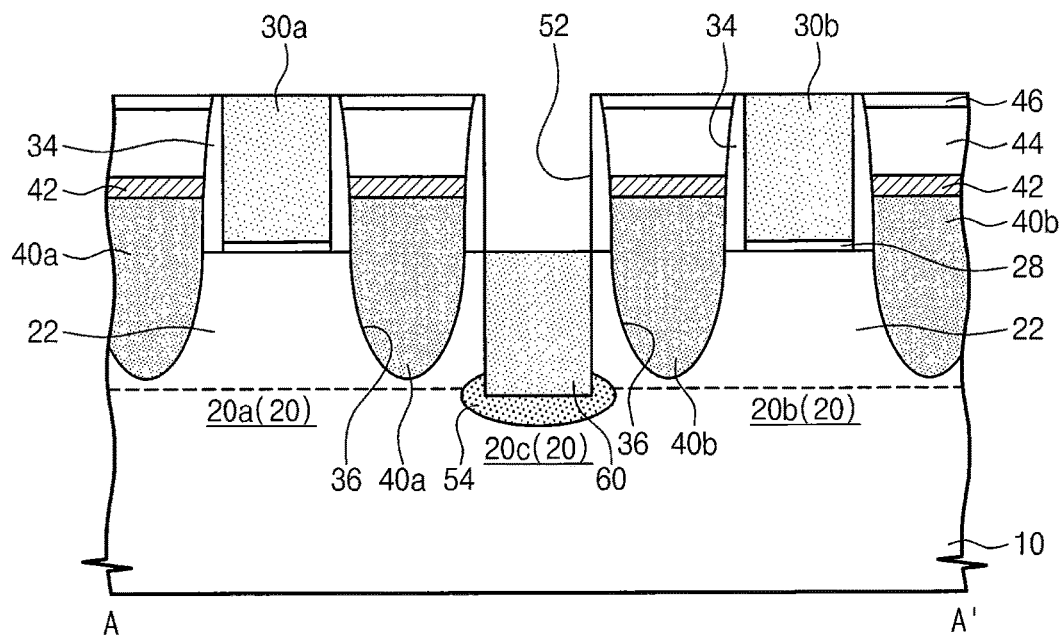
Figure 10B:
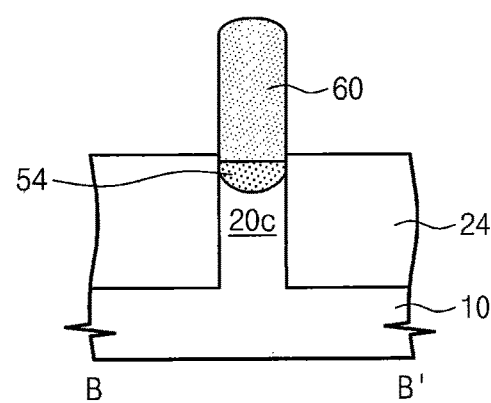
Figure 10B:
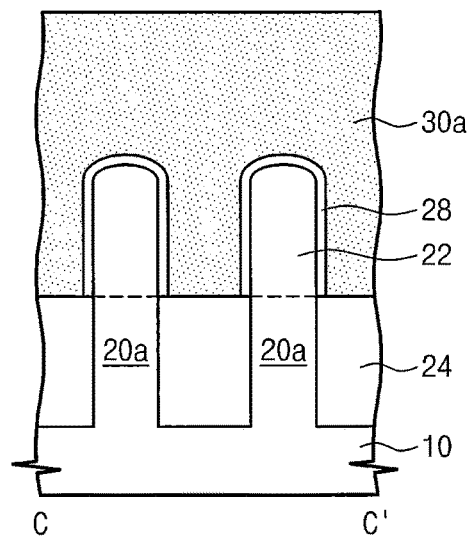
Figure 10B:
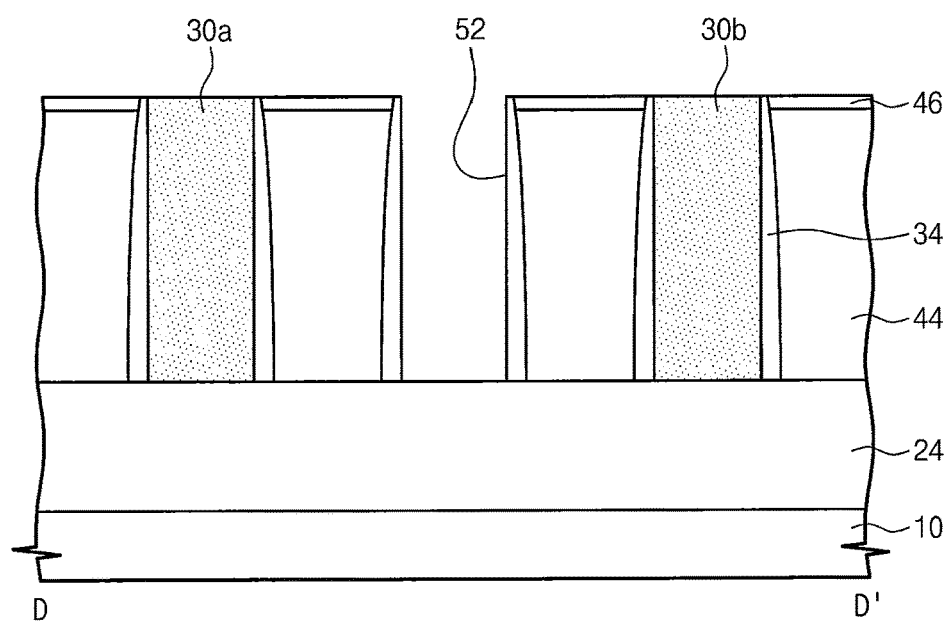

As shown in FIGS. 10BA to 10BD, thereafter, the first mask 50 may be removed and then the trimmed pillar regions 22a under which the punch-through stop layer 54 is formed may be oxidized to form the second isolation insulating layer 60. The second isolation insulating layer 60 may be an oxide layer formed under the same condition as described with reference to FIGS. 8IA to 8ID.

FIGS. 11AA to 11DB are cross-sectional views illustrating some processes of a method of manufacturing the semiconductor device according to the second embodiment of the inventive concepts. FIGS. 11AA and 11BA are cross-sectional views taken along a line A-A' of FIG. 1, and FIGS. 11AB and 11BB are cross-sectional views taken along a line B-B' of FIG. 1. FIGS. 11AC and 11BC are cross-sectional views taken along a line C-C' of FIG. 1, and FIGS. 11AD and 11BD are cross-sectional views taken along a line D-D' of FIG. 1. Hereinafter, the descriptions of elements already described above with respect to FIGS. 8AA to 8MD will be omitted or mentioned only briefly so that differences between the present embodiment and the embodiment of FIGS. 8AA to 8MD may be highlighted.

As shown in FIGS. 11AA to 11AD, the first isolation insulating layer 24 exposed by the first groove 52 may be removed by a thickness t1. For example, a top surface of the first isolation insulating layer 24 exposed by the first groove 52 may be lower than the top surface of the first isolation insulating layer 24 disposed under the first and second sacrificial gates 30a, 30b by the thickness t1. A height h2 of the first isolation insulating layer 24 exposed by the first groove 24 may be a value obtained by subtracting the thickness t1 from a height h1 of the first isolation insulating layer 24 disposed under the first and second sacrificial gates 30a, 30b. Thus, a height of a pillar region 22b exposed by the first groove 52 may be greater than the height of the pillar region 22 of FIG. 8GB by the thickness t1.

Figure 11B:
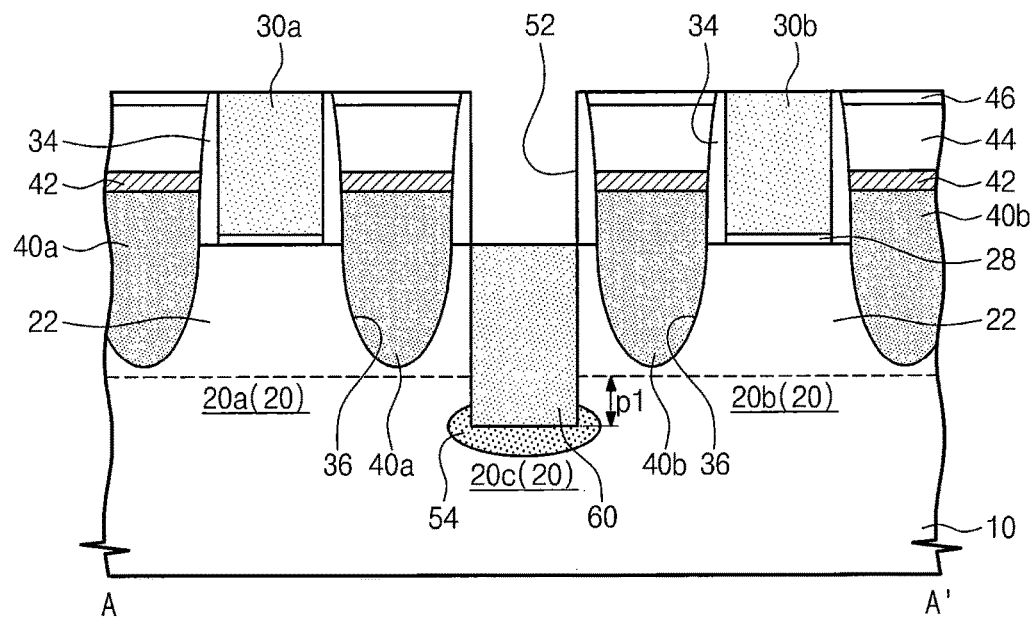
Figure 11B:
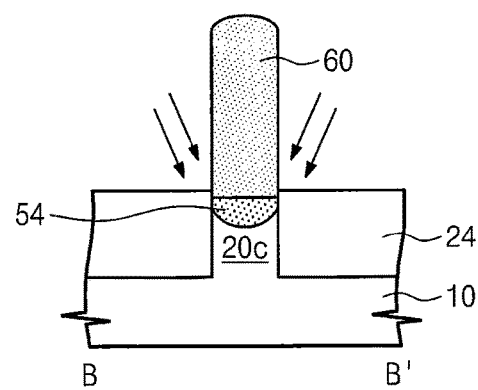
Figure 11B:
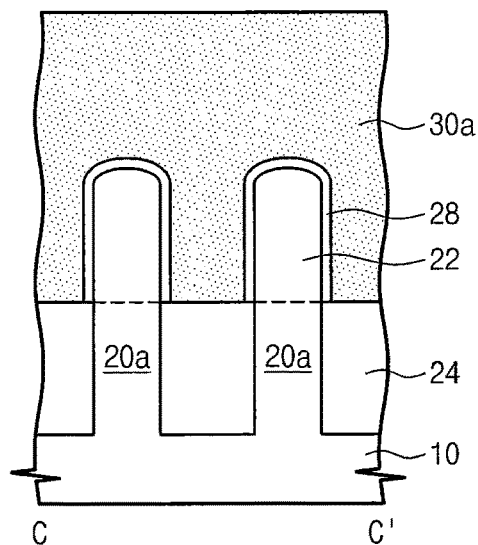
Figure 11B:
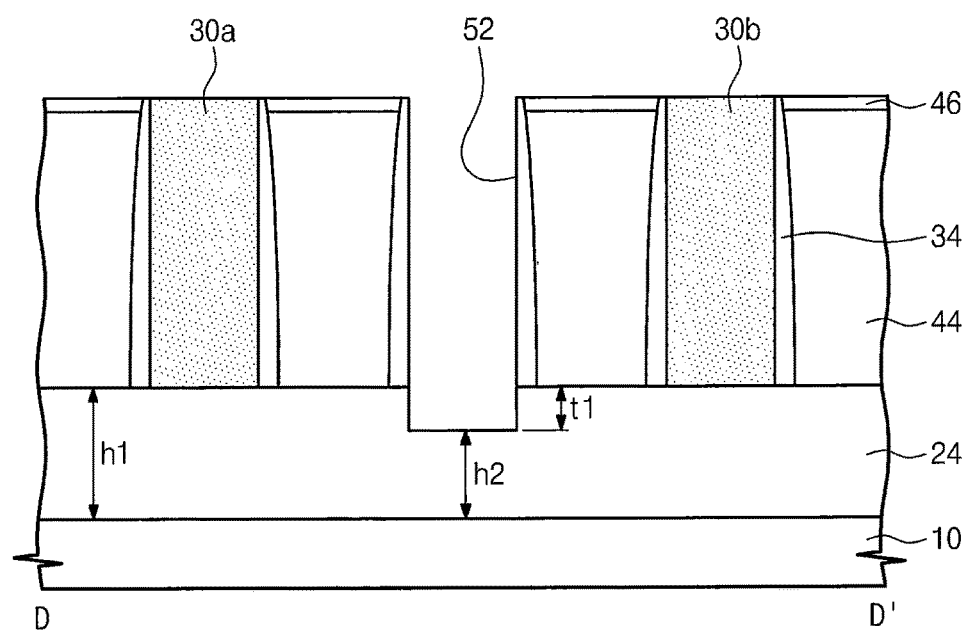

As shown in FIGS. 11BA to 11BD, the pillar region 22b exposed by the first groove 52 may be oxidized to form a second isolation insulating layer 60. A first fin subregion 20a and a second fin subregion 20b may be isolated or separated from each other by the second isolation insulating layer 60. The pillar region 22*b* may be oxidized under the same or similar oxidation condition with the trimmed pillar region 22*a* as described with reference to FIGS. FIGS. 8IA to 8ID to form the second isolation insulating layer 60. Accordingly, a bottom surface of the second isolation insulating layer 60 may be lower than the top surface of the first isolation insulating layer 24 by a vertical distance p1, so a height of the second isolation insulating layer 60 may be increased to improve the isolation characteristic between the first and second fin subregions 20*a*, 20*b*. A punch-through stop layer 54 may be formed in a third fin subregion 20*c* under the second isolation insulating layer 60. The punch-through stop layer 54 may be a dopant region formed under the same condition as described with reference to FIGS. 8JA to 8JD. Subsequent processes may be the same as described with reference to FIGS. 8KA to 8MD.

FIGS. 12AA to 12DD are cross-sectional views illustrating some processes of a method of manufacturing the semiconductor device according to the third embodiment of the inventive concepts. FIGS. 12AA to 12DA are cross-sectional views taken along a line A-A' of FIG. 4A, and FIGS. 12AB to 12DB are cross-sectional views taken along a line B-B' of FIG. 4A. FIGS. 12AC to 12DC are cross-sectional views taken along a line C-C' of FIG. 4A, and FIGS. 12AD to 12DD are cross-sectional views taken along a line D-D' of FIG. 4A. Hereinafter, the descriptions of elements already described above with respect to FIGS. 8AA to 8MD will be omitted or mentioned only briefly so that differences between the present embodiment and the embodiment of FIGS. 8AA to 8MD may be highlighted.

As shown in FIGS. 12AA to 12AD, a portion of the fin region 20 exposed by the first groove 52 may be removed using the first mask 50 as an etch mask to form a second recess region 53. For example, the pillar region 22 exposed by the first groove region 52 may be removed and the fin region 20 may be further etched by a depth t2 to form the second recess region 53. Thus, a bottom surface of the second recess region 53 may be lower than the top surface of the first isolation insulating layer 24. The fin region 20 may have structures separated from each other in the first direction X by the second recess region 53.

Figure 12B:
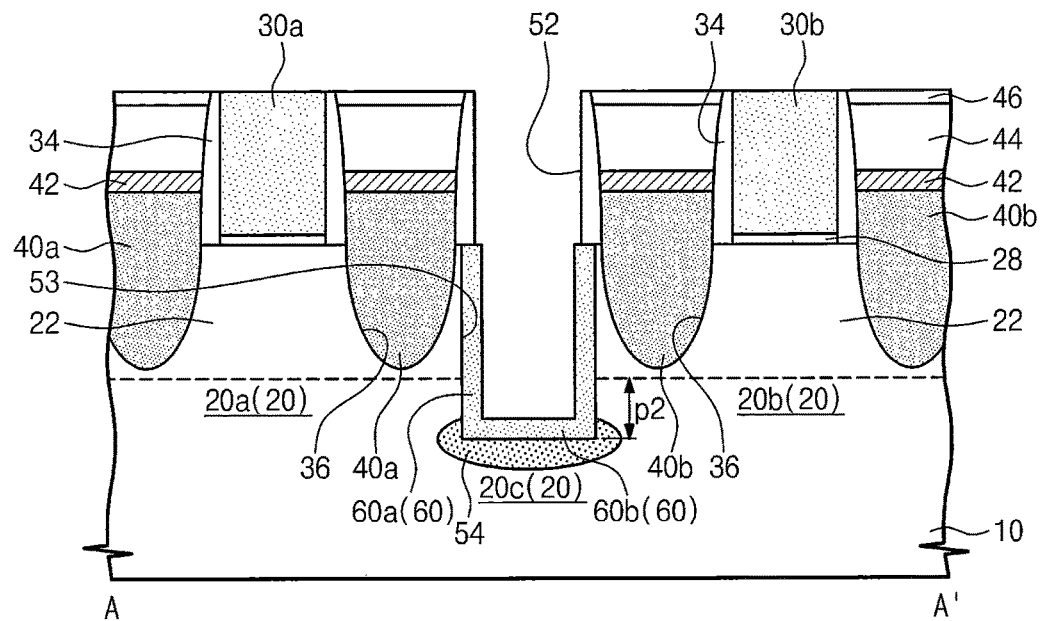
Figure 12B:
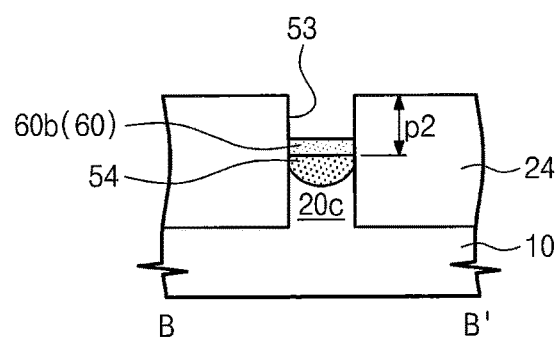
Figure 12B:
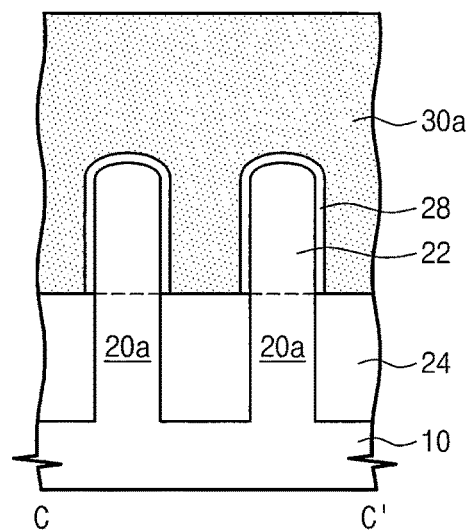
Figure 12B:
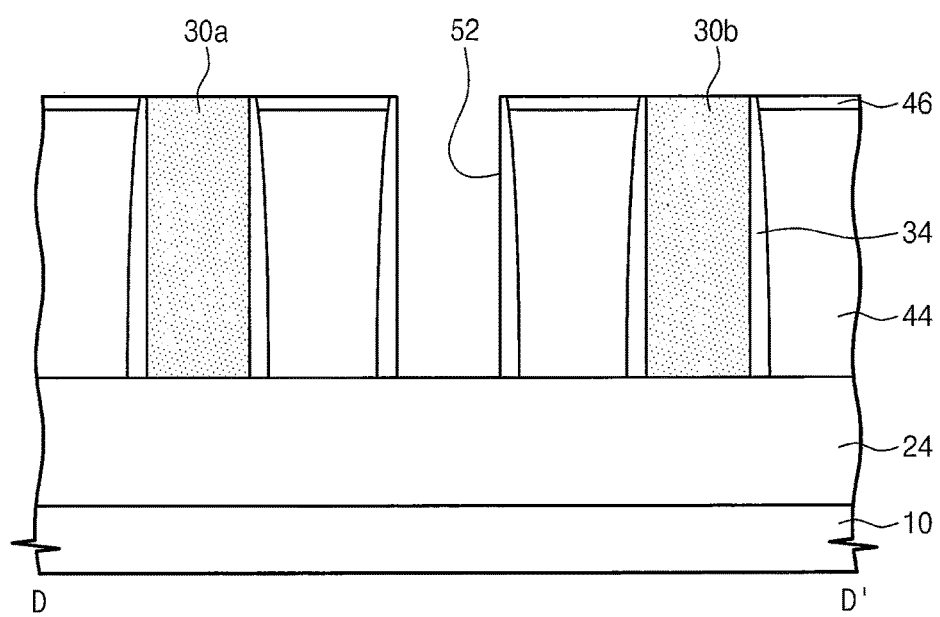

As shown in FIGS. 12BA to 12BD, after the first mask 50 is removed, the fin region 20 exposed by the second recess region 53 may be oxidized to form a second isolation insulating layer 60. The second isolation insulating layer 60 may be a liner-shaped oxide layer self-alignedly formed on the bottom surface and inner sidewalls of the second recess region 53. The second isolation insulating layer 60 may have a U-shaped cross section. The portion of the fin region 20 exposed by the second recess region 53 may be oxidized by a plasma oxidation process to form the second isolation insulating layer 60. For example, the fin region 20 exposed through the second recess region 53 may be oxidized using an oxygen gas or an ozone gas at a temperature of 20° C. to 800° C. under a plasma atmosphere to form the second isolation insulating layer 60. In other embodiments, the fin region 20 exposed through the second recess region 53 may be oxidized by a thermal oxidation process to form the second isolation insulating layer 60. For example, the thermal oxidation process may be a dry oxidation process, a wet oxidation process, or a thermal radical oxidation process. Alternatively, the second isolation insulating layer 60 may be formed by the SIMOX method described with reference to FIGS. 9AA to 9AD. The second isolation insulating layer 60 may include a vertical portion 60*a* formed on the inner sidewall of the second recess region 53 and a base portion 60*b* formed on the bottom surface of the second recess region 53. The vertical portion 60*a* may partially overlap with the gate spacer 34, and thus, a width of a space defined by the second isolation insulating layer 60 in the second recess region 53 may be smaller than a width of the first groove 52 in the first direction X. A bottom surface of the second isolation insulating layer 60 may be lower than the top surface of the first isolation insulating layer 24 by a vertical distance p2. The second isolation insulating layer 60 may be in contact with the first and second source/drain regions 40*a*, 40*b*. The first fin subregion 20*a* may be isolated from the second fin subregion 20*b* by the second isolation insulating layer 60. A punch-through stop layer 54 may be formed in a third fin subregion 20*c* under the second isolation insulating layer 60. The punch-through stop layer 54 may be a dopant region formed by ion-implanting dopants using, for example, the same method as described with reference to FIGS. FIGS. 8JA to 8JD. The punch-through stop layer 54 may be formed before or after the formation of the second isolation insulating layer 60.

Figure 12C:
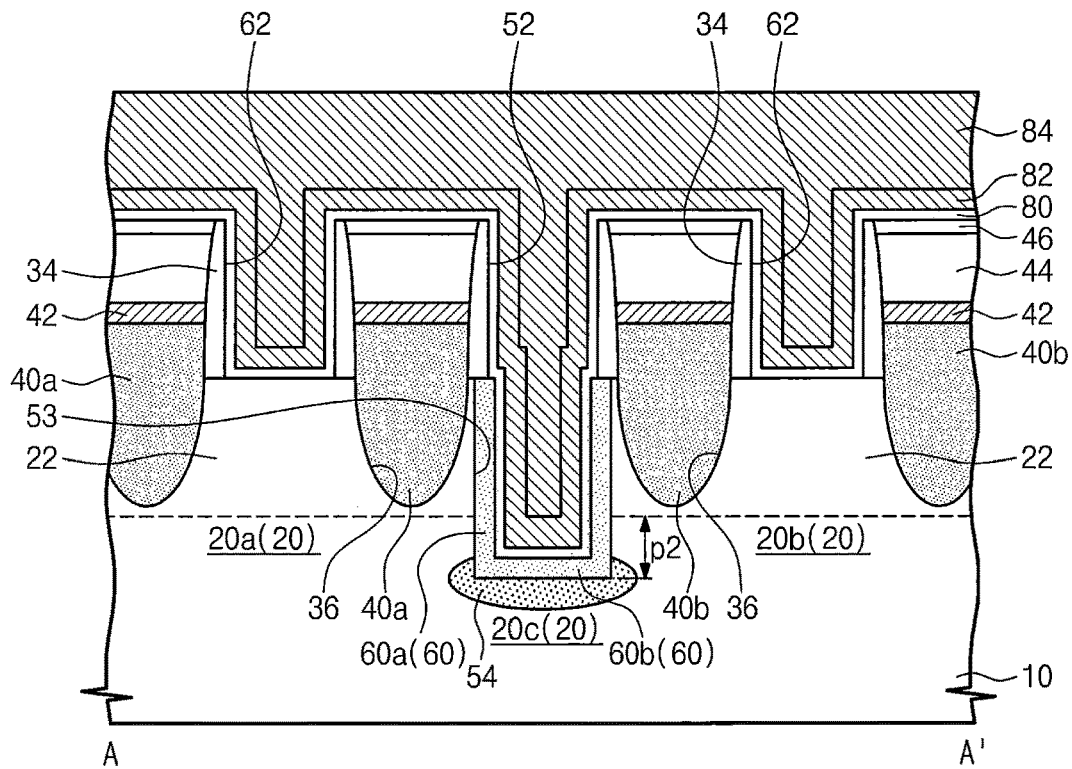
Figure 12C:
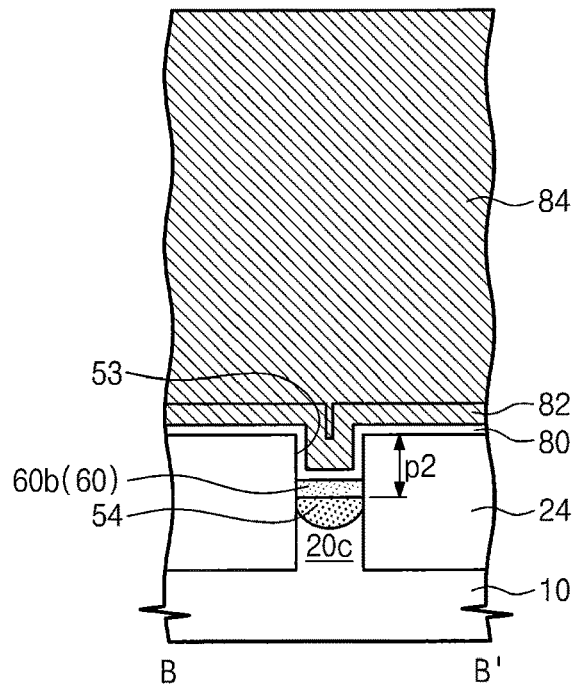
Figure 12C:
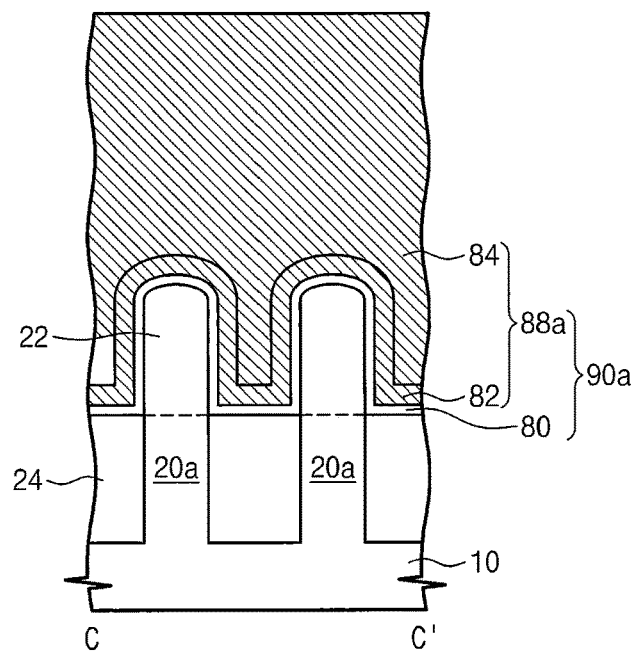
Figure 12C:
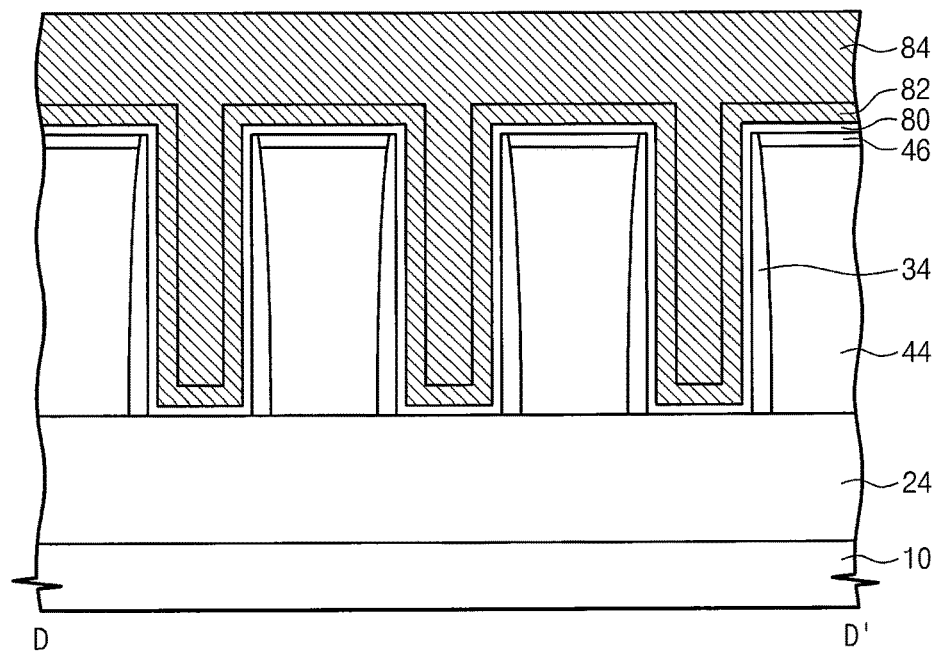

As shown in FIGS. 12CA to 12CD, the first and second sacrificial gates 30*a*, 30*b* and the sacrificial gate dielectric layers 28 may be selectively removed to form second grooves 62. A gate dielectric layer 80, a first gate conductive layer 82, and a second gate conductive layer 84 may be sequentially formed on the substrate 10 to fill the first groove 52 and the second grooves 62. The gate dielectric layer 80, the first gate conductive layer 82, and the second gate conductive layer 84 may be formed of the same materials as described with reference to FIGS. 8LA to 8LD by the same processes as described with reference to FIGS. 8LA to 8LD.

Figure 12D:
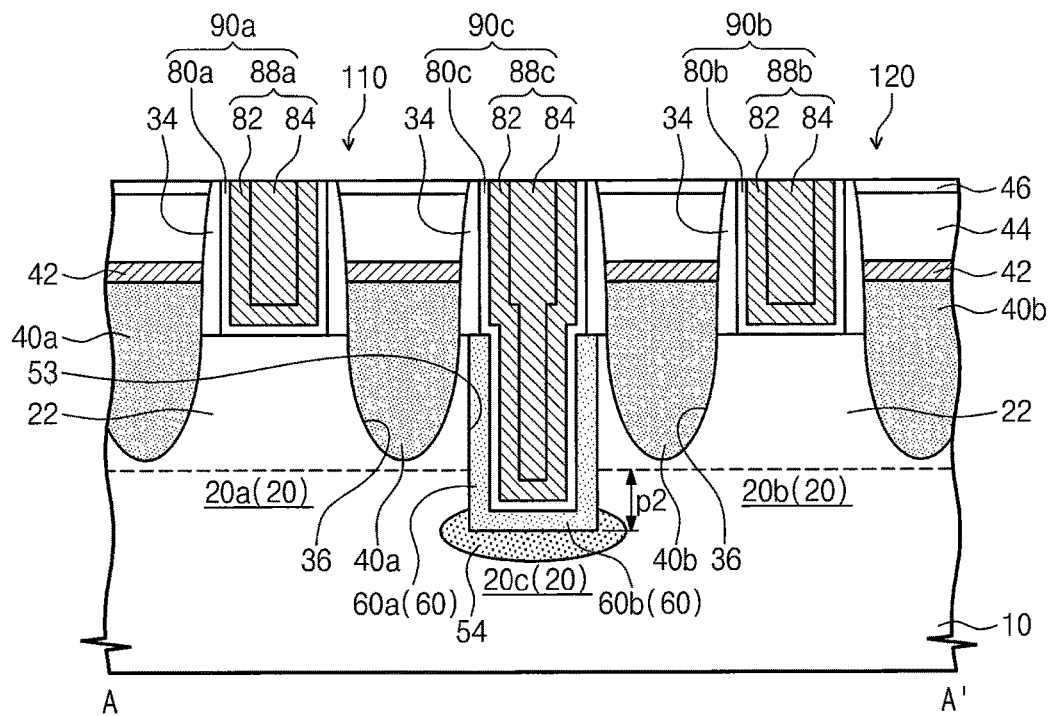
Figure 12D:
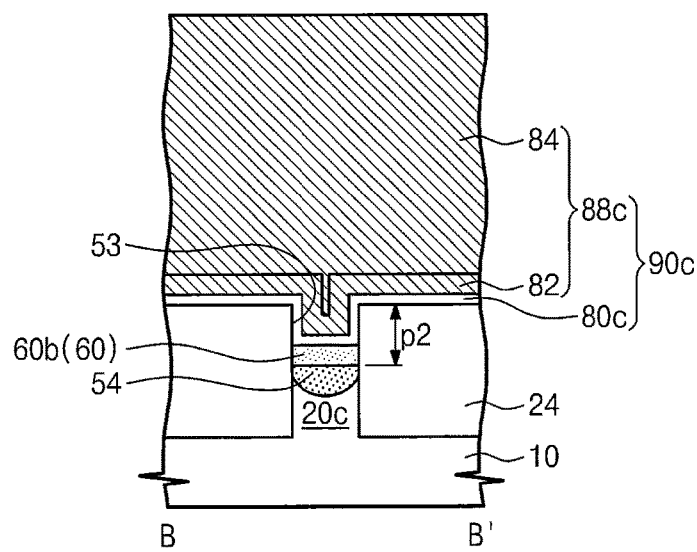
Figure 12D:
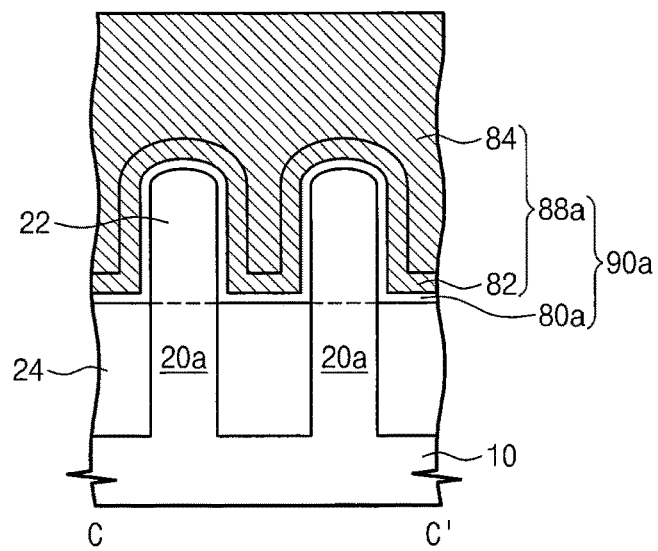
Figure 12D:
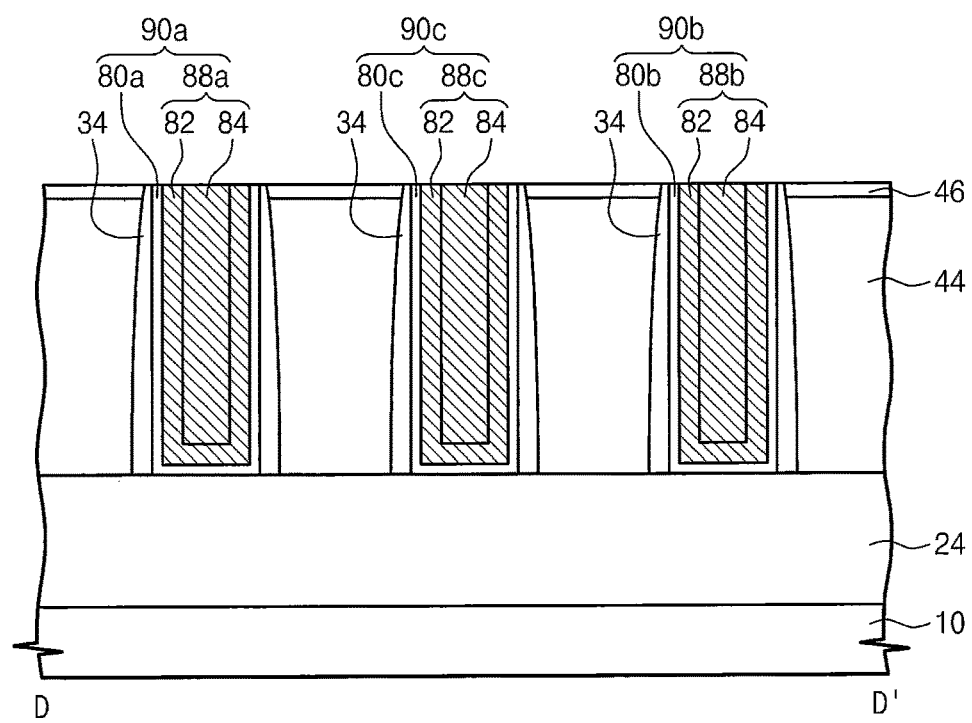

Referring to FIGS. 12DA to 12DD, the gate dielectric layer 80, the first gate conductive layer 82, and the second gate conductive layer 84 may be planarized by, for example, a CMP process. Thus, a first gate 90*a* including a first gate dielectric layer 80*a* and a first gate electrode 88*a* may be formed on the first fin subregion 20*a*, a second gate 90*b* including a second gate dielectric layer 80*b* and a second gate electrode 88*b* may be formed on the second fin subregion 20*b*, and a third gate 90*c* including a third gate dielectric layer 80*c* and a third gate electrode 88*c* may be formed on the second isolation insulating layer 60. Each of the first to third gate electrodes 88*a*, 88*b*, 88*c* may include the first gate conductive layer 82 and the second gate conductive layer 84. The third gate 90*c* may cover the vertical portions 60*a* and the base portion 60*b* and may extend in the second direction Y. A bottom surface of the third gate 90*c* disposed on the base portion 60*b* may be lower than the top surface of the first isolation insulating layer 24. A height of the third gate 90*c* disposed on the base portion 60*b* may be greater than heights of the first and second gates 90*a*, 90*b* disposed on the first and second fin subregions 20*a*, 20*b*. Heights of the first to third gates 90*a*, 90*b*, 90*c* disposed on the first isolation insulating layer 24 may be substantially equal to each other.

FIGS. 13AA to 13DD are cross-sectional views illustrating some processes of a method of manufacturing the semiconductor device according to the fourth embodiment of the inventive concepts. FIGS. 13AA to 13DA are cross-sectional views taken along a line A-A' of FIG. 5, and FIGS. 13AB to 13DB are cross-sectional views taken along a line B-B' of FIG. 5. FIGS. 13AC to 13DC are cross-sectional views taken along a line C-C' of FIG. 5, and FIGS. 13AD to 13DD are cross-sectional views taken along a line D-D' of FIG. 5. Hereinafter, the descriptions of elements already described above with respect to FIGS. 8AA to 8MD will be omitted or mentioned only briefly so that differences between the present embodiment and the embodiment of FIGS. 8AA to 8MD may be highlighted.

As shown in FIGS. 13AA to 13AD, the fin region 20 exposed by the inner sidewalls and the bottom surface of the second recess region 53 of FIGS. 12AA to 12AD may be oxidized to form an oxide layer 64. The oxide layer 64 may be formed by, for example, the same process as the formation process of the second isolation insulating layer 60 described with reference to FIGS. 12BA to 12BD. A bottom surface of the oxide layer 64 may be lower than the top surface of the first isolation insulating layer 24 by a vertical distance p2. A filling insulation layer 66 may be formed on the oxide layer 64. For example, the filling insulation layer 66 may be formed to fill the first groove 52 and the second recess region 53. For example, the filling insulation layer 66 may include an oxide, an oxynitride, and/or a nitride.

Figure 13B:
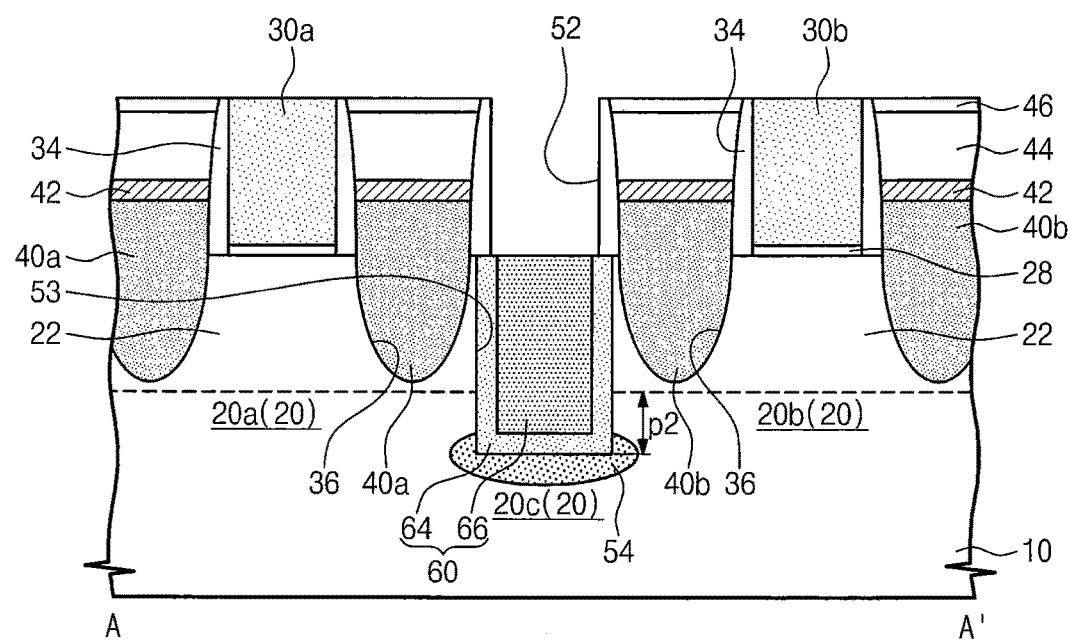
Figure 13B:
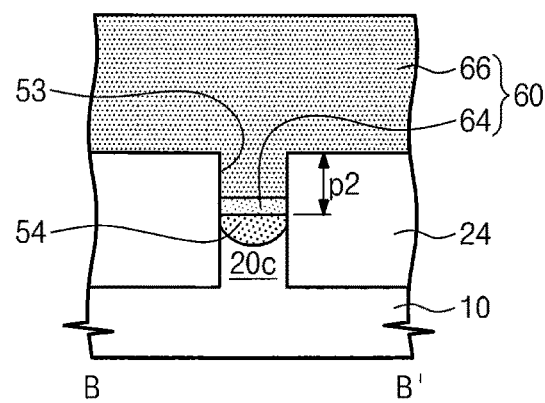
Figure 13B:
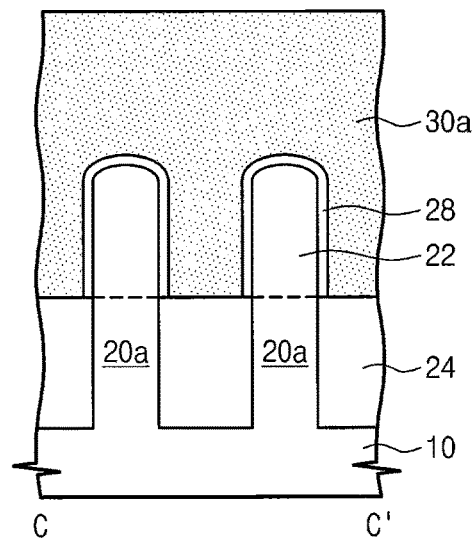
Figure 13B:
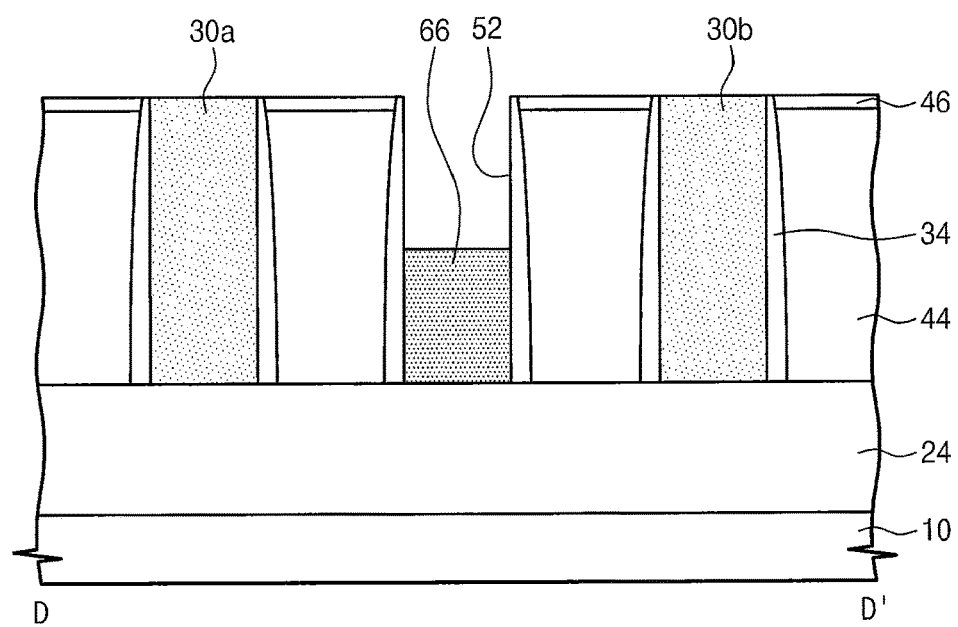

As shown in FIGS. 13BA to 13BD, the filling insulation layer 66 may be recessed to expose the first groove 52. For example, a blanket etch-back process may be performed to remove a portion of the filling insulation layer 66 formed on the protection patterns 46 and the sacrificial gates 30a, 30b and another portion of the filling insulation layer 66 formed in the first groove 52. For example, the portions of the filling insulation layer 66 may be selectively removed with respect to the protection patterns 46 and the sacrificial gates 30a, 30b. Thus, a second isolation insulating layer 60 may be formed to include the oxide layer 64 and the filling insulation layer 66 which fill the second recess region 53. In some embodiments, a top surface of the filling insulation layer 66 formed in the second recess region 53 may be a little higher than the top surfaces of the first and second fin subregions 20a, 20b. For example, the top surface of the filling insulation layer 66 may be substantially coplanar with a top surface of the sacrificial gate dielectric layer 28. Alternatively, the top surface of the filling insulation layer 66 may be formed to be higher than the top surface of the sacrificial gate dielectric layer 28.

The filling insulation layer 66 may be a pattern extending in the second direction Y. The filling insulation layer 66 may also be formed on the first isolation insulating layer 24. In some embodiments, the filling insulation layer 66 may be formed to be a discrete isolation insulating island (e.g., an island-shaped pattern). In this case, a plurality of filling insulation layers 66 formed under the first groove 52 may be spaced apart from each other in the second direction Y. Thus, the filling insulation layer 66 as well as the oxide layer 64 self-alignedly formed may have an isolated shape like the second isolation insulating layer 60 illustrated in FIG. 1.

Figure 13C:
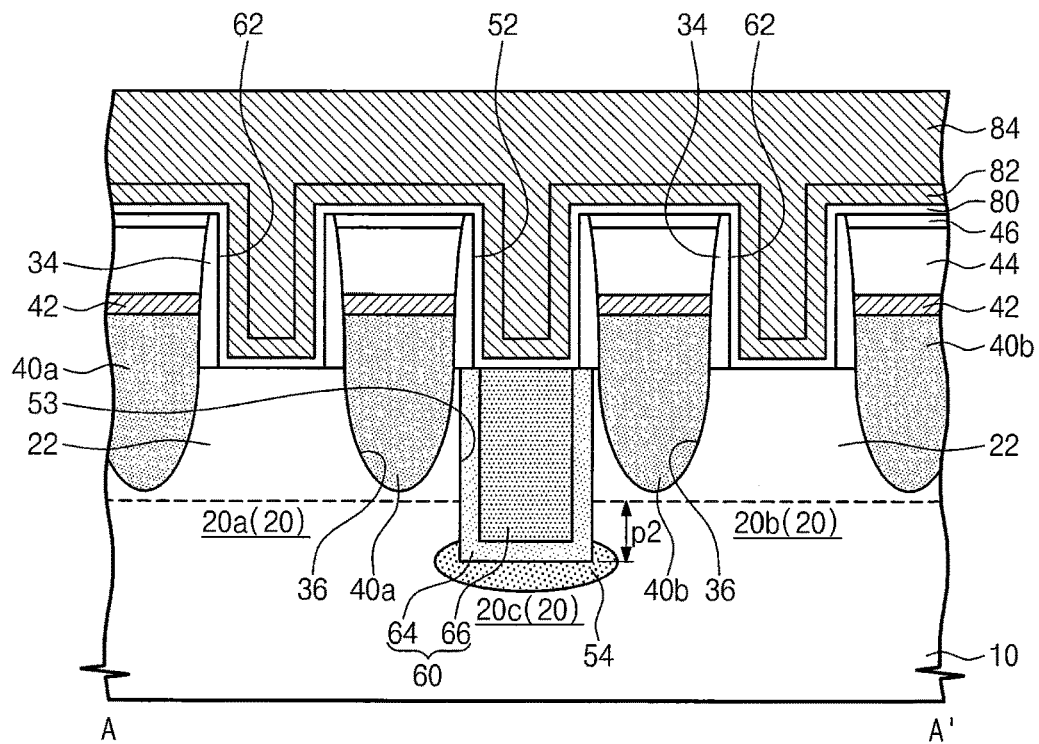
Figure 13C:
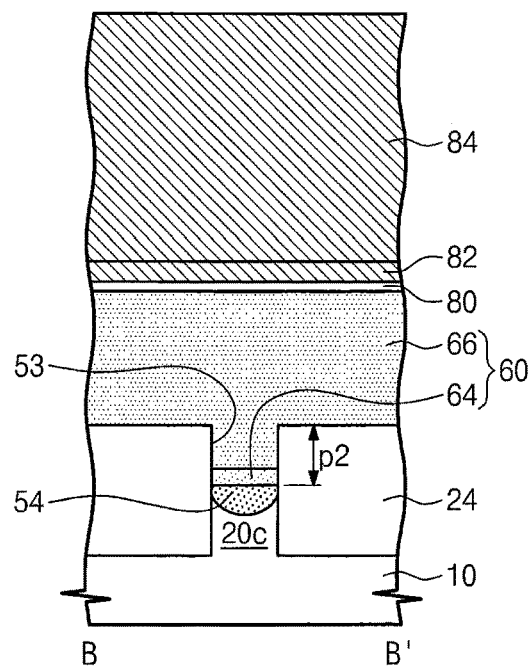
Figure 13C:
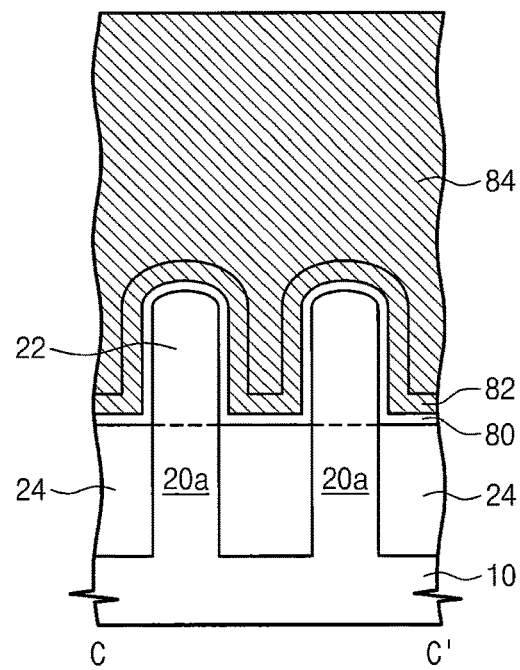
Figure 13C:
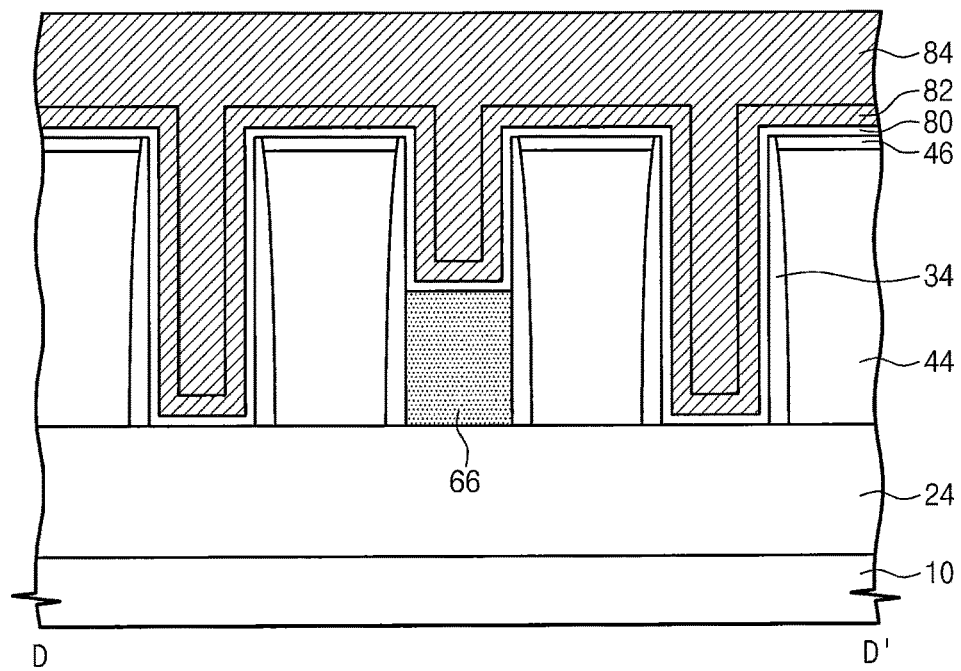

As shown in FIGS. 13CA to 13CD, the first and second sacrificial gates 30a, 30b and the sacrificial gate dielectric layers 28 are selectively removed. A portion of the filling insulation layer 66 may be removed during the removal of the sacrificial gate dielectric layers 28, so a top surface of the filling insulation layer 66 may be substantially coplanar with the top surfaces of the first and second fin subregions 20a, 20b. Alternatively, the top surface of the filling insulation layer 66 may be higher than the top surfaces of the first and second fin subregions 20a, 20b. Thereafter, a gate dielectric layer 80, a first gate conductive layer 82, and a second gate conductive layer 84 may be sequentially formed. The gate dielectric layer 80, the first gate conductive layer 82, and the second gate conductive layer 84 may be formed of the same materials as described with reference to FIGS. 8LA to 8LD by the same processes as described with reference to FIGS. 8LA to 8LD.

Figure 13D:
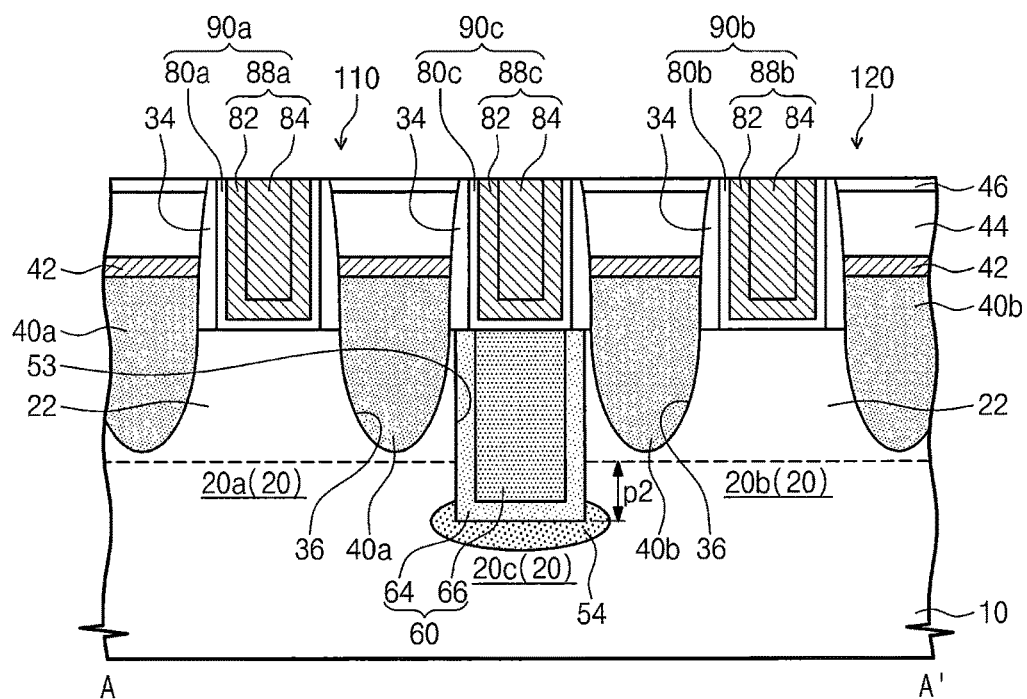
Figure 13D:
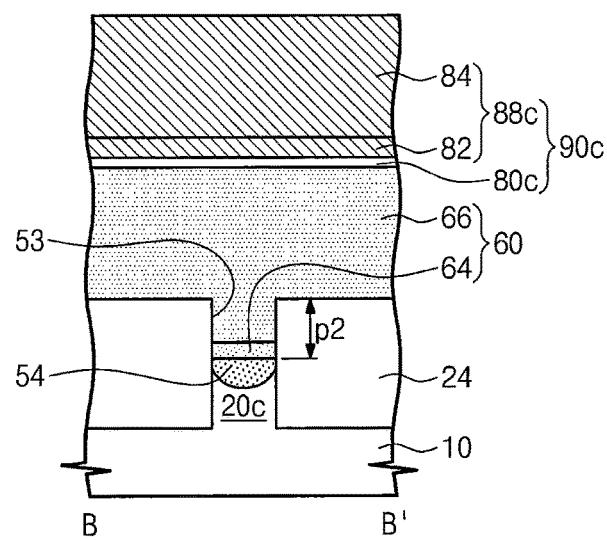
Figure 13D:
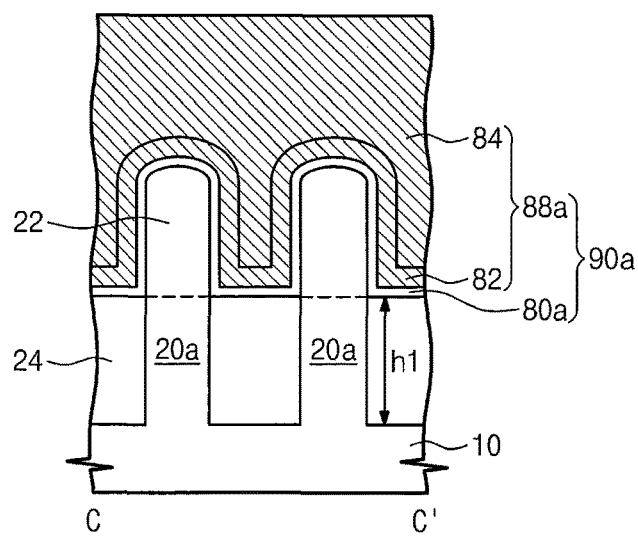
Figure 13D:
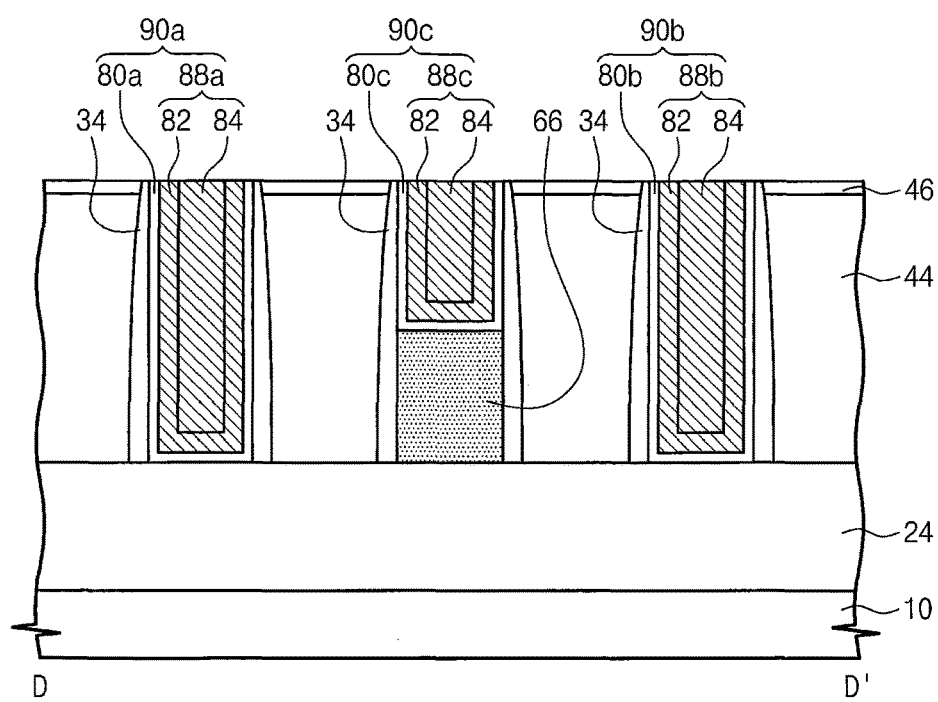

As shown in FIGS. 13DA to 13DD, the gate dielectric layer 80, the first gate conductive layer 82, and the second gate conductive layer 84 may be planarized by, for example, a CMP process. Thus, a first gate 90a including a first gate dielectric layer 80a and a first gate electrode 88a may be formed on the first fin subregion 20a, a second gate 90b including a second gate dielectric layer 80b and a second gate electrode 88b may be formed on the second fin subregion 20b, and a third gate 90c including a third gate dielectric layer 80c and a third gate electrode 88c may be formed on the second isolation insulating layer 60. Each of the first to third gate electrodes 88a, 88b and 88c may include the first gate conductive layer 82 and the second gate conductive layer 84. A height of the third gate 90c disposed on the second isolation insulating layer 60 may be substantially equal to heights of the first and second gates 90a, 90b disposed on the first and second fin subregions 20a, 20b. Alternatively, the height of the third gate 90c disposed on the second isolation insulating layer 60 may be smaller than the heights of the first and second gates 90a, 90b disposed on the first and second fin subregions 20a, 20b. On the other hand, a height of the third gate 90c disposed on the first isolation insulating layer 24 may be smaller than heights of the first and second gates 90a, 90b disposed on the first isolation insulating layer 24. For example, on the first isolation insulating layer 24, the height of the third gate 90c may be smaller than the heights of the first and second gates 90a, 90b by a height of the filling insulation layer 66. The filling insulation layer 66 may extend in the second direction Y, and the third gate 90c may extend on the filling insulation layer 66 in the second direction Y. In some embodiments, if the filling insulation layer 66 is a discrete isolation insulating island, the third gate 90c may cover sidewalls and a top surface of the second isolation insulating layer 60 and may extend in the second direction Y to intersect the first isolation insulating layer 24.

FIGS. 14AA to 14CD are cross-sectional views illustrating some processes of a method of manufacturing the semiconductor device according to the fifth embodiment of the inventive concepts. FIGS. 14AA to 14CA are cross-sectional views taken along a line A-A' of FIG. 5, and FIGS. 14AB to 14CB are cross-sectional views taken along a line B-B' of FIG. 5. FIGS. 14AC to 14CC are cross-sectional views taken along a line C-C' of FIG. 5, and FIGS. 14AD to 14CD are cross-sectional views taken along a line D-D' of FIG. 5. Hereinafter, the descriptions of elements already described above with respect to FIGS. 8AA to 8MD will be omitted or mentioned only briefly so that differences between the present embodiment and the embodiment of FIGS. 8AA to 8MD may be highlighted.

As shown in FIGS. 14AA to 14AD, a second isolation insulating layer 60 according to the present embodiment may have a height smaller than that of the filling insulation layer 66 described with reference to FIGS. 13BA to 13BD. For example, the filling insulation layer 66 illustrated in FIGS. 13AA to 13AD may be etched back to expose a portion of the second recess region 53, so the sidewalls of the oxide layer 64 may be partially exposed. A top surface of the filling insulation layer 66 may be lower than the top surfaces of the first and second fin subregions 20a, 20b.

Figure 14B:
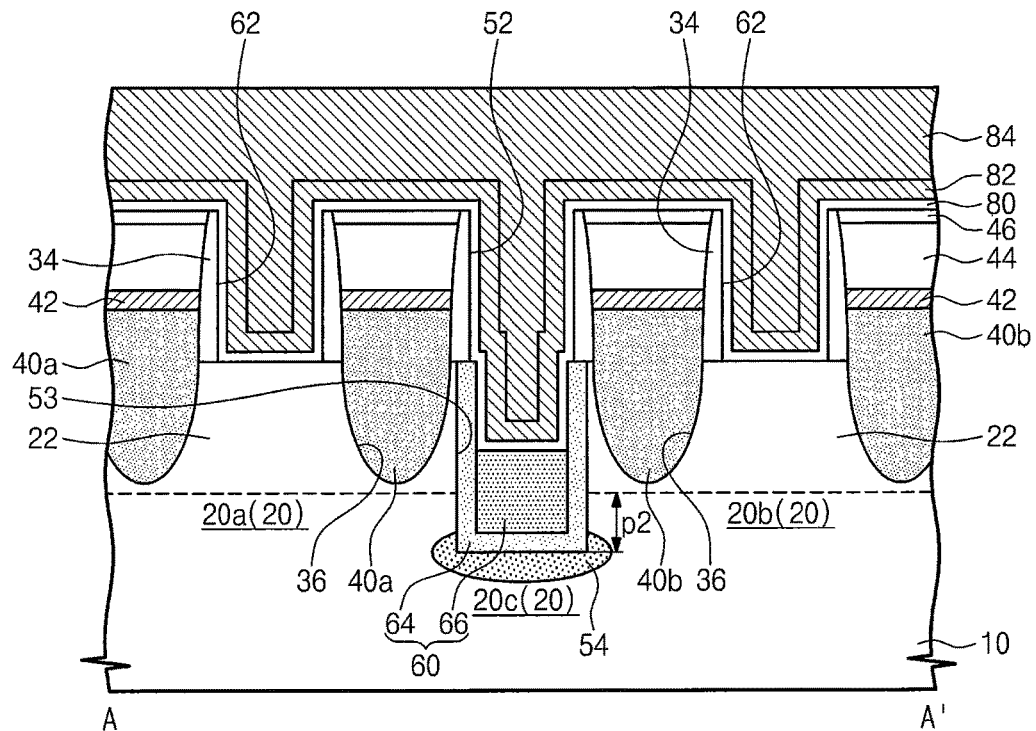
Figure 14B:
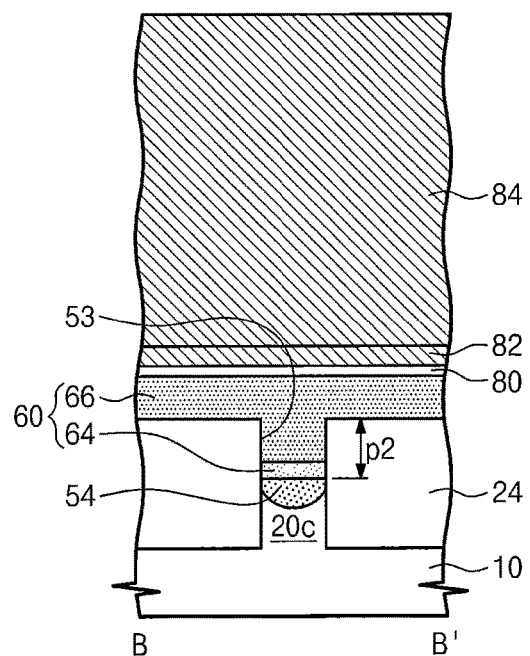
Figure 14B:
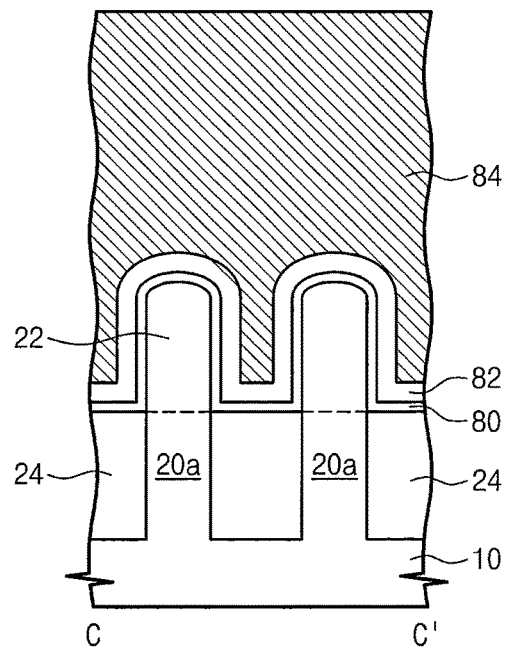
Figure 14B:
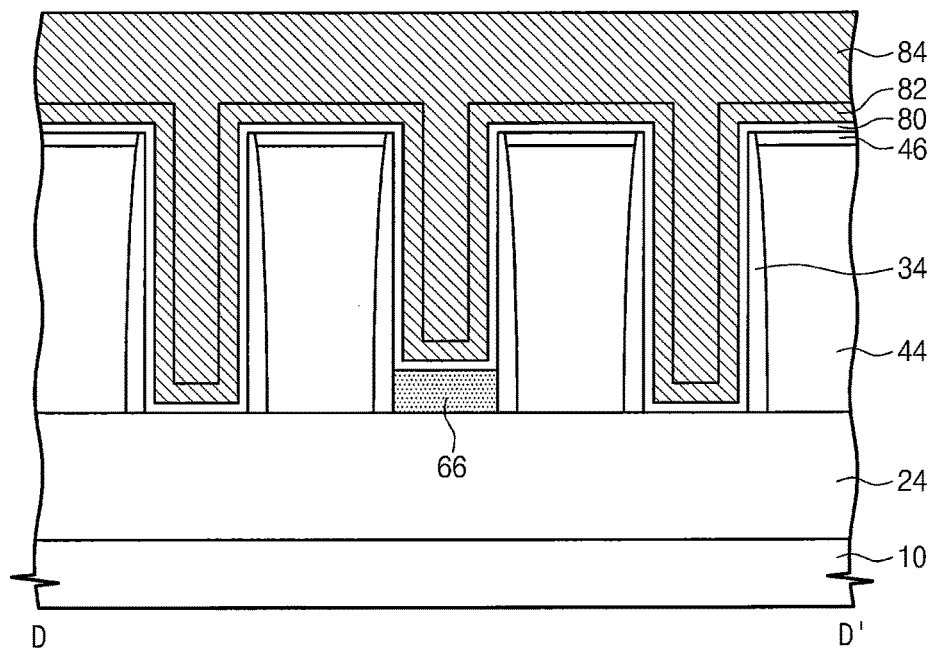

As shown in FIGS. 14BA to 14BD, the first and second sacrificial gates 30a, 30b and the sacrificial gate dielectric layers 28 are selectively removed. Thereafter, a gate dielectric layer 80, a first gate conductive layer 82, and a second gate conductive layer 84 may be sequentially formed. The gate dielectric layer 80, the first gate conductive layer 82, and the second gate conductive layer 84 may be formed of the same materials as described with reference to FIGS. 8LA to 8LD by the same processes as described with reference to FIGS. 8LA to 8LD.

Figure 14C:
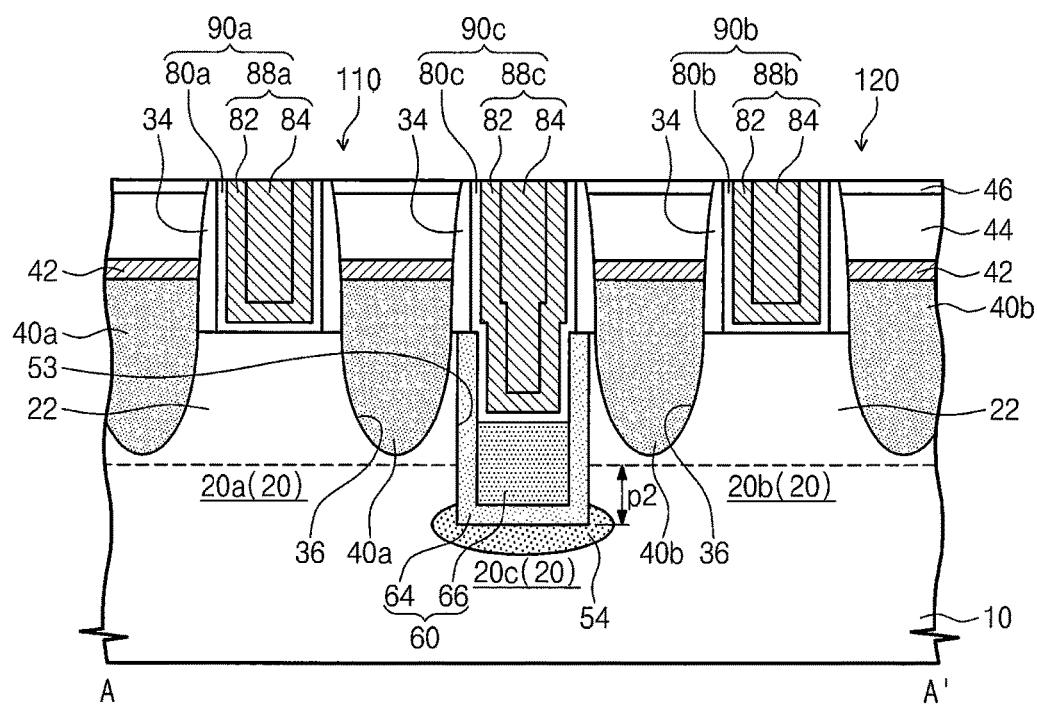
Figure 14C:
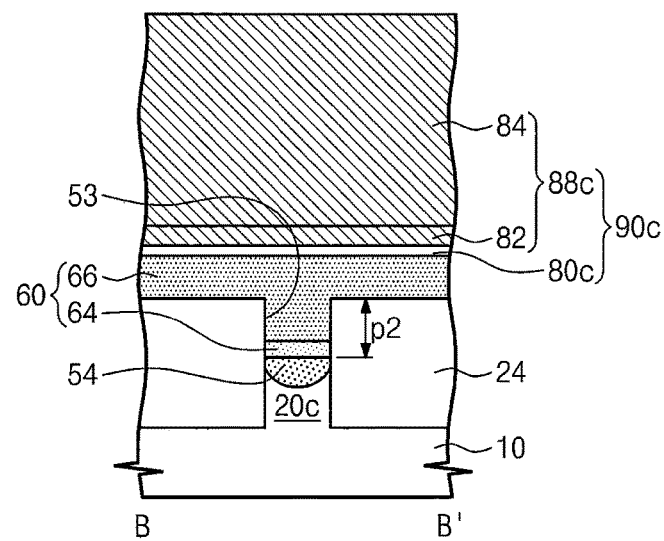
Figure 14C:
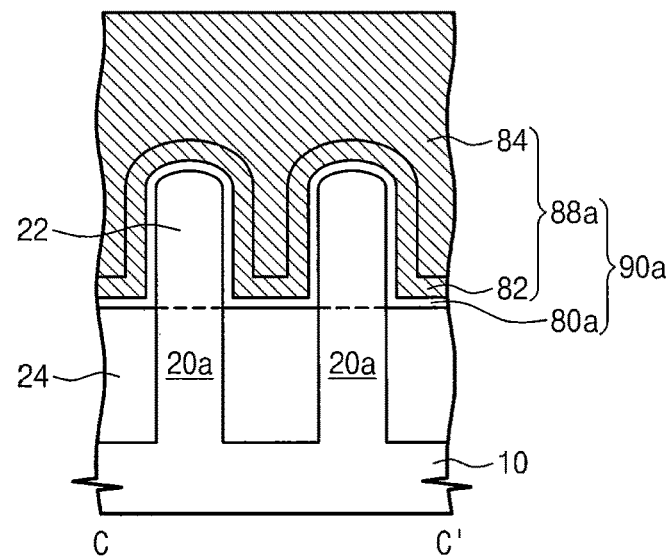
Figure 14C:
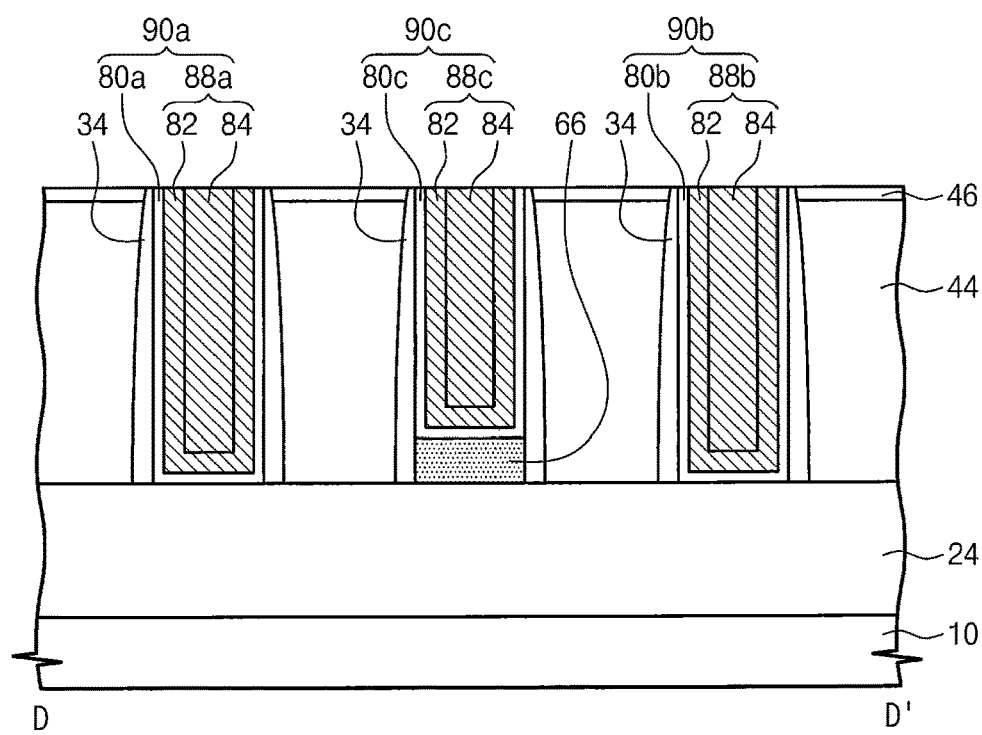

As shown in FIGS. 14CA to 14CD, the gate dielectric layer 80, the first gate conductive layer 82, and the second gate conductive layer 84 may be planarized by, for example, a CMP process. Thus, a first gate 90a including a first gate dielectric layer 80a and a first gate electrode 88a may be formed on the first fin subregion 20a, a second gate 90b including a second gate dielectric layer 80b and a second gate electrode 88b may be formed on the second fin subregion 20b, and a third gate 90c including a third gate dielectric layer 80c and a third gate electrode 88c may be formed on the second isolation insulating layer 60. Each of the first to third gate electrodes 88a, 88b and 88c may include the first gate conductive layer 82 and the second gate conductive layer 84. A height of the third gate 90c disposed on the second isolation insulating layer 60 may be greater than the heights of the first and second gates 90a, 90b disposed on the first and second fin subregions 20a, 20b. For example, a bottom surface of the third gate 90c disposed on the filling insulation layer 66 of the second isolation insulating layer 60 may be lower than the top surfaces of the first and second fin subregions 20a, 20b. On the other hand, a height of the third gate 90c disposed on the first isolation insulating layer 24 may be smaller than heights of the first and second gates 90a, 90b disposed on the first isolation insulating layer 24. For example, on the first isolation insulating layer 24, the height of the third gate 90c may be smaller than the heights of the first and second gates 90a, 90b by a height of the filling insulation layer 66. The filling insulation layer 66 may extend in the second direction Y, and the third gate 90c may extend on the filling insulation layer 66 in the second direction Y. In some embodiments, if the filling insulation layer 66 is a discrete isolation insulating island, the third gate 90c may cover sidewalls and a top surface of the second isolation insulating layer 60 and may extend in the second direction Y to intersect the first isolation insulating layer 24.

Figure 15A:
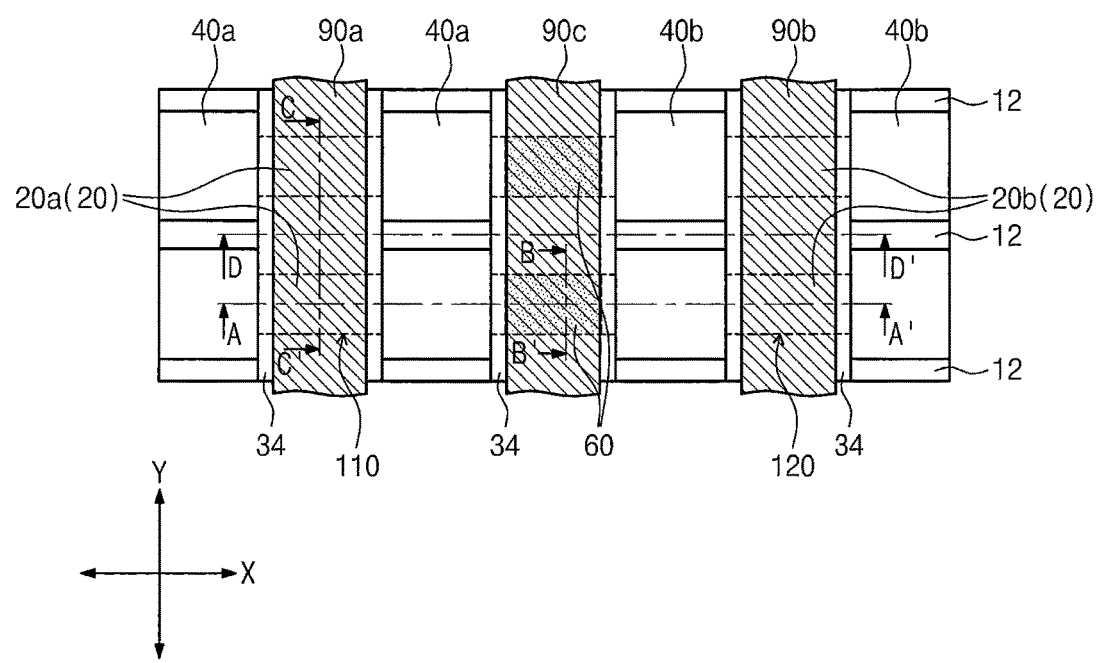
FIG. 15A is a plan view illustrating semiconductor devices according to a sixth embodiment of the inventive concepts.

FIG. 15A is a plan view illustrating a semiconductor device according to a sixth embodiment of the inventive concepts. FIGS. 15B, 15C, 15D, and 15E are cross-sectional views taken along lines A-A', B-B', C-C', and D-D' of FIG. 15A, respectively.

As shown in FIGS. 15A to 15E, a semiconductor device according to a sixth embodiment of the inventive concepts may include fin regions 20, a first gate 90a, a second gate 90b, and a third gate 90c, a first isolation insulating layer 12, and a second isolation insulating layer 60, and first and second source/drain regions 40a, 40b.

Each of the fin regions 20 may extend in a first direction (e.g., an X-axis direction) and may include a first fin subregion 20a and a second fin subregion 20b which are isolated from each other. The fin regions 20 may be provided on the first isolation insulating layer 12. The fin regions 20 may be separated from each other in a second direction (e.g., a Y-axis direction) different from the first direction X. Bottom surfaces of the fin regions 20 may be in contact with a top surface of the first isolation insulating layer 12. The first direction X and the second direction Y may intersect each other. For example, the first direction X and the second direction Y may be perpendicular to each other. However, the inventive concepts are not limited thereto. The fin regions 20 may be patterns that include a semiconductor material and are formed on the first isolation insulating layer 12. FIGS. 15A to 15E illustrate two fin regions 20 separated from each other in the second direction Y as an example. However, the inventive concepts are not limited thereto.

A substrate may be a semiconductor-on-insulator (SOI) substrate. The substrate may include a lower semiconductor layer 10, the first isolation insulating layer 12, and an upper semiconductor layer. The upper semiconductor layer may be patterned to form a plurality of fin regions 20 on the first isolation insulating layer 12. The lower semiconductor layer 10 may include at least one semiconductor material selected from a group consisting of silicon (Si), germanium (Ge), silicon-germanium (SiGe), gallium-phosphorus (GaP), gallium-arsenic (GaAs), silicon-carbon (SiC), silicon-germanium-carbon (SiGeC), indium-arsenic (InAs), or indium-phosphorus (InP). The fin regions 20 formed from the upper semiconductor layer may include at least one semiconductor material selected from a group consisting of silicon (Si), germanium (Ge), silicon-germanium (SiGe), gallium-phosphorus (GaP), gallium-arsenic (GaAs), silicon-carbon (SiC), silicon-germanium-carbon (SiGeC), indium-arsenic (InAs), or indium-phosphorus (InP). The first isolation insulating layer 12 may be a buried oxide layer. The first isolation insulating layer 12 may be formed using, for example, a separation by implanted oxygen (SIMOX) method, or an oxidation method, or a deposition method.

Each of the fin regions 20 may have a length and a width. The first direction X may be parallel to a length direction of each of the fin regions 20, and the second direction Y may be parallel to a width direction of each of the fin regions 20. One end of the first fin subregion 20a may face one end of the second fin subregion 20b in the first direction X.

The first and second fin subregions 20a, 20b may be used as active regions and channel regions of fin field effect transistors (FINFETs). For example, an N-type transistor (e.g., an NMOS transistor) or a P-type transistor (e.g., PMOS transistor) may be formed on the first fin subregion 20a and/or the second fin subregion 20b. For example, a first transistor 110 may be formed on the first fin subregion 20a, and a second transistor 120 may be formed on the second fin subregion 20b. The first transistor 110 may include a first gate 90a and first source/drain regions 40a. The second transistor 120 may include a second gate 90b and second source/drain regions 40b.

The second isolation insulating layer 60 may be disposed between the first fin subregion 20a and the second fin subregion 20b to isolate the first fin subregion 20a from the second fin subregion 20b in the first direction X. The first transistor 110 and the second transistor 120 may be isolated from each other by the second isolation insulating layer 60. The second isolation insulating layer 60 may be a discrete isolation insulating island (e.g., an island-shaped pattern) and may be provided in plurality. For example, a plurality of second isolation insulating layers 60 may be spaced apart from each other in the second direction Y to be aligned with each other. The second isolation insulating layer 60 may be an oxide layer formed by oxidizing a portion of the fin region 20. For example, the portion of the fin region 20 provided on the first isolation insulating layer 12 may be oxidized to self-alignedly form the second isolation insulating layer 60. A top surface of the second isolation insulating layer 60 may be curved. A bottom surface of the second isolation insulating layer 60 may be substantially coplanar with the top surface of the first isolation insulating layer 12. The top surface of the isolation insulating layer 60 may be substantially coplanar with or lower than top surfaces of the first and second fin subregions 20a, 20b.

Sidewalls of the second isolation insulating layer 60 may be in contact with a sidewall of the first fin subregion 20a and a sidewall of the second fin subregion 20b, respectively. A width in the second direction Y of the second isolation insulating layer 60 may be substantially equal to widths in the second direction Y of the first and second fin subregions 20a, 20b. However, the inventive concepts are not limited thereto. In other embodiments, the width in the second direction Y of the second isolation insulating layer 60 may be less or greater than the widths in the second direction Y of the first and second fin subregions 20a, 20b.

Figure 15B:
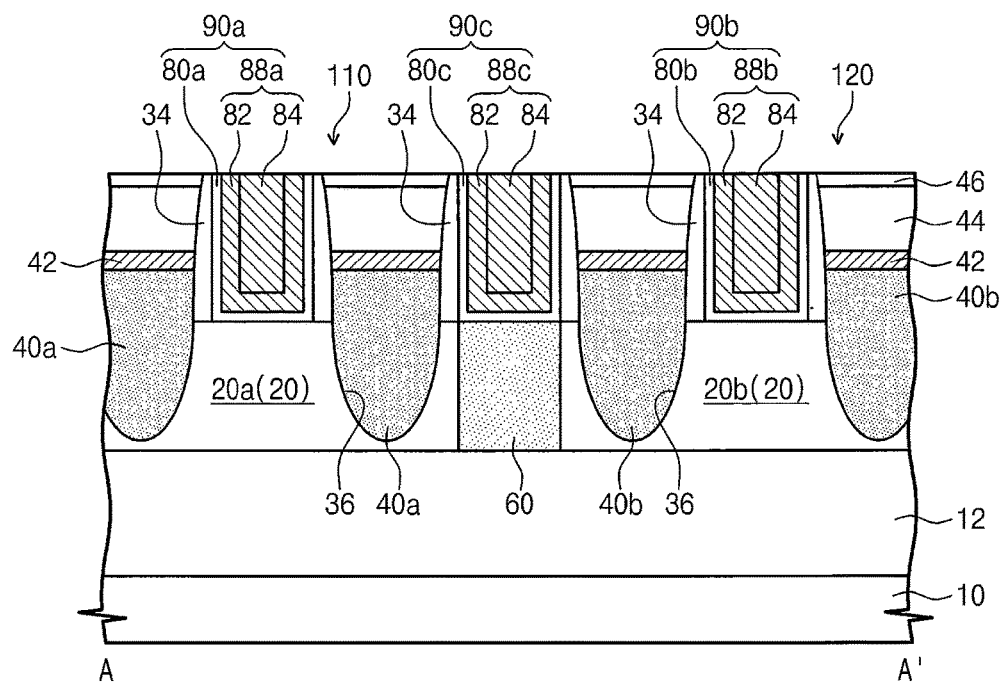
FIGS. 15B, 15C, 15D, and 15E are cross-sectional views taken along lines A-A', B-B', C-C', and D-D' of FIG. 15A, respectively.
Figure 15C:
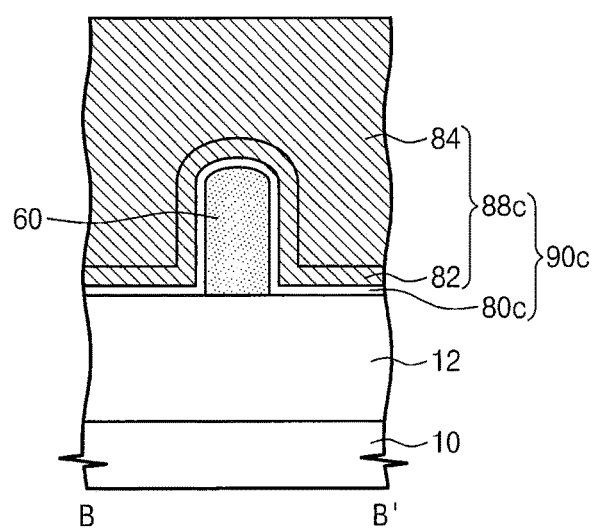
Figure 15D:
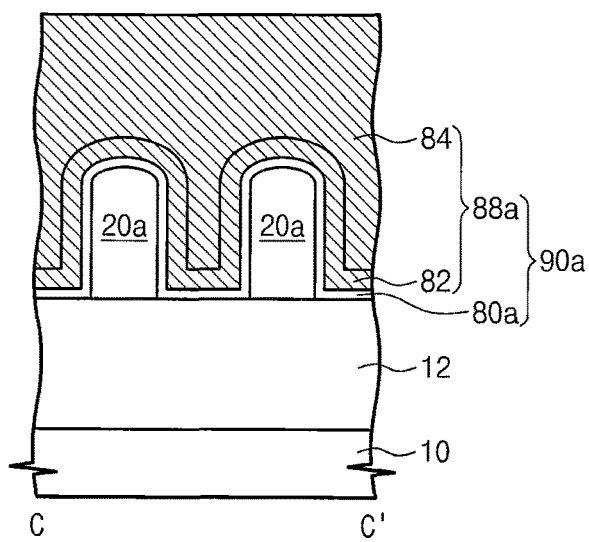
Figure 15E:
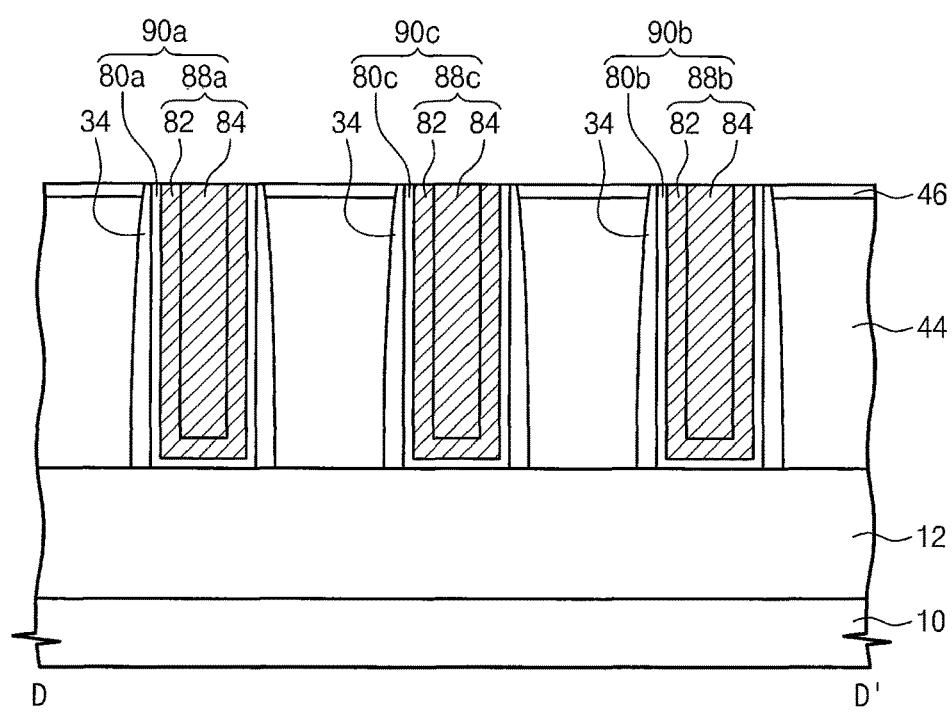

The first gate 90a crossing over the first fin subregion 20a and the second gate 90b crossing over the second fin subregion 20b may extend in the second direction Y. The first gate 90a may cover sidewalls and a top surface of the first fin subregion 20a thereunder and may extend in the second direction Y to intersect the first isolation insulating layer 12. The second gate 90b may cover sidewalls and a top surface of the second fin subregion 20b thereunder and may extend in the second direction Y to intersect the first isolation insulating layer 12. The third gate 90c may cover sidewalls and a top surface of the second isolation insulating layer 60 and may extend in the second direction Y to cross the first isolation insulating layer 12. For example, the third gate 90c may cover the sidewalls and the top surface of the second isolation insulating layer 60 exposed between gate spacers 34 adjacent to both sidewalls of the third gate 90c and may extend in the second direction Y to cross the first isolation insulating layer 12. The first and second gates 90a, 90b may be uses as normal gates for operating transistors, but the third gate 90c may be used as a dummy gate which is not used for operating a transistor. Alternatively, the third gate 90c may be used as an interconnection for transmitting a signal or a normal gate. A width of the third gate 90c may be substantially equal to or smaller than widths of the first and second gates 90a, 90b. FIGS. 15A and 15B illustrate a single third gate 90c disposed on a single second isolation insulating layer 60 as an example. However, the inventive concepts are not limited thereto. In other embodiments, two or more third gates 90c may be disposed on a single second isolation insulating layer 60.

The first gate 90a may include a first gate electrode 88a and a first gate dielectric layer 80a. The second gate 90b may include a second gate electrode 88b and a second gate dielectric layer 80b. The third gate 90c may include a third gate electrode 88c and a third gate dielectric layer 80c.

The first and second gate dielectric layers 80a, 80b may be disposed between the first and second fin subregions 20a, 20b and the first and second gate electrodes 88a and 88b, respectively. In addition, the third gate dielectric layer 80c may be disposed between the third gate electrode 88c and the second isolation insulating layer 60. Each of the gate dielectric layers 80a, 80b, 80c may surround sidewalls and a bottom surface of a corresponding one of the first to third gate electrodes 88a, 88b, 88c and may extend in the second direction Y. Each of the first and second gate dielectric layers 80a, 80b may cover the sidewalls and the top surface of the corresponding one of the first and second fin subregions 20a, 20b together with each of the first and second gate electrodes 80a, 88b and may extend in the second direction Y. The third gate dielectric layer 80c may cover the sidewalls and the top surface of the second isolation insulating layer 60 together with the third gate electrode 88c and may extend in the second direction Y. The gate dielectric layers 80a, 80b, 80c may intersect the first isolation insulating layer 12 and may extend in the second direction Y. Each of the gate dielectric layers 80a, 80b, 80c may include a high-k dielectric material having a dielectric constant higher than that of silicon oxide. For example, Each of the gate dielectric layers 80a, 80b, 80c may include at least one of, but not limited to, hafnium oxide (e.g., $HfO_2$), hafnium-silicon oxide, lanthanum oxide (e.g., $La_2O_3$), lanthanum-aluminum oxide, zirconium oxide (e.g., $ZrO_2$), zirconium-silicon oxide, tantalum oxide (e.g., $Ta_2O_5$), titanium oxide, barium-strontium-titanium oxide, barium-titanium oxide, strontium-titanium oxide, yttrium oxide, aluminum oxide (e.g., $Al_2O_3$), lead-scandium-tantalum oxide, or lead-zinc niobate.

A width of a lower portion of the third gate electrode 88c may be smaller than a width of an upper portion of the second isolation insulating layer 60. A top surface of the first gate electrode 88a, a top surface of the second gate electrode 88b, and a top surface of the third gate electrode 88c may be substantially coplanar with each other. For example, the top surfaces of the gate electrodes 88a, 88b, 88c may be in the same plane through a planarization process. Top surfaces of the gate dielectric layers 80a, 80b, 80c may also be substantially coplanar with the top surfaces of the gate electrodes 88a, 88b, 88c, respectively. Heights of the first and second gates 90a, 90b disposed on the first and second fin subregions 20a, 20b may be substantially equal to a height of the third gate 90c disposed on the second isolation insulating layer 60. For example, heights of the first and second gate electrodes 88a and 88b disposed on the first and second fin subregions 20a, 20b may be substantially equal to a height of the third gate electrode 88c disposed on the second isolation insulating layer 60. Accordingly, if the third gate electrode 88c is used as a signal interconnection or a normal gate electrode, the third gate electrode 88c has the same thickness as other gate electrodes 88a, 88b to reduce/prevent a signal delay phenomenon through the third gate electrode 88c. As a result, characteristics of the semiconductor device according to the inventive concepts may be improved. Alternatively, the heights of the first and second gate electrodes 88a and 88b disposed on the first and second fin subregions 20a, 20b may be greater than the height of the third gate electrode 88c disposed on the second isolation insulating layer 60.

Each of the first and second gate electrodes 88a and 88b may include a first gate conductive layer 82 and a second gate conductive layer 84. The first gate conductive layer 82 may be disposed between the second gate conductive layer 84 and the first and second gate dielectric layers 80a, 80b to control a work function of a corresponding one of the first and second gate electrodes 88a, 88b. The second gate conductive layer 84 may fill a space formed by the first gate conductive layer 82. The first gate conductive layer 82 may include a metal. For example, the first gate conductive layer 82 may include at least one of titanium nitride (TiN), tantalum nitride (TaN), titanium carbide (TiC), titanium-aluminum (TiAl), titanium-aluminum carbide (TiAlC), titanium-aluminum nitride (TiAlN), tantalum carbide (TaC), or tantalum-aluminum nitride (TaAlN). The second gate conductive layer 84 may include a metal. For example, the second conductive layer 84 may include tungsten (W) or aluminum (Al). The third gate electrode 88c may include a first gate conductive layer 82 and a second gate conductive layer 84. The first gate conductive layer 82 of the third gate electrode 88c may be disposed between the third gate dielectric layer 80c and the second gate conductive layer 84, and the second gate conductive layer 84 of the third gate electrode 88c may fill a space formed by the first gate conductive layer 82 of the third gate electrode 88c. The first and second gate conductive layers 82, 84 of the third gate electrode 88c may be formed of the same materials as the first and second gate conductive layers 82, 84 of each of the first and second gate electrodes 88a, 88b, respectively. The first to third gate electrodes 88a, 88b, 88c may be formed by a replacement process or a gate last process. However, the inventive concepts are not limited thereto.

Gate spacers 34 may be formed to be adjacent to both sidewalls of each of the first to third gates 90a, 90b, 90c. The gate spacers 34 may extend in the second direction Y together with the first to third gates 90a, 90b, 90c. The gate dielectric layers 80a, 80b, 80c may extend to be disposed between the gate spacer 34 and each of the gate electrodes 88a, 88b, 88c. Top surfaces of the gate spacers 34 may be planarized to be substantially coplanar with the top surfaces of the gate electrodes 88a, 88b, 88c. The sidewalls of the second isolation insulating layer 60 which are parallel to the second direction Y may be substantially aligned with inner sidewalls of the gate spacers 34 adjacent to the both sidewalls of the third gate electrode 88c, or the top surface of the second isolation insulating layer 60 may overlap with and be in contact with portions of bottom surfaces of the gate spacers 34. The gate spacer 34 may include silicon nitride and/or silicon oxynitride.

The source/drain regions 40a, 40b including dopants may be disposed to be adjacent to the sidewalls of the first to third gates 90a, 90b, 90c. For example, the first source/drain regions 40a may be formed in the first fin subregion 20a adjacent to the both sidewalls of the first gate 90a, and the second source/drain regions 40b may be formed in the second fin subregion 20b adjacent to the both sidewalls of the second gate 90b. The first and second source/drain regions 40a, 40b may include an epitaxial layer including a semiconductor material. For example, the epitaxial layer including the semiconductor material may be formed in each of first recess regions 36 formed in the first fin subregion 20a and the second fin subregion 20b. In addition, the first and second source/drain regions 40a, 40b may protrude to be higher than the top surfaces of the first and second fin subregions 20a, 20b, so the first and second source/drain regions 40a, 40b may have elevated source/drain structures. A cross section of each of the first and second source/drain regions 40a, 40b may have a polygonal shape, an elliptical shape, or a circular shape. In some embodiments, at least one of the first and second source/drain regions 20a, 20b may not include the epitaxial layer. The first gate electrode 88a and the first source/drain region 40a may be isolated from each other by the gate spacer 34. In addition, the second gate electrode 88b and the second source/drain region 40b may be isolated from each other by the gate spacer 34. The third gate electrode 88c may be spaced apart from the first and second source/drain regions 40a, 40b by the gate spacer 34 and the second isolation insulating layer 60 self-alignedly formed, so a short and a leakage current between the third gate electrode 88c and the source/drain regions 40a, 40b may be impeded/prevented.

If the first transistor 110 and/or the second transistor 120 are the PMOS transistor, the first source/drain region 40a and/or the second source/drain region 40b may include a compressive stress material. The compressive stress material may be a material (e.g., SiGe) having a lattice constant greater than that of silicon. The compressive stress material may apply a compressive stress to the first fin subregion 20a under the first gate electrode 88a and/or the second fin subregion 20b under the second gate electrode 88b, thereby improving mobility of carries of a channel region.

If the first transistor 110 and/or the second transistor 120 are the NMOS transistor, the first source/drain region 40a and/or the second source/drain region 40b may include the same material as the fin regions 20 or a tensile stress material. For example, if the fin regions 20 are formed of silicon, the first source/drain region 40a and/or the second source/drain region 40b may include silicon or a material (e.g., SiC) having a lattice constant smaller than that of silicon.

A silicide layer 42 may be formed on each of the first and second source/drain regions 40a, 40b. The silicide layer 42 may include a metal. For example, the silicide layer 42 may include at least one of nickel (Ni), cobalt (Co), platinum (Pt), or titanium (Ti).

An interlayer insulating layer 44 may be formed on the silicide layer 42. The interlayer insulating layer 44 may partially fill a gap between the gate spacers 34. The interlayer insulating layer 44 may include silicon oxide or a low-k dielectric material having a dielectric constant lower than that of silicon oxide. The interlayer insulating layer 44 may include a porous insulating material. Meanwhile, an air gap may be formed in the interlayer insulating layer 44. Protection patterns 46 may be formed on the interlayer insulating layer 44. Top surfaces of the protection patterns 46 may be substantially coplanar with the top surfaces of the gate electrodes 88a, 88b, 88c. The protection patterns 46 may include a nitride and/or an oxynitride.

Figure 16A:
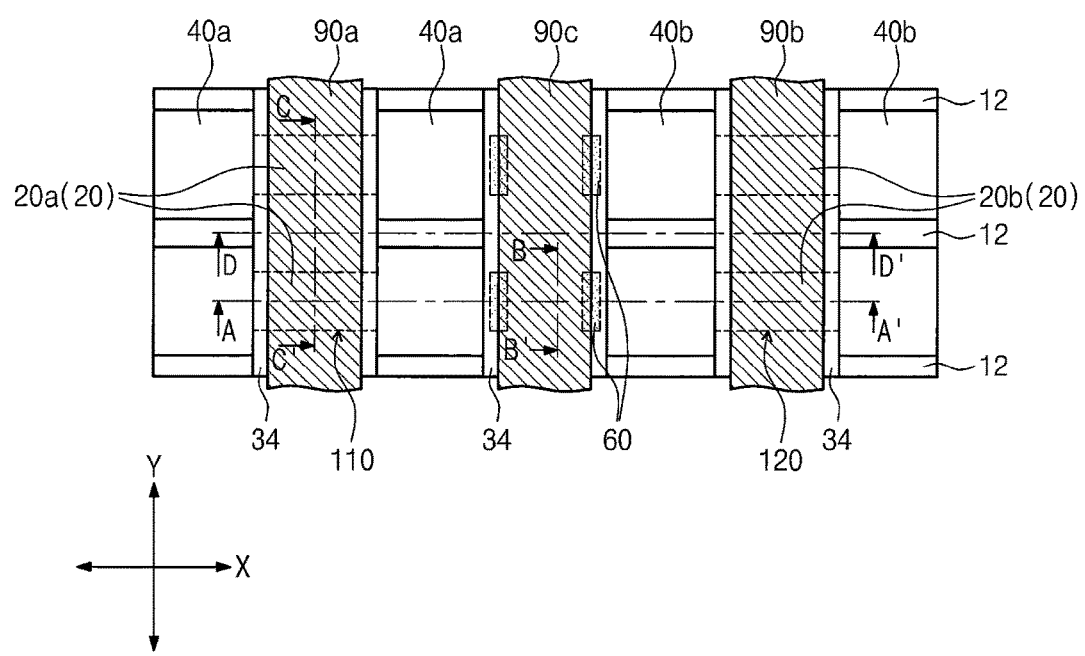
FIG. 16A is a plan view illustrating semiconductor devices according to a seventh embodiment of the inventive concepts.
Figure 16B:
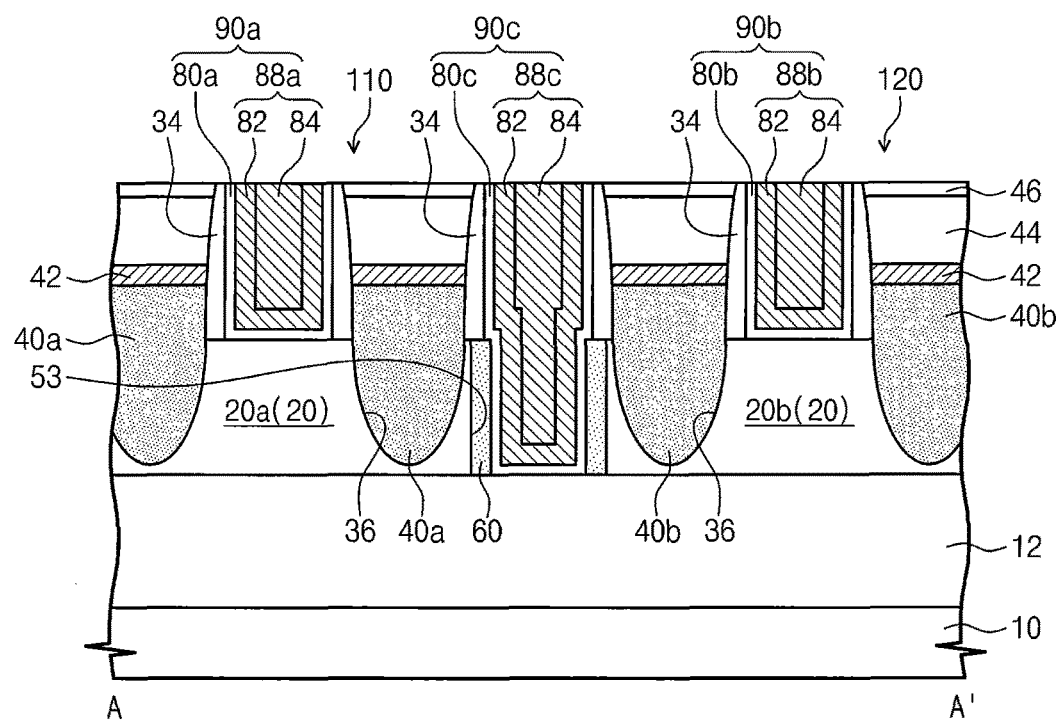
FIGS. 16B, 16C, 16D, and 16E are cross-sectional views taken along lines A-A', B-B', C-C', and D-D' of FIG. 16A, respectively.
Figure 16C:
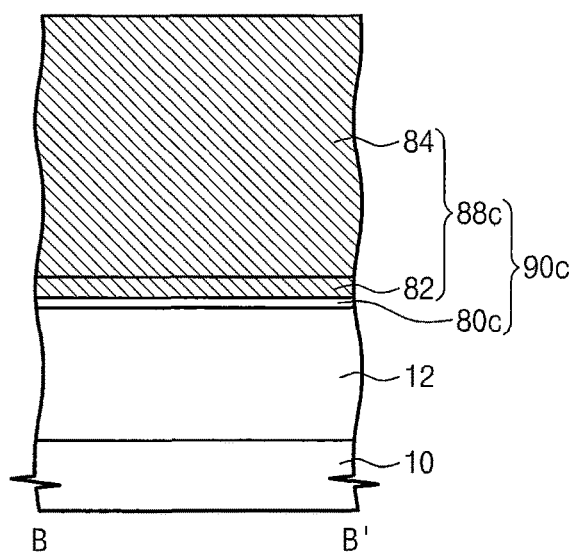
Figure 16D:
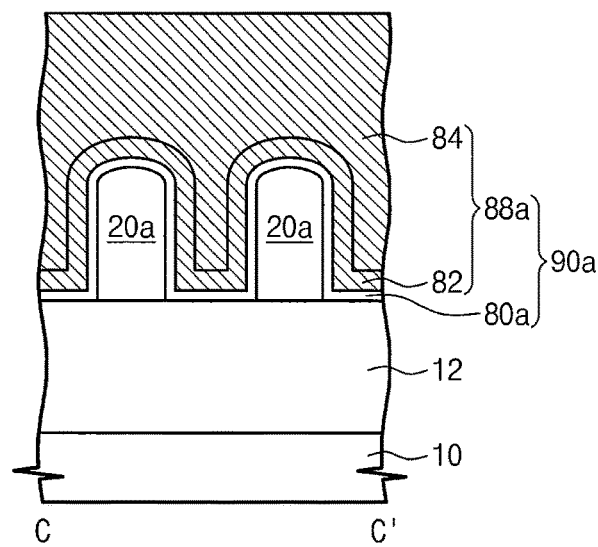
Figure 16E:
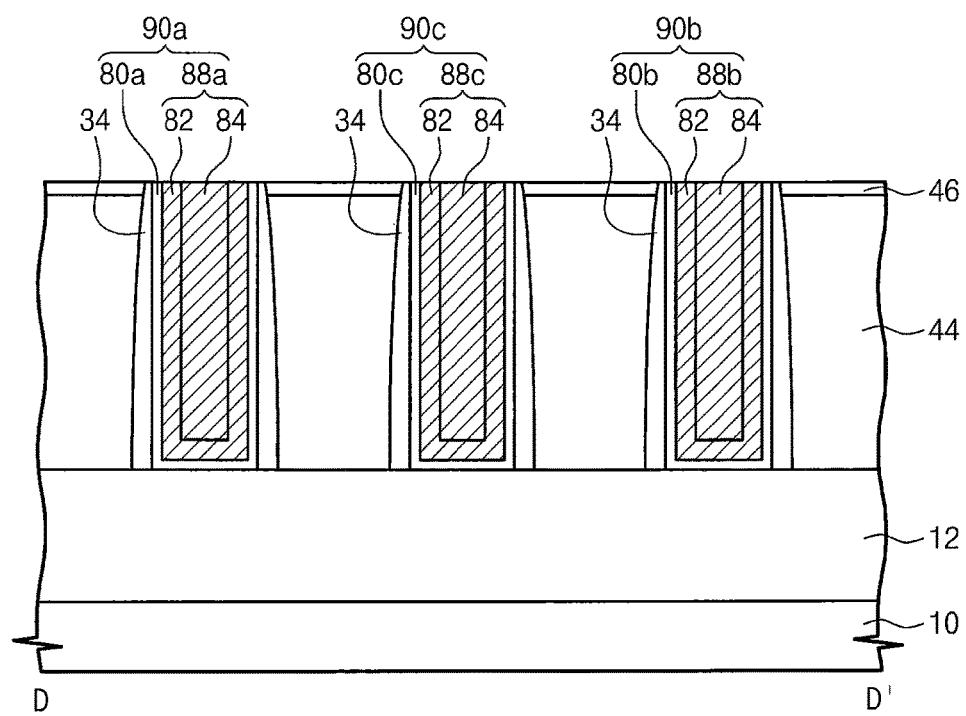

FIG. 16A is a plan view illustrating a semiconductor device according to a seventh embodiment of the inventive concepts. FIGS. 16B, 16C, 16D, and 16E are cross-sectional views taken along lines A-A', B-B', C-C', and D-D' of FIG. 16A, respectively. Hereinafter, the descriptions of elements already described above with respect to FIGS. 15A to 15E will be omitted or mentioned only briefly so that differences between the present embodiment and the embodiment of 15A to 15E may be highlighted.

As shown in FIGS. 16A to 16E, a semiconductor device according to a seventh embodiment of the inventive concepts may include a second isolation insulating layer 60 having a pair of insulating layers separated from each other. The second isolation insulating layer 60 may be in contact with the sidewalls of the first and second fin subregions 20a, 20b. For example, the second isolation insulating layer 60 may include oxide layers that are self-alignedly formed on the sidewall of the first fin subregion 20a and the sidewall of the second fin subregion 20b which face each other in the first direction X. For example, sidewalls of the fin region 20 exposed by a second recess region 53 formed in the fin region 20 may be self-alignedly oxidized to form the oxide layers of the second isolation insulating layer 60. For example, the sidewalls of the first and second fin subregions 20a, 20b exposed by the second recess region 53 may be selectively oxidized to form the second isolation insulating layer 60. A bottom surface of the second isolation insulating layer 60 may be in contact with the top surface of the first isolation insulating layer 12. A third gate 90c may cover inner sidewalls of the second isolation insulating layer 60 and may extend in the second direction Y. A portion of the third gate 90c may fill the second recess region 53. For example, portions of the third gate electrode 88c and the third gate dielectric layer 80c of the third gate 90c may be disposed between the inner sidewalls of the second isolation insulating layer 60 and may extend in the second direction Y.

The third gate 90c may extend on the first isolation insulating layer 12 in the second direction Y with a substantially uniform height. The third gate 90c may extend from the top surface of the gate spacer 34 to the top surface of the first isolation insulating layer 12, and sidewalls of the third gate 90c may be in contact with the gate spacers 34 and the second isolation insulating layer 60 under the gate spacers 34. A height of the third gate 90c at a position where the third gate 90c is in contact with the second isolation insulating layer 60 may be greater than the heights of the first and second gates 90a, 90b disposed on the first and second fin subregions 20a, 20b. Heights of the first to third gates 90a, 90b, 90c disposed on the first isolation insulating layer 12 between the fin regions 20 may be substantially equal to each other.

Figure 17A:
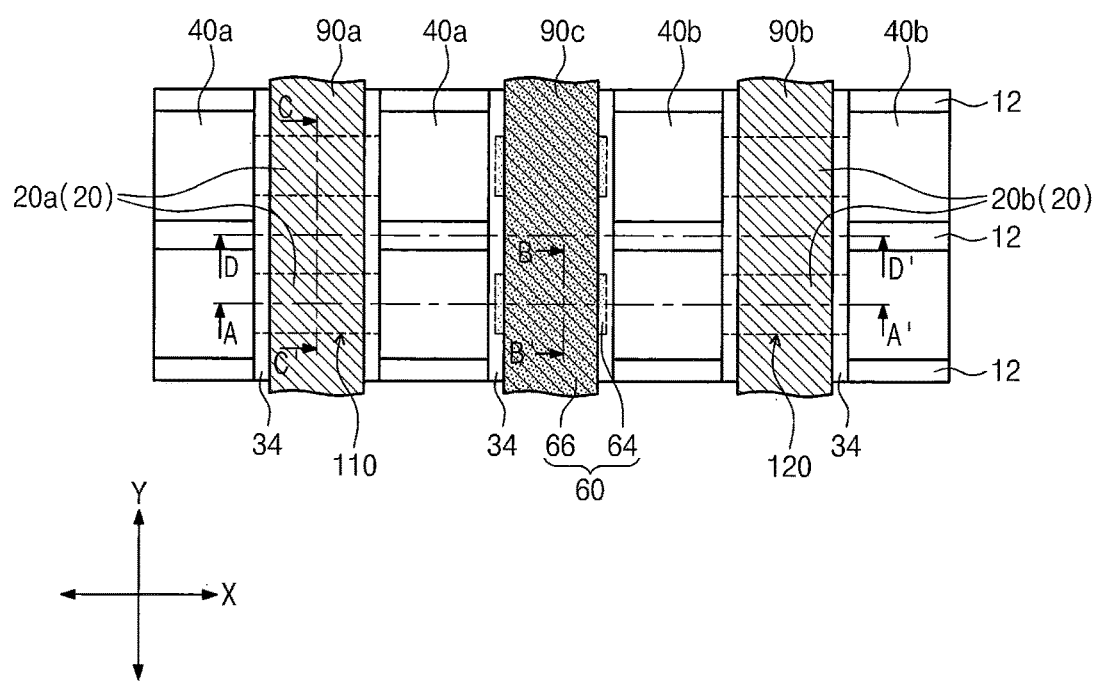
FIG. 17A is a plan view illustrating semiconductor devices according to an eighth embodiment of the inventive concepts.
Figure 17B:
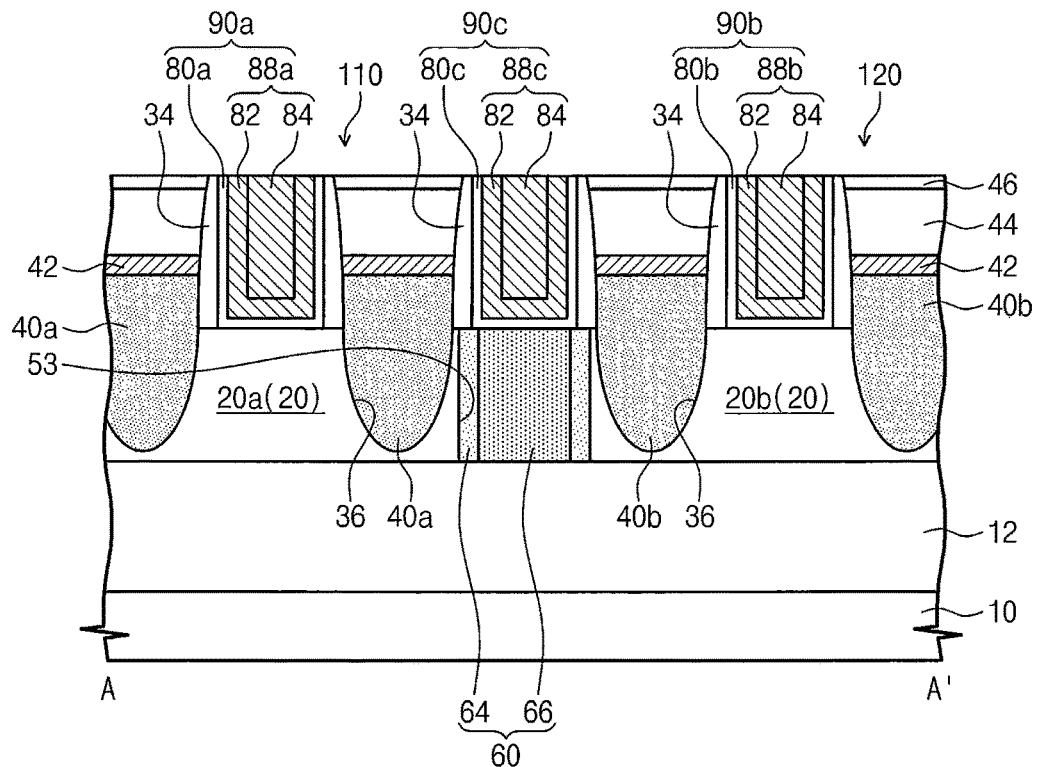
FIGS. 17B, 17C, 17D, and 17E are cross-sectional views taken along lines A-A', B-B', C-C', and D-D' of FIG. 17A, respectively.
Figure 17C:
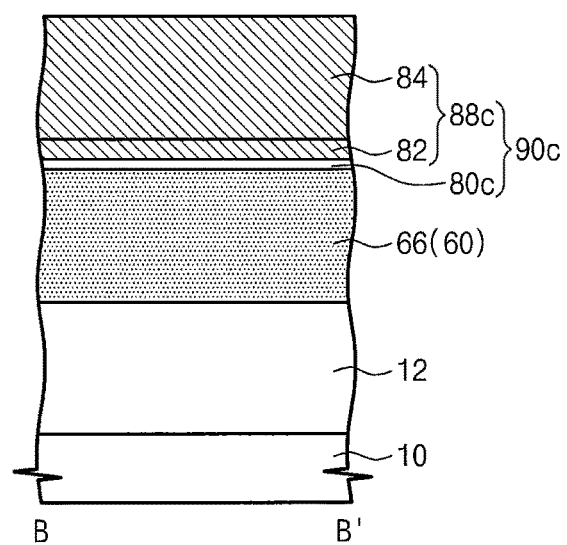
Figure 17D:
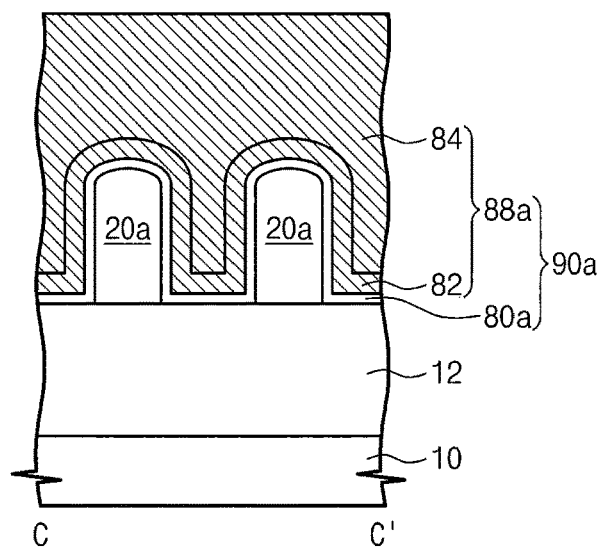
Figure 17E:
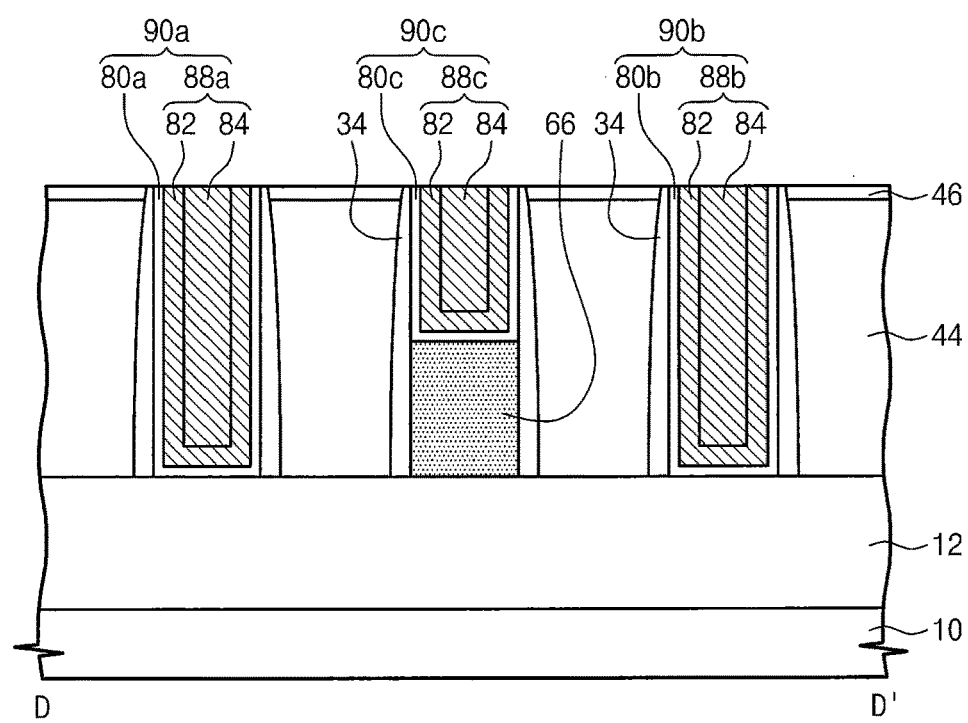

FIG. 17A is a plan view illustrating a semiconductor device according to an eighth embodiment of the inventive concepts. FIGS. 17B, 17C, 17D, and 17E are cross-sectional views taken along lines A-A', B-B', C-C', and D-D' of FIG. 17A, respectively. Hereinafter, the descriptions of elements already described above with respect to FIGS. 15A to 15E and 16A to 16E will be omitted or mentioned only briefly so that differences between the present embodiment and the embodiments of 15A to 15E and 16A to 16E may be highlighted.

As shown in FIGS. 17A to 17E, a semiconductor device according to an eighth embodiment of the inventive concepts may include may include a second isolation insulating layer 60 including an oxide layer 64 and a filling insulation layer 66. The oxide layer 64 may have the same structure and the same material as the second isolation insulating layer 60 described with reference to FIGS. 16A to 16E. The filling insulation layer 66 may fill the second recess region 53 having sidewalls on which the oxide layers 64 are formed. A top surface of the filling insulation layer 66 may be substantially coplanar with the top surfaces of the first and second fin subregions 20a, 20b. Alternatively, the top surface of the filling insulation layer 66 may be higher than the top surfaces of the first and second fin subregions 20a, 20b.

The filling insulation layer 66 may be in contact with the first isolation insulating layer 12 and may extend in the second direction Y. A height of the third gate 90c may be smaller than heights of the first and second gates 90a, 90b on the first isolation insulating layer 12 between the fin regions 20. The third gate 90c may extend on the second isolation insulating layer 60 in the second direction Y. In some embodiments, the filling insulation layer 66 may be a discrete isolation insulating island (e.g., an island-shaped pattern) like the second isolation insulating layer 60 illustrated in FIG. 15A. In this case, the third gate 90c may cover a top surface and sidewalls of at least the filling insulation layer 66 of the second isolation insulating layer 60 and may extend in the second direction Y to intersect the first isolation insulating layer 12.

In some embodiments, the filling insulation layer 66 may have a top surface lower than top surfaces of the oxide layers 64 and the top surfaces of the first and second fin subregions 20a, 20b, as described with reference to FIGS. 7A to 7D. In this case, the filling insulation layer 66 may be a linear pattern extending in the second direction Y or a discrete isolation insulating island. Like the third gate 90c described with reference to FIGS. 7A to 7D, a height of the third gate 90c disposed on the second isolation insulating layer 60 may be greater than the heights of the first and second gates 90a, 90b disposed on the first and second fin subregions 20a, 20b. On the other hand, on the first isolation insulating layer 12 between the fin regions 20, a height of the third gate 90c may be smaller than heights of the first and second gates 90a, 90b by a height of the filling insulation layer 66. The third gate 90c may extend on the second isolation insulating layer 60 in the second direction Y. Meanwhile, if the filling insulation layer 66 is a discrete isolation insulating island, the third gate 90c may cover a top surface and sidewalls of at least the filling insulation layer 66 of the second isolation insulating layer 60 and may extend in the second direction Y to cross the first isolation insulating layer 12.

Figure 18A:
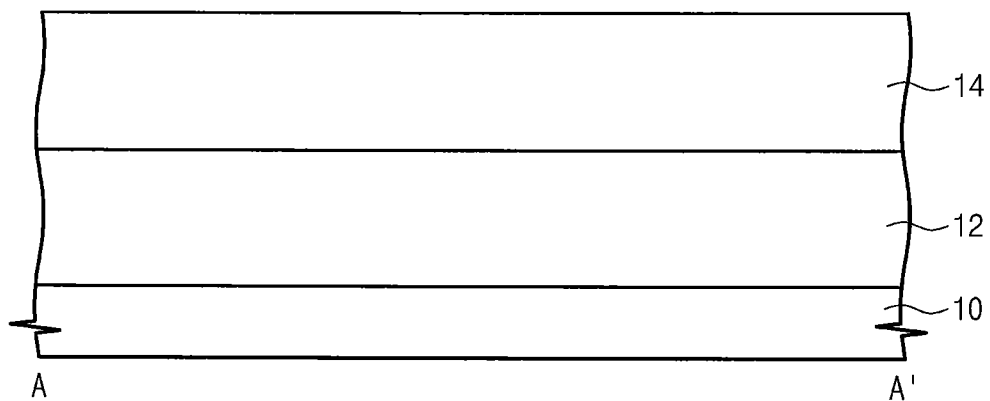
FIGS. 18AA to 18LA are cross-sectional views taken along line A-A' of FIG. 15A to illustrate a method of manufacturing a semiconductor device according to the sixth embodiment of the inventive concepts.
Figure 18A:
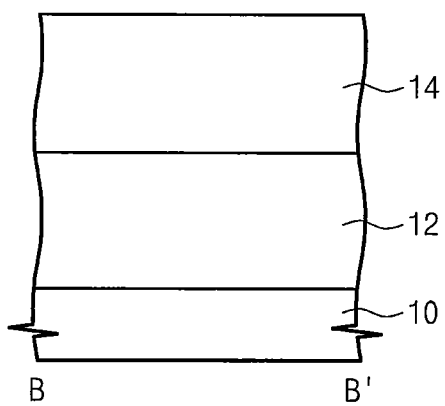
Figure 18A:
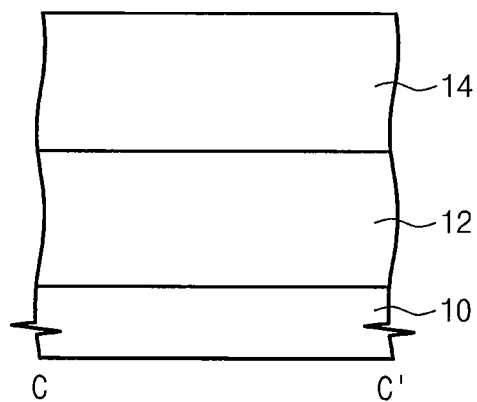
Figure 18A:
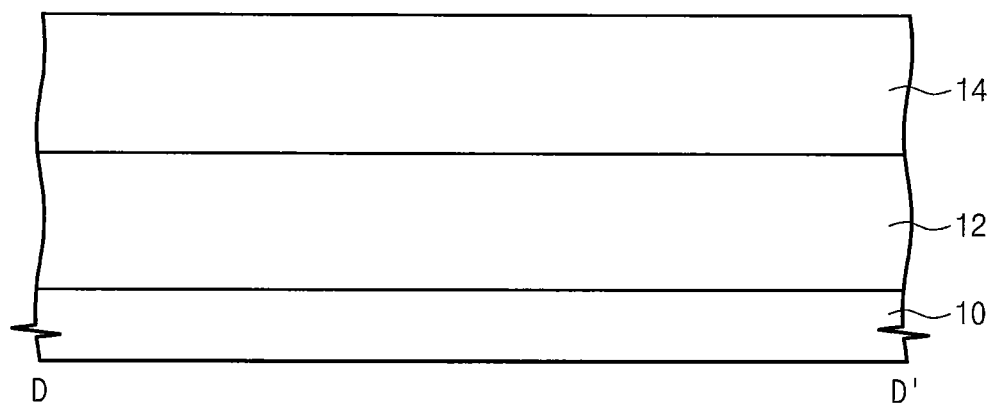

FIGS. 18AA to 18LD are cross-sectional views illustrating some processes of a method of manufacturing the semiconductor device according to the sixth embodiment of the inventive concepts. FIGS. 18AA to 18LA are cross-sectional views taken along a line A-A' of FIG. 15A, and FIGS. 18AB to 18LB are cross-sectional views taken along a line B-B' of FIG. 15A. FIGS. 18AC to 18LC are cross-sectional views taken along a line C-C' of FIG. 15A, and FIGS. 18AD to 18LD are cross-sectional views taken along a line D-D' of FIG. 15A.

As shown in FIGS. 18AA to 18AD, a semiconductor-on-insulator (SOI) substrate may be provided. The SOI substrate may include a lower semiconductor layer 10, a first isolation insulating layer 12, and an upper semiconductor layer 14 which are sequentially stacked. The lower and upper semiconductor layers 10 and 14 may include at least one semiconductor material selected from a group consisting of, for example, Si, Ge, SiGe, GaP, GaAs, SiC, SiGeC, InAs, or InP. The first isolation insulating layer 12 may be a buried oxide layer. The first isolation insulating layer 12 may be formed using, for example, a separation by implanted oxygen (SIMOX) method, or an oxidation method, or a deposition method.

Figure 18B:
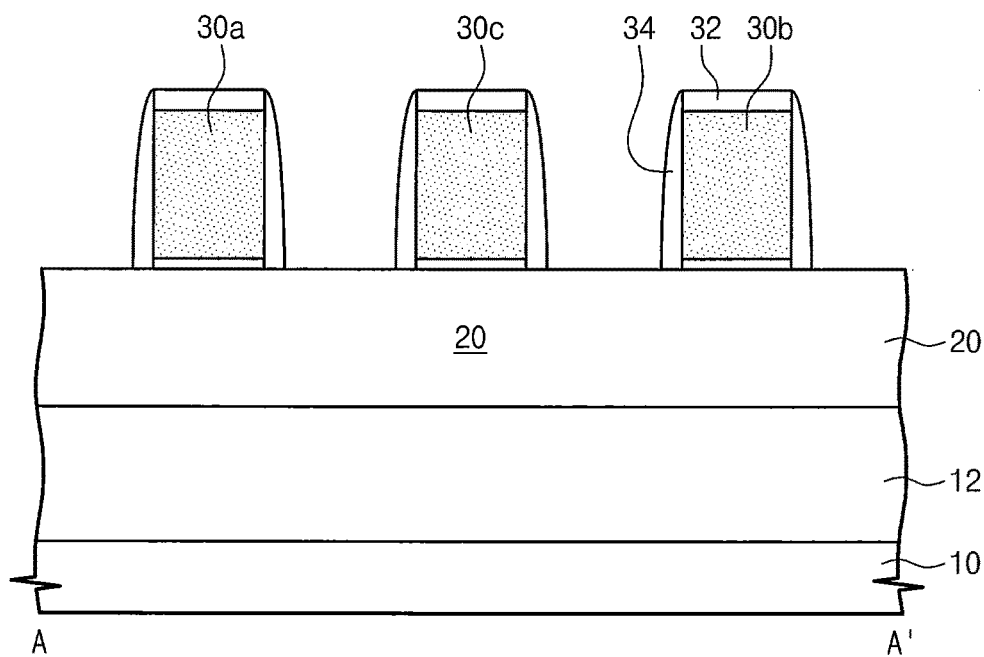
Figure 18B:
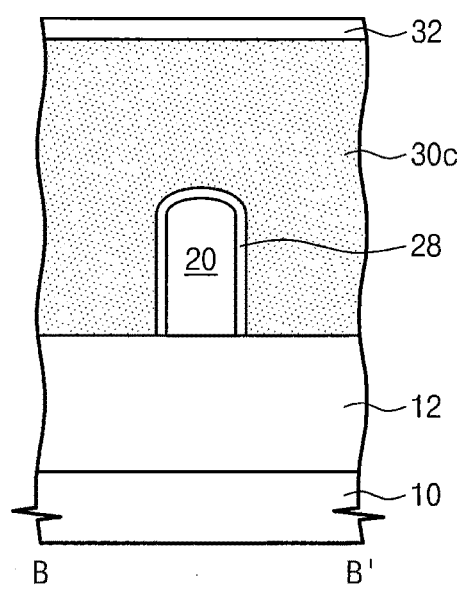
Figure 18B:
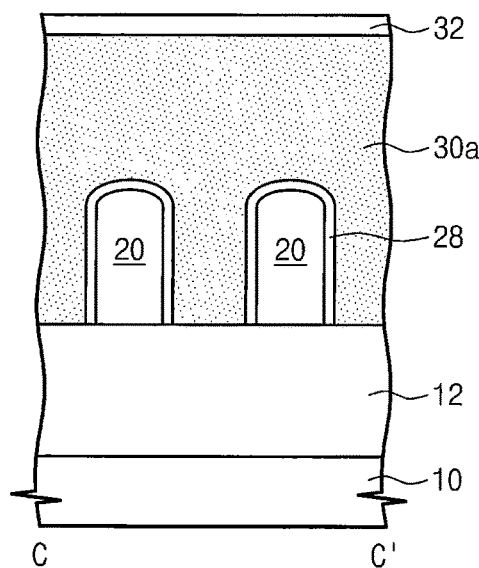
Figure 18B:
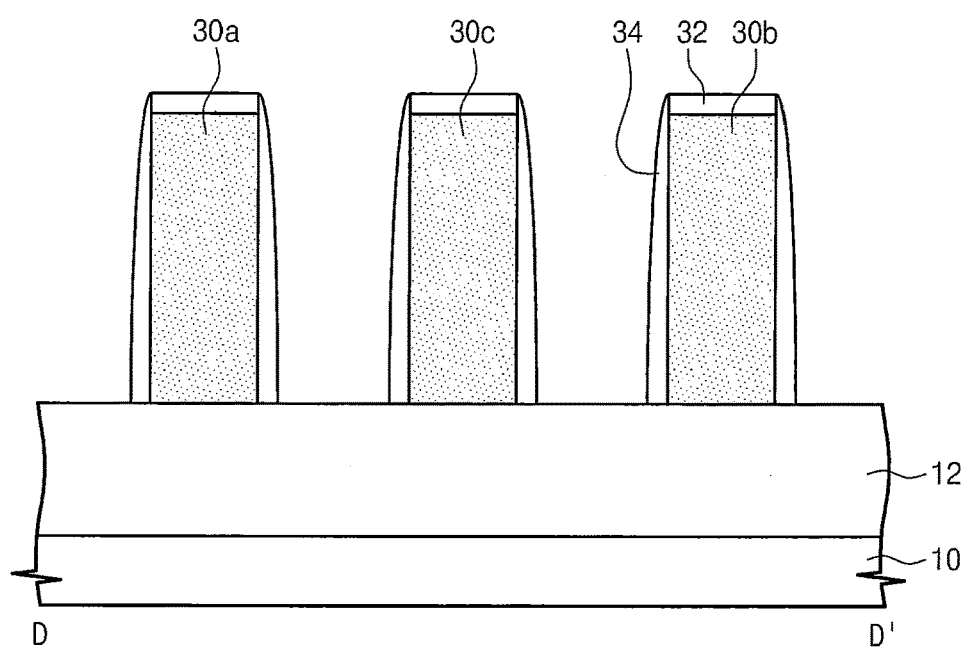

As shown in FIGS. 18BA to 18BD, the upper semiconductor layer 14 may be patterned to form fin regions 20 that extend in a first direction X and are spaced apart from each other in a second direction Y. The fin regions 20 may be isolated from each other in the second direction Y by the first isolation insulating layer 12. The first direction X may cross the second direction Y. For example, the first direction X may be perpendicular to the second direction Y. However, the inventive concepts are not limited thereto. Each of the fin regions 20 may be formed to have a linear shape and may have a length and a width. A length direction of each of the fin regions 20 may be parallel to the first direction X, and a width direction of each of the fin regions 20 may be parallel to the second direction Y.

Sacrificial gates 30a, 30b, 30c may be formed to cross the fin regions 20 along the second direction Y. For example, a first sacrificial gate 30a and a second sacrificial gate 30b may be disposed to be parallel to each other with a third sacrificial gate 30c therebetween. The first to third sacrificial gates 30a, 30b, 30c may extend in the second direction Y. The sacrificial gates 30a, 30b, 30c may cover a top surface and sidewalls of each of the fin regions 20 and may extend in the second direction Y to intersect the first isolation insulating layer 12. The first to third sacrificial gates 30a, 30b, 30c may include, for example, a poly-silicon layer or an amorphous silicon layer. A sacrificial gate dielectric layer 28 may be formed between each of the fin regions 20 and each of the sacrificial gates 30a, 30b, 30c. The sacrificial gate dielectric layer 28 may include, for example, a thermal oxide layer. A gate capping layer 32 may be formed on a top surface of each of the first to third sacrificial gates 30a, 30b, 30c. Gate spacers 34 may be formed on sidewalls of each of the first to third sacrificial gates 30a, 30b, 30c and sidewalls of the gate capping layer 32. The gate spacers 34 may extend in parallel with the first to third sacrificial gates 30a, 30b, 30c in the second direction Y. The gate capping layer 32 and the gate spacer 34 may include silicon nitride and/or silicon oxynitride.

Figure 18C:
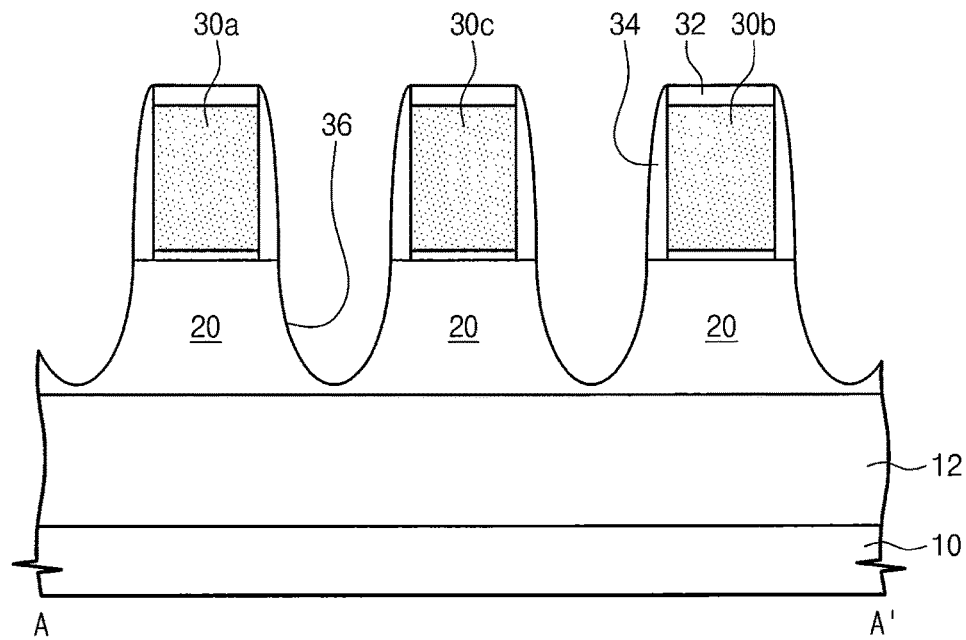
Figure 18C:
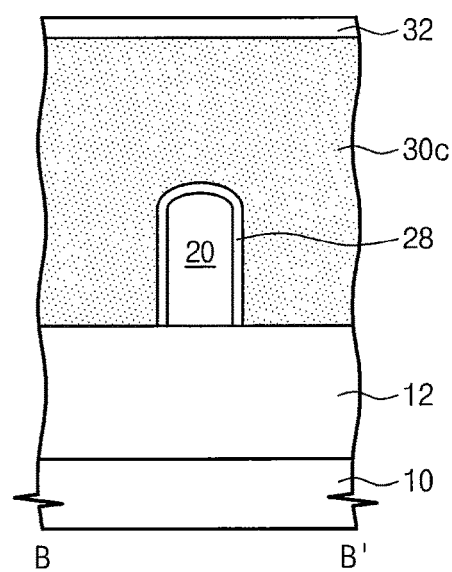
Figure 18C:
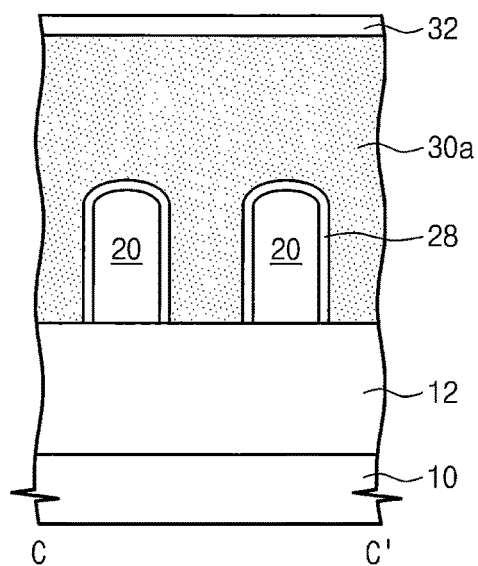
Figure 18C:
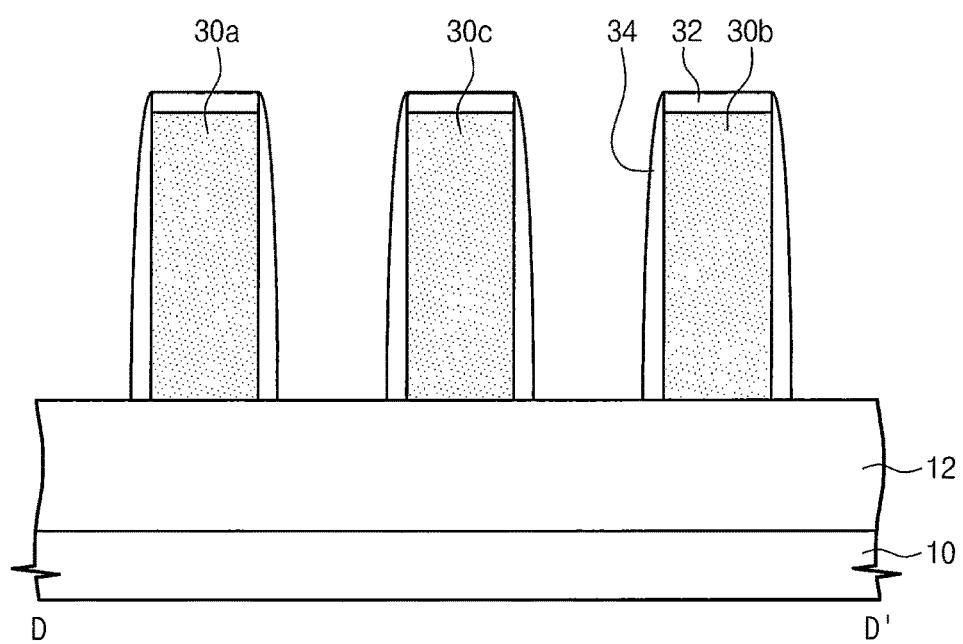

As shown in FIGS. 18CA to 18CD, portions of the fin regions 20 adjacent to the gate spacers 34 may be etched using the gate capping layers 32 and the gate spacers as an etch mask to form first recess regions 36. For example, the first recess regions 36 may be formed using a dry etching method or using a dry etching method and a wet etching method. Bottom surfaces of the first recess regions 36 may be disposed in the fin regions 20. Inner sidewalls of the first recess regions 36 may be aligned with sidewalls of the gate spacers 34. In some embodiments, the first recess regions 36 may be enlarged to partially expose bottom surfaces of the gate spacers 34.

Figure 18D:
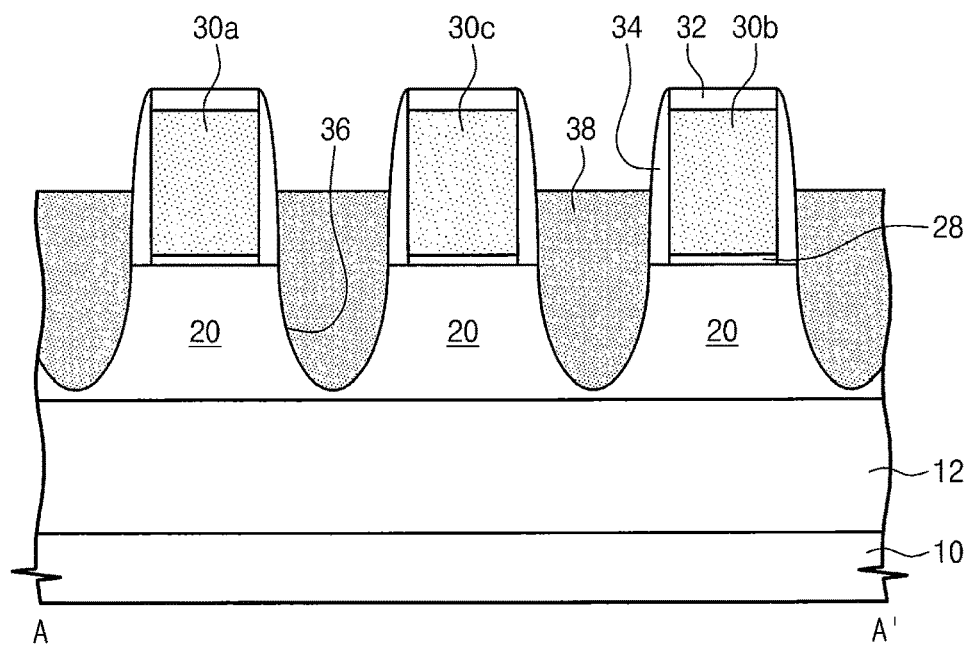
Figure 18D:
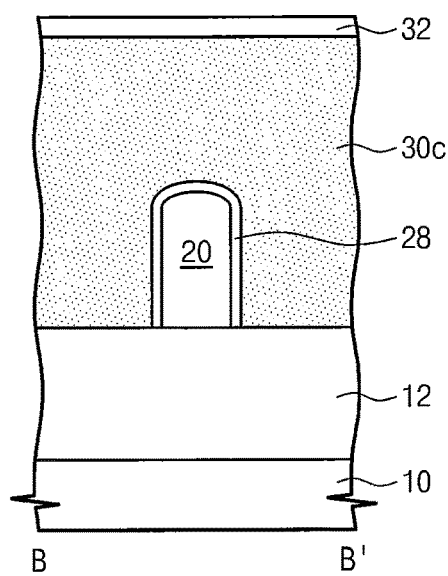
Figure 18D:
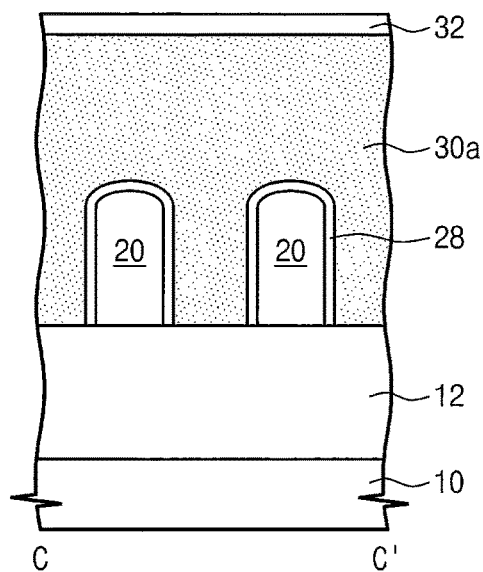
Figure 18D:
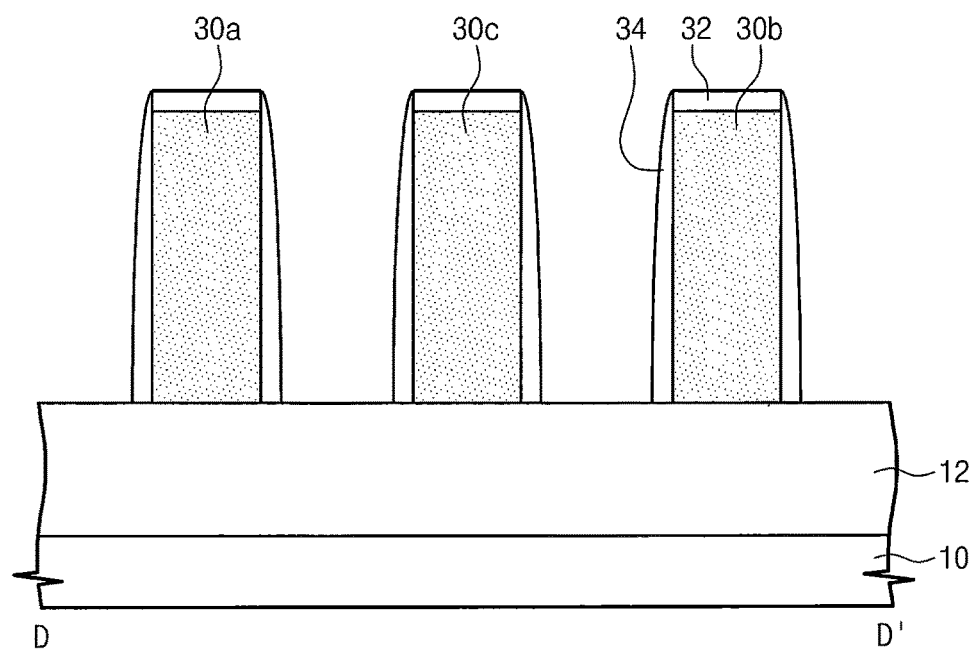

As shown in FIGS. 18DA to 18DD, an epitaxial layer 38 may be formed in each of the first recess regions 36. The epitaxial layer 38 may be formed by selectively epitaxial-growing a semiconductor material. If a PMOS transistor is formed, the epitaxial layer 38 may be formed by epitaxial-growing a compressive stress material. The compressive stress material may have a lattice constant greater than that of silicon. For example, silicon-germanium (SiGe) may be epitaxial-grown to form a SiGe epitaxial layer. Alternatively, if an NMOS transistor is formed, the epitaxial layer 38 may be formed by epitaxial-growing the same material as the fin regions 20 or a tensile stress material. For example, if the fin regions 20 are formed of silicon (Si), silicon (Si) or silicon carbide (SiC) may be epitaxial-grown to form a Si epitaxial layer or a SiC epitaxial layer having a lattice constant smaller than that of silicon. A top surface of the epitaxial layer 38 may be formed to be higher than the top surface of the fin region 20. A cross section of the epitaxial layer 38 may have a polygonal shape, a circular shape, or an elliptical shape.

Figure 18E:
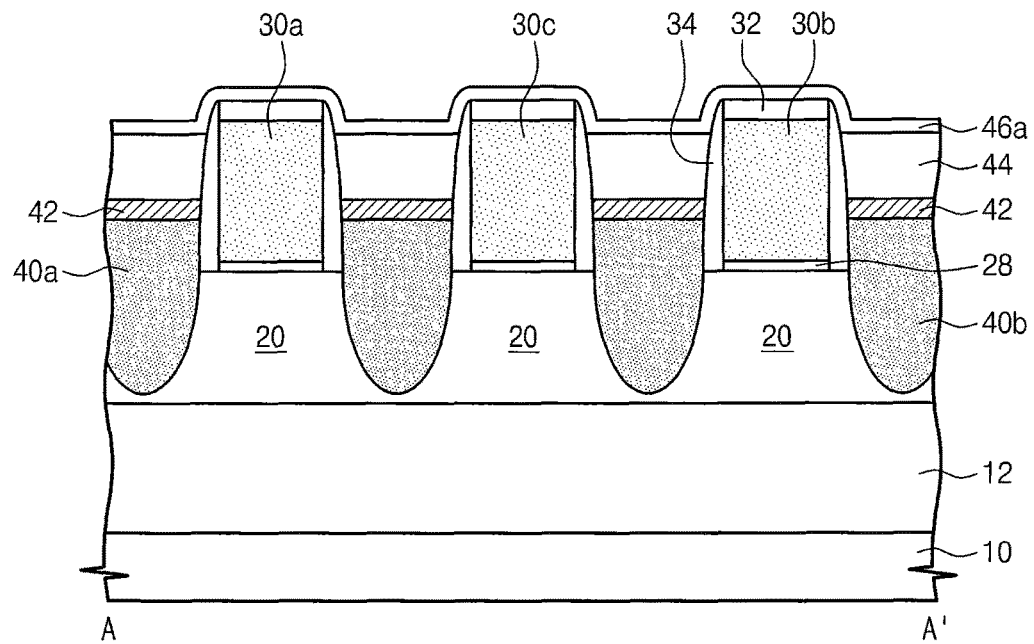
Figure 18E:
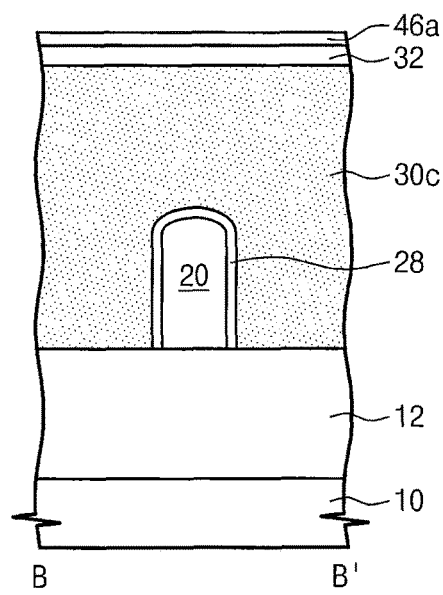
Figure 18E:
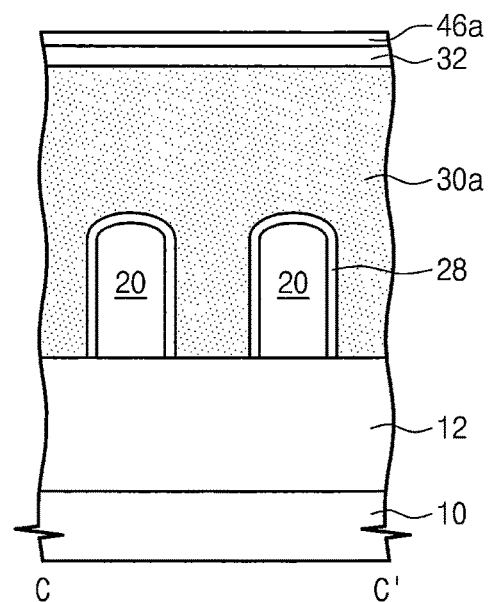
Figure 18E:
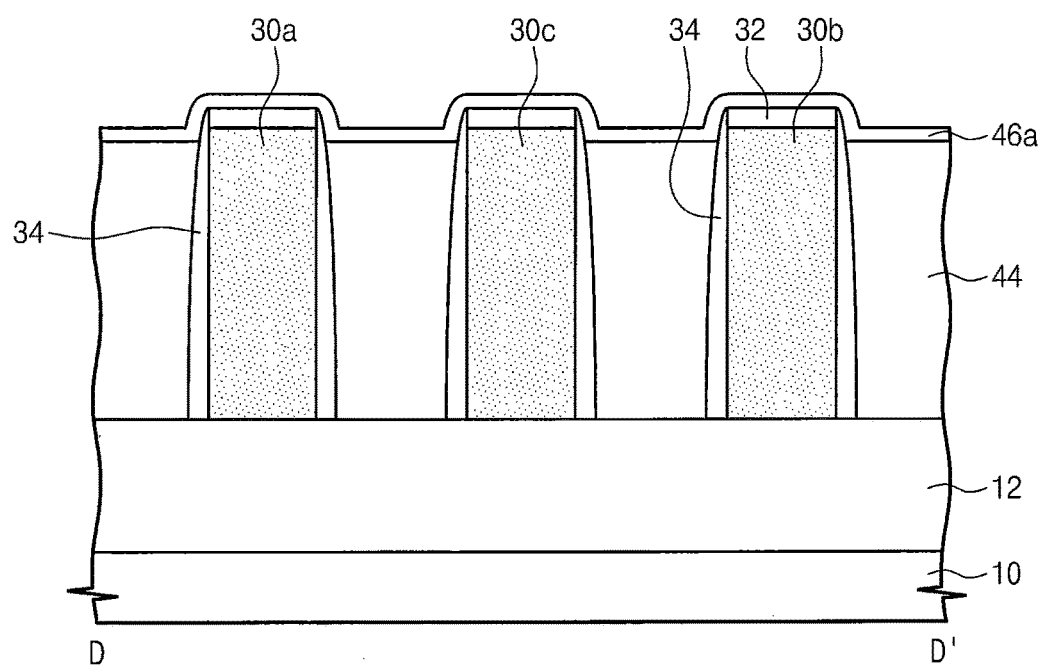

As shown in FIGS. 18EA to 18ED, the epitaxial layers 38 may be doped with dopants to form first and second source/drain regions 40a, 40b. The first source/drain regions 40a may be formed to be adjacent to sidewalls of the first sacrificial gate 30a, and the second source/drain regions 40b may be formed to be adjacent to sidewalls of the second sacrificial gate 30b. In some embodiments, the epitaxial layers 38 may be doped with P-type or N-type dopants in-situ to form the first and second source/drain regions 40a, 40b when the epitaxial layers 38 are formed. In other embodiments, the first and second source/drain regions 40a, 40b may be formed by ion-implanting P-type or N-type dopants into the epitaxial layers 38. The first and second drain regions 40a, 40b may be formed in the epitaxial layers 38 to have elevated source/drain structures. In some embodiments, if the epitaxial layer 38 is not formed, dopants may be injected into the fin region 20 to form the first and/or second source/drain regions 40a and/or 40b.

The first and second source/drain regions 40a, 40b may be isolated from the first to third sacrificial gates 30a, 30b, 30c by the gate spacers 34. A silicide layer 42 may be formed on each of the first and second source/drain regions 40a, 40b. The silicide layer 42 may include at least one metal of nickel (Ni), cobalt (Co), platinum (Pt), or titanium (Ti). An interlayer insulating layer 44 may be formed on the silicide layers 42. The interlayer insulating layer 44 may include an oxide or a low-k dielectric material. The interlayer insulating layer 44 may include a porous material. The interlayer insulating layer 44 may include an air gap therein. The interlayer insulating layer 44 may be formed using a chemical vapor deposition (CVD) process, an atomic layer deposition (ALD) process, or a spin coating process. The interlayer insulating layer 55 may be formed to cover the gate capping layers 32 and may be etched back until the gate capping layer 32 and portions of the gate spacers 34 are exposed. The interlayer insulating layer 44 may partially fill a space between the gate spacers 34 facing each other. A protection layer 46a may be formed on the interlayer insulating layer 44. The protection layer 46a may be formed to cover the gate capping layer 32 and the gate spacer 34 which are exposed by the interlayer insulating layer 44. For example, the protection layer 46a may include a nitride and/or an oxynitride.

Figure 18F:
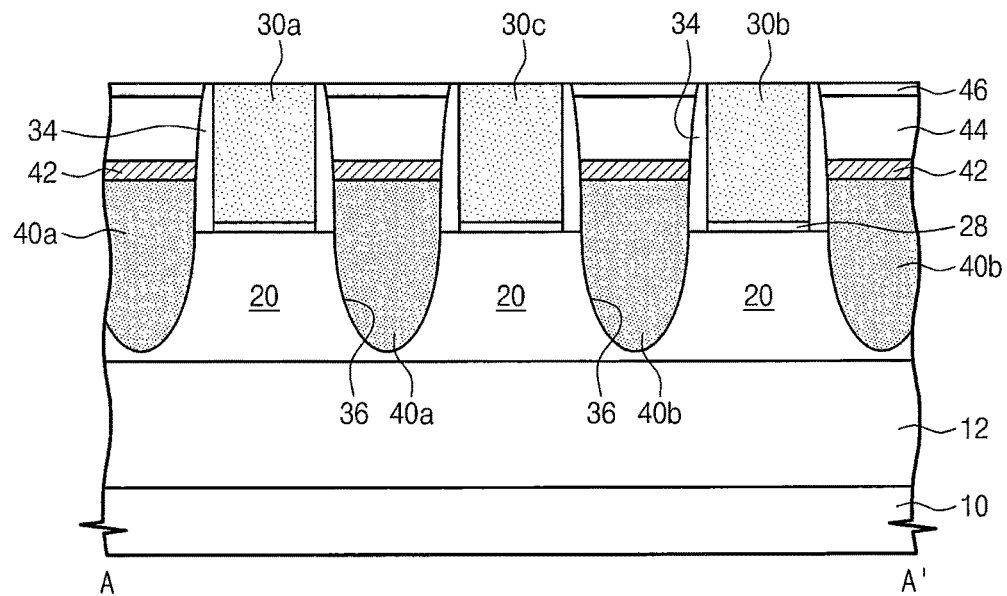
Figure 18F:
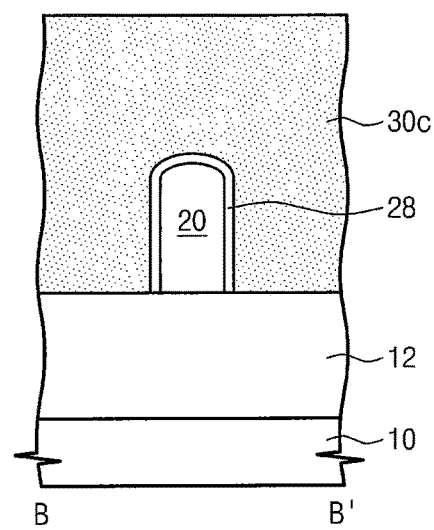
Figure 18F:
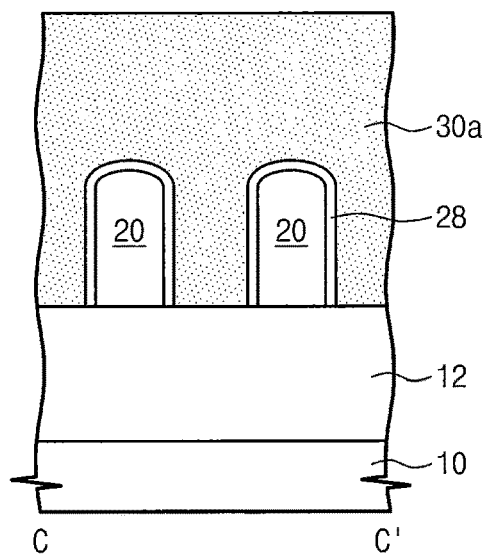
Figure 18F:
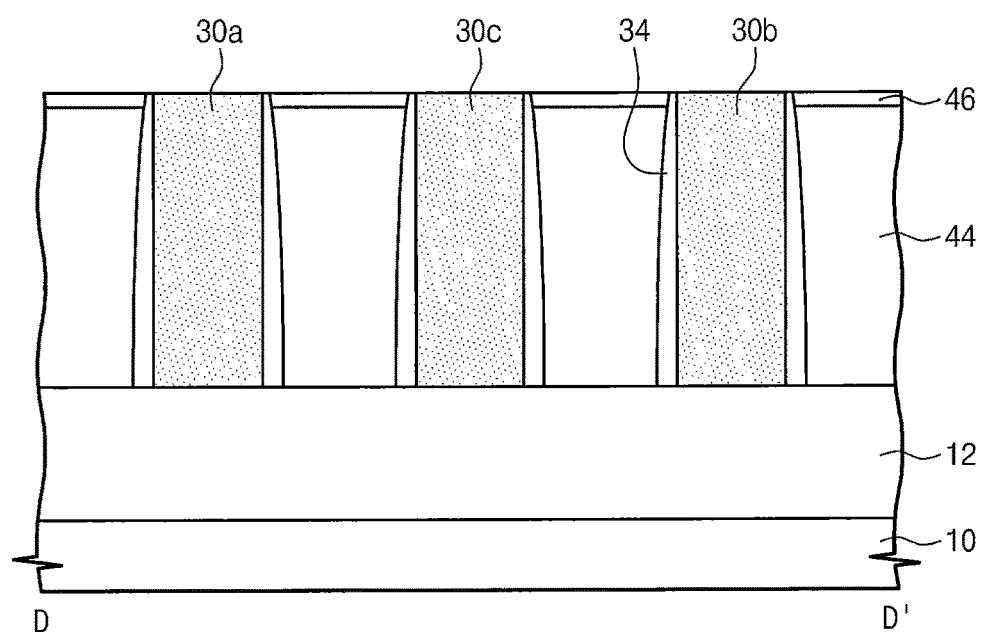

As shown in FIGS. 18FA to 18FD, protection patterns 46 may be formed on the interlayer insulating layer 44 to be spaced apart from each other. For example, the protection layer 46a and the gate capping layer 32 may be planarized by, for example, a chemical mechanical polishing (CMP) process, so the gate capping layer 32 and a portion of the protection layer 46a thereon may be removed to form the protection patterns 46. At this time, the gate spacer 34 may be partially removed. As a result, top surfaces of the first to third sacrificial gates 30a, 30b, 30c may be exposed.

Figure 18G:
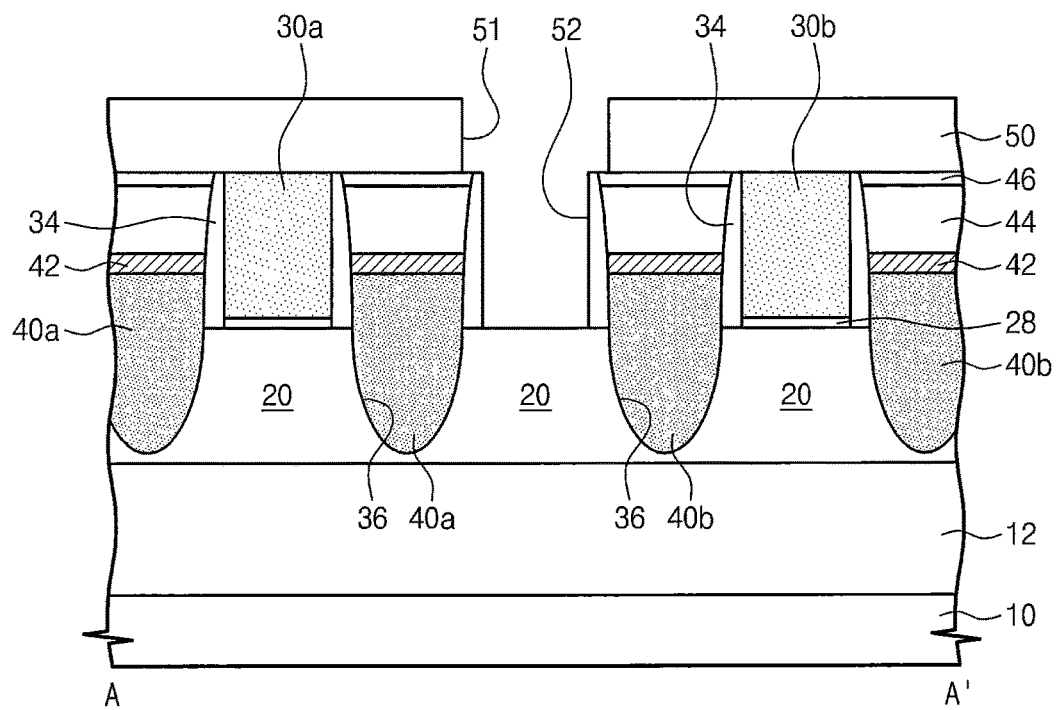
Figure 18G:
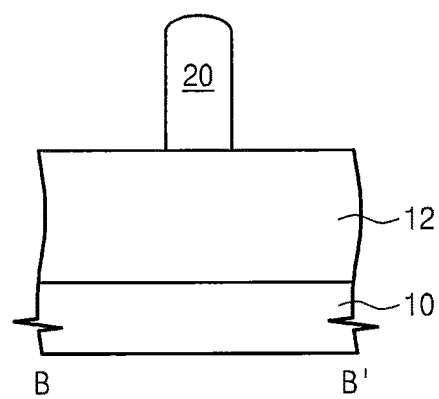
Figure 18G:
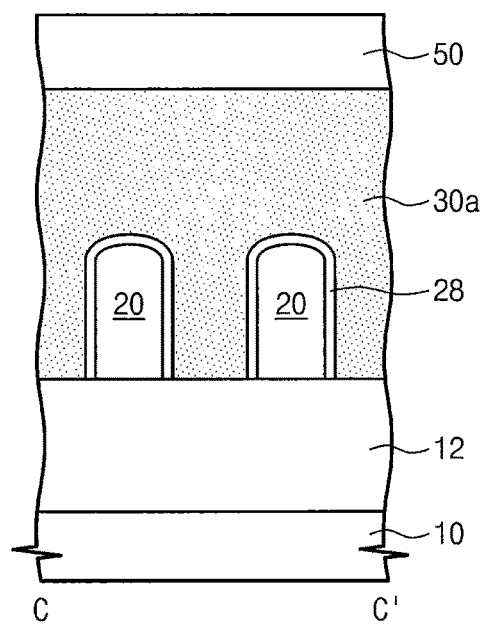
Figure 18G:
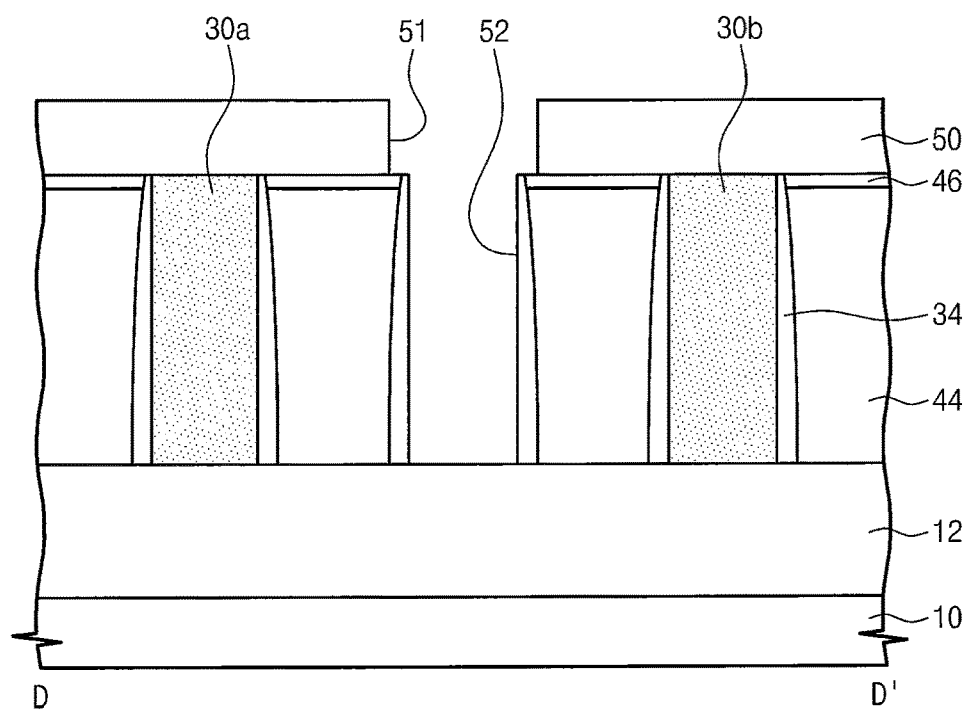

As shown in FIGS. 18GA to 18GD, a first mask 50 may be formed to cover the first and second sacrificial gates 30a, 30b and to have a first opening 51 exposing the third sacrificial gate 30c. The first opening 51 may have a width greater than the width of the third sacrificial gate 30c in the first direction X and may extend in the second direction Y. The first opening 51 may partially expose the gate spacers 34 and the protection patterns 46 which are adjacent to the third sacrificial gate 30c. The first mask 50 may include a hard mask layer or a photoresist layer. The hard mask layer may be formed of, for example, a spin-on-hardmask (SOH) layer. The third sacrificial gate 30c and the sacrificial gate dielectric layer 28 may be removed using the first mask 50 as an etch mask to form a first groove 52. The first and second source/drain regions 40a, 40b adjacent to the third sacrificial gate 30c are covered with the gate spacers 34 and the protection patterns 46 during the formation of the first groove 52 not to be exposed, and thus, it is possible to protect/prevent the first and second source/drain regions 40a, 40b from being etched. The first groove 52 may expose portions of the fin regions 20. In addition, the first groove 52 may partially expose the first isolation insulating layer 12.

Figure 18H:
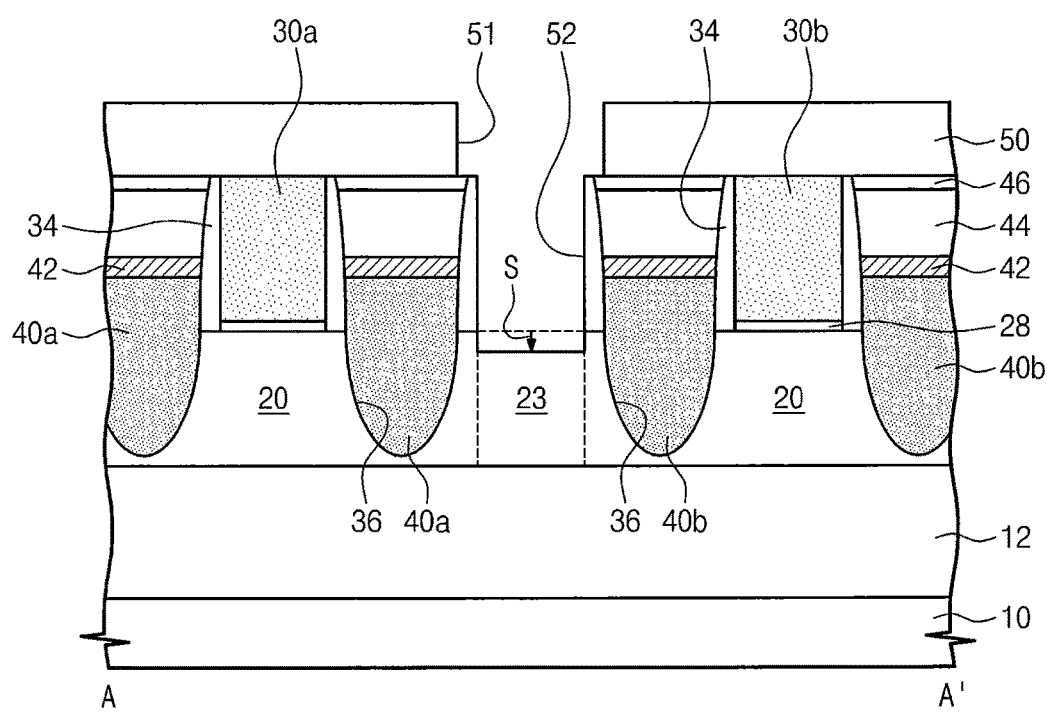
Figure 18H:
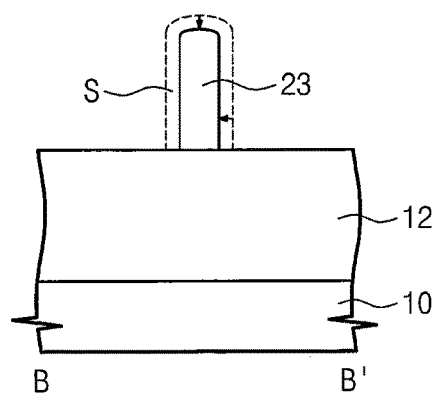
Figure 18H:
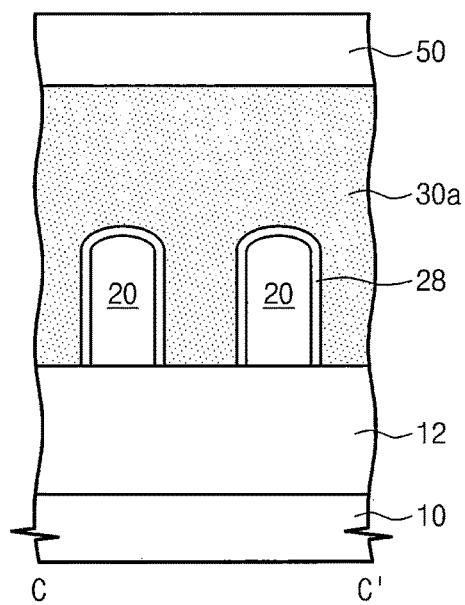
Figure 18H:
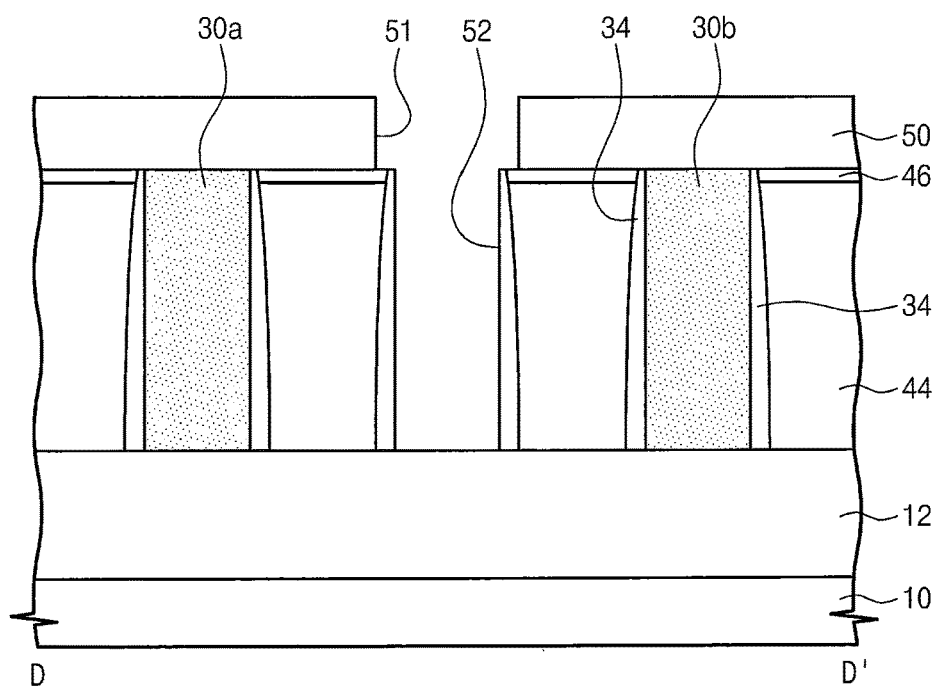

As shown in FIGS. 18HA to 18HD, the fin regions 20 exposed by the first groove 52 may be trimmed to form trimmed fin regions 23. For example, a portion of the fin region 20 may be removed through the trimming process by, for example, a thickness S. Each of the top surface and the sidewalls of the fin region 20 may be removed by the thickness S. For example, the thickness S may be in a range of 1/20 to 1/3 of the width of each of the fin regions 20.

Figure 18I:
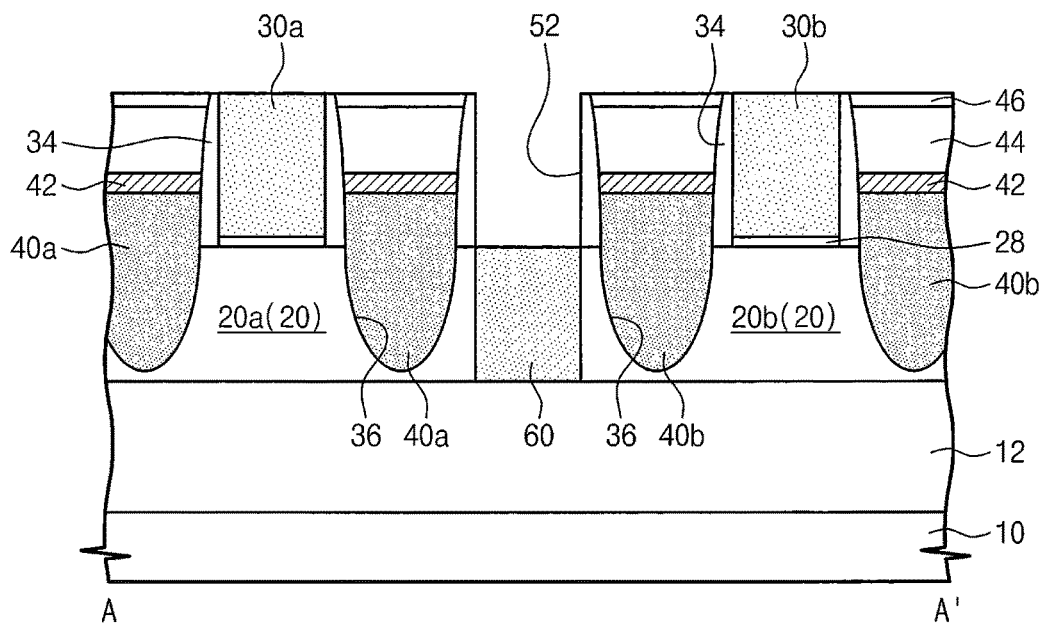
Figure 18I:
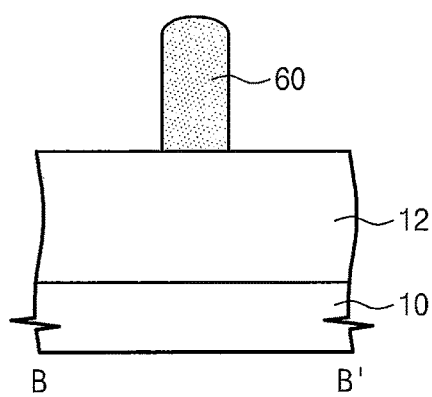
Figure 18I:
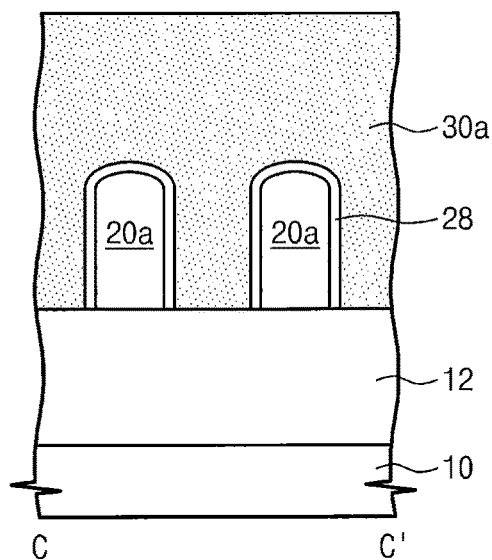
Figure 18I:
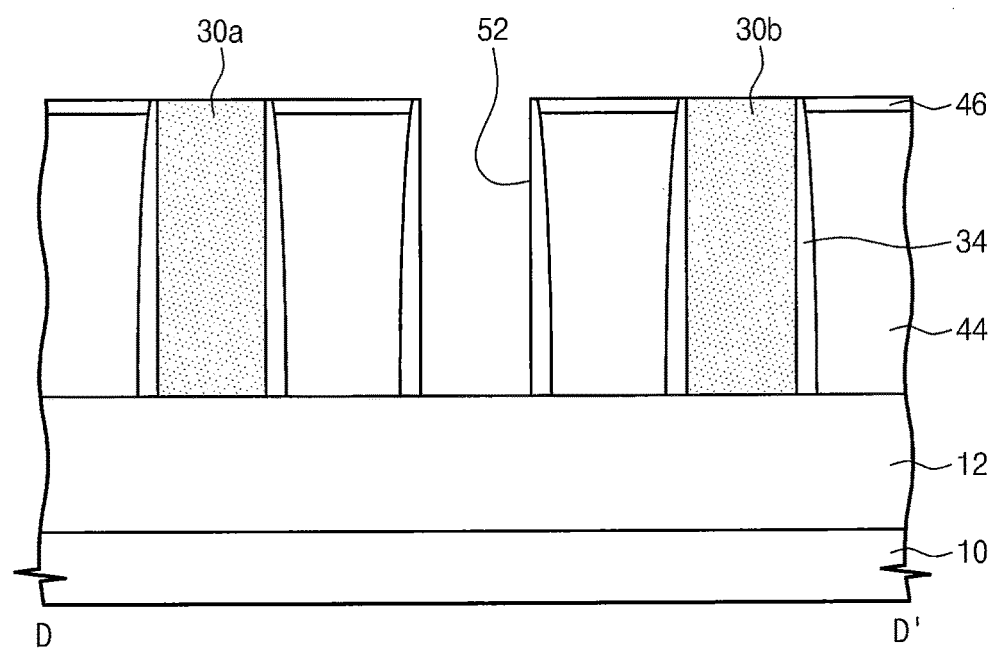

As shown in FIGS. 18IA to 18ID, the first mask 50 may be removed, and the trimmed fin region 23 may be then oxidized to form a second isolation insulating layer 60. The second isolation insulating layer 60 may be formed to be self-aligned with the first groove 52 by the oxidation of the trimmed fin region 23 exposed by the first groove 52. For example, the second isolation insulating layer 60 may be an oxide layer that is formed by oxidizing the trimmed fin region 23 using a plasma oxidation process. For example, the trimmed fin region 23 may be oxidized using an oxygen gas or an ozone gas at a temperature of 20° C. to 800° C. under a plasma atmosphere to form the second isolation insulating layer 60. In other embodiments, the second isolation insulating layer 60 may be an oxide layer that is formed by oxidizing the trimmed fin region 23 using a thermal oxidation process. For example, the second isolation insulating layer 60 may be an oxide layer which is formed by oxidizing the trimmed fin region 23 using a dry oxidation process, a wet oxidation process, or a thermal radical oxidation process. Alternatively, the second isolation insulating layer may be formed by the SIMOX process described with reference to FIGS. 9AA to 9AD. A first fin subregion 20a and a second fin subregion 20b separated from each other in the first direction X may be formed in each of the fin regions 20 by the second isolation insulating layer 60. The second isolation insulating layer 60 may be in contact with the first isolation insulating layer 12.

The second isolation insulating layer 60 may be a discrete isolation insulating island (e.g., an island-shaped pattern) having a top surface and sidewalls. For example, sidewalls of the second isolation insulating layer 60 which are arranged in the second direction Y may be exposed by the first groove 52. In other words, the sidewalls of the second isolation insulating layer 60 exposed by the first groove 52 may be parallel to the first direction X. Sidewalls of the second isolation insulating layer 60 which are arranged in the first direction X may be in contact with the sidewall of the first fin subregion 20a and the sidewall of the second fin subregion 20b which face each other. In other words, the sidewalls of the second isolation insulating layer 60 which are in contact with the sidewalls of the first and second fin subregions 20a, 20b may be parallel to the second direction Y. A plurality of the second isolation insulating layers 60 may be spaced apart from and aligned with each other in the second direction Y. In some embodiments, the sidewalls of the second isolation insulating layer 60 arranged in the first direction X may be in contact with the first and second source/drain regions 40a, 40b. The second isolation insulating layer 60 may have sidewalls aligned with inner sidewalls of the gate spacers 34. Alternatively, a width in the first direction X of the second isolation insulating layer 60 may be widened, so a top surface of the second isolation insulating layer 60 may partially overlap with a bottom surface of the gate spacer 34. In some embodiments, the trimming process of the fin regions 20 may be omitted and the fin regions 20 may be oxidized to form the second isolation insulating layers 60.

Figure 18J:
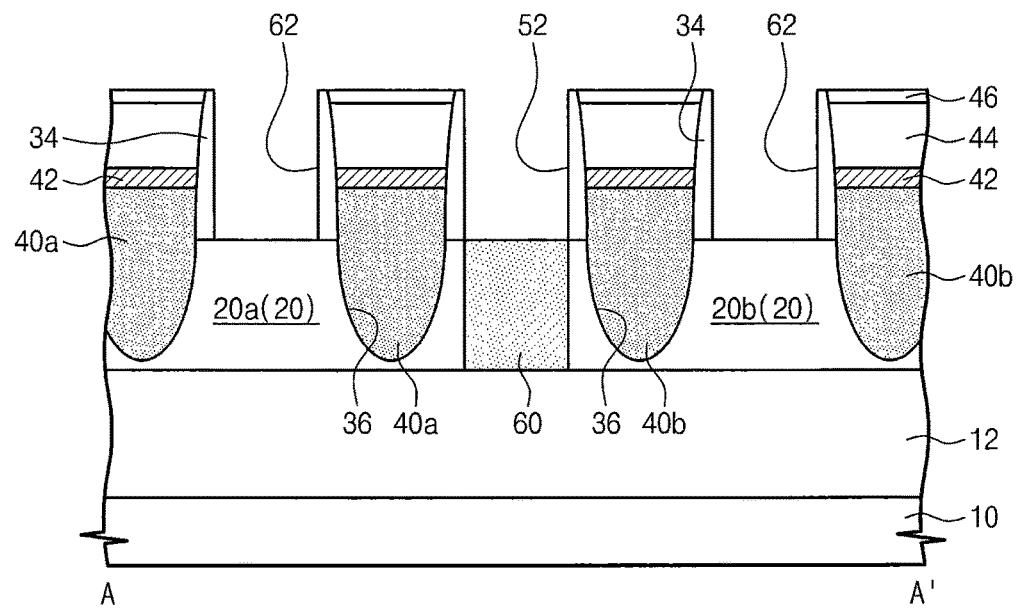
Figure 18J:
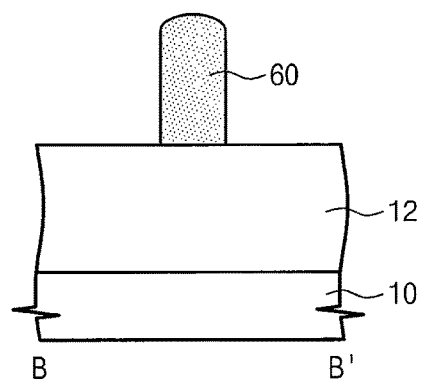
Figure 18J:
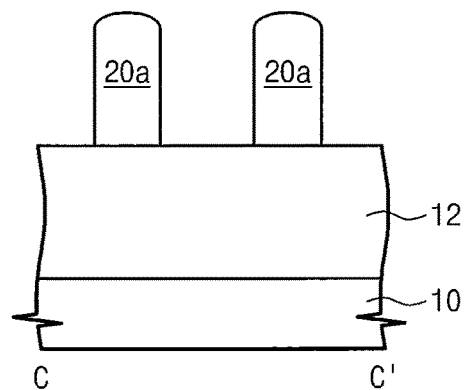
Figure 18J:
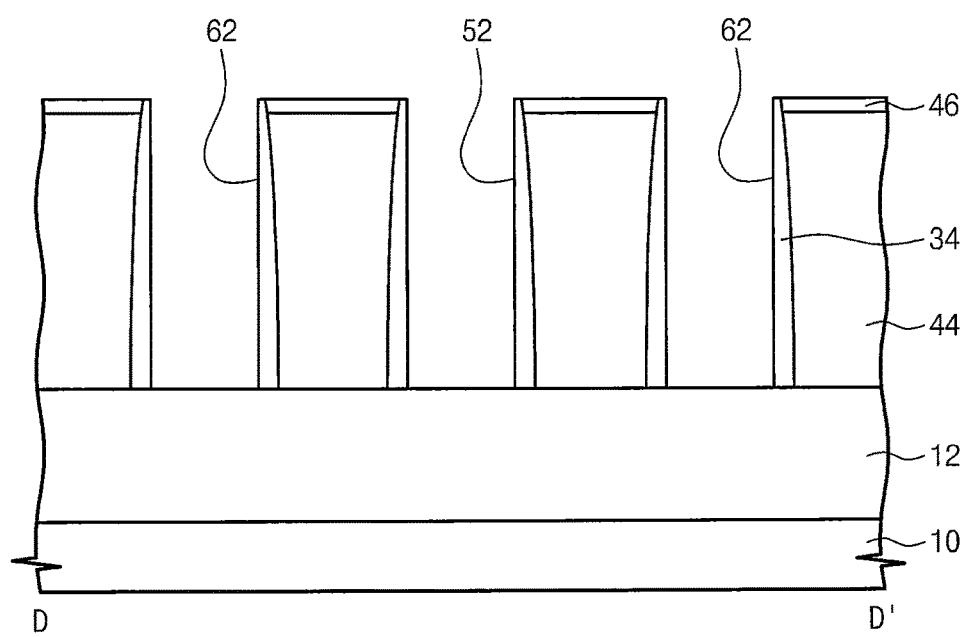

As shown in FIGS. 18JA to 18JD, a second groove 62 may be formed on each of the first and second fin subregions 20a, 20b. For example, the second grooves 62 may formed by sequentially removing the first and second sacrificial gates 30a, 30b and the sacrificial gate dielectric layer 28. For example, the first and second sacrificial gates 30a, 30b may be selectively removed using the gate spacers 34 and the protection patterns 46 as an etch mask. When the sacrificial gate dielectric layer 28 is removed, a portion of the second isolation insulating layer 60 may be removed. Top surfaces and sidewalls of the first and second fin subregions 20a, 20b may be partially exposed by the second grooves 62. In addition, portions of the first isolation insulating layer 12 may be exposed by the second grooves 62.

Figure 18K:
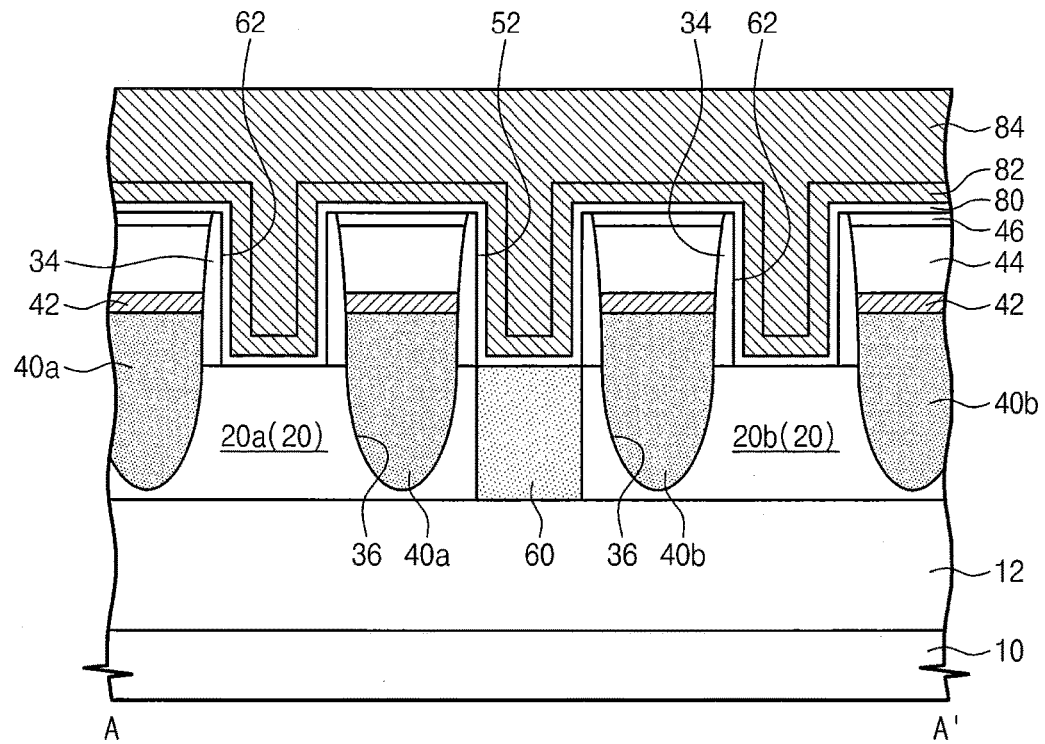
Figure 18K:
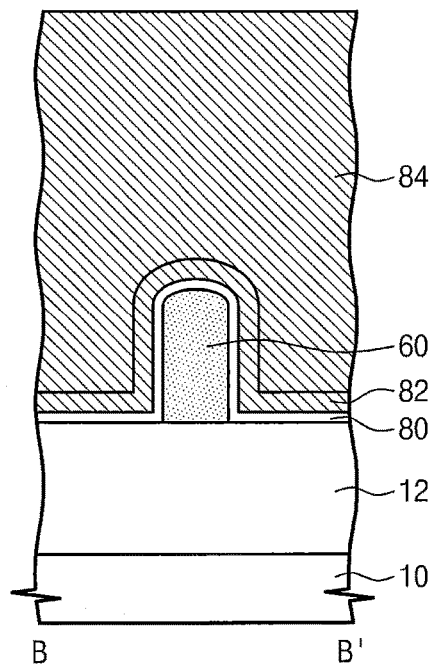
Figure 18K:
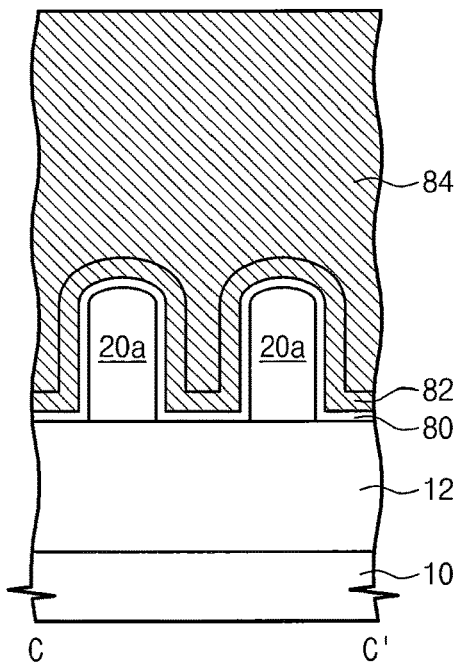
Figure 18K:
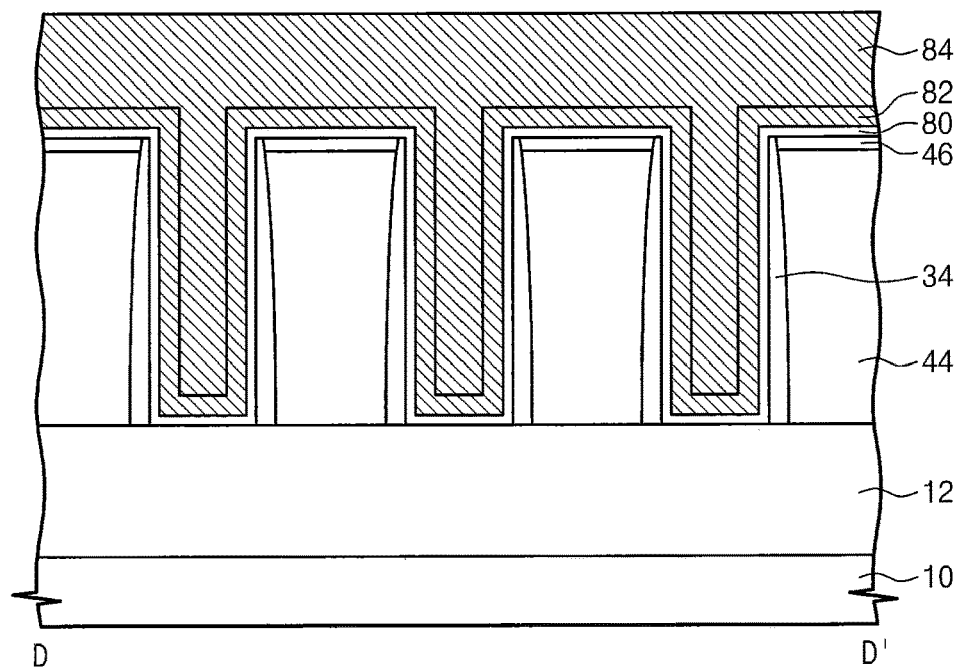

As shown in FIGS. 18KA to 18KD, a gate dielectric layer 80, a first gate conductive layer 82, and a second gate conductive layer 84 may be sequentially formed to fill the first and second grooves 52 and 62. The gate dielectric layer 80, the first gate conductive layer 82, and the second gate conductive layer 84 may be formed by a replacement process refilling spaces formed by the removal of the sacrificial gates 30a, 30b, 30c. The gate dielectric layer 80, the first gate conductive layer 82, and the second gate conductive layer 84 may cover the top surfaces and the sidewalls of the first and second fin subregions 20a, 20b. In addition, the gate dielectric layer 80, the first gate conductive layer 82, and the second gate conductive layer 84 may cover the top surface and the sidewalls of the second isolation insulating layer 60. The gate dielectric layer 80 may include a high-k dielectric material having a dielectric constant higher than that of silicon oxide. For example, the gate dielectric layer 80 may include at least one of, but not limited to, hafnium oxide, hafnium-silicon oxide, lanthanum oxide, lanthanum-aluminum oxide, zirconium oxide, zirconium-silicon oxide, tantalum oxide, titanium oxide, barium-strontium-titanium oxide, barium-titanium oxide, strontium-titanium oxide, yttrium oxide, aluminum oxide, lead-scandium-tantalum oxide, or lead-zinc niobate.

The gate dielectric layer 80 may be formed using an ALD process or a CVD process. The first gate conductive layer 82 may include a material capable of controlling a work function of a gate electrode. The second gate conductive layer 84 may fill spaces defined by the first gate conductive layer 82. The first gate conductive layer 82 may include a metal. For example, the first gate conductive layer 82 may include at least one of titanium nitride (TiN), tantalum nitride (TaN), titanium carbide (TiC), titanium-aluminum (TiAl), titanium-aluminum carbide (TiAlC), titanium-aluminum nitride (TiAlN), tantalum carbide (TaC), or tantalum-aluminum nitride (TaAlN). The second gate conductive layer 84 may include a metal. For example, the second conductive layer 84 may include tungsten (W) or aluminum (Al). Each of the first and second gate conductive layers 82 and 84 may be formed using an ALD process or a CVD process.

Figure 18L:
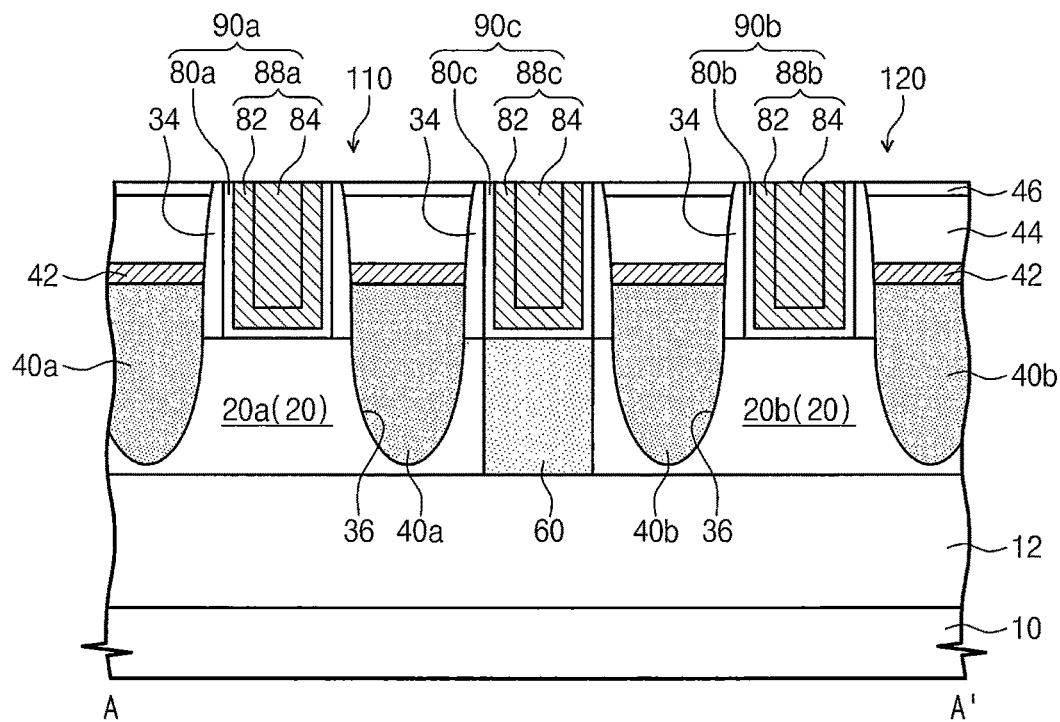
Figure 18L:
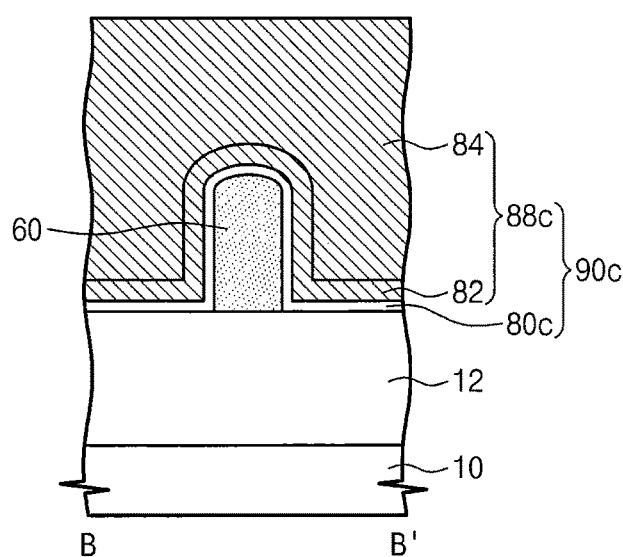
Figure 18L:
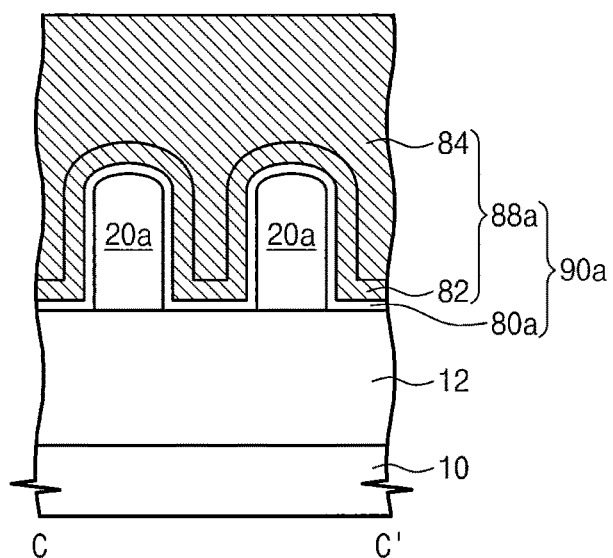
Figure 18L:
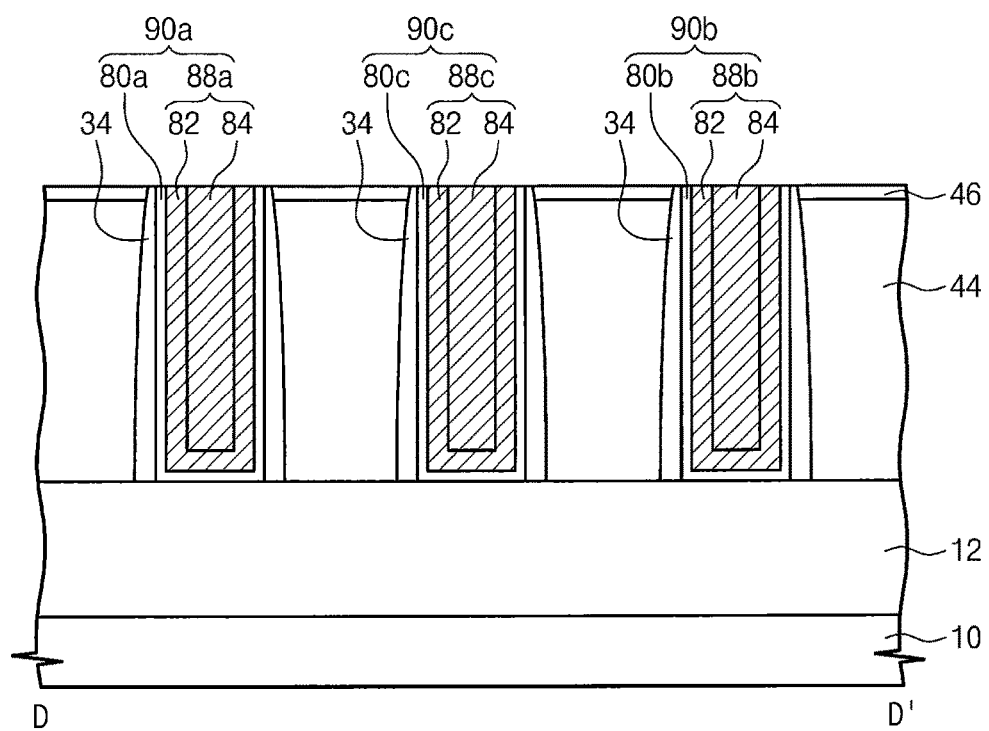

As shown in FIGS. 18LA to 18LD, a first gate 90a may be formed on the first fin subregion 20a, a second gate 90b may be formed on the second fin subregion 20b, and a third gate 90c may be formed on the second isolation insulating layer 60. The first gate 90a may include a first gate dielectric layer 80a and a first gate electrode 88a, the second gate 90b may include a second gate dielectric layer 80b and a second gate electrode 88b, and the third gate 90c may include a third gate dielectric layer 80c and a third gate electrode 88c. To form the first to third gates 90a, 90b and 90c, the second gate conductive layer 84, the first gate conductive layer 82, and the gate dielectric layer 80 may be planarized by, for example, a CMP method until the protection patterns 46 and the gate spacers 34 are exposed. Thus, the gate dielectric layer 80 and the first and second gate conductive layers 82 and 84 may be removed from top surfaces of the protection patterns 46 and the gate spacers 34 but may remain in the first and second grooves 52 and 62. As a result, the first gate electrode 88a may be formed to include the first and second gate conductive layers 82 and 84 intersecting the first fin subregion 20a, and the second gate electrode 88b may be formed to include the first and second gate conductive layers 82, 84 intersecting the second fin subregion 20b. In addition, the third gate electrode 88c may be formed to include the first and second conductive layers 82, 84 intersecting the second isolation insulating layer 60. The first gate dielectric layer 80a may be disposed between the first fin subregion 20a and the first gate electrode 88a, the second gate dielectric layer 80b may be disposed between the second fin subregion 20b and the second gate electrode 88b, and the third gate dielectric layer 80c may be disposed between the second isolation insulating layer 60 and the third gate electrode 88c. Each of the gate dielectric layers 80a, 80b, 80c may surround sidewalls and a bottom surface of a corresponding one of the first to third gate electrodes 88a, 88b, 88c and may extend in the second direction Y. The first and second gate electrodes 88a, 88b and the first and second gate dielectric layers 80a, 80b may cover the top surfaces and the sidewalls of the first and second fin subregions 20a, 20b, respectively, and may extend in the second direction Y. The third gate electrode 88c and the third gate dielectric layer 80c may surround the top surface and the sidewalls of the second isolation insulating layer 60 and may extend in the second direction Y. Accordingly, the first and second gates 90a, 90b respectively intersecting the first and second fin subregions 20a, 20b may extend in the second direction Y. The first gate 90a may cover the top surface and the sidewalls of the first fin subregion 20a and may extend in the second direction Y to intersect the first isolation insulating layer 12. The second gate 90b may cover the top surface and the sidewalls of the second fin subregion 20b and may extend in the second direction Y to intersect the first isolation insulating layer 12. The third gate 90c may cover the top surface and the sidewalls of the second isolation insulating layer 60 and may extend in the second direction Y to intersect the first isolation insulating layer 12. For example, the third gate 90c may cover the sidewalls and the top surface of the second isolation insulating layer 60 which are exposed between the gate spacers 34 adjacent to the sidewalls of the third gate 90c and may extend in the second direction Y to intersect the first isolation insulating layer 12.

The first and second gates 90a, 90b may be used as normal gates for operation of transistors, but the third gate 90c may be used as a dummy gate that is not used for operation of a transistor. Alternatively, the third gate 90c may be used as a signal-transmitting interconnection or a normal gate.

A width of the third gate 90c may be substantially equal to or smaller than widths of the first and second gates 90a, 90b. Heights of the first and second gates 90a, 90b disposed on the first and second fin subregions 20a, 20b may be substantially equal to a height of the third gate 90c disposed on the second isolation insulating layer 60. For example, heights of the first and second gate electrodes 88a, 88b disposed on the first and second fin subregions 20a, 20b may be substantially equal to a height of the third gate electrode 88c disposed on the second isolation insulating layer 60. Accordingly, if the third gate electrode 88c is used as a signal-transmitting interconnection or a normal gate electrode, the third gate electrode 88c has the same thickness as other gate electrodes 88a, 88b to reduce/prevent a signal delay phenomenon through the third gate electrode 88c. As a result, characteristics of the semiconductor device according to the inventive concepts may be improved.

A first transistor 110 including the first gate 90a and the first source/drain regions 40a may be formed on the first fin subregion 20a, and a second transistor 120 including the second gate 90b and the second source/drain regions 40b may be formed on the second fin subregion 20b. The first transistor 110 and/or the second transistor 120 may be an N-type transistor and/or a P-type transistor. The second isolation insulating layer 60 may isolate the first transistor 110 from the second transistor 120. For example, the first transistor 110 may be electrically and physically isolated from the second transistor 120 by the second isolation insulating layer 60. An isolation characteristic between the first and second transistors 110, 120 may be improved by the second isolation insulating layer 60 and the first isolation insulating layer 12 disposed under the first isolation insulating layer 60.

Figure 19A:
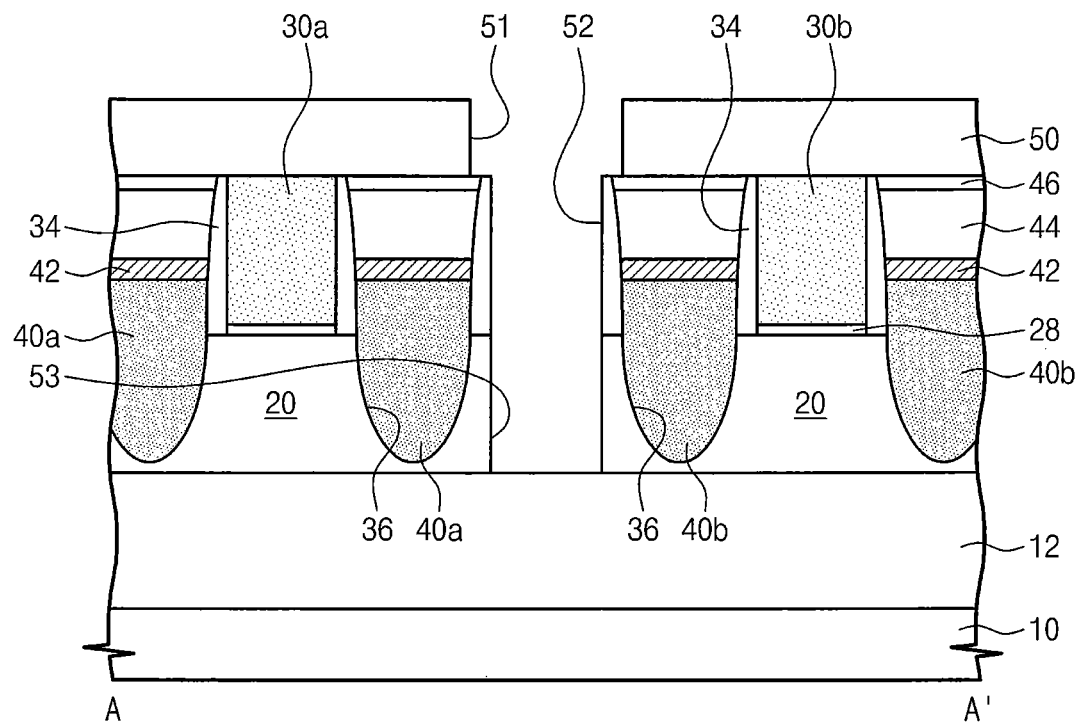
FIGS. 19AA to 19DA are cross-sectional views taken along line A-N of FIG. 16A to illustrate a method of manufacturing a semiconductor device according to the seventh embodiment of the inventive concepts.
Figure 19A:
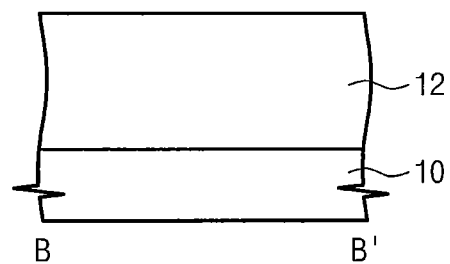
Figure 19A:
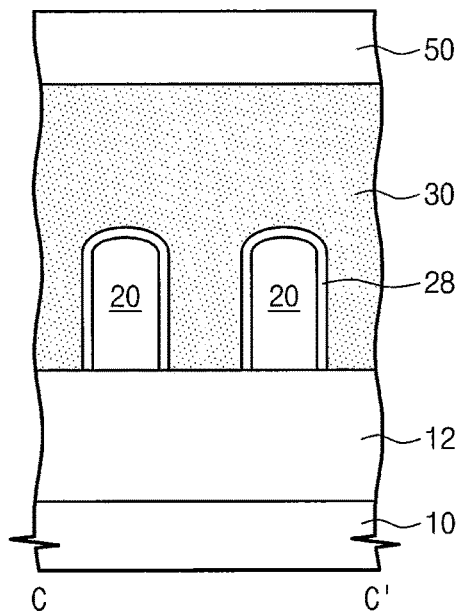
Figure 19A:
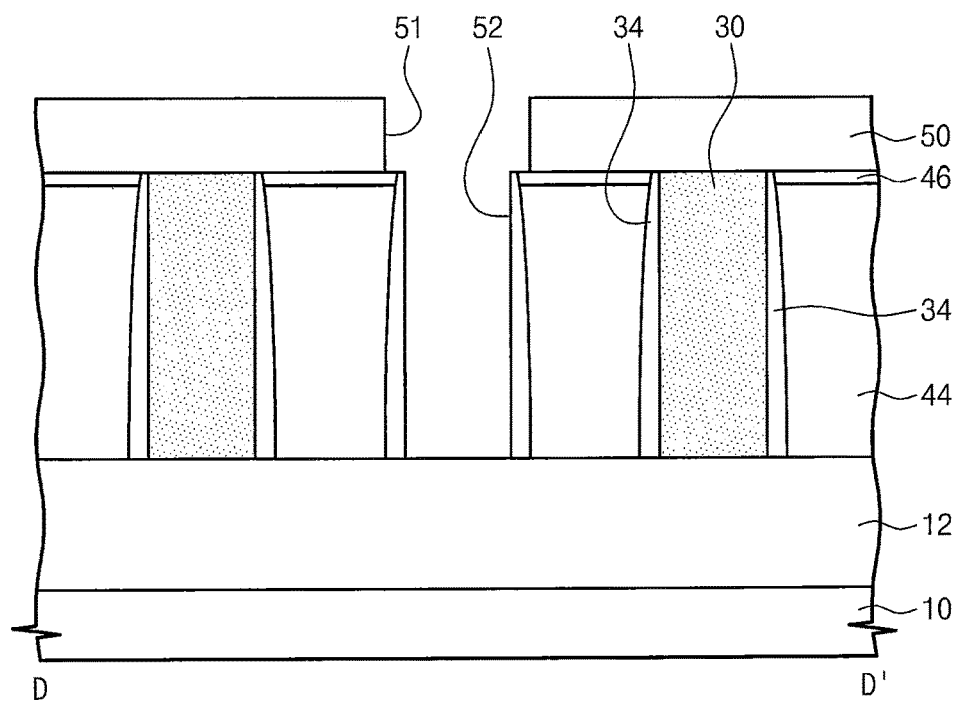

FIGS. 19AA to 19DD are cross-sectional views illustrating some processes of a method of manufacturing the semiconductor device according to the seventh embodiment of the inventive concepts. FIGS. 19AA to 19DA are cross-sectional views taken along a line A-A' of FIG. 16A, and FIGS. 19AB to 19DB are cross-sectional views taken along a line B-B' of FIG. 16A. FIGS. 19AC to 19DC are cross-sectional views taken along a line C-C' of FIG. 16A, and FIGS. 19AD to 19DD are cross-sectional views taken along a line D-D' of FIG. 16A. Hereinafter, the descriptions of elements already described above with respect to FIGS. 18AA to 18LD will be omitted or mentioned only briefly so that differences between the present embodiment and the embodiment of 18AA to 18LD may be highlighted.

As shown in FIGS. 19AA to 19AD, a portion of each of the fin regions 20 exposed by the first groove 52 may be removed using the first mask 50 as an etch mask to form a second recess region 53. For example, the fin region 20 exposed by the first groove region 52 may be removed to form the second recess region 53. The first isolation insulating layer 12 may be exposed by the second recess region 53. A portion of the first isolation insulating layer 12 may also be removed during the formation of the second recess region 53.

Figure 19B:
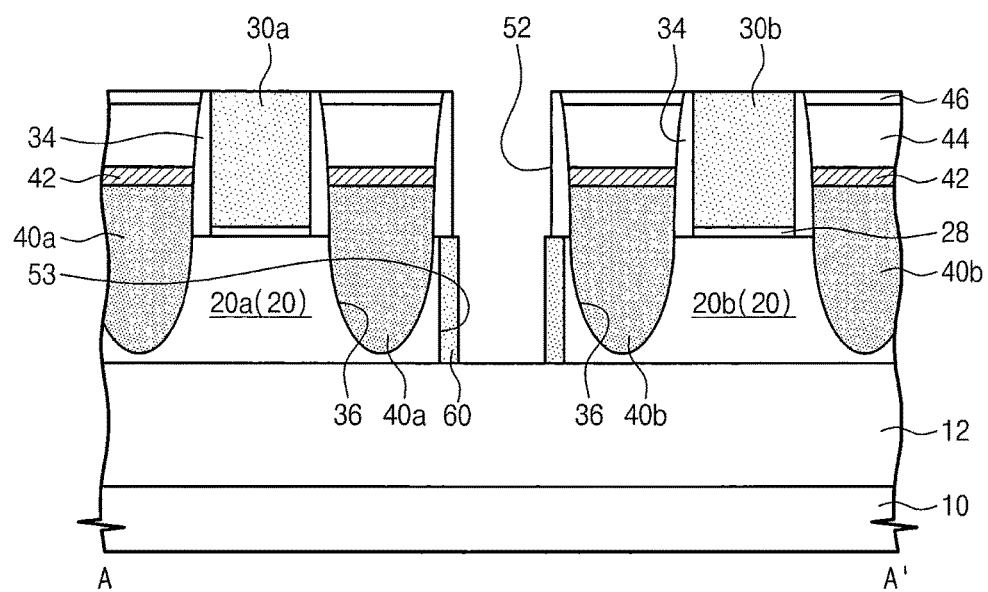
Figure 19B:
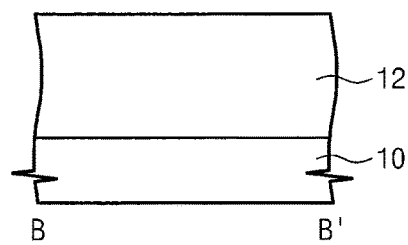
Figure 19B:
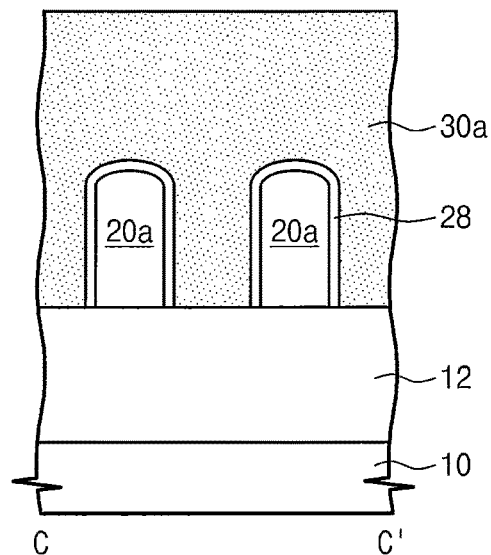
Figure 19B:
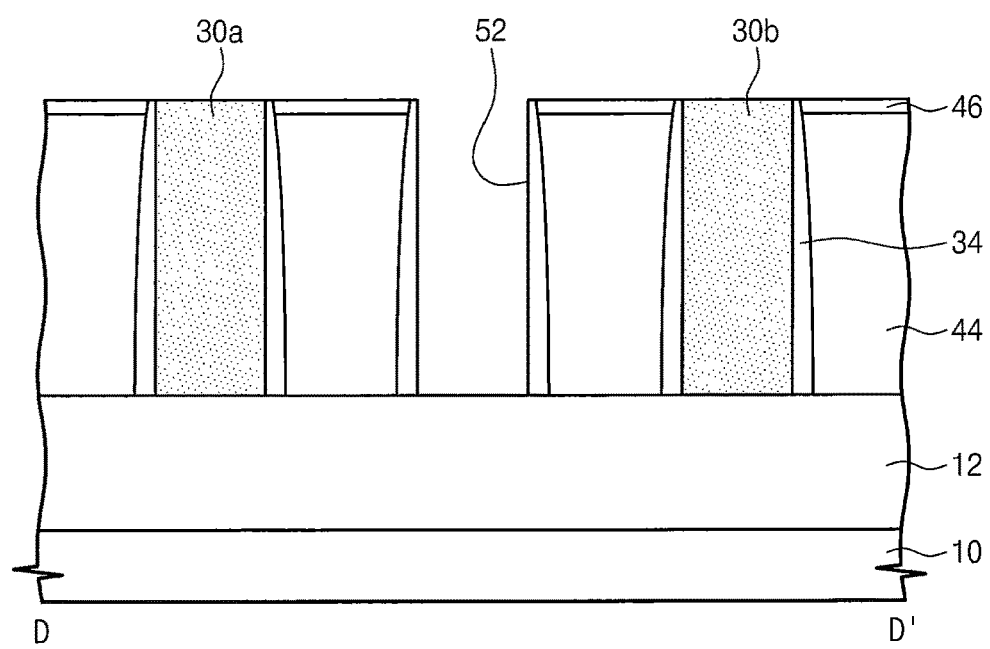

As shown in FIGS. 19BA to 19BD, after the first mask 50 is removed, the fin region 20 exposed by the second recess region 53 may be oxidized to form a second isolation insulating layer 60. The second isolation insulating layer 60 may be an oxide layer self-alignedly formed on sidewalls of the second recess region 53. The second isolation insulating layer 60 may include a pair of oxide layers separated from each other. Portions of the fin region 20 exposed by the second recess region 53 may be oxidized by a plasma oxidation process to form the second isolation insulating layer 60. For example, the fin region 20 exposed by the second recess region 53 may be oxidized using an oxygen gas or an ozone gas at a temperature of 20° C. to 800° C. under a plasma atmosphere to form the second isolation insulating layer 60. In other embodiments, the fin region 20 exposed through the second recess region 53 may be oxidized by a thermal oxidation process to form the second isolation insulating layer 60. For example, the thermal oxidation process may be a dry oxidation process, a wet oxidation process, or a thermal radical oxidation process. Alternatively, the second isolation insulating layer 60 may be formed by the SIMOX method described with reference to FIGS. 9AA to 9AD. The second isolation insulating layer 60 may be insulating layers formed on only both sidewalls of the second recess region 53. A top surface of the second isolation insulating layer 60 may partially overlap with the gate spacer 34, and the second isolation insulating layer 60 may protrude into the second recess region 53. Thus, a width of an opened region (e.g., a distance between the pair of oxide layers) of the second recess region 53 may be smaller than the width of the first groove 52 in the first direction X. In some embodiments, the second isolation insulating layer 60 may be in contact with the first and second source/drain regions 40a, 40b. A first fin subregion 20a and a second fin subregion 20b may be isolated from each other by the second isolation insulating layer 60.

Figure 19C:
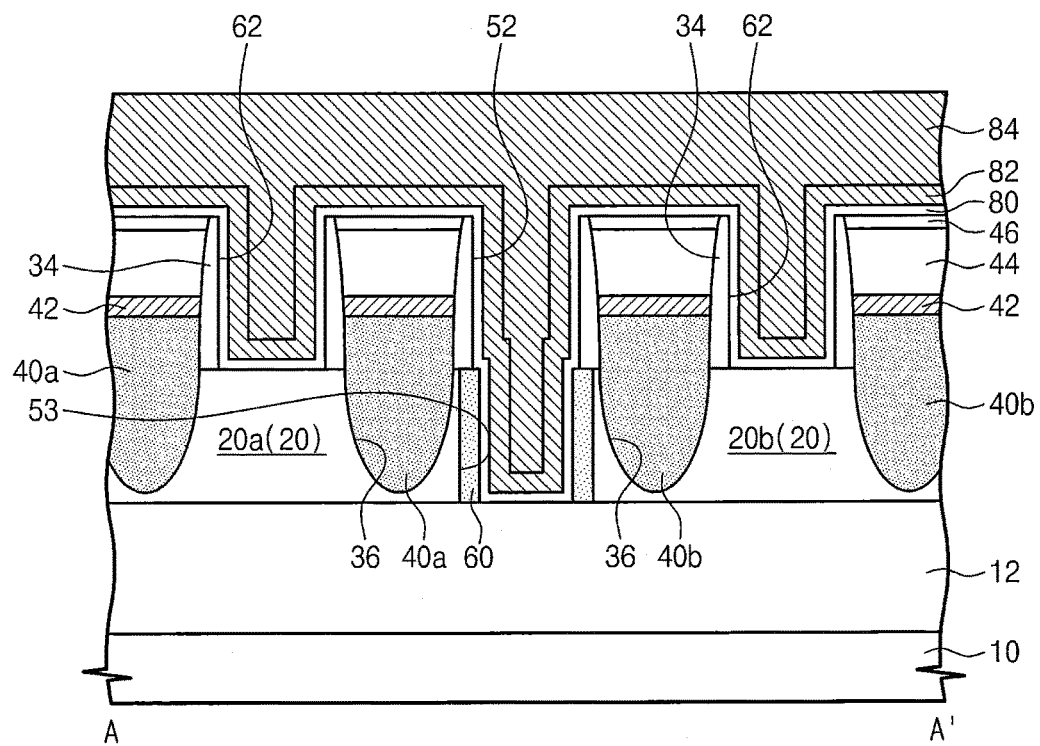
Figure 19C:
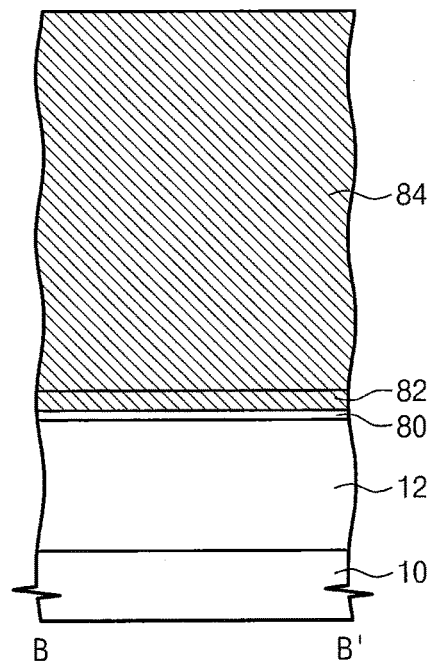
Figure 19C:
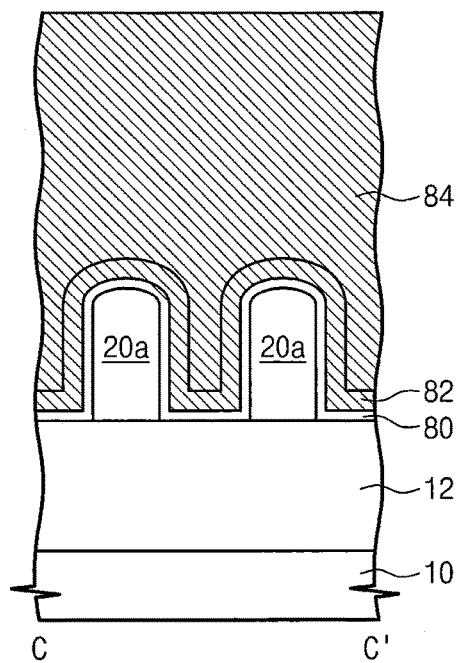
Figure 19C:
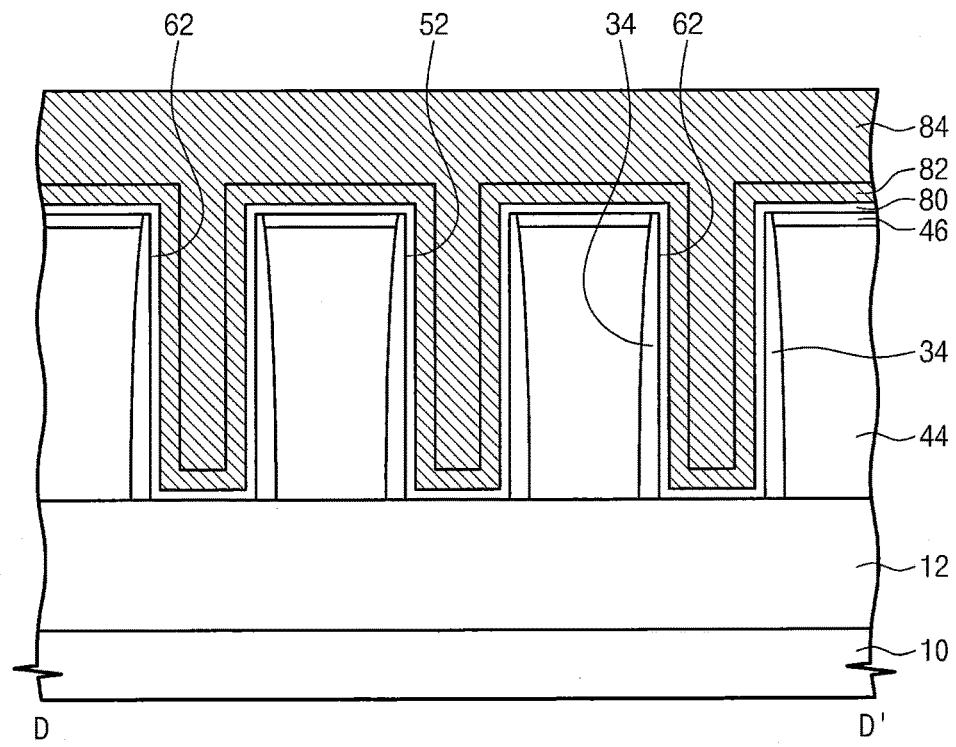

As shown in FIGS. 19CA to 19CD, the first and second sacrificial gates 30a, 30b and the sacrificial gate dielectric layers 28 may be selectively removed to form second grooves 62. A gate dielectric layer 80, a first gate conductive layer 82, and a second gate conductive layer 84 may be sequentially formed on the substrate 10 to fill the first groove 52 and the second grooves 62. The gate dielectric layer 80, the first gate conductive layer 82, and the second gate conductive layer 84 may be formed of the same materials as described with reference to FIGS. 18KA to 18KD by the same processes as described with reference to FIGS. 18KA to 18KD.

Figure 19D:
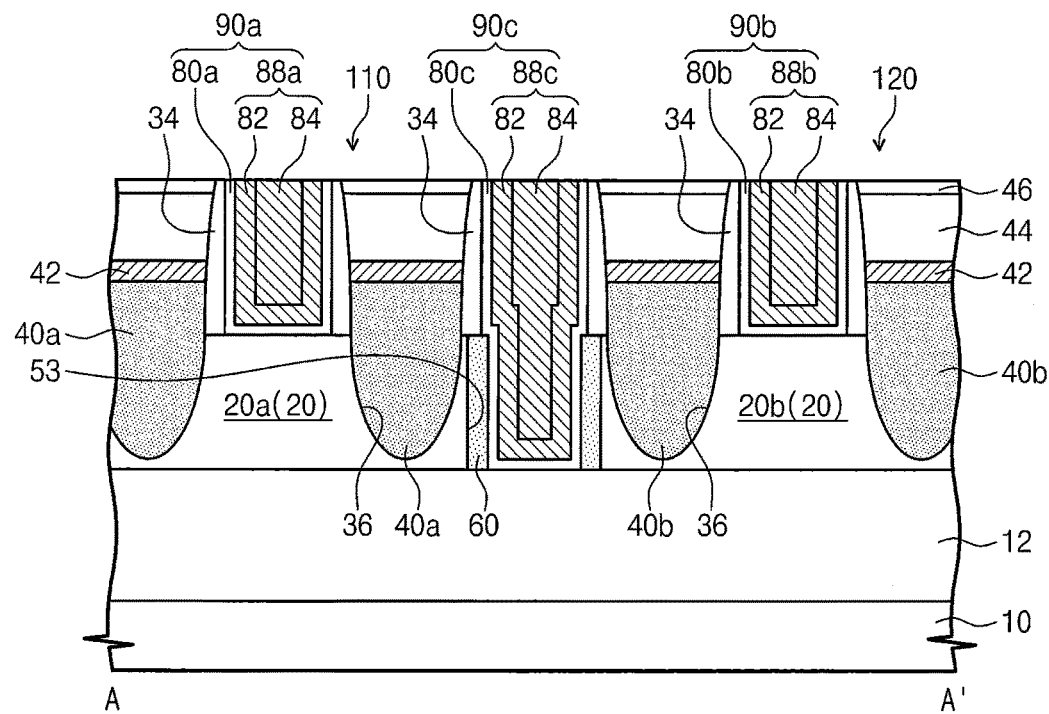
Figure 19D:
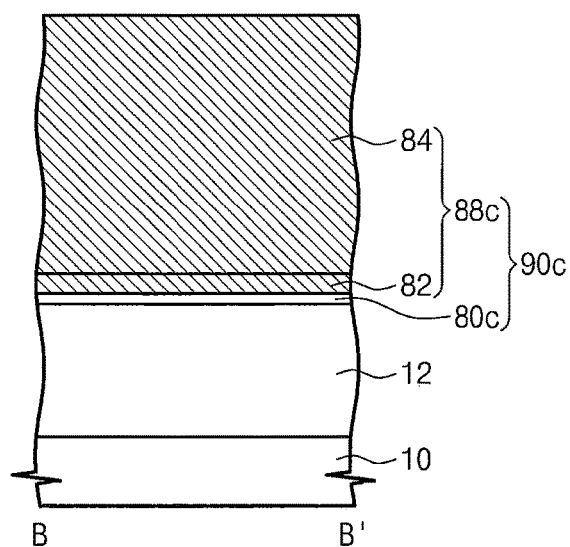
Figure 19D:
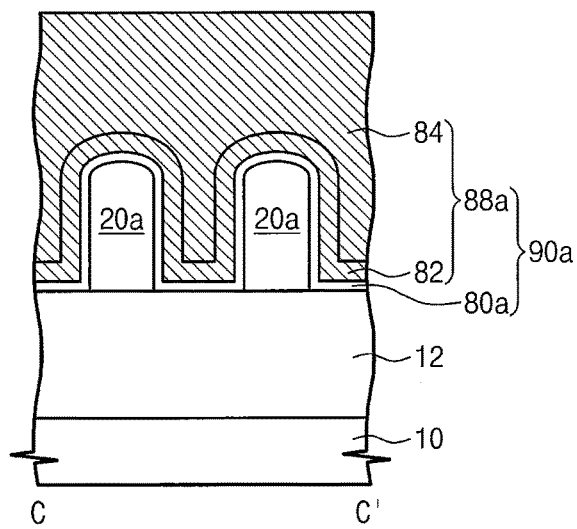
Figure 19D:
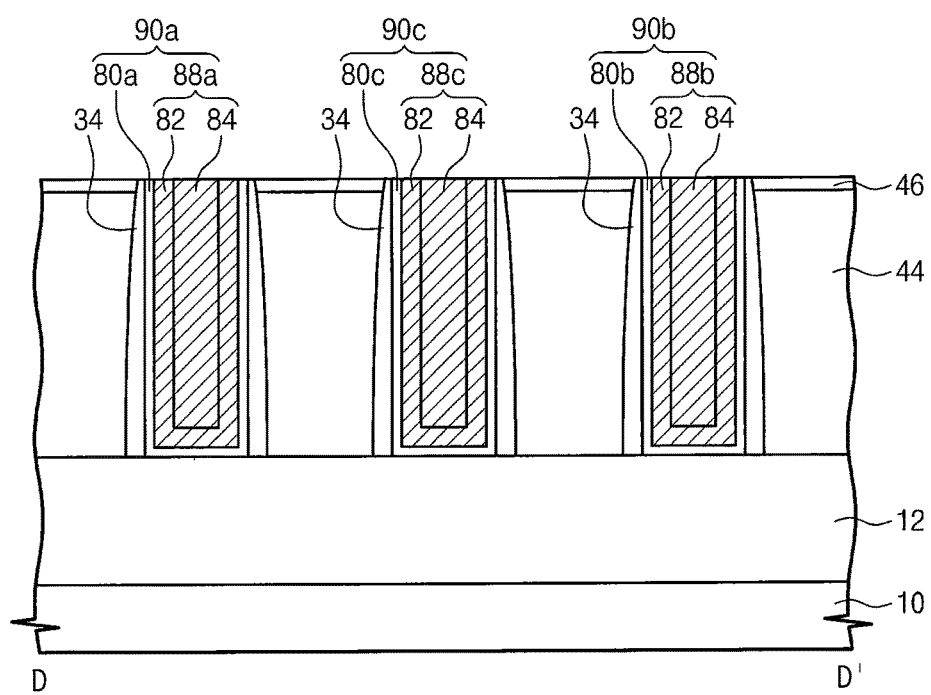

As shown in FIGS. 19DA to 19DD, the gate dielectric layer 80, the first gate conductive layer 82, and the second gate conductive layer 84 may be planarized by, for example, a CMP process. Thus, a first gate 90a including a first gate dielectric layer 80a and a first gate electrode 88a may be formed on the first fin subregion 20a, a second gate 90b including a second gate dielectric layer 80b and a second gate electrode 88b may be formed on the second fin subregion 20b, and a third gate 90c including a third gate dielectric layer 80c and a third gate electrode 88c may be formed on the second isolation insulating layer 60. Each of the first to third gate electrodes 88a, 88b, 88c may include the first gate conductive layer 82 and the second gate conductive layer 84. The third gate 90c may extend on the first isolation insulating layer 12 in the second direction Y with a uniform height. The third gate 90c may extend from the top surface of the gate spacer 34 to the top surface of the first isolation insulating layer 12. A height of the third gate 90c at a position where the third gate 90c is in contact with the second isolation insulating layer 60 may be greater than the heights of the first and second gates 90a, 90b disposed on the first and second fin subregions 20a, 20b. Heights of the first to third gates 90a, 90b, 90c disposed on the first isolation insulating layer 12 between the fin regions 20 may be substantially equal to each other.

Figure 20A:
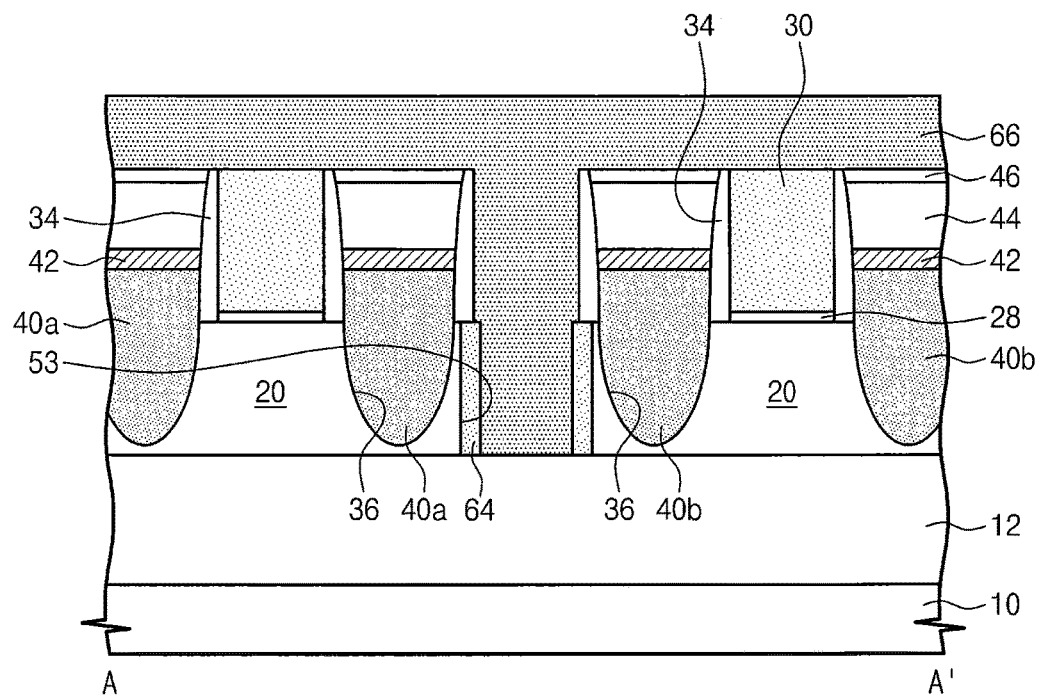
FIGS. 20AA to 20CA are cross-sectional views taken along line A-A' of FIG. 17A to illustrate a method of manufacturing a semiconductor device according to the eighth embodiment of the inventive concepts.
Figure 20A:
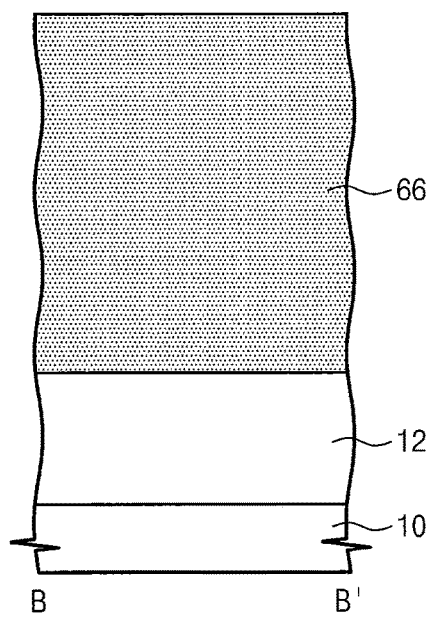
Figure 20A:
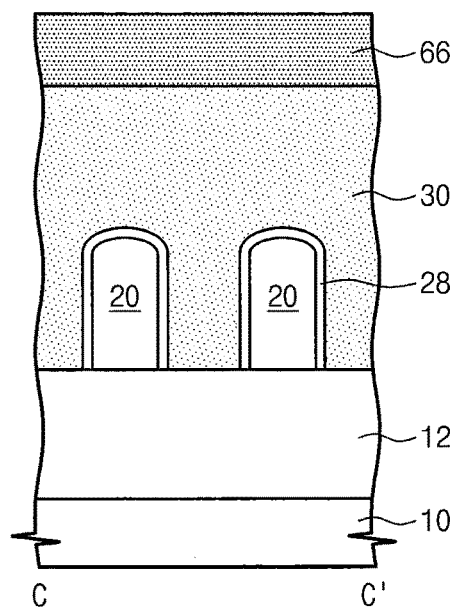
Figure 20A:
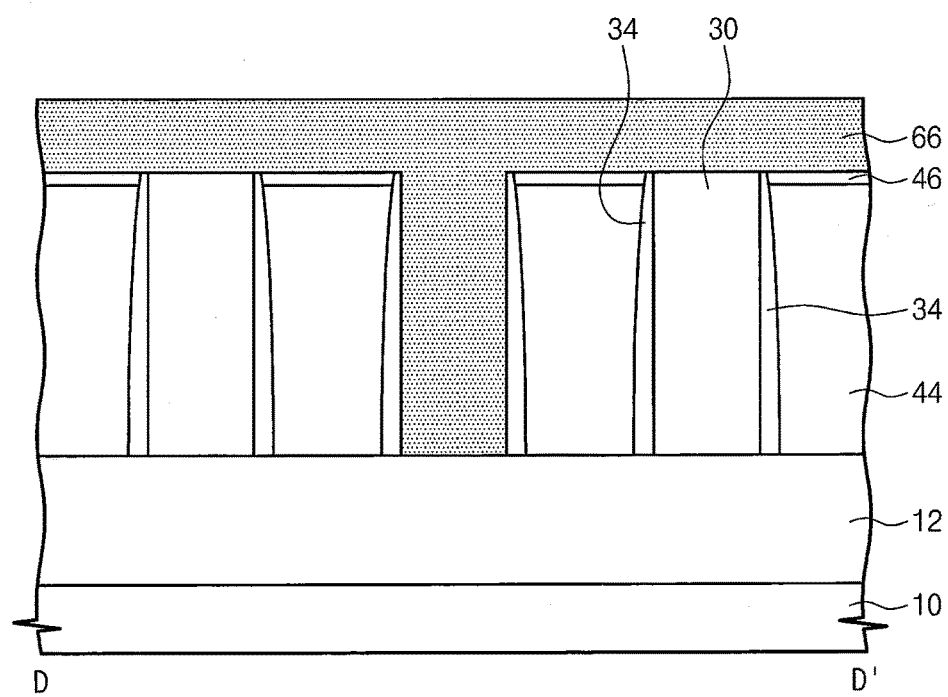

FIGS. 20AA to 20CD are cross-sectional view illustrating some processes of a method of manufacturing the semiconductor device according to the eighth embodiment of the inventive concepts. FIGS. 20AA to 20CA are cross-sectional views taken along a line A-A' of FIG. 17A, and FIGS. 20AB to 20CB are cross-sectional views taken along a line A-A' of FIG. 17A. FIGS. 20AC to 20CC are cross-sectional views taken along a line A-A' of FIG. 17A, and FIGS. 20AD to 20CD are cross-sectional views taken along a line A-A' of FIG. 17A. Hereinafter, the descriptions of elements already described above with respect to FIGS. 18AA to 18LD will be omitted or mentioned only briefly so that differences between the present embodiment and the embodiments of 18AA to 18LD and 19AA to 19DD may be highlighted.

As shown in FIGS. 20AA to 20AD, the fin region 20 exposed by the sidewalls of the second recess region 53 may be oxidized to form an oxide layer 64. The oxide layer 64 may be formed by, for example, the same process as the formation process of the second isolation insulating layer 60 described with reference to FIGS. 19BA to 19BD. A filling insulation layer 66 may be formed to fill the first groove 52 having the oxide layer 64 and the second recess region 53. For example, the filling insulation layer 66 may include an oxide and/or a nitride.

Figure 20B:
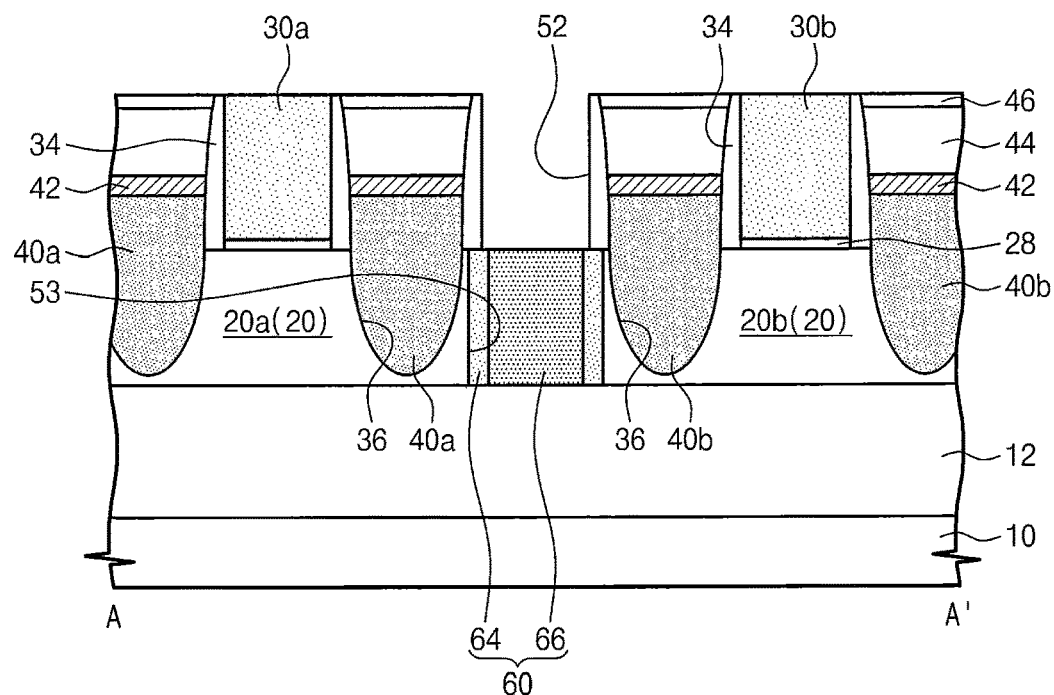
Figure 20B:
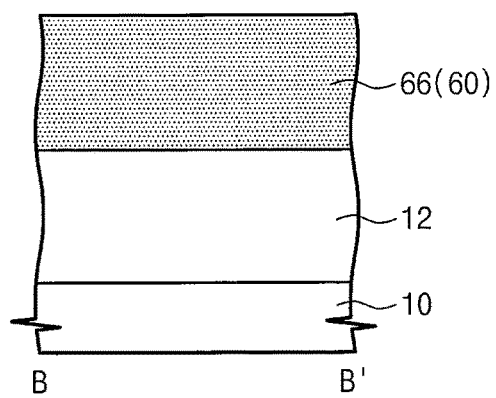
Figure 20B:
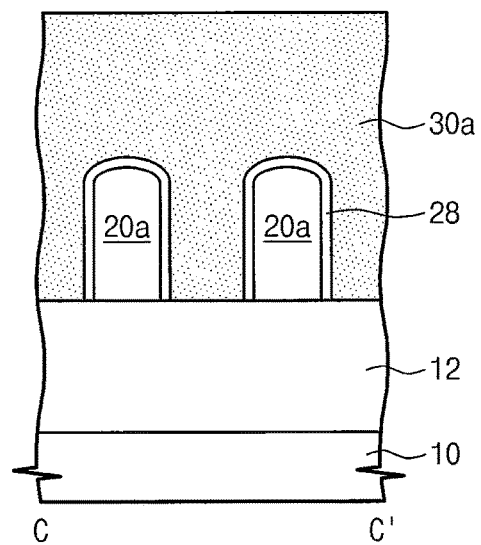
Figure 20B:
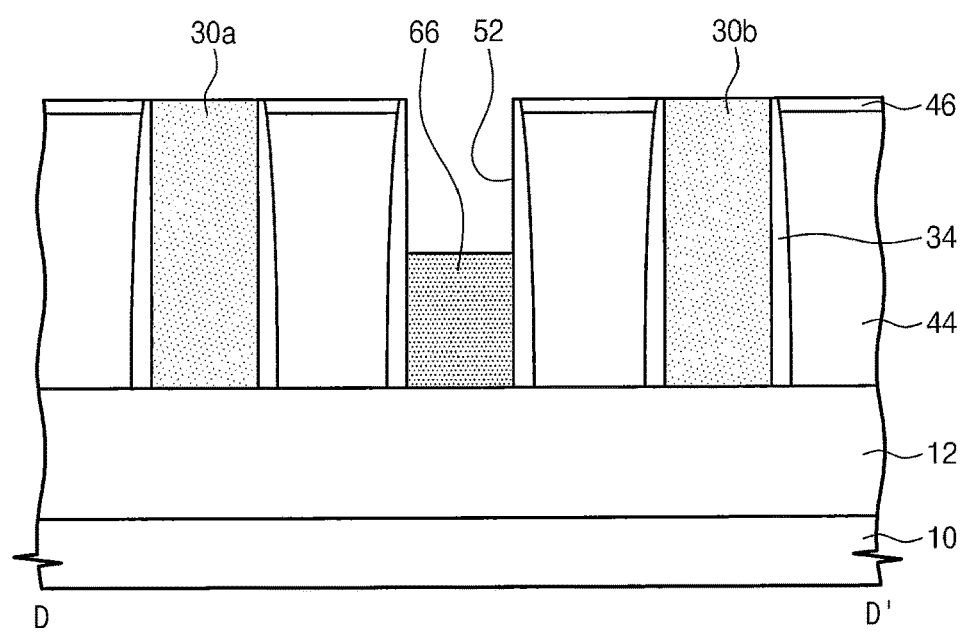

As shown in FIGS. 20BA to 20BD, the filling insulation layer 66 may be recessed to expose the first groove 52. For example, a blanket etch-back process may be performed to remove a portion of the filling insulation layer 66 formed on the protection patterns 46 and the sacrificial gates 30a, 30b and another portion of the filling insulation layer 66 formed in the first groove 52. For example, the portions of the filling insulation layer 66 may be selectively removed with respect to the protection patterns 46 and the sacrificial gates 30a, 30b. Thus, a second isolation insulating layer 60 may be formed to include the oxide layer 64 and the filling insulation layer 66 which fill the second recess region 53. In some embodiments, a top surface of the filling insulation layer 66 formed in the second recess region 53 may be a little higher than the top surfaces of the first and second fin subregions 20a, 20b. For example, the top surface of the filling insulation layer 66 may be substantially coplanar with a top surface of the sacrificial gate dielectric layer 28. Alternatively, the top surface of the filling insulation layer 66 may be formed to be higher than the top surface of the sacrificial gate dielectric layer 28.

The filling insulation layer 66 may have a structure extending in the second direction Y. The filling insulation layer 66 may be formed on the first isolation insulating layer 12. In some embodiments, the filling insulation layer 66 may be formed to be a discrete isolation insulating island (e.g., an island-shaped pattern). In this case, a plurality of filling insulation layers 66 formed under the first groove 52 may be spaced apart from each other in the second direction Y. Thus, the filling insulation layer 66 and the oxide layer 64 self-alignedly formed may have an isolated shape like the second isolation insulating layer 60 illustrated in FIG. 15A.

Figure 20C:
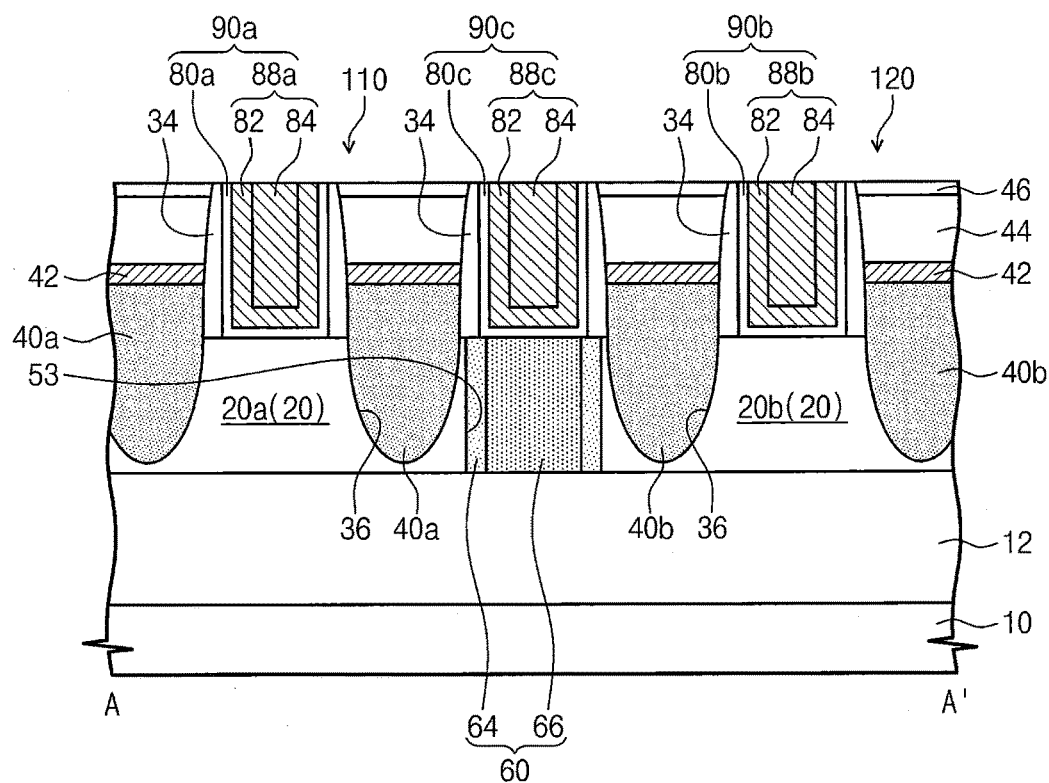
Figure 20C:
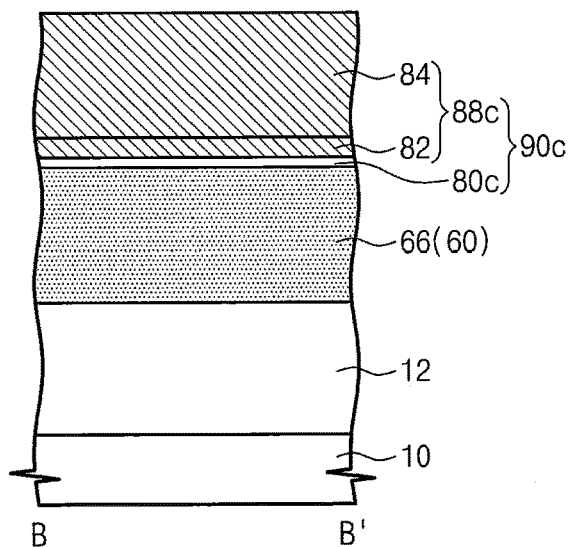
Figure 20C:
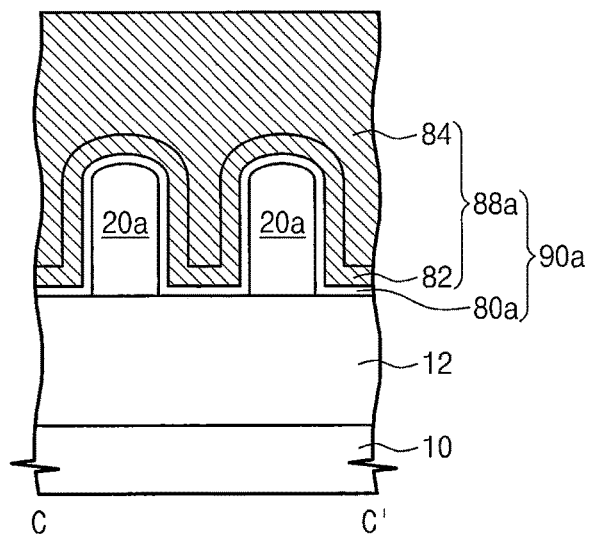
Figure 20C:
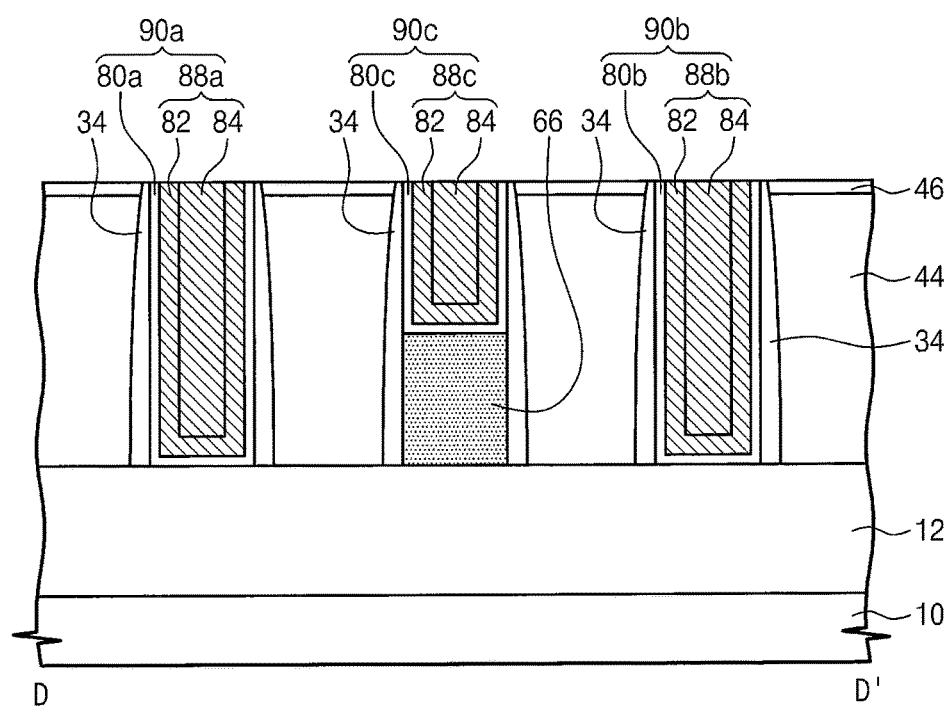
Figure 21A:
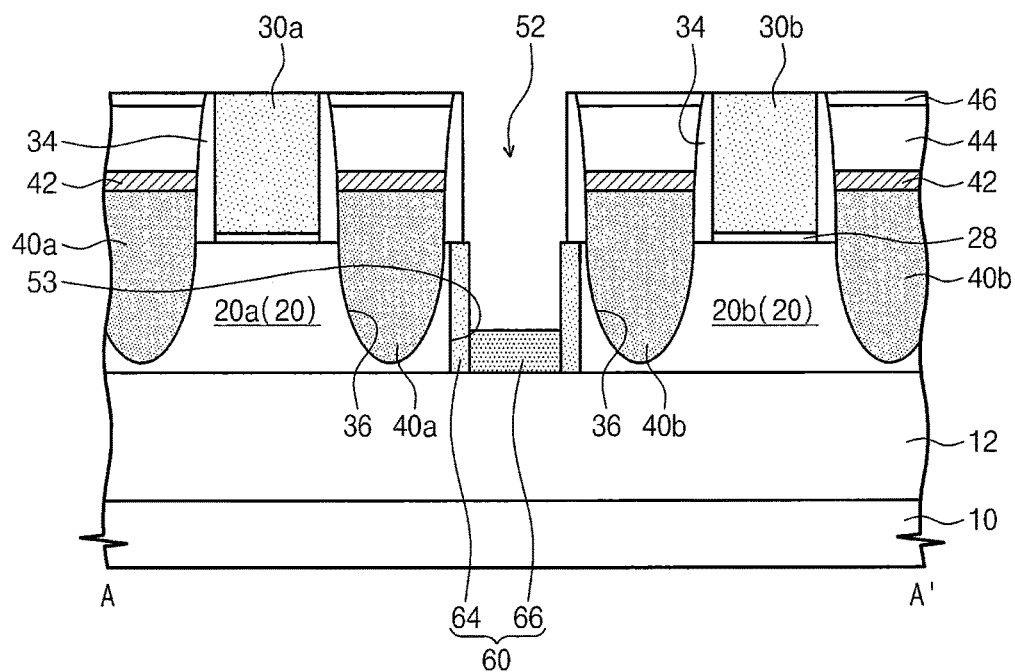
FIGS. 21A to 21D are cross-sectional views taken along lines A-A', B-B', C-C', and D-D' of FIG. 17A, respectively, to illustrate a method of manufacturing a semiconductor device according to the eighth embodiment of the inventive concepts.
Figure 21B:
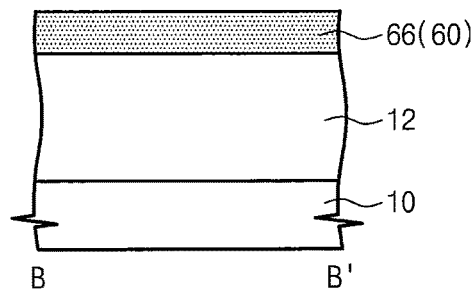
Figure 21C:
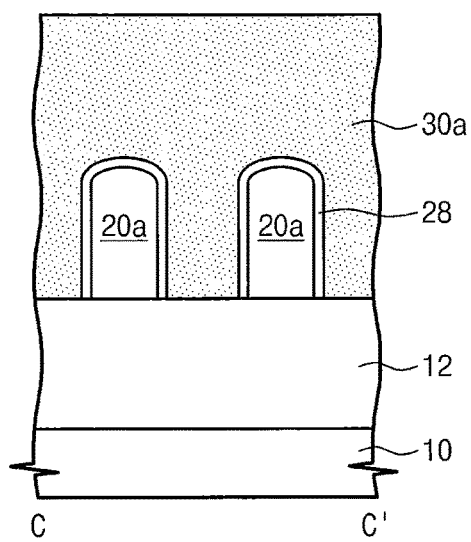
Figure 21D:
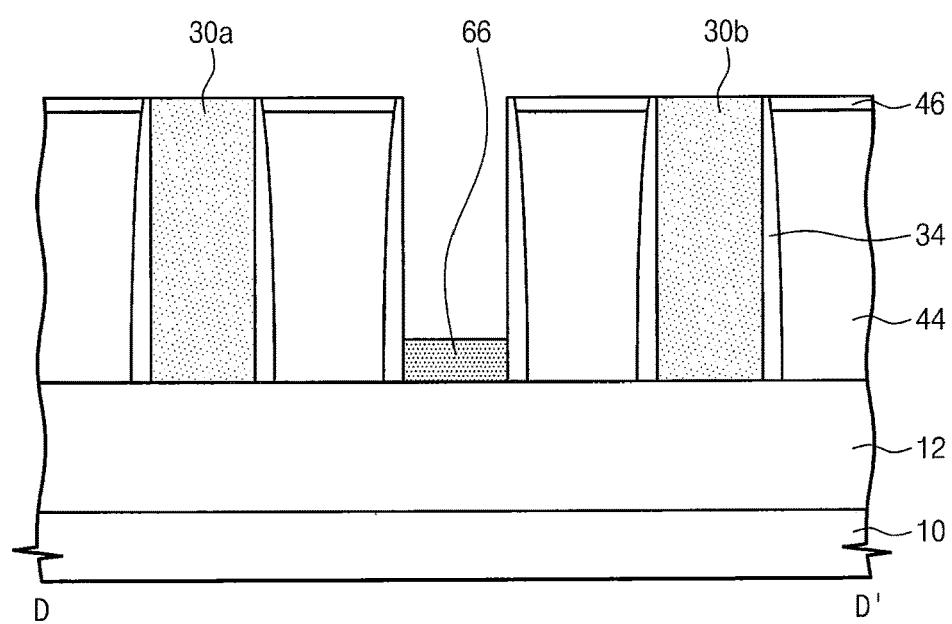

As shown in FIGS. 20CA to 20CD, the first and second sacrificial gates 30a, 30b and the sacrificial gate dielectric layers 28 are selectively removed. A portion of the filling insulation layer 66 may be removed during the removal of the sacrificial gate dielectric layers 28, so a top surface of the filling insulation layer 66 may be substantially coplanar with, for example, the top surfaces of the first and second fin subregions 20a, 20b. Alternatively, the top surface of the filling insulation layer 66 may be higher than the top surfaces of the first and second fin subregions 20a, 20b.

Thereafter, a gate dielectric layer 80, a first gate conductive layer 82, and a second gate conductive layer 84 may be sequentially formed. The gate dielectric layer 80, the first gate conductive layer 82, and the second gate conductive layer 84 may be formed of the same materials as described with reference to FIGS. 18KA to 18KD by the same processes as described with reference to FIGS. 18KA to 18KD. Subsequently, the gate dielectric layer 80, the first gate conductive layer 82, and the second gate conductive layer 84 may be planarized by, for example, a CMP process. Thus, a first gate 90a including a first gate dielectric layer 80a and a first gate electrode 88a may be formed on the first fin subregion 20a, a second gate 90b including a second gate dielectric layer 80b and a second gate electrode 88b may be formed on the second fin subregion 20b, and a third gate 90c including a third gate dielectric layer 80c and a third gate electrode 88c may be formed on the second isolation insulating layer 60. Each of the first to third gate electrodes 88a, 88b, 88c may include the first gate conductive layer 82 and the second gate conductive layer 84. A height of the third gate 90c disposed on the second isolation insulating layer 60 may be substantially equal to heights of the first and second gates 90a, 90b disposed on the first and second fin subregions 20a, 20b. Alternatively, the height of the third gate 90c disposed on the second isolation insulating layer 60 may be smaller than the heights of the first and second gates 90a, 90b disposed on the first and second fin subregions 20a, 20b. On the first isolation insulating layer 12 between the fin regions 20, a height of the third gate 90c may be smaller than heights of the first and second gates 90a, 90b. For example, the height of the third gate 90c may be smaller than the heights of the first and second gates 90a, 90b by a height of the filling insulation layer 66 on the first isolation insulating layer 12 between the fin regions 20. The filling insulation layer 66 may extend in the second direction Y, and the third gate 90c may extend on the filling insulation layer 66 in the second direction Y. In some embodiments, if the filling insulation layer 66 is the discrete isolation insulating island, the third gate 90c may cover sidewalls and a top surface of the second isolation insulating layer 60 and may extend in the second direction Y.

FIGS. 21A to 21D are cross-sectional views respectively taken along lines A-A', B-B', C-C', and D-D' of FIG. 17A to illustrate a process of another embodiment of a method of manufacturing the semiconductor device according to the eighth embodiment of the inventive concepts. Hereinafter, the descriptions of elements already described above with respect to FIGS. 18AA to 18LD will be omitted or mentioned only briefly so that differences between the present embodiment and the embodiments of 18AA to 18LD, 19AA to 19DD and 20AA to 20CD may be highlighted.

As shown in FIGS. 21A to 21D, a second isolation insulating layer 60 may include a filling insulation layer 66 having a height lower than the height of the filling insulation layer 66 illustrated in FIGS. 20CA to 20CD. For example, the filling insulation layer 66 illustrated in FIGS. 20AA to 20AD may further be etched back to expose a portion of the second recess region 53, so a portion of the oxide layer 64 may be exposed. A top surface of the filling insulation layer 66 may be lower than the top surfaces of the first and second fin subregions 20a, 20b. Thereafter, the first and second sacrificial gates 30a, 30b may be removed and then processes of forming a gate dielectric layer and gate electrodes may be performed as described with reference to FIGS. 20BA to 20CD.

Figure 22:
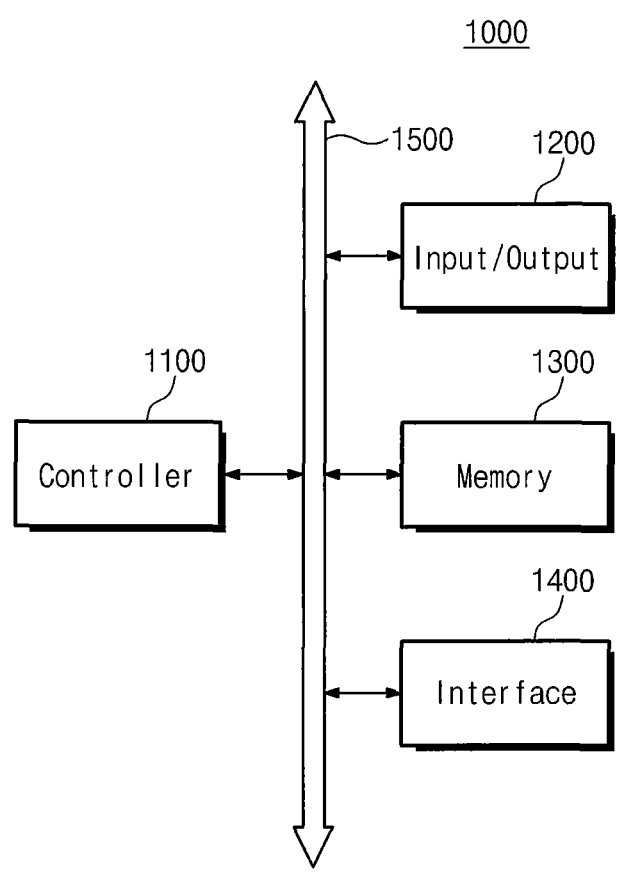
FIG. 22 is a schematic block diagram illustrating an electronic system according to embodiments of the inventive concepts.

FIG. 22 is a schematic block diagram illustrating an example of electronic systems including semiconductor devices according to embodiments of the inventive concepts. The semiconductor devices described with reference to FIGS. 1 to 21D may be applied to an electronic system of FIG. 22.

As shown in FIG. 22, an electronic system 1000 according to embodiments of the inventive concepts may include a controller 1100, an input/output unit 1200, a memory device 1300, an interface unit 1400, and a data bus 1500. The controller 1100, the input/output unit 1200, the memory device 1300, and/or the interface unit 1400 may be coupled to each other through the data bus 1500. The data bus 1500 may correspond to a path through which data are transmitted.

The controller 1100 may include at least one of a microprocessor, a digital signal processor, a microcontroller, or other logic devices capable of performing a similar function to any one thereof. The input/output unit 1200 may include a keypad, a keyboard and/or a display unit. The memory device 1300 may store data and/or commands. The interface unit 1400 may transmit electrical data to a communication network or may receive electrical data from a communication network. The interface unit 1400 may operate by wireless or cable. For example, the interface unit 1400 may include an antenna a wireless/cable transceiver. The electronic system 1000 may further include a fast dynamic random access memory (DRAM) device and/or a fast static random access memory (SRAM) device which acts as a cache memory for improving an operation of the controller 1100. The semiconductor devices according to embodiments of the inventive concepts may be provided to the controller 1100, the cache memory of the controller 1100, and/or the input/output unit 1200.

The electronic system 1000 may be applied to a personal digital assistant (PDA), a portable computer, a web tablet, a wireless phone, a mobile phone, a digital music player, a memory card, or other electronic products receiving and/or transmitting information data by wireless.

In the semiconductor device according to embodiments of the inventive concepts, the gate electrode is disposed on the isolation insulating layer which is self-alignedly formed. Thus, it is possible to protect against (e.g., impede/prevent) the short or leakage current between the source/drain region formed in the fin region and the gate electrode disposed on the isolation insulating layer. As a result, reliability of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A method of manufacturing a semiconductor device, the method comprising:
    forming a fin region protruding from a substrate and extending in a first direction, the fin region comprising opposing sidewalls that extend in the first direction;
    forming an isolation insulating layer on the opposing sidewalls of the fin region, the isolation insulating layer exposing upper portions of the opposing sidewalls of the fin region;
    after forming the isolation insulating layer, forming a discrete isolation insulating island in the fin region by oxidizing a portion of the fin region, thereby forming a first fin subregion and a second fin subregion separated from each other in the first direction by the discrete isolation insulating island, the isolation insulating layer exposing an upper portion of the discrete isolation insulating island; and
    forming a gate extending on the discrete isolation insulating island in a second direction different from the first direction.

2. The method of claim 1, wherein oxidizing the portion of the fin region comprises performing a plasma oxidation process or a thermal oxidation process.

3. The method of claim 1, wherein oxidizing the portion of the fin region comprises implanting oxygen ions into the portion of the fin region and thermally treating the fin region.

4. The method of claim 1, wherein the portion of the fin region comprises a first portion of the fin region, and
    wherein the method further comprises injecting dopants into a second portion of the fin region underneath the discrete isolation insulating island to form a punch-through stop layer.

5. The method of claim 1, wherein forming the gate comprises forming a first gate, a second gate and a third gate that extend in the second direction, and
    wherein the first gate traverses the first fin subregion, the second gate traverses the second fin subregion, and the third gate extends on the discrete isolation insulating island.

6. The method of claim 5, wherein oxidizing the portion of the fin region comprises:
    forming a sacrificial gate dielectric layer on the fin region;
    forming a first sacrificial gate and a second sacrificial gate spaced apart from each other on the sacrificial gate dielectric layer, the first and second sacrificial gates intersecting the fin region in the second direction;
    forming a third sacrificial gate on the sacrificial gate dielectric layer, the third sacrificial gate intersecting the fin region between the first and second sacrificial gates in the second direction;
    forming a gate spacer on a sidewall of each of the first, second and third sacrificial gates;
    removing the third sacrificial gate and a portion of the sacrificial gate dielectric layer disposed under the third sacrificial gate to form a first groove exposing the portion of the fin region; and
    oxidizing the portion of the fin region exposed by the first groove.

7. The method of claim 6, wherein forming the first, second and third gates comprises:
    removing the first sacrificial gate, the second sacrificial gate, and portions of the sacrificial gate dielectric layer disposed under the first and second sacrificial gates to form second grooves on the first and second fin subregions; and forming a gate dielectric layer and a gate electrode in each of the first and second grooves to form the first gate and the second gate in respectively ones of the second grooves, and to form the third gate in the first groove, wherein each of the first, second and third gates comprises the gate dielectric layer and the gate electrode.

8. The method of claim 5, wherein oxidizing the portion of the fin region comprises:

forming a sacrificial gate dielectric layer on the fin region;

forming a first sacrificial gate and a second sacrificial gate spaced apart from each other on the sacrificial gate dielectric layer, the first and second sacrificial gates intersecting the fin region in the second direction;

forming a third sacrificial gate on the sacrificial gate dielectric layer, the third sacrificial gate intersecting the fin region between the first and second sacrificial gates in the second direction;

forming a gate spacer on a sidewall of each of the first, second and third sacrificial gates;

removing the third sacrificial gate and a portion of the sacrificial gate dielectric layer disposed under the third sacrificial gate to form a first groove exposing the portion of the fin region;

trimming the portion of the fin region exposed by the first groove; and oxidizing the trimmed portion of the fin region exposed by the first groove.

9. The method of claim 5, wherein oxidizing the portion of the fin region comprises:

forming a sacrificial gate dielectric layer on the fin region;

forming a first sacrificial gate and a second sacrificial gate spaced apart from each other on the sacrificial gate dielectric layer, the first and second sacrificial gates intersecting the fin region in the second direction;

forming a third sacrificial gate on the sacrificial gate dielectric layer, the third sacrificial gate intersecting the fin region between the first and second sacrificial gates in the second direction;

forming a gate spacer on a sidewall of each of the first, second and third sacrificial gates;

removing the third sacrificial gate and a portion of the sacrificial gate dielectric layer disposed under the third sacrificial gate to form a first groove exposing the portion of the fin region;

removing the portion of the fin region exposed by the first groove to form a recess region; and oxidizing surfaces of the recess region.

10. The method of claim 9, wherein the discrete isolation insulating island comprises an oxide layer having a U-shaped cross section.

11. The method of claim 9, wherein the discrete isolation insulating island comprises a pair of oxide layers separated from each other in the first direction.

12. The method of claim 1, wherein the gate is on opposing sidewalls of the upper portion of the discrete isolation insulating island.

13. A method of manufacturing a semiconductor device, the method comprising:

forming a fin region protruding from a surface of a substrate, the fin region comprising a first fin subregion and a second fin subregion spaced apart from each other in a first direction;

forming a first isolation insulating layer being in contact with sidewalls of the first and second fin subregions, which extend in the first direction, the first isolation insulating layer extending in the first direction;

forming a discrete isolation insulating island disposed between the first fin subregion and the second fin subregion, the discrete isolation insulating island separating the first fin subregion from the second fin subregion and comprising a lower surface facing the fin region, and the lower surface of the discrete isolation insulating island being at a level between a level of the surface of the substrate and a level of an upper surface of the first fin subregion;

forming a first gate intersecting the first fin subregion and extending in a second direction different from the first direction;

forming a second gate intersecting the second fin subregion and extending in the second direction; and forming a third gate on a top surface and opposing sidewalls of the discrete isolation insulating island and extending in the second direction, wherein each of the first to third gates comprises a gate dielectric layer and a gate electrode, wherein the third gate intersects the first isolation insulating layer, and wherein a bottom surface of the third gate disposed on the first isolation insulating layer is lower than a top surface of the first isolation insulating layer.

14. The method of claim 13, further comprising:

forming first source/drain regions in the first fin subregion adjacent to sidewalls of the first gate, the first source/drain regions comprising one or more dopants of a first conductivity type; and forming second source/drain regions in the second fin subregion adjacent to sidewalls of the second gate, the second source/drain regions comprising dopants of the first conductivity type.

15. The method of claim 14, wherein the fin region further comprises a third fin subregion that is disposed underneath the discrete isolation insulating island, and wherein the method further comprises forming a punch-through stop layer in the third fin subregion, the punch-through stop layer comprising dopants having a second conductivity type different from the first conductivity type.

16. The method of claim 14, wherein at least one of the first and second source/drain regions includes an epitaxial layer.

17. The method of claim 13, wherein the opposing sidewalls of the discrete isolation insulating island are parallel to the first direction and exposed by the fin region.

18. A method of manufacturing a semiconductor device, the method comprising:

forming a fin region extending in a first direction on a substrate;

forming gate spacers on the fin region, the gate spacers extending in a second direction different from the first direction and defining a groove that exposes a portion of the fin region;

forming a recess region in the fin region by removing the portion of the fin region exposed by the groove;

oxidizing surfaces of the recess region to form an oxide layer;

forming a filling insulation layer filling the recess region on the oxide layer to form an isolation insulating layer comprising the oxide layer and the filling insulation layer; and forming a gate filling the groove on the filling insulation layer, the gate including a gate dielectric layer and a gate electrode.

19. The method of claim 18, further comprising:

forming a punch-through stop layer including dopants in the fin region underneath the isolation insulating layer.

* * * * *